US007925377B2

(12) United States Patent
Ishikawa et al.

(10) Patent No.: US 7,925,377 B2
(45) Date of Patent: Apr. 12, 2011

(54) CLUSTER TOOL ARCHITECTURE FOR PROCESSING A SUBSTRATE

(75) Inventors: Tetsuya Ishikawa, Saratogo, CA (US); Rick J. Roberts, San Jose, CA (US); Helen R. Armer, Cupertino, CA (US); Leon Volfovski, Mountain View, CA (US); Jay D. Pinson, San Jose, CA (US); Michael Rice, Pleasanton, CA (US); David H. Quach, San Jose, CA (US); Mohsen S. Salek, Saratoga, CA (US); Robert Lowrance, Los Gatos, CA (US); William Tyler Weaver, Austin, TX (US); Charles Carlson, Cedar Park, TX (US); Chongyang Wang, San Jose, CA (US); Jeffrey Hudgens, San Francisco, CA (US); Harald Herchen, Los Altos, CA (US); Brian Lue, Mountain View, CA (US); John A. Backer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1301 days.

(21) Appl. No.: 11/458,667

(22) Filed: Jul. 19, 2006

(65) Prior Publication Data

US 2006/0286300 A1    Dec. 21, 2006

Related U.S. Application Data

(63) Continuation of application No. 11/112,932, filed on Apr. 22, 2005, now abandoned.

(60) Provisional application No. 60/639,109, filed on Dec. 22, 2004.

(51) Int. Cl.
*G06F 7/00* (2006.01)

(52) U.S. Cl. ....................................... 700/218; 414/936

(58) Field of Classification Search .................. 700/213, 700/218, 214, 228, 121; 414/936
See application file for complete search history.

(56) References Cited

U.S. PATENT DOCUMENTS 1,383,093 A    6/1921   Finch
(Continued)

FOREIGN PATENT DOCUMENTS

DE    3790259 C2    11/1986
(Continued)

OTHER PUBLICATIONS

Klaus Eberhardt, "Advanced Photoresist Wafer Processing System for Deep UV (DUV)", Fairchild Technologies GMBH, Vaihingen/Enz, Germany, Nov. 2004, pp. 1-9.

(Continued)

*Primary Examiner* — Gene Crawford
*Assistant Examiner* — Ramya Prakasam
(74) *Attorney, Agent, or Firm* — Patterson & Sheridan, LLP

(57) ABSTRACT

Embodiments generally provide an apparatus and method for processing substrates using a multi-chamber processing system (e.g., a cluster tool) that has an increased system throughput, increased system reliability, substrates processed in the cluster tool have a more repeatable wafer history, and also the cluster tool has a smaller system footprint. In one embodiment of the cluster tool, grouping substrates together, and transferring and processing the substrates in groups of two or more, improves system throughput, and reduces the number of moves a robot has to make to transfer a batch of substrates between the processing chambers, thus reducing wear on the robot and increasing system reliability. Embodiments also provide for a method and apparatus that are used to increase the reliability of the substrate transfer process to reduce system down time.

3 Claims, 71 Drawing Sheets

U.S. PATENT DOCUMENTS

| | | |
|---|---|---|
| 1,927,677 A | 9/1933 | Bennington |
| 2,578,220 A | 12/1951 | Billner |
| 3,193,080 A | 7/1965 | Speaker et al. |
| 3,206,041 A | 9/1965 | McGrath |
| 3,279,625 A | 10/1966 | McConnell et al. |
| 3,351,219 A | 11/1967 | Ruderfer et al. |
| 3,402,835 A | 9/1968 | Saul |
| 3,428,195 A | 2/1969 | Pamer |
| 3,610,159 A | 10/1971 | Fickenacher |
| 3,669,206 A | 6/1972 | Tax et al. |
| 3,750,804 A | 8/1973 | Lemelson |
| 3,782,564 A | 1/1974 | Burt |
| 3,796,327 A | 3/1974 | Meyer et al. |
| 3,876,085 A | 4/1975 | Bright |
| 4,027,246 A | 5/1977 | Caccoma et al. |
| 4,197,000 A | 4/1980 | Blackwood |
| 4,319,689 A | 3/1982 | Clapp |
| 4,609,575 A | 9/1986 | Burkman |
| 4,634,655 A | 1/1987 | Yanagimoto et al. |
| 4,664,133 A | 5/1987 | Silvernail |
| 4,682,614 A | 7/1987 | Silvernail |
| 4,750,505 A | 6/1988 | Inuta et al. |
| 4,755,257 A | 7/1988 | Yamamoto et al. |
| 4,756,047 A | 7/1988 | Hayashi et al. |
| 4,774,552 A | 9/1988 | Nishihama et al. |
| 4,788,994 A | 12/1988 | Shinbara |
| 4,803,734 A | 2/1989 | Onishi et al. |
| 4,830,888 A | 5/1989 | Kobayashi et al. |
| 4,838,979 A | 6/1989 | Nishida et al. |
| 4,844,746 A | 7/1989 | Hormann et al. |
| 4,846,623 A | 7/1989 | Otani et al. |
| 4,855,775 A | 8/1989 | Matsuoka |
| 4,856,641 A | 8/1989 | Matsumura et al. |
| 4,857,949 A | 8/1989 | Masuda et al. |
| 4,870,923 A | 10/1989 | Sugimoto |
| 4,871,417 A | 10/1989 | Nishizawa et al. |
| 4,892,761 A | 1/1990 | Yamada |
| 4,895,604 A | 1/1990 | Hayashi |
| 4,899,686 A | 2/1990 | Toshima et al. |
| 4,911,761 A | 3/1990 | McConnell et al. |
| 4,917,123 A | 4/1990 | McConnell et al. |
| 4,919,073 A | 4/1990 | Kobayashi et al. |
| 4,922,278 A | 5/1990 | Takeda et al. |
| 4,923,054 A | 5/1990 | Ohtani et al. |
| 4,924,073 A | 5/1990 | Chiba |
| 4,924,800 A | 5/1990 | Tanaka |
| 4,966,094 A | 10/1990 | Yamada |
| 4,982,694 A | 1/1991 | Moriyama |
| 4,984,597 A | 1/1991 | McConnell et al. |
| 4,985,720 A | 1/1991 | Masuda et al. |
| 4,987,687 A | 1/1991 | Sugimoto |
| 4,998,021 A | 3/1991 | Mimasaka |
| 5,002,008 A | 3/1991 | Ushijima et al. |
| 5,020,200 A | 6/1991 | Mimasaka et al. |
| 5,031,474 A | 7/1991 | Keppler et al. |
| 5,032,217 A | 7/1991 | Tanaka |
| 5,035,200 A | 7/1991 | Moriyama |
| 5,054,332 A | 10/1991 | Terauchi et al. |
| 5,061,144 A | 10/1991 | Akimoto et al. |
| 5,065,178 A | 11/1991 | Awazu et al. |
| 5,070,813 A | 12/1991 | Sakai et al. |
| 5,078,832 A | 1/1992 | Tanaka |
| 5,089,305 A | 2/1992 | Ushijima et al. |
| 5,127,362 A | 7/1992 | Iwatsu et al. |
| 5,151,871 A | 9/1992 | Masumura et al. |
| 5,169,408 A | 12/1992 | Biggerstaff |
| 5,174,855 A | 12/1992 | Tanaka |
| 5,180,431 A | 1/1993 | Sugimoto et al. |
| 5,197,846 A | 3/1993 | Uno et al. |
| 5,201,653 A | 4/1993 | Hasegawa et al. |
| 5,209,180 A | 5/1993 | Shoda et al. |
| 5,234,499 A | 8/1993 | Sasaki et al. |
| 5,240,556 A | 8/1993 | Ishikawa et al. |
| 5,250,114 A | 10/1993 | Konishi et al. |
| 5,252,137 A | 10/1993 | Tateyama et al. |
| 5,254,367 A | 10/1993 | Masumura et al. |
| D341,418 S | 11/1993 | Akimoto |
| 5,275,658 A | 1/1994 | Kimura |
| 5,307,109 A | 4/1994 | Miyasaka et al. |
| 5,308,210 A | 5/1994 | Ohtani et al. |
| 5,312,487 A | 5/1994 | Akimoto et al. |
| 5,322,079 A | 6/1994 | Fukutomi et al. |
| 5,331,987 A | 7/1994 | Hayashi et al. |
| 5,339,128 A | 8/1994 | Tateyama et al. |
| 5,349,412 A | 9/1994 | Miyasaka |
| 5,359,785 A | 11/1994 | Fukutomi et al. |
| 5,374,312 A | 12/1994 | Hasebe et al. |
| 5,376,216 A | 12/1994 | Yoshioka et al. |
| 5,401,316 A | 3/1995 | Shiraishi et al. |
| 5,405,443 A | 4/1995 | Akimoto et al. |
| 5,411,076 A | 5/1995 | Matsunaga et al. |
| 5,415,890 A | 5/1995 | Kloiber et al. |
| 5,416,047 A | 5/1995 | Konishi et al. |
| 5,418,382 A | 5/1995 | Blackwood et al. |
| 5,427,820 A | 6/1995 | Biche et al. |
| 5,430,271 A | 7/1995 | Orgami et al. |
| 5,431,700 A | 7/1995 | Sloan |
| 5,436,848 A | 7/1995 | Nishida et al. |
| 5,438,209 A | 8/1995 | Yamamoto et al. |
| 5,443,348 A | 8/1995 | Biche et al. |
| 5,485,644 A | 1/1996 | Shinbara et al. |
| 5,501,870 A | 3/1996 | Shiraishi et al. |
| 5,505,781 A | 4/1996 | Omori et al. |
| 5,514,215 A | 5/1996 | Takamatsu et al. |
| 5,514,852 A | 5/1996 | Takamori et al. |
| 5,520,744 A | 5/1996 | Fujikawa et al. |
| 5,522,215 A | 6/1996 | Matsunaga et al. |
| 5,536,918 A | 7/1996 | Ohkase et al. |
| 5,553,994 A | 9/1996 | Biche et al. |
| 5,555,234 A | 9/1996 | Sugimoto |
| 5,571,325 A | 11/1996 | Ueyama et al. |
| 5,580,607 A | 12/1996 | Takekuma et al. |
| 5,599,394 A | 2/1997 | Yabe et al. |
| 5,601,645 A | 2/1997 | Nonomura et al. |
| 5,608,943 A | 3/1997 | Konishi et al. |
| 5,611,685 A | 3/1997 | Nakajima et al. |
| 5,618,348 A | 4/1997 | Tran |
| 5,620,560 A | 4/1997 | Akimoto et al. |
| 5,625,433 A | 4/1997 | Inada et al. |
| 5,626,913 A | 5/1997 | Tomoeda et al. |
| 5,633,040 A | 5/1997 | Toshima et al. |
| 5,634,377 A | 6/1997 | Kimura et al. |
| 5,638,687 A | 6/1997 | Mizohata et al. |
| 5,639,301 A | 6/1997 | Sasada et al. |
| 5,651,823 A | 7/1997 | Parodi et al. |
| 5,658,615 A | 8/1997 | Hasebe et al. |
| 5,665,200 A | 9/1997 | Fujimoto et al. |
| 5,668,733 A | 9/1997 | Morimoto et al. |
| 5,670,210 A | 9/1997 | Mandal et al. |
| 5,672,205 A | 9/1997 | Fujimoto et al. |
| 5,674,410 A | 10/1997 | Nakajima et al. |
| 5,677,000 A | 10/1997 | Yoshioka et al. |
| 5,681,614 A | 10/1997 | Omori et al. |
| 5,687,085 A * | 11/1997 | Morimoto et al. ............ 700/121 |
| 5,688,322 A | 11/1997 | Motoda et al. |
| 5,688,324 A | 11/1997 | Umaba |
| 5,688,326 A | 11/1997 | Kandori et al. |
| 5,689,749 A | 11/1997 | Tanaka et al. |
| 5,695,817 A | 12/1997 | Tateyama et al. |
| 5,700,046 A | 12/1997 | Van Doren et al. |
| 5,701,627 A | 12/1997 | Matsumura et al. |
| 5,704,493 A | 1/1998 | Fujikawa et al. |
| 5,711,809 A | 1/1998 | Kimura et al. |
| 5,715,173 A | 2/1998 | Nakajima et al. |
| 5,730,574 A | 3/1998 | Adachi et al. |
| 5,733,024 A | 3/1998 | Slocum et al. |
| 5,762,684 A | 6/1998 | Hayashi et al. |
| 5,762,708 A | 6/1998 | Motoda et al. |
| 5,762,709 A | 6/1998 | Sugimoto et al. |
| 5,762,745 A | 6/1998 | Hirose |
| 5,763,892 A | 6/1998 | Kizaki et al. |
| 5,765,072 A | 6/1998 | Ohtani et al. |
| 5,766,671 A | 6/1998 | Matsui |
| 5,766,824 A | 6/1998 | Batchelder et al. |
| 5,772,764 A | 6/1998 | Akimoto |
| 5,779,796 A | 7/1998 | Tomoeda et al. |
| 5,788,742 A | 8/1998 | Sugimoto et al. |

| | | | | | | |
|---|---|---|---|---|---|---|
| 5,788,773 A | 8/1998 | Okuda et al. | | 6,033,475 A | 3/2000 | Hasebe et al. |
| 5,788,868 A | 8/1998 | Itaba et al. | | 6,040,120 A | 3/2000 | Matsushita et al. |
| 5,792,259 A | 8/1998 | Yoshioka et al. | | 6,048,400 A | 4/2000 | Ohtani |
| 5,803,932 A | 9/1998 | Akimoto et al. | | 6,051,101 A | 4/2000 | Ohtani et al. |
| 5,803,970 A | 9/1998 | Tateyama et al. | | 6,051,349 A | 4/2000 | Yoshioka |
| 5,817,156 A | 10/1998 | Tateyama et al. | | 6,053,058 A | 4/2000 | Hayashi et al. |
| 5,823,736 A | 10/1998 | Matsumura | | 6,053,977 A | 4/2000 | Konishi |
| 5,826,130 A | 10/1998 | Tanaka et al. | | 6,056,998 A | 5/2000 | Fujimoto |
| 5,834,737 A | 11/1998 | Hirose et al. | | 6,059,880 A | 5/2000 | Kitano et al. |
| 5,838,121 A | 11/1998 | Fairbairn et al. | | 6,060,697 A | 5/2000 | Morita et al. |
| 5,839,011 A | 11/1998 | Urasaki et al. | | 6,062,240 A | 5/2000 | Sada et al. |
| 5,841,515 A | 11/1998 | Ohtani | | 6,062,288 A | 5/2000 | Tateyama |
| 5,843,527 A | 12/1998 | Sanada | | 6,062,852 A | 5/2000 | Kawamoto et al. |
| 5,845,170 A | 12/1998 | Ogata | | 6,063,190 A | 5/2000 | Hasebe et al. |
| 5,846,327 A | 12/1998 | Kawamoto et al. | | 6,063,439 A | 5/2000 | Semba et al. |
| 5,853,483 A | 12/1998 | Morita et al. | | 6,067,727 A | 5/2000 | Muraoka |
| 5,853,812 A | 12/1998 | Kawasaki et al. | | 6,074,515 A | 6/2000 | Iseki et al. |
| 5,854,953 A | 12/1998 | Semba | | 6,076,652 A | 6/2000 | Head |
| 5,866,307 A | 2/1999 | Kiba et al. | | 6,076,979 A | 6/2000 | Mimasaka et al. |
| 5,867,389 A | 2/1999 | Hamada et al. | | 6,077,321 A | 6/2000 | Adachi et al. |
| 5,871,584 A | 2/1999 | Tateyama et al. | | 6,087,632 A | 7/2000 | Mizosaki et al. |
| 5,875,804 A | 3/1999 | Tanaka et al. | | 6,089,762 A | 7/2000 | Mimasaka et al. |
| 5,881,750 A | 3/1999 | Yoshitani | | 6,097,005 A | 8/2000 | Akimoto |
| 5,887,214 A | 3/1999 | Kuriu et al. | | 6,099,643 A | 8/2000 | Ohtani et al. |
| 5,888,344 A | 3/1999 | Ogami et al. | | 6,104,002 A | 8/2000 | Hirose et al. |
| 5,898,588 A | 4/1999 | Morimoto | | 6,108,932 A | 8/2000 | Chai |
| 5,904,169 A | 5/1999 | Yoshitani | | 6,109,677 A | 8/2000 | Anthony |
| 5,906,469 A | 5/1999 | Oka et al. | | 6,113,695 A | 9/2000 | Fujimoto |
| 5,906,860 A | 5/1999 | Motoda et al. | | 6,117,486 A | 9/2000 | Yoshihara |
| 5,908,657 A | 6/1999 | Kimura et al. | | 6,120,834 A | 9/2000 | Terauchi |
| 5,912,054 A | 6/1999 | Tateyama | | 6,126,725 A | 10/2000 | Tateyama |
| 5,915,396 A | 6/1999 | Kinose | | 6,128,829 A | 10/2000 | Wolke et al. |
| 5,916,366 A | 6/1999 | Ueyama et al. | | 6,129,546 A | 10/2000 | Sada |
| 5,919,520 A | 7/1999 | Tateyama et al. | | 6,138,695 A | 10/2000 | Shibao et al. |
| 5,919,529 A | 7/1999 | Matsumura | | 6,142,722 A | 11/2000 | Genov et al. |
| 5,921,257 A | 7/1999 | Weber et al. | | 6,143,087 A | 11/2000 | Walter |
| 5,923,915 A | 7/1999 | Akimoto et al. | | 6,143,478 A | 11/2000 | Toshima et al. |
| 5,927,077 A | 7/1999 | Hisai et al. | | 6,147,329 A | 11/2000 | Okamura et al. |
| 5,927,303 A | 7/1999 | Miya et al. | | 6,149,727 A | 11/2000 | Yoshioka et al. |
| 5,932,380 A | 8/1999 | Yaegashi et al. | | 6,155,275 A | 12/2000 | Shinbara |
| 5,935,768 A | 8/1999 | Biche et al. | | 6,156,125 A | 12/2000 | Harada |
| 5,938,847 A | 8/1999 | Akimoto et al. | | 6,158,446 A | 12/2000 | Mohindra |
| 5,939,130 A | 8/1999 | Shiraishi et al. | | 6,159,291 A | 12/2000 | Morita et al. |
| 5,941,083 A | 8/1999 | Sada et al. | | 6,159,541 A | 12/2000 | Sakai et al. |
| 5,942,035 A | 8/1999 | Hasebe et al. | | 6,165,273 A | 12/2000 | Fayefield |
| 5,943,726 A | 8/1999 | Eitoku et al. | | 6,168,665 B1 | 1/2001 | Sakai et al. |
| 5,943,880 A | 8/1999 | Tateyama et al. | | 6,169,274 B1 | 1/2001 | Kulp |
| 5,945,161 A | 8/1999 | Hashimoto et al. | | 6,174,371 B1 | 1/2001 | Iseki et al. |
| 5,960,225 A | 9/1999 | Fujimoto | | 6,176,667 B1 | 1/2001 | Fairbairn et al. |
| 5,961,269 A | 10/1999 | Kroeker | | 6,177,133 B1 | 1/2001 | Ting et al. |
| 5,962,070 A | 10/1999 | Mitsuhashi et al. | | 6,179,982 B1 | 1/2001 | Adachi et al. |
| 5,963,753 A * | 10/1999 | Ohtani et al. ............... 396/611 | | 6,183,147 B1 | 2/2001 | Kimura et al. |
| 5,965,200 A | 10/1999 | Tateyama et al. | | 6,185,370 B1 | 2/2001 | Sekimoto et al. |
| 5,968,268 A | 10/1999 | Kitano et al. | | 6,190,063 B1 | 2/2001 | Akimoto |
| 5,968,691 A | 10/1999 | Yoshioka et al. | | 6,191,394 B1 | 2/2001 | Shirakawa et al. |
| 5,970,717 A | 10/1999 | Tateyama et al. | | 6,193,783 B1 | 2/2001 | Sakamoto et al. |
| 5,972,110 A | 10/1999 | Akimoto | | 6,199,568 B1 | 3/2001 | Arai et al. |
| 5,974,682 A | 11/1999 | Akimoto et al. | | 6,200,633 B1 | 3/2001 | Kitano et al. |
| 5,976,256 A | 11/1999 | Kawano | | 6,202,653 B1 | 3/2001 | Harada et al. |
| 5,976,620 A | 11/1999 | Sanada et al. | | 6,203,969 B1 | 3/2001 | Ueda |
| 5,984,540 A | 11/1999 | Mimasaka et al. | | 6,207,231 B1 | 3/2001 | Tateyama |
| 5,985,357 A | 11/1999 | Sanada | | 6,210,481 B1 | 4/2001 | Sakai et al. |
| 5,989,342 A | 11/1999 | Ikeda et al. | | 6,216,475 B1 | 4/2001 | Sada et al. |
| 5,989,346 A | 11/1999 | Hiroki | | 6,217,657 B1 | 4/2001 | Kiba et al. |
| 5,989,632 A | 11/1999 | Sanada et al. | | 6,221,787 B1 | 4/2001 | Ogata |
| 5,992,431 A | 11/1999 | Weber et al. | | 6,222,161 B1 | 4/2001 | Shirakawa et al. |
| 5,993,518 A | 11/1999 | Tateyama | | 6,224,638 B1 | 5/2001 | Jevtic et al. |
| 6,000,862 A | 12/1999 | Okuda | | 6,227,786 B1 | 5/2001 | Tateyama |
| 6,002,108 A | 12/1999 | Yoshioka | | 6,228,171 B1 | 5/2001 | Shirakawa |
| 6,004,047 A | 12/1999 | Akimoto et al. | | 6,228,561 B1 | 5/2001 | Hasebe |
| 6,007,629 A | 12/1999 | Ohtani et al. | | 6,229,116 B1 | 5/2001 | Shirakawa et al. |
| 6,010,570 A | 1/2000 | Motoda et al. | | 6,235,641 B1 | 5/2001 | Christenson |
| 6,012,192 A | 1/2000 | Sawada et al. | | 6,238,107 B1 | 5/2001 | Inada |
| 6,012,858 A | 1/2000 | Konishi et al. | | 6,238,109 B1 | 5/2001 | Minami |
| 6,013,317 A | 1/2000 | Motoda et al. | | 6,238,735 B1 | 5/2001 | Mandal et al. |
| 6,015,066 A | 1/2000 | Kimura et al. | | 6,238,848 B1 | 5/2001 | Konishi et al. |
| 6,017,663 A | 1/2000 | Yaegashiy et al. | | 6,241,402 B1 | 6/2001 | Sakamoto et al. |
| 6,018,616 A | 1/2000 | Schaper | | 6,241,403 B1 | 6/2001 | Sakamoto et al. |
| 6,021,790 A | 2/2000 | Yoshitani et al. | | 6,246,030 B1 | 6/2001 | Matsuyama |

| | | | | | | |
|---|---|---|---|---|---|---|
| 6,248,398 | B1 | 6/2001 | Talieh et al. | 6,464,789 | B1 | 10/2002 | Akimoto et al. |
| 6,251,195 | B1 | 6/2001 | Wagoner | 6,465,765 | B1 | 10/2002 | Katayama et al. |
| 6,253,118 | B1 | 6/2001 | Koyama | 6,468,586 | B1 | 10/2002 | Gurer et al. |
| 6,254,936 | B1 | 7/2001 | Gurer et al. | 6,471,421 | B2 | 10/2002 | Kitamura |
| 6,257,778 | B1 | 7/2001 | Toshima et al. | 6,471,422 | B1 | 10/2002 | Ueda et al. |
| 6,258,167 | B1 | 7/2001 | Kawano et al. | 6,474,986 | B2 | 11/2002 | Oda et al. |
| 6,260,562 | B1 | 7/2001 | Morinishi et al. | 6,475,279 | B1 | 11/2002 | Akimoto et al. |
| 6,261,007 | B1 | 7/2001 | Takamori et al. | 6,485,782 | B2 | 11/2002 | Takamori |
| 6,261,365 | B1 | 7/2001 | Matsuyama et al. | 6,485,893 | B1 | 11/2002 | Matsuyama |
| 6,261,744 | B1 | 7/2001 | Yoshioka | 6,491,452 | B2 | 12/2002 | Konishi et al. |
| 6,266,125 | B1 | 7/2001 | Fukuda et al. | 6,491,491 | B1 | 12/2002 | Tsuneda et al. |
| 6,267,516 | B1 | 7/2001 | Nagamine et al. | 6,496,245 | B2 | 12/2002 | Kosugi et al. |
| 6,268,013 | B1 | 7/2001 | Akimoto et al. | 6,501,191 | B2 | 12/2002 | Tanaka et al. |
| 6,273,104 | B1 | 8/2001 | Shinbara et al. | 6,503,003 | B2 | 1/2003 | Hasebe et al. |
| 6,278,089 | B1 | 8/2001 | Young et al. | 6,507,770 | B2 | 1/2003 | Tateyama et al. |
| 6,281,145 | B1 | 8/2001 | Deguchi et al. | 6,511,315 | B1 | 1/2003 | Hashimoto |
| 6,283,701 | B1 | 9/2001 | Sundar et al. | 6,514,073 | B1 | 2/2003 | Toshima et al. |
| 6,284,043 | B1 | 9/2001 | Takekuma | 6,514,343 | B1 | 2/2003 | Motoda et al. |
| 6,284,616 | B1 | 9/2001 | Smith | 6,514,344 | B2 | 2/2003 | Kitano et al. |
| 6,287,390 | B2 | 9/2001 | Sakai et al. | 6,514,570 | B1 | 2/2003 | Matsuyama et al. |
| 6,291,800 | B1 | 9/2001 | Shirakawa et al. | 6,518,199 | B2 | 2/2003 | Kitano et al. |
| 6,292,250 | B1 | 9/2001 | Matsuyama | 6,526,329 | B2 | 2/2003 | Tateyama et al. |
| 6,293,713 | B1 | 9/2001 | Ueda | 6,527,860 | B1 | 3/2003 | Yoshihara et al. |
| 6,299,938 | B1 | 10/2001 | Tateyama | 6,527,861 | B2 | 3/2003 | Takekuma |
| 6,300,043 | B1 | 10/2001 | Konishi et al. | 6,533,531 | B1 | 3/2003 | Nguyen et al. |
| 6,302,960 | B1 | 10/2001 | Baroudi et al. | 6,533,864 | B1 | 3/2003 | Matsuyama et al. |
| 6,306,455 | B1 | 10/2001 | Takamori et al. | 6,534,750 | B1 | 3/2003 | Tanoue et al. |
| 6,312,177 | B1 | 11/2001 | Nureki | 6,536,964 | B1 | 3/2003 | Kitano et al. |
| 6,313,441 | B1 | 11/2001 | Schaper et al. | 6,537,373 | B1 | 3/2003 | Kitano et al. |
| 6,313,903 | B1 | 11/2001 | Ogata | 6,539,956 | B1 | 4/2003 | Wolke et al. |
| 6,318,948 | B1 | 11/2001 | Ueda et al. | 6,541,170 | B2 | 4/2003 | Fukuda et al. |
| 6,318,951 | B1 | 11/2001 | Schmidt et al. | 6,541,376 | B2 | 4/2003 | Inada et al. |
| 6,319,317 | B1 | 11/2001 | Takamori | 6,550,988 | B2 | 4/2003 | Sugimoto et al. |
| 6,327,793 | B1 | 12/2001 | Gurer et al. | 6,551,400 | B2 | 4/2003 | Hasebe et al. |
| 6,332,723 | B1 | 12/2001 | Matsuyama et al. | 6,551,448 | B2 | 4/2003 | Kuga et al. |
| 6,336,204 | B1 | 1/2002 | Jevtic | 6,556,893 | B2 | 4/2003 | Kumar et al. |
| 6,340,643 | B2 | 1/2002 | Ueda | 6,558,053 | B2 | 5/2003 | Shigemori et al. |
| 6,348,101 | B1 | 2/2002 | Walter | 6,568,847 | B2 | 5/2003 | Nishijima et al. |
| 6,352,083 | B1 | 3/2002 | Araki et al. | 6,571,147 | B1 | 5/2003 | Kashihara |
| 6,354,311 | B1 | 3/2002 | Kimura et al. | 6,573,031 | B2 | 6/2003 | Shinya et al. |
| 6,359,264 | B1 | 3/2002 | Schaper et al. | 6,578,772 | B2 | 6/2003 | Fujimoto et al. |
| 6,361,600 | B1 | 3/2002 | Tateyama et al. | 6,579,370 | B2 | 6/2003 | Kimura et al. |
| 6,364,547 | B1 | 4/2002 | Matsuyama et al. | 6,579,730 | B2 | 6/2003 | Li et al. |
| 6,368,776 | B1 | 4/2002 | Harada et al. | 6,579,733 | B2 | 6/2003 | Rangarajan et al. |
| 6,371,667 | B1 | 4/2002 | Kitano et al. | 6,589,339 | B2 | 7/2003 | Takeshita et al. |
| 6,371,713 | B1 | 4/2002 | Nishimura et al. | 6,598,805 | B2 | 7/2003 | Sakai et al. |
| 6,379,056 | B1 | 4/2002 | Ueda et al. | 6,599,366 | B1 | 7/2003 | Kitano et al. |
| 6,380,518 | B2 | 4/2002 | Shirakawa et al. | 6,602,382 | B1 | 8/2003 | Matsuyama et al. |
| 6,382,849 | B1 | 5/2002 | Sakamoto et al. | 6,605,153 | B2 | 8/2003 | Kitano et al. |
| 6,383,948 | B1 | 5/2002 | Kitano et al. | 6,616,394 | B1 | 9/2003 | Park |
| 6,384,894 | B2 | 5/2002 | Matsuyama et al. | 6,616,760 | B2 | 9/2003 | Kitano et al. |
| 6,391,111 | B1 | 5/2002 | Fujimoto et al. | 6,616,762 | B2 | 9/2003 | Inada et al. |
| 6,398,429 | B1 | 6/2002 | Toshima et al. | 6,617,095 | B2 | 9/2003 | Kitano et al. |
| 6,401,353 | B2 | 6/2002 | Kimura | 6,620,244 | B2 | 9/2003 | Yoshihara |
| 6,402,399 | B2 | 6/2002 | Sakamoto et al. | 6,620,245 | B2 | 9/2003 | Ishida et al. |
| 6,402,400 | B1 | 6/2002 | Ueda et al. | 6,620,251 | B2 | 9/2003 | Kitano et al. |
| 6,402,508 | B2 | 6/2002 | Harada et al. | 6,627,263 | B2 | 9/2003 | Kitano et al. |
| 6,402,509 | B1 | 6/2002 | Ookura et al. | 6,633,022 | B2 | 10/2003 | Kitano et al. |
| 6,402,844 | B1 | 6/2002 | Harada et al. | 6,634,806 | B2 | 10/2003 | Toshima et al. |
| 6,403,924 | B1 | 6/2002 | Hayashi | 6,635,113 | B2 | 10/2003 | Takamori et al. |
| 6,410,194 | B1 | 6/2002 | Yoshihara | 6,644,965 | B2 | 11/2003 | Ookura et al. |
| 6,416,583 | B1 | 7/2002 | Kitano et al. | 6,645,880 | B1 | 11/2003 | Shigemori et al. |
| 6,418,356 | B1 | 7/2002 | Oh | 6,654,668 | B1 | 11/2003 | Harada et al. |
| 6,419,408 | B1 | 7/2002 | Inada | 6,656,277 | B2 | 12/2003 | Sanada et al. |
| 6,431,769 | B1 | 8/2002 | Fukuda et al. | 6,656,281 | B1 | 12/2003 | Ueda et al. |
| 6,432,199 | B1 | 8/2002 | Takekuma | 6,659,661 | B2 | 12/2003 | Deguchi et al. |
| 6,438,449 | B2 | 8/2002 | Kawamatsu et al. | 6,662,466 | B2 | 12/2003 | Gurer et al. |
| 6,440,218 | B1 | 8/2002 | Sanada et al. | 6,669,782 | B1 | 12/2003 | Thakur |
| 6,443,641 | B2 | 9/2002 | Takamori et al. | 6,669,808 | B2 | 12/2003 | Adachi et al. |
| 6,444,029 | B1 | 9/2002 | Kimura et al. | 6,672,779 | B2 | 1/2004 | Ueda et al. |
| 6,446,646 | B1 | 9/2002 | Izumi | 6,673,151 | B2 | 1/2004 | Yoshihara et al. |
| 6,447,608 | B1 | 9/2002 | Sakai et al. | 6,676,757 | B2 | 1/2004 | Kitano et al. |
| 6,450,803 | B2 | 9/2002 | Shirakawa et al. | 6,678,572 | B1 | 1/2004 | Oh |
| 6,450,805 | B1 | 9/2002 | Oda et al. | 6,683,006 | B2 | 1/2004 | Konishi et al. |
| 6,451,515 | B2 | 9/2002 | Takamori et al. | 6,686,571 | B2 | 2/2004 | Ookura et al. |
| 6,454,332 | B1 | 9/2002 | Govzman et al. | 6,691,430 | B2 | 2/2004 | Saito et al. |
| 6,458,208 | B1 | 10/2002 | Anai et al. | 6,692,165 | B2 | 2/2004 | Tanaka et al. |
| 6,458,607 | B1 | 10/2002 | Rangarajan et al. | 6,694,218 | B2 | 2/2004 | Oh |
| 6,461,438 | B1 | 10/2002 | Ookura et al. | 6,694,224 | B2 | 2/2004 | Ramanan |

| | | |
|---|---|---|
| 6,695,922 B2 | 2/2004 | Kitano et al. |
| 6,703,316 B2 | 3/2004 | Inoue et al. |
| 6,706,321 B2 | 3/2004 | Nishiya et al. |
| 6,709,174 B2 | 3/2004 | Yamamoto et al. |
| 6,709,523 B1 | 3/2004 | Toshima et al. |
| 6,712,579 B2 | 3/2004 | Fujii et al. |
| 6,713,120 B2 | 3/2004 | Fukuda et al. |
| 6,713,239 B2 | 3/2004 | Toshima et al. |
| 6,715,943 B2 | 4/2004 | Nagamine |
| 6,716,478 B2 | 4/2004 | Kitano et al. |
| 6,726,771 B2 | 4/2004 | Ueda |
| 6,730,599 B2 | 5/2004 | Inada et al. |
| 6,736,556 B2 | 5/2004 | Kanagawa et al. |
| 6,744,020 B2 | 6/2004 | Shirakawa et al. |
| 6,749,351 B2 | 6/2004 | Sanada et al. |
| 6,749,688 B2 | 6/2004 | Tateyama et al. |
| 6,752,543 B2 | 6/2004 | Fukutomi et al. |
| 6,752,544 B2 | 6/2004 | Sanada et al. |
| 6,752,585 B2 | 6/2004 | Reimer et al. |
| 6,752,872 B2 | 6/2004 | Inada et al. |
| 6,753,508 B2 | 6/2004 | Shirakawa |
| 6,761,125 B2 | 7/2004 | Kitano et al. |
| 6,768,930 B2 | 7/2004 | Oh |
| 6,770,424 B2 | 8/2004 | Mandal et al. |
| 6,773,510 B2 | 8/2004 | Kitano et al. |
| 6,775,456 B2 | 8/2004 | Matsuura |
| 6,780,461 B2 | 8/2004 | Gurer et al. |
| 6,780,795 B2 | 8/2004 | Suzuki et al. |
| 6,790,283 B2 | 9/2004 | Hayashi et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,793,769 B2 | 9/2004 | Kajino et al. |
| 6,796,054 B2 | 9/2004 | Minami et al. |
| 6,805,769 B2 | 10/2004 | Okuda et al. |
| 6,807,452 B2 | 10/2004 | Mukuta et al. |
| 6,807,455 B2 | 10/2004 | Yoshida et al. |
| 6,808,566 B2 | 10/2004 | Kitano et al. |
| 6,809,036 B2 | 10/2004 | Liu |
| 6,811,613 B2 | 11/2004 | Kitano et al. |
| 6,811,962 B2 | 11/2004 | Yoshihara et al. |
| 6,814,507 B2 | 11/2004 | Inagaki |
| 6,814,809 B2 | 11/2004 | Matsushita et al. |
| 6,815,647 B2 | 11/2004 | Tanoue et al. |
| 6,817,790 B2 | 11/2004 | Toshima et al. |
| 6,821,550 B2 | 11/2004 | Deguchi et al. |
| 6,822,413 B2 | 11/2004 | Simondet et al. |
| 6,823,880 B2 | 11/2004 | Sakashita et al. |
| 6,824,616 B2 | 11/2004 | Kitano et al. |
| 6,826,214 B2 | 11/2004 | Nomoto |
| 6,827,782 B2 | 12/2004 | Goto et al. |
| 6,830,774 B2 | 12/2004 | Hayashi et al. |
| 6,832,863 B2 | 12/2004 | Sugimoto et al. |
| 6,834,210 B2 | 12/2004 | Tateyama et al. |
| 6,837,631 B2 | 1/2005 | Nakano et al. |
| 6,837,632 B2 | 1/2005 | Koyama et al. |
| 6,841,031 B2 * | 1/2005 | Iwata et al. ............... 156/345.22 |
| 6,841,342 B2 | 1/2005 | Nishi et al. |
| 6,843,259 B2 | 1/2005 | Nagamine |
| 6,846,149 B2 * | 1/2005 | Savage et al. ............ 414/416.03 |
| 6,848,625 B2 | 2/2005 | Takekuma et al. |
| 6,851,872 B1 | 2/2005 | Okubo et al. |
| 6,852,194 B2 | 2/2005 | Matsushita et al. |
| 6,860,945 B2 | 3/2005 | Kobayashi et al. |
| 6,868,888 B2 | 3/2005 | Adachi |
| 6,869,234 B2 | 3/2005 | Sanada et al. |
| 6,869,640 B2 | 3/2005 | Yoshihara et al. |
| 6,872,256 B2 | 3/2005 | Kitano et al. |
| 6,874,513 B2 | 4/2005 | Yamagata et al. |
| 6,878,216 B2 | 4/2005 | Fujishima |
| 6,878,303 B2 | 4/2005 | Okamoto |
| 6,878,401 B2 | 4/2005 | Nishijima et al. |
| 6,878,501 B2 | 4/2005 | Hatakeyama et al. |
| 6,884,294 B2 | 4/2005 | Minami et al. |
| 6,885,467 B2 | 4/2005 | Du-Nour et al. |
| 6,889,105 B2 | 5/2005 | Mukuta et al. |
| 6,893,171 B2 | 5/2005 | Fukutomi et al. |
| 6,893,513 B2 | 5/2005 | Michaluk et al. |
| 6,893,805 B2 | 5/2005 | Iseki et al. |
| 6,896,466 B2 | 5/2005 | Nishimura et al. |
| 6,996,453 B2 * | 2/2006 | Ahn et al. ..................... 700/213 |
| 7,279,067 B2 | 10/2007 | Yoshida et al. |
| 7,357,842 B2 | 4/2008 | Ishikawa et al. |
| 7,699,021 B2 | 4/2010 | Volfovski et al. |
| 2001/0024691 A1 | 9/2001 | Kimura et al. |
| 2002/0098072 A1 | 7/2002 | Sundar |
| 2003/0044261 A1 | 3/2003 | Bonora et al. |
| 2003/0052497 A1 | 3/2003 | Holbrooks |
| 2004/0020601 A1 | 2/2004 | Zhao et al. |
| 2004/0091349 A1 | 5/2004 | Tabrizie et al. |
| 2005/0095088 A1 | 5/2005 | Kurita et al. |
| 2006/0165408 A1 | 7/2006 | Akimoto et al. |
| 2007/0231109 A1 * | 10/2007 | Pak et al. ..................... 414/217 |

FOREIGN PATENT DOCUMENTS

| | | |
|---|---|---|
| EP | 1 114 882 A | 7/2001 |
| JP | 51004311 | 1/1976 |
| JP | 07235473 | 9/1995 |
| JP | 10006757 | 1/1998 |
| JP | 11279797 | 10/1999 |
| TW | 501169 | 9/2002 |
| TW | 516072 | 1/2003 |
| WO | WO 00/12958 | 3/2000 |

OTHER PUBLICATIONS

First Office Action for Chinese Patent Application No. 200680013355.8 dated Apr. 24, 2009.

Non-Final Office Action dated Jun. 11, 2009 for U.S. Appl. No. 11/553,820.

First Office Action dated Aug. 24, 2009, in Korean Patent Application No. 10-2007-7025316.

Final Office Action Mailed Jul. 6, 2009, in U.S. Appl. No. 11/315,984.

USPTO Office Action dated Feb. 3, 2009, in U.S. Appl. No. 11/315,778.

Response to Office Action filed Jun. 3, 2009, in U.S. Appl. No. 11/315,778.

USPTO Final Office Action dated Aug. 5, 2009, in U.S. Appl. No. 11/315,778.

USPTO Office Action dated Jul. 22, 2009, in U.S. Appl. No. 11/458,664.

Response to Office Action filed Oct. 14, 2008, in U.S. Appl. No. 11/458,664.

USPTO Final Office Action dated Jan. 27, 2009, in U.S. Appl. No. 11/458,664.

Response to Final Office Action filed Mar. 31, 2009, in U.S. Appl. No. 11/458,664.

USPTO Office Action dated Jun. 23, 2009, in U.S. Appl. No. 11/458,664.

USPTO Office Action dated May 12, 2008, in U.S. Appl. No. 11/553,820.

Response to Office Action filed Aug. 12, 2008, in U.S. Appl. No. 11/553,820.

USPTO Final Office Action dated Nov. 28, 2008, in U.S. Appl. No. 11/553,820.

Response to Final Office Action filed Jan. 27, 2009, in U.S. Appl. No. 11/553,820.

Second Response to Final Office Action filed Feb. 26, 2009, in U.S. Appl. No. 11/553,820.

USPTO Advisory Action dated Mar. 6, 2009, in U.S. Appl. No. 11/553,820.

Supplemental Response to Final Office Action filed Mar. 30, 2009, in U.S. Appl. No. 11/553,820.

USPTO Office Action dated May 15, 2008, in U.S. Appl. No. 11/315,984.

Response to Office Action filed Jul. 10, 2008, in U.S. Appl. No. 11/315,984.

PCT Search Report dated Jul. 8, 2006.

Official Letter dated Apr. 21, 2010 and Search Report for Taiwan Patent Application No. 95114022.

* cited by examiner

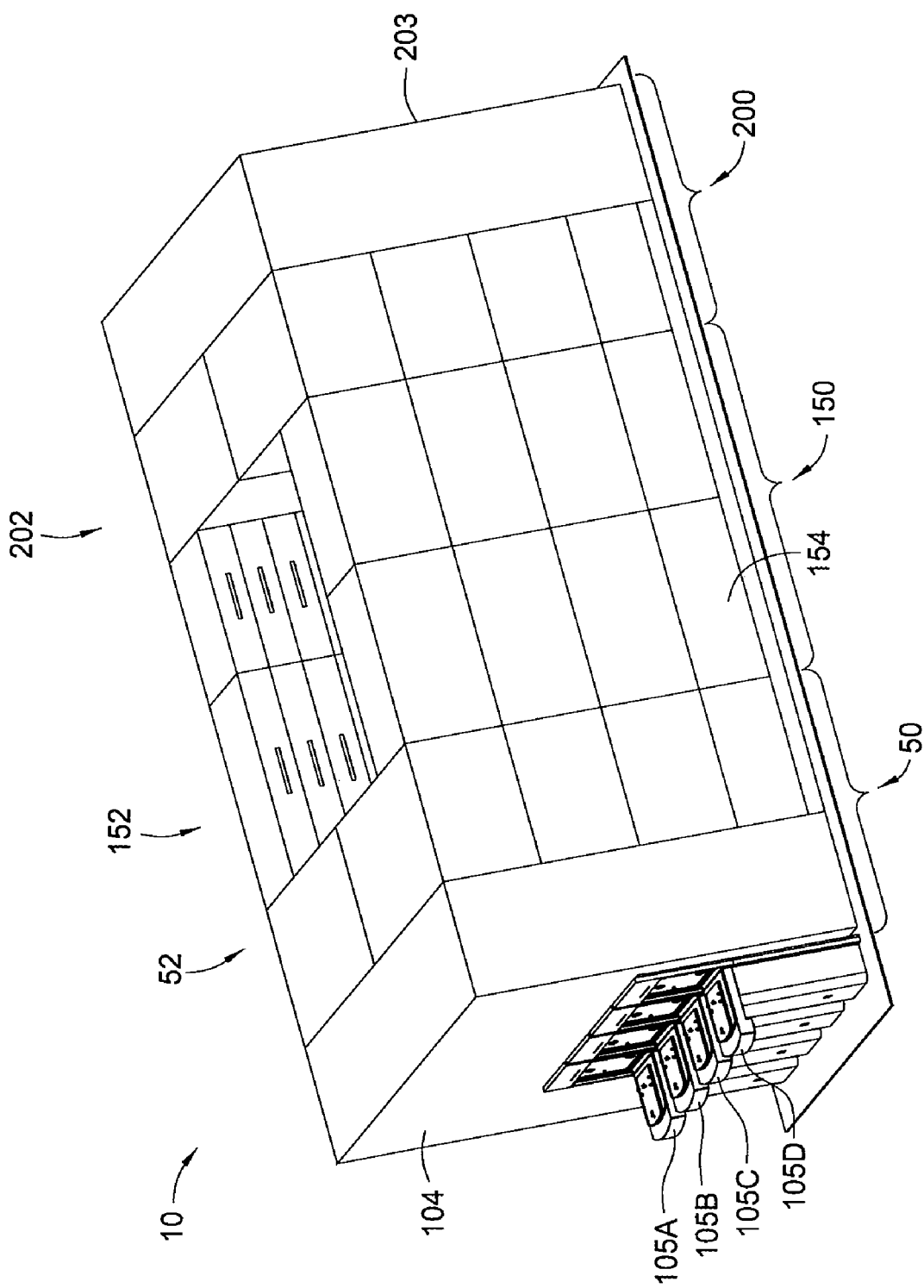

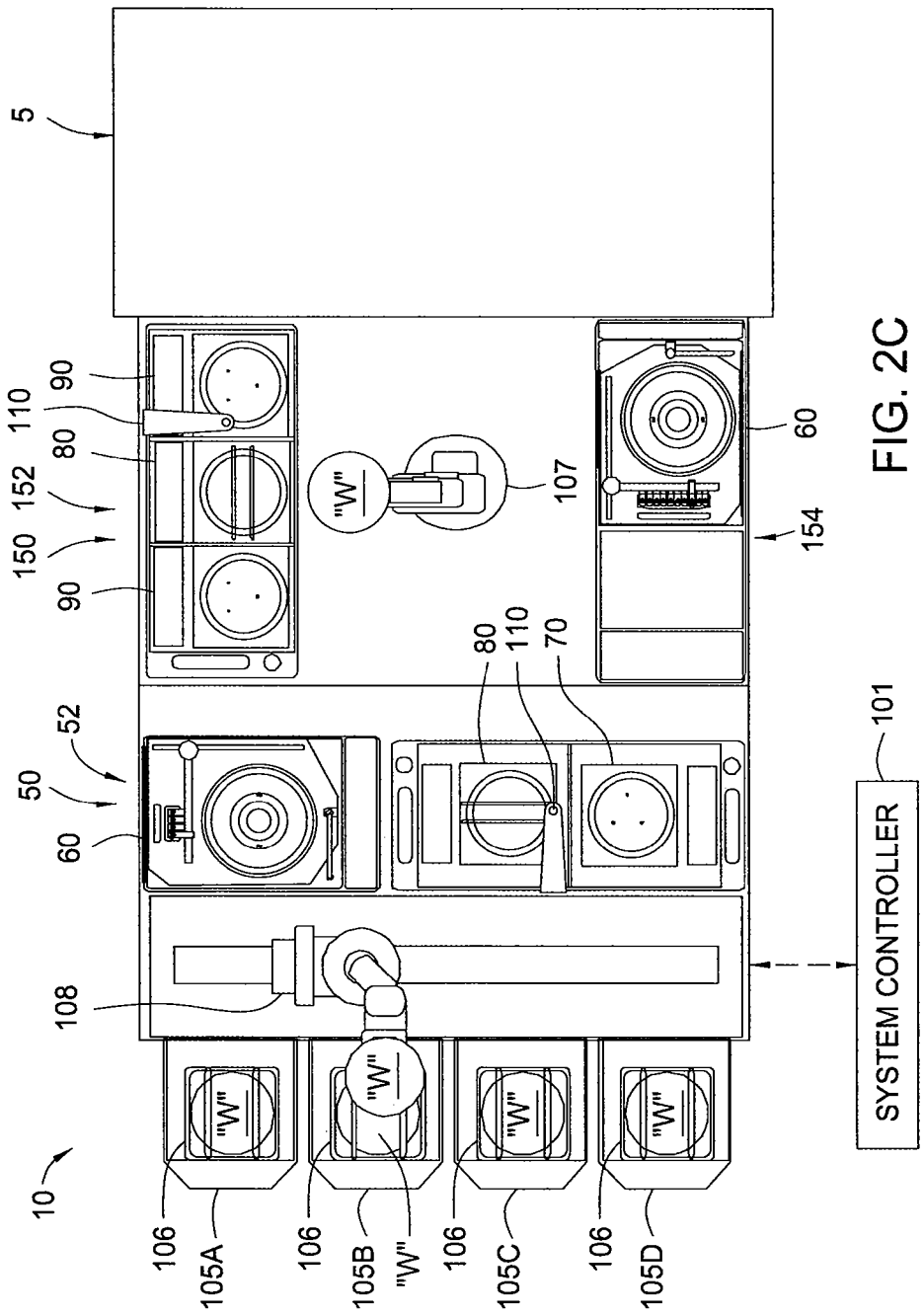

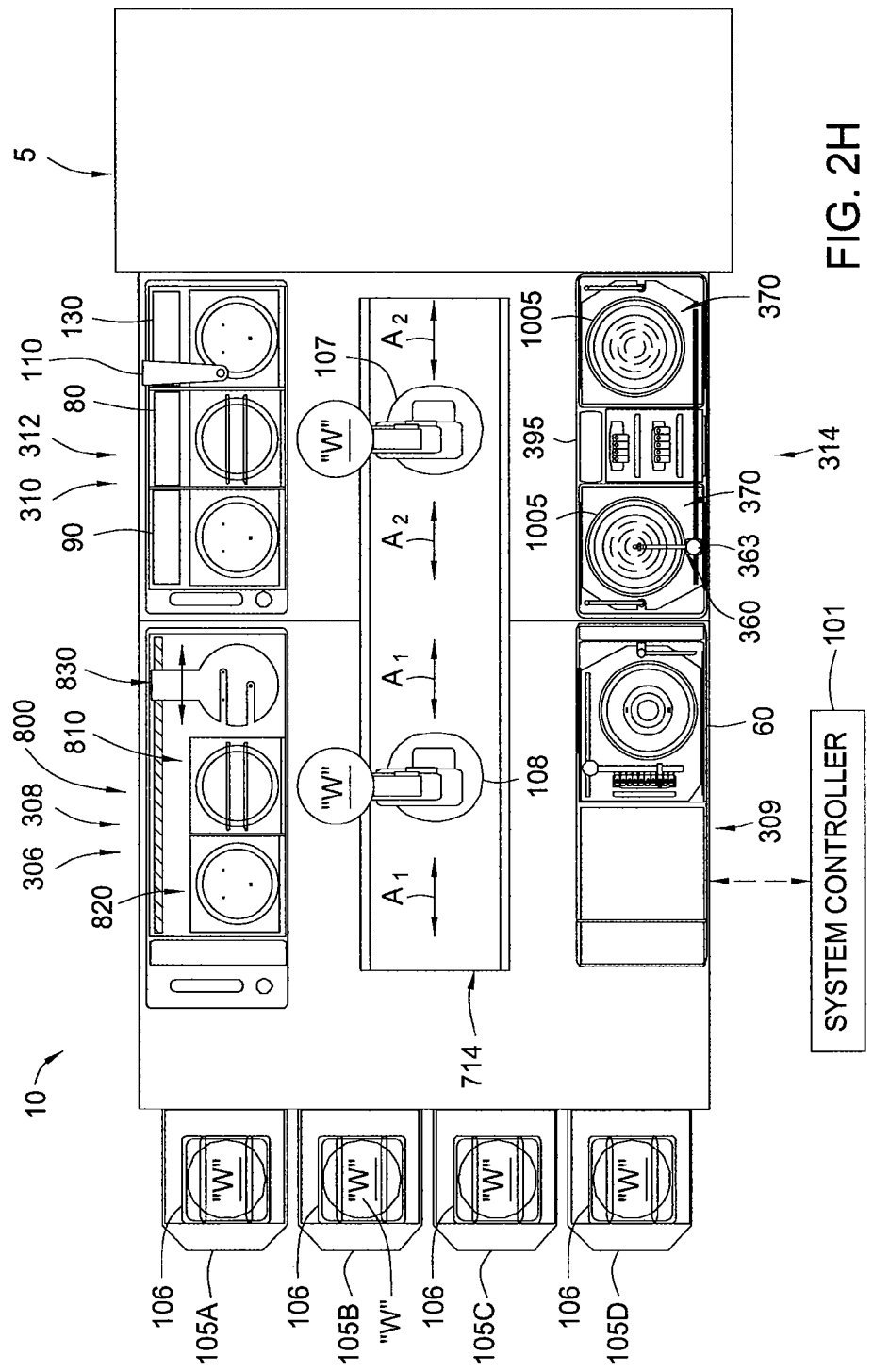

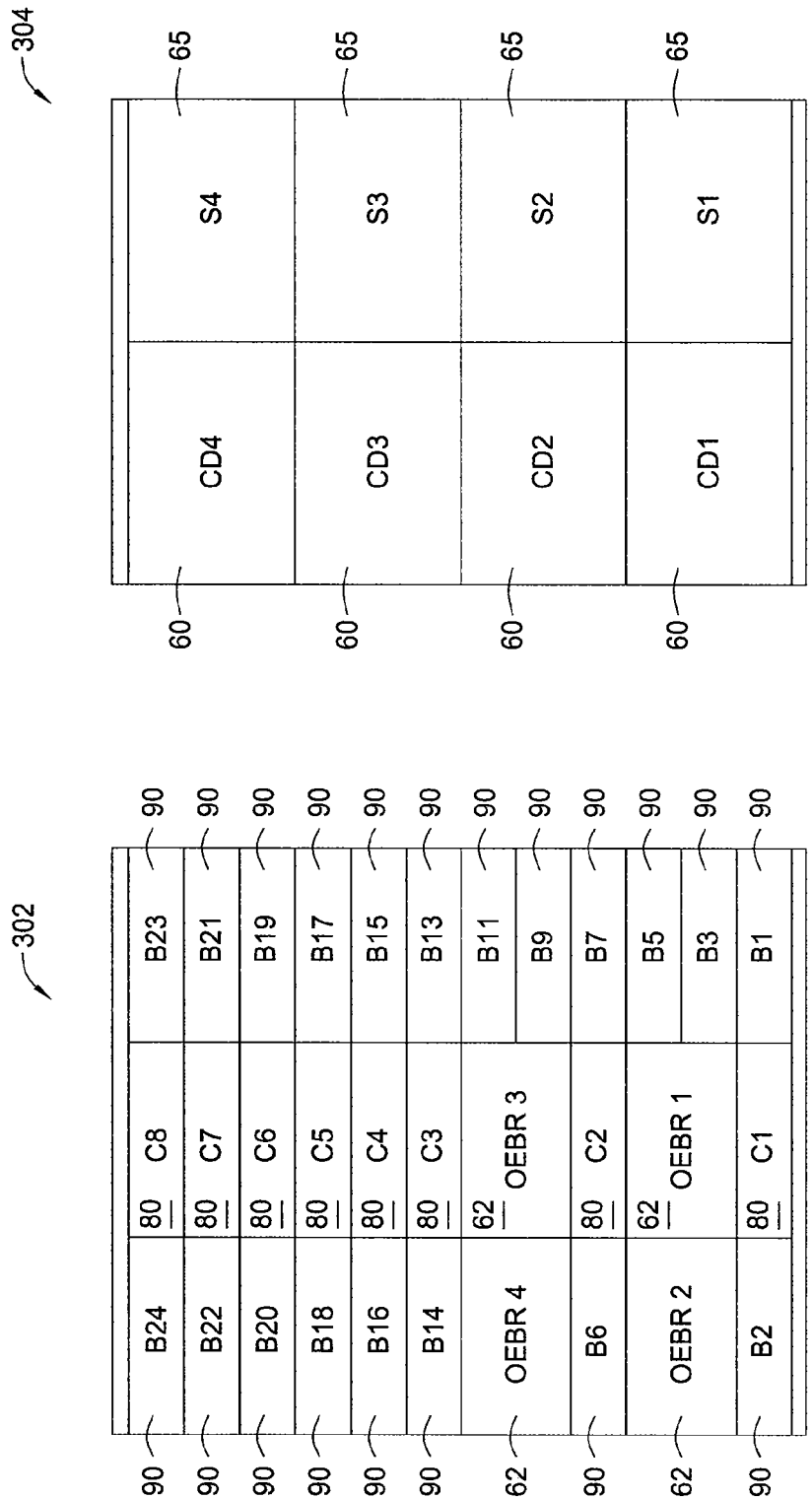

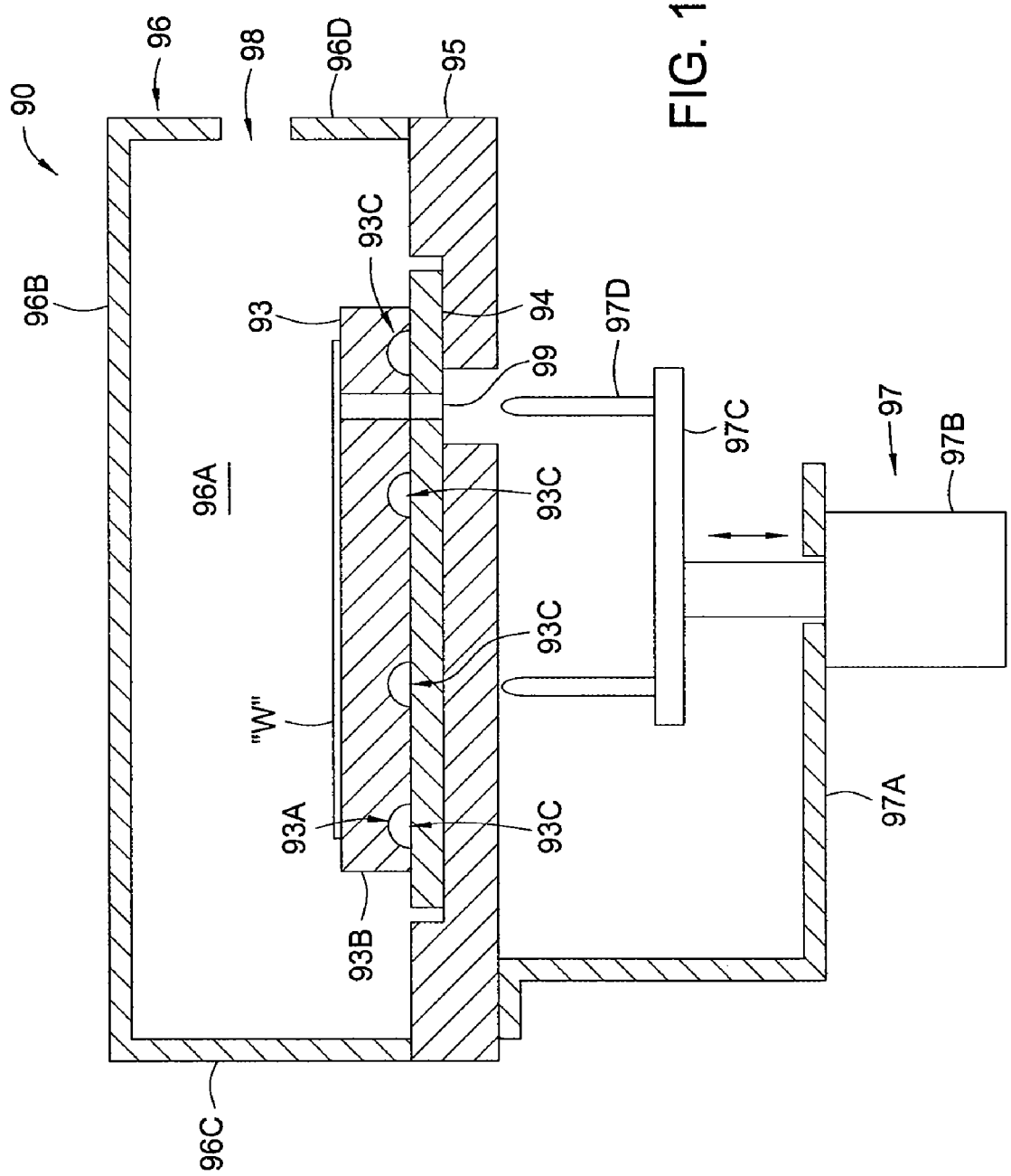

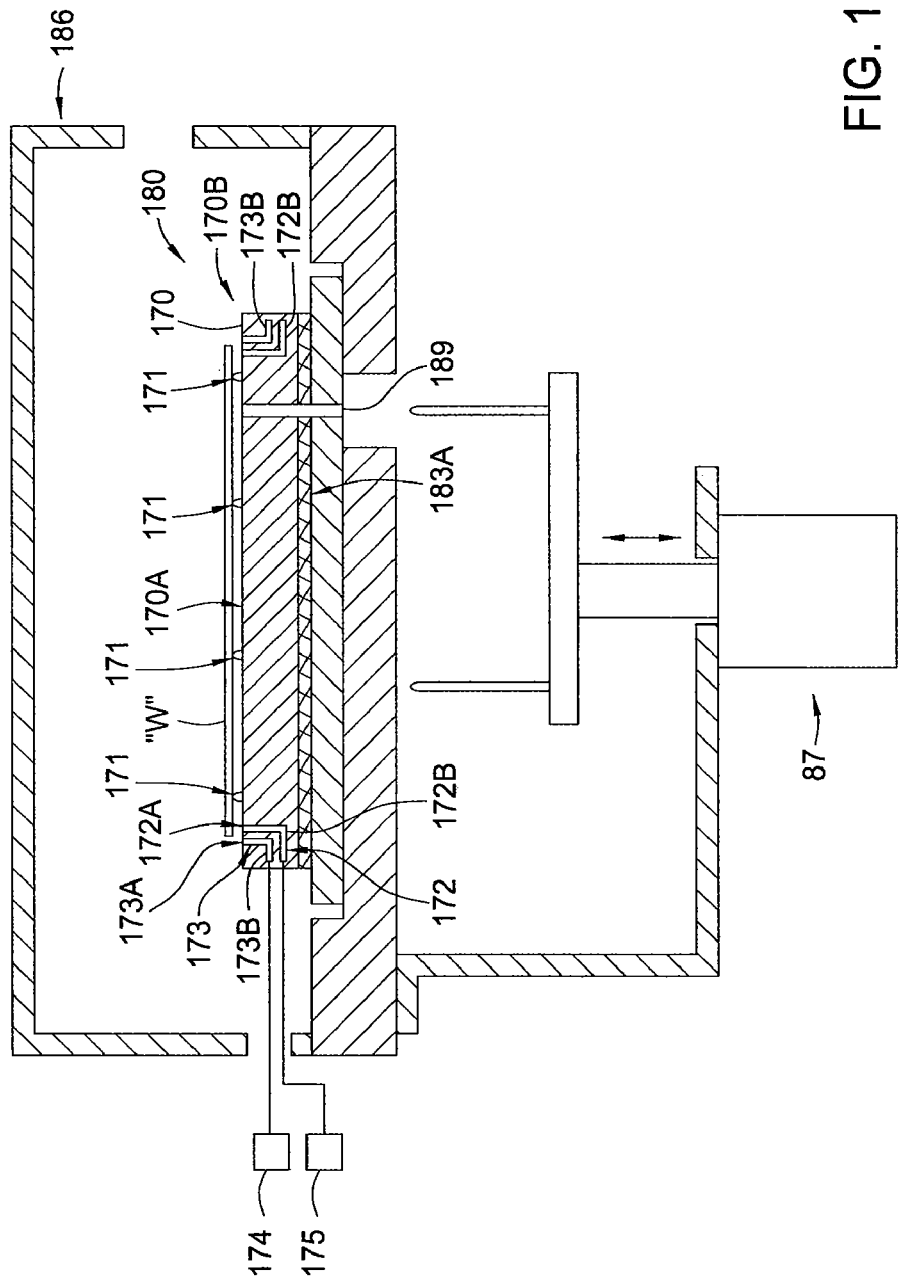

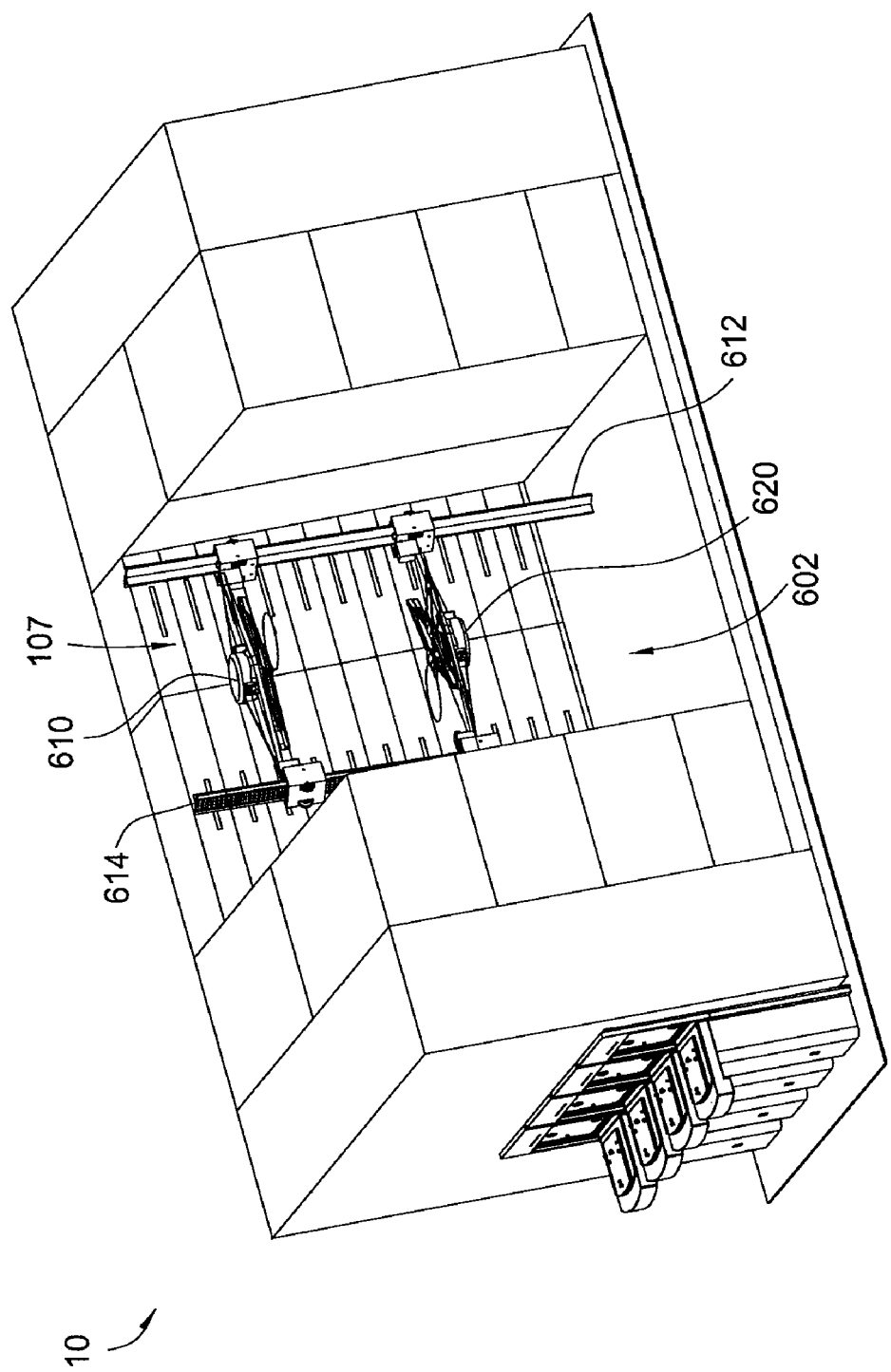

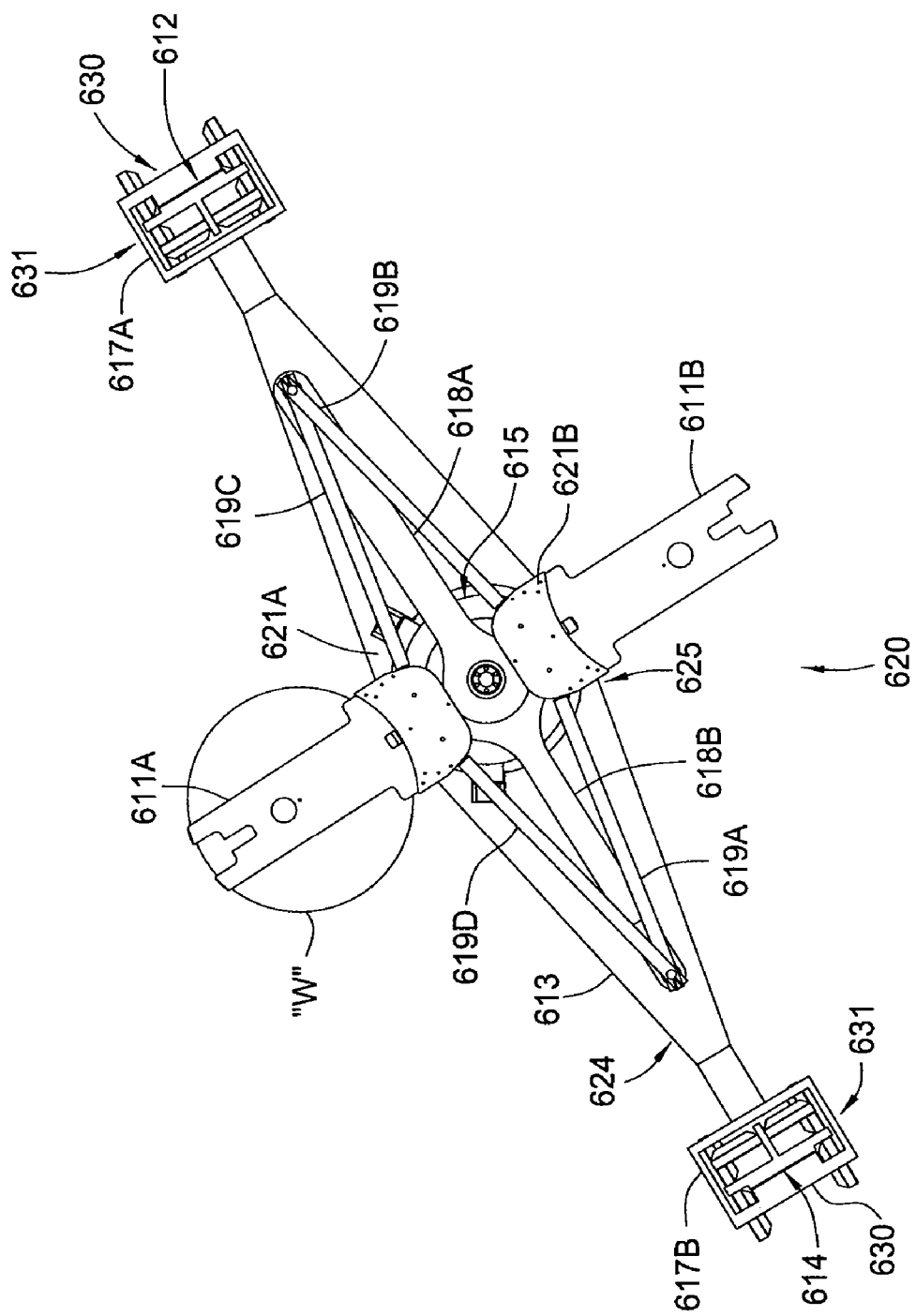

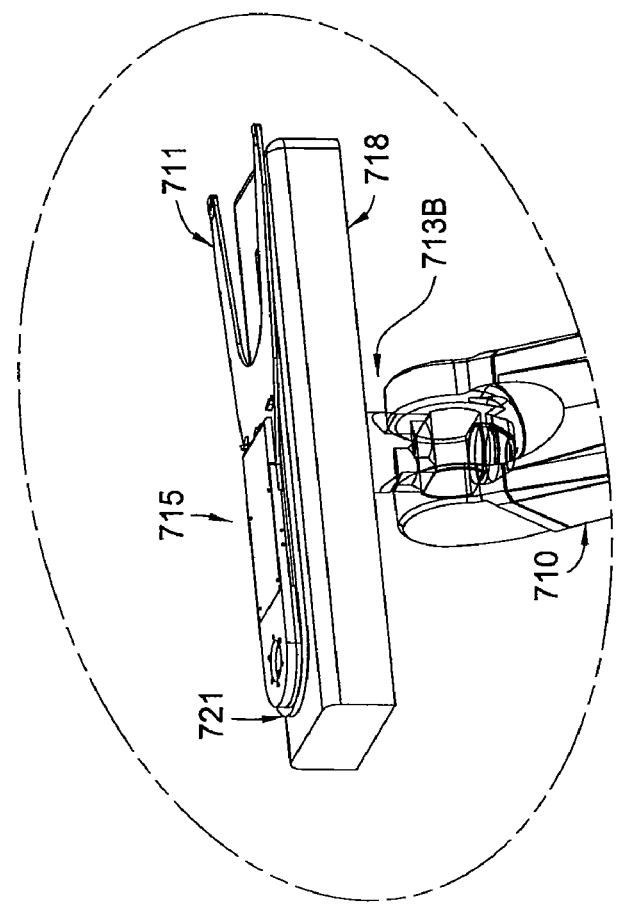
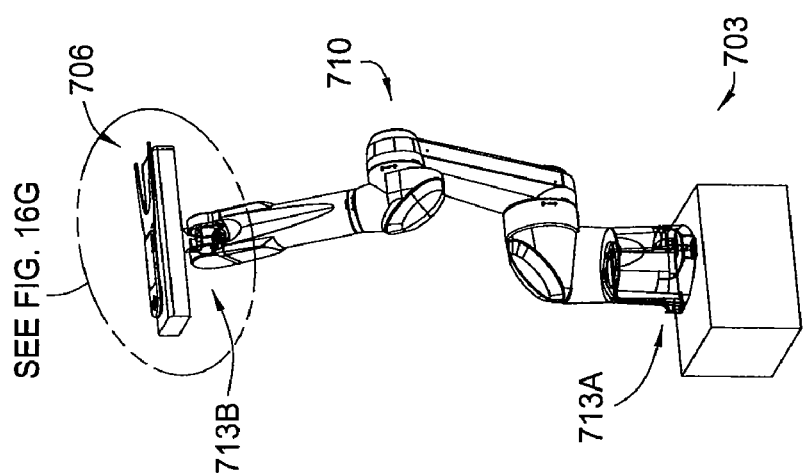
FIG. 16G
FIG. 16F

| | | | | | |
|---|---|---|---|---|---|
| CD2 /60 | CD1 /60 | 80/ C6 | 90/ B6 | 80/ C12 | 80/ PEB6 /130 |
| | | 80/ C5 | 90/ B5 | 80/ C11 | 80/ C24 PEB5 /130 |
| | | 80/ C4 | 90/ B4 | 80/ C10 | 80/ C23 PEB4 /130 |
| | | 80/ C3 | 90/ B3 | 80/ C9 | 80/ C22 PEB3 /130 |
| | | 80/ C2 | 90/ B2 | 80/ C8 | 80/ C21 PEB2 /130 |
| | | 80/ C1 | 90/ B1 | 80/ C7 | 80/ C20 PEB1 /130 |

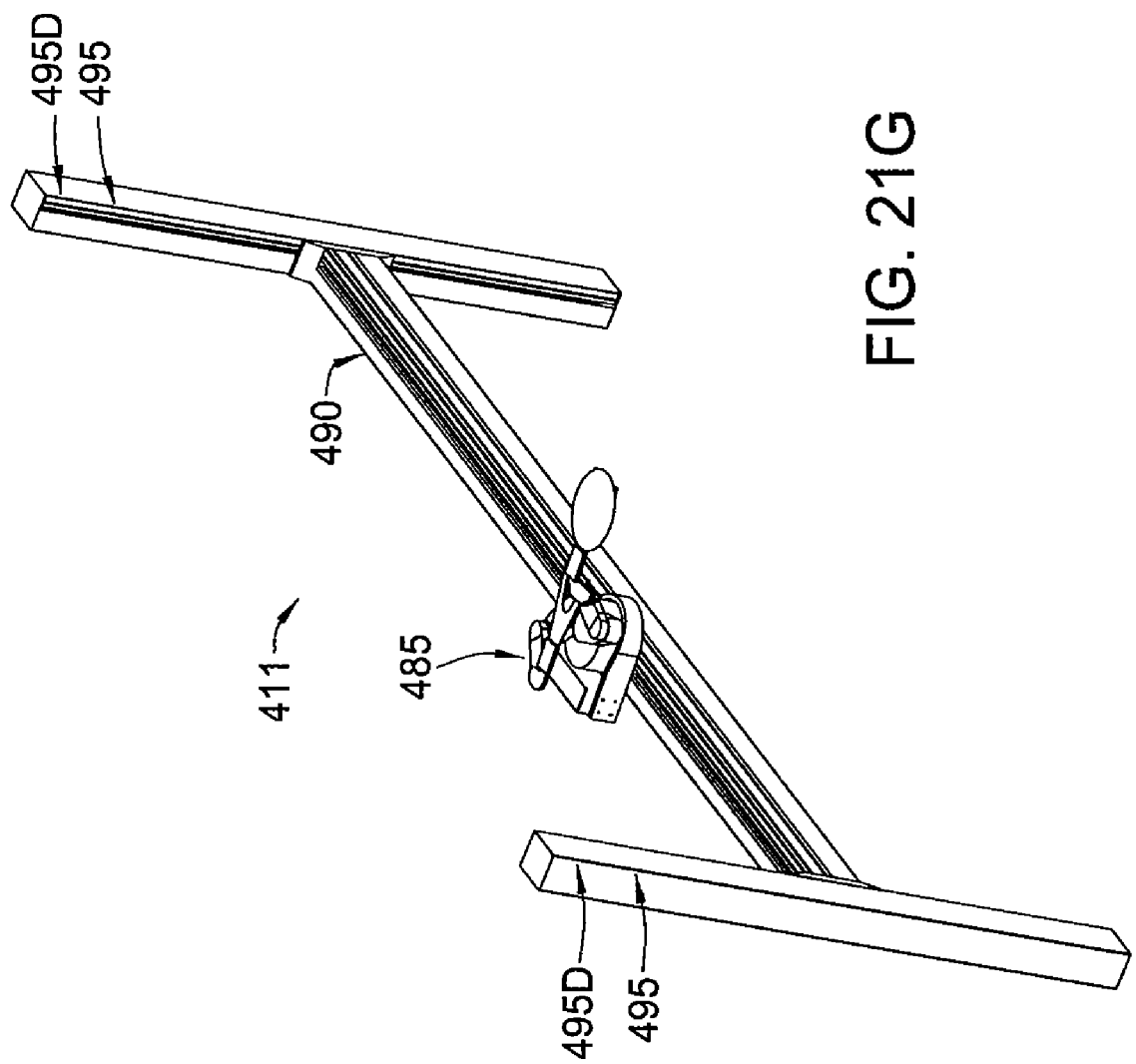

CLUSTER TOOL ARCHITECTURE FOR PROCESSING A SUBSTRATE

CROSS-REFERENCE TO RELATED APPLICATIONS

This application is a continuation of U.S. patent application Ser. No. 11/112,932, filed Apr. 22, 2005 now abandoned, which claims benefit of U.S. provisional patent application Ser. No. 60/639,109 filed Dec. 22, 2004, which are both herein incorporated by reference.

BACKGROUND OF THE INVENTION

1. Field of the Invention

Embodiments of the invention generally relate to an integrated processing system containing multiple processing stations and robots that are capable of processing multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. A typical cluster tool used to deposit (i.e., coat) and develop a photoresist material, commonly known as a track lithography tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times. In track lithography type cluster tools, since the chamber processing times tend to be rather short, (e.g., about a minute to complete the process) and the number of processing steps required to complete a typical process sequence is large, a significant portion of the time it takes to complete the processing sequence is taken up transferring the substrates between the various processing chambers. A typical track lithography process sequence will generally include the following steps: depositing one or more uniform photoresist (or resist) layers on the surface of a substrate, then transferring the substrate out of the cluster tool to a separate stepper or scanner tool to pattern the substrate surface by exposing the photoresist layer to a photoresist modifying electromagnetic radiation, and then developing the patterned photoresist layer. If the substrate throughput in a cluster tool is not robot limited, the longest process recipe step will generally limit the throughput of the processing sequence. This is usually not the case in track lithography process sequences, due to the short processing times and large number of processing steps. Typical system throughput for the conventional fabrication processes, such as a track lithography tool running a typical process, will generally be between 100-120 substrates per hour.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware and reliable systems that have increased uptime.

The push in the industry to shrink the size of semiconductor devices to improve device processing speed and reduce the generation of heat by the device, has caused the industry's tolerance to process variability to diminish. Due to the shrinking size of semiconductor devices and the ever increasing device performance requirements, the allowable variability of the device fabrication process uniformity and repeatability has greatly decreased. To minimize process variability an important factor in the track lithography processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance. Therefore, a cluster tool and supporting apparatus capable of performing a process sequence that minimizes process variability and the variability in the timing between process steps is needed. Also, a cluster tool and supporting apparatus that is capable of performing a device fabrication process that delivers a uniform and repeatable process result, while achieving a desired substrate throughput is also needed.

Therefore, there is a need for a system, a method and an apparatus that can process a substrate so that it can meet the required device performance goals and increase the system throughput and thus reduce the process sequence CoO.

SUMMARY OF THE INVENTION

1. The present invention generally provides a method processing substrates in a cluster tool that contains multiple processing stations and robots that are capable of processing multiple substrates in parallel. The method of processing a substrate in a cluster tool comprising: inserting at least one substrate into each of two or more vertically stacked processing chambers in a first processing rack using a first robot;

processing the substrates in the two or more processing chambers in the first processing rack; removing the substrates from the two or more vertically stacked processing chambers in the first rack substantially simultaneously using a second robot; simultaneously transferring the substrates to two or more vertically stacked processing chambers in a second processing rack using the second robot; and depositing the substrates in the two or more vertically stacked processing chambers in the second processing rack using the second robot.

Embodiments of the invention further provide a method of processing a substrate in a cluster tool comprising: inserting at least one substrate in two or more vertically stacked processing chambers in a first processing rack using a first robot; processing the substrates in the two or more processing chambers in the first processing rack; removing the substrates from the two or more vertically stacked processing chambers in the first processing rack substantially simultaneously using a second robot, wherein removing the substrates further comprises: repositioning a robot blade connected to a support attached to the second robot to prevent the blade from accessing a first vertically stacked processing chamber; positioning a robot blade that is separately connected to the support in a second vertically stacked processing chamber; positioning a substrate positioned in the second vertically stacked processing chamber on the robot blade; and removing the robot blade from the second vertically stacked processing chamber; and transferring the substrate to a second set of two or more vertically stacked processing chambers using the second robot.

Embodiments of the invention further provide a method of processing a substrate in a cluster tool comprising: inserting at least one substrate through a first side of two or more vertically stacked processing chambers positioned in a cluster tool using a first robot; processing the substrates in the processing chambers; removing two or more substrates through a second side of the two or more vertically stacked processing chambers substantially simultaneously using a second robot; simultaneously transferring the two or more substrates to a desired position using the second robot.

Embodiments of the invention further provide a method of processing a substrate in a cluster tool comprising: removing a substrate from a cassette using a robot; inserting a first substrate in a first processing chamber adjacently positioned to a second processing chamber; isolating the first processing chamber from the second processing chamber by positioning a shutter between the first processing chamber and the second processing chamber; dispensing a processing fluid on the surface of the substrate positioned in the first processing chamber using a nozzle connected to a fluid dispensing system; inserting a second substrate in the second processing chamber; and dispensing a processing fluid on the surface of the second substrate positioned in the second processing chamber using the nozzle connected to the fluid dispensing system.

Embodiments of the invention further provide a method of processing a substrate in a cluster tool comprising: positioning a substrate on a substrate exchanging device in a first processing chamber that is adjacently positioned to a second processing chamber; transferring the substrate from the substrate exchanging device in the first processing chamber to a substrate receiving surface of a chilled robot blade, wherein the substrate receiving surface is adapted to control the temperature of the substrate retained thereon; transferring the substrate to the second processing chamber using the chilled robot blade; and transferring the substrate to a third processing chamber using the chilled robot blade, wherein the third processing chamber is adjacent to the second processing chamber.

Embodiments of the invention further provide a method of processing a substrate in a cluster tool comprising: positioning a substrate on a substrate exchanging device in a first processing chamber that is adjacently positioned to a second processing chamber; transferring the substrate from the substrate exchanging device in the first processing chamber to a substrate receiving surface of a chilled robot blade, wherein the substrate receiving surface is adapted to control the temperature of the substrate retained thereon; transferring the substrate to the second processing chamber using the chilled robot blade; heating the substrate in the second processing chamber to a desired temperature; transferring the substrate to a third processing chamber using the chilled robot blade, wherein the third processing chamber is adjacent to the second processing chamber; and cooling the substrate in the third processing chamber to a desired temperature.

Embodiments of the invention further provide a method of processing a substrate in a cluster tool comprising: transferring a substrate from a cassette containing two or more substrates, wherein the cassette is retained in the cluster tool; completing a final processing step on a substrate in a processing chamber; transferring the substrate from the processing chamber to a chill chamber that is adapted to perform a chill process; and transferring the substrate from the chill chamber to the cassette.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is an isometric view illustrating a cluster tool according to an embodiment of the invention.

FIG. 2C is a plan view that illustrates another embodiment of cluster tool that contains a front end module and a central module, wherein the central module is adapted to communicate with a stepper/scanner tool.

FIG. 2H is a plan view that illustrates another embodiment of cluster tool that contains a front end module and a central processing module, which each contain two processing racks and a slide assembly to allow the base of the front end and central robots to translate.

FIG. 2I is a plan view that illustrates another embodiment of cluster tool that contains a front end module, central processing module and a rear processing module, which each contain two processing racks and two slide assemblies to allow the base of the front end, central robot and rear robots to translate.

FIG. 4A is a side view that illustrates one embodiment of the front end processing rack 52 according to the present invention.

FIG. 4B is a side view that illustrates one embodiment of the first processing rack 152 according to the present invention.

FIG. 4E is a side view that illustrates one embodiment of the first rear processing rack 302 according to the present invention.

FIG. 4F is a side view that illustrates one embodiment of the second rear processing rack 304 according to the present invention.

FIG. 10B is a side view that illustrates one embodiment of a bake chamber wherein the present invention may be used to advantage.

FIG. 13A is a side view of a processing chamber that illustrates one embodiment of a plate assembly that has improved thermal coupling and reduced contact with the substrate surface.

FIG. 15A is an isometric view illustrating one embodiment of a cluster tool of the invention that contains a frog-leg robot.

FIG. 15D is a plan view of a frog-leg robot assembly of the invention.

FIG. 16F is an isometric view illustrating one embodiment of a single blade 6-axis articulated robot assembly wherein the present invention may be used to advantage.

FIG. 16G is an isometric view illustrating one embodiment of the single blade assembly shown in FIG. 16F.

DETAILED DESCRIPTION

The present invention generally provides an apparatus and method for processing substrates using a multi-chamber processing system (e.g., a cluster tool) that has an increased system throughput, increased system reliability, more repeatable wafer processing history (or wafer history) within the cluster tool, and also a reduced footprint of the cluster tool. In one embodiment, the cluster tool is adapted to perform a track lithography process in which a substrate is coated with a photosensitive material, is then transferred to a stepper/scanner, which exposes the photosensitive material to some form of radiation to form a pattern in the photosensitive material, and then certain portions of the photosensitive material are removed in a developing process completed in the cluster tool.

Figure 1B:
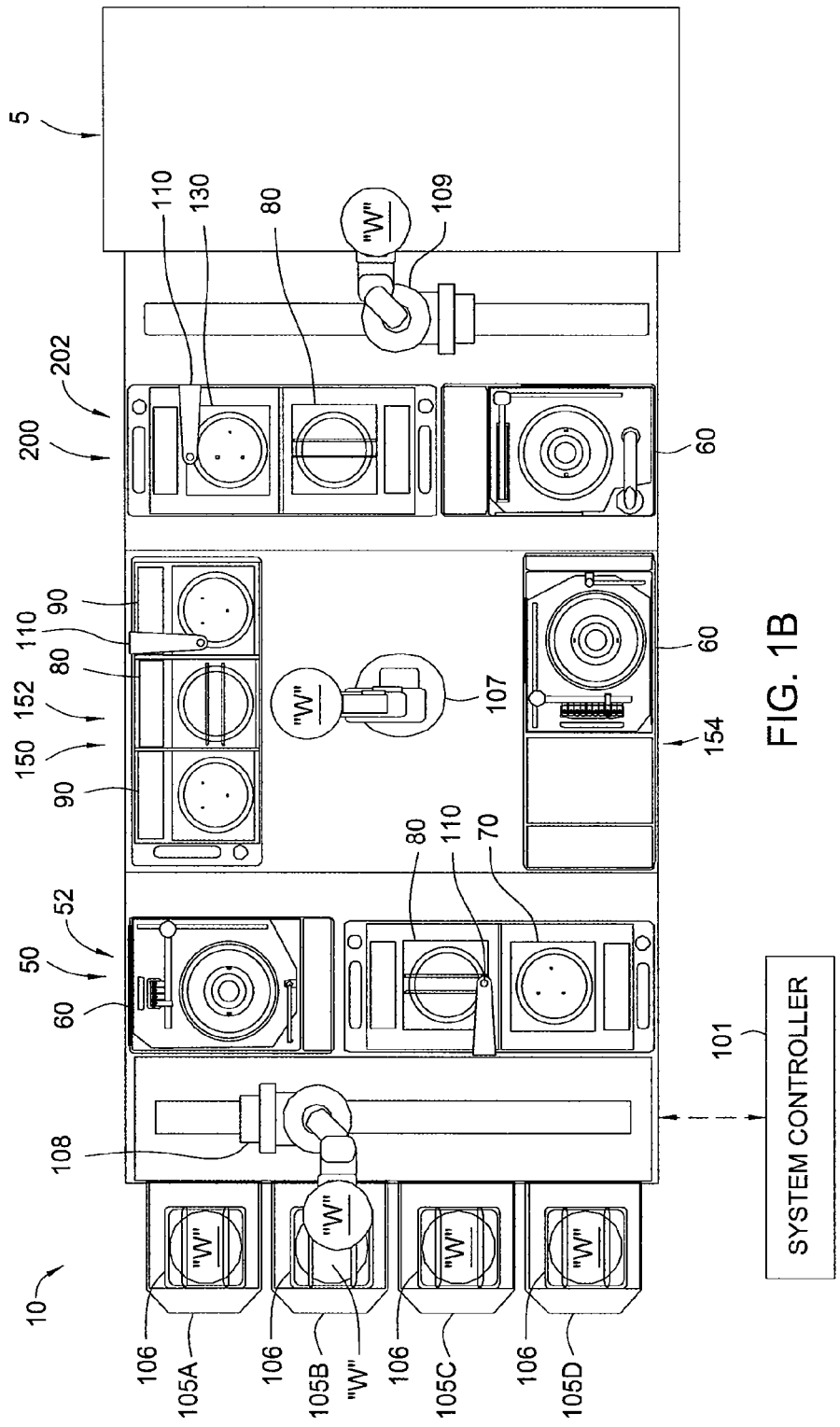
FIG. 1B is a plan view of the processing system illustrated in FIG. 1A wherein the present invention may be used to advantage.
Figure 1C:
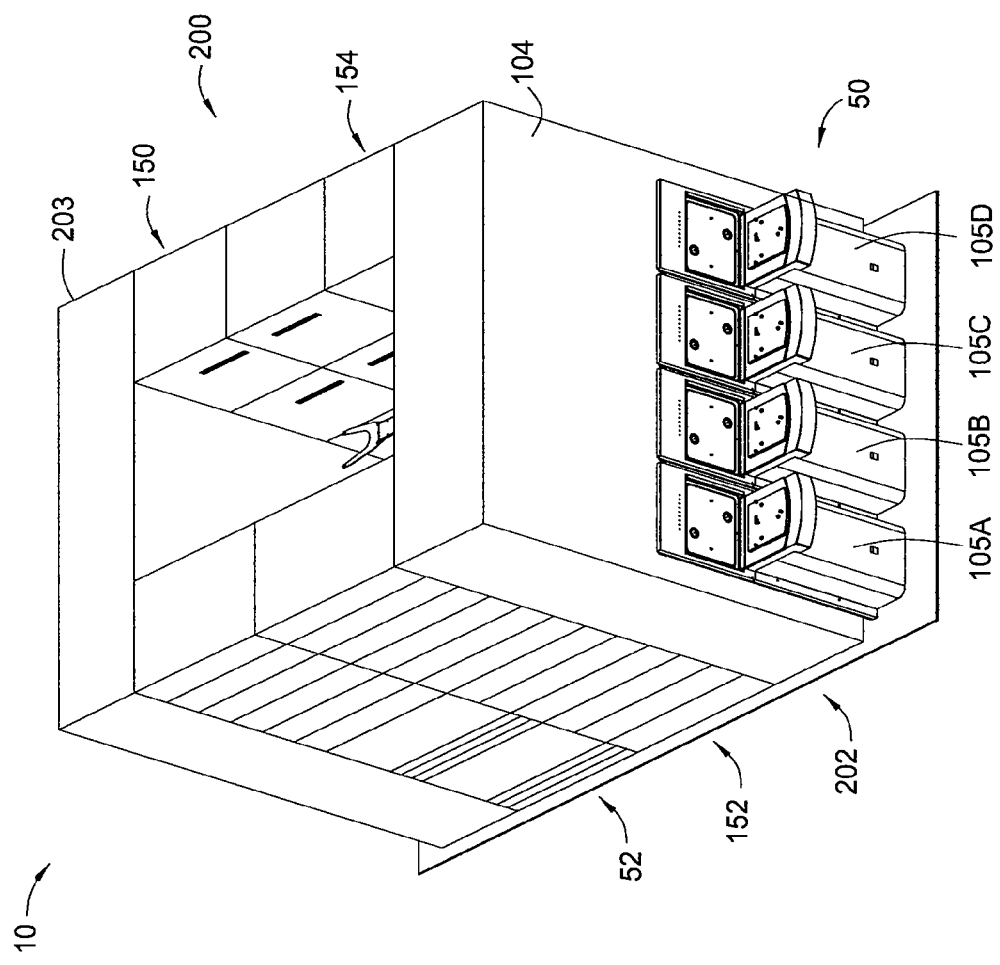
FIG. 1C is another isometric view illustrating a view from the opposite side shown in FIG. 1A.

FIGS. 1A and 1C are isometric views of one embodiment of a cluster tool 10 that illustrates a number of the aspects of the present invention that may be used to advantage. One embodiment of the cluster tool 10, as illustrated in FIGS. 1A and 1C, contains a front end module 50, a central module 150, and a rear module 200. The front end module 50 generally contains one or more pod assemblies 105 (e.g., items 105A-D), a front end robot 108 (FIG. 1B), and a front end processing rack 52. The central module 150 will generally contain a first central processing rack 152, a second central processing rack 154, and a central robot 107 (FIG. 1B). The rear module 200 will generally contain a rear processing rack 202 and a rear robot 109 (FIG. 1B). In one embodiment, the cluster tool 10 contains: a front end robot 108 adapted to access processing chambers in the front end processing rack 52; a central robot 107 that is adapted to access processing chambers in the front end processing rack 52, the first central processing rack 152, the second central processing rack 154 and/or the rear processing rack 202; and a rear robot 109 that is adapted to access processing chambers in the rear processing rack 202 and in some cases exchange substrates with a stepper/scanner 5 (FIG. 1B). In one embodiment, a shuttle robot 110 is adapted to transfer substrates between two or more adjacent processing chambers retained in one or more processing racks (e.g., front end processing rack 52, first central processing rack 152, etc.). In one embodiment, a front end enclosure 104 is used to control the environment around the front end robot 108 and between the pod assemblies 105 and front end processing rack 52.

FIG. 1B illustrates a plan view of one embodiment illustrated in FIG. 1A, which contains more detail of possible process chamber configurations found in aspects of the invention. Referring to FIG. 1B, the front end module 50 generally contains one or more pod assemblies 105, a front end robot 108 and a front end processing rack 52. The one or more pod assemblies 105, or front-end opening unified pods (FOUPs), are generally adapted to accept one or more cassettes 106 that may contain one or more substrates "W", or wafers, that are to be processed in the cluster tool 10. The front end processing rack 52 contains multiple processing chambers (e.g., bake chamber 90, chill chamber 80, etc.) that are adapted to perform the various processing steps found in the substrate processing sequence. In one embodiment, the front end robot 108 is adapted to transfer substrates between a cassette mounted in a pod assembly 105 and between the one or more processing chambers retained in the front end processing rack 52.

The central module 150 generally contains a central robot 107, a first central processing rack 152 and a second central processing rack 154. The first central processing rack 152 and a second central processing rack 154 contain various processing chambers (e.g., coater/developer chamber 60, bake chamber 90, chill chamber 80, etc.) that are adapted to perform the various processing steps found in the substrate processing sequence. In one embodiment, the central robot 107 is adapted to transfer substrates between the front end processing rack 52, the first central processing rack 152, the second central processing rack 154 and/or the rear processing rack 202. In one aspect, the central robot 107 is positioned in a central location between the first central processing rack 152 and a second central processing rack 154 of the central module 150.

The rear module 200 generally contains a rear robot 109 and a rear processing rack 202. The rear processing rack 202 generally contains processing chambers (e.g., coater/developer chamber 60, bake chamber 90, chill chamber 80, etc.) that are adapted to perform the various processing steps found in the substrate processing sequence. In one embodiment, the rear robot 109 is adapted to transfer substrates between the rear processing rack 202 and a stepper/scanner 5. The stepper/scanner 5, which may be purchased from Canon USA, Inc. of San Jose, Calif., Nikon Precision Inc. of Belmont, Calif., or ASML US, Inc. of Tempe, Ariz., is a lithographic projection apparatus used, for example, in the manufacture of integrated circuits (ICs). The scanner/stepper tool 5 exposes a photosensitive material (photoresist), deposited on the substrate in the cluster tool, to some form of electromagnetic radiation to generate a circuit pattern corresponding to an individual layer of the integrated circuit (IC) device to be formed on the substrate surface.

In one embodiment, a system controller 101 is used to control all of the components and processes performed in the cluster tool 10. The system controller 101 is generally adapted to communicate with the stepper/scanner 5, monitor and control aspects of the processes performed in the cluster tool 10, and is adapted to control all aspects of the complete substrate processing sequence. The system controller 101, which is typically a microprocessor-based controller, is configured to receive inputs from a user and/or various sensors in one of the processing chambers and appropriately control the processing chamber components in accordance with the various inputs and software instructions retained in the controller's memory. The system controller 101 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the system controller 101 determines which tasks are performable in the processing chamber(s). Preferably, the program is software readable by the system controller 101 and includes instructions to monitor and control the process based on defined rules and input data.

Figure 2A:
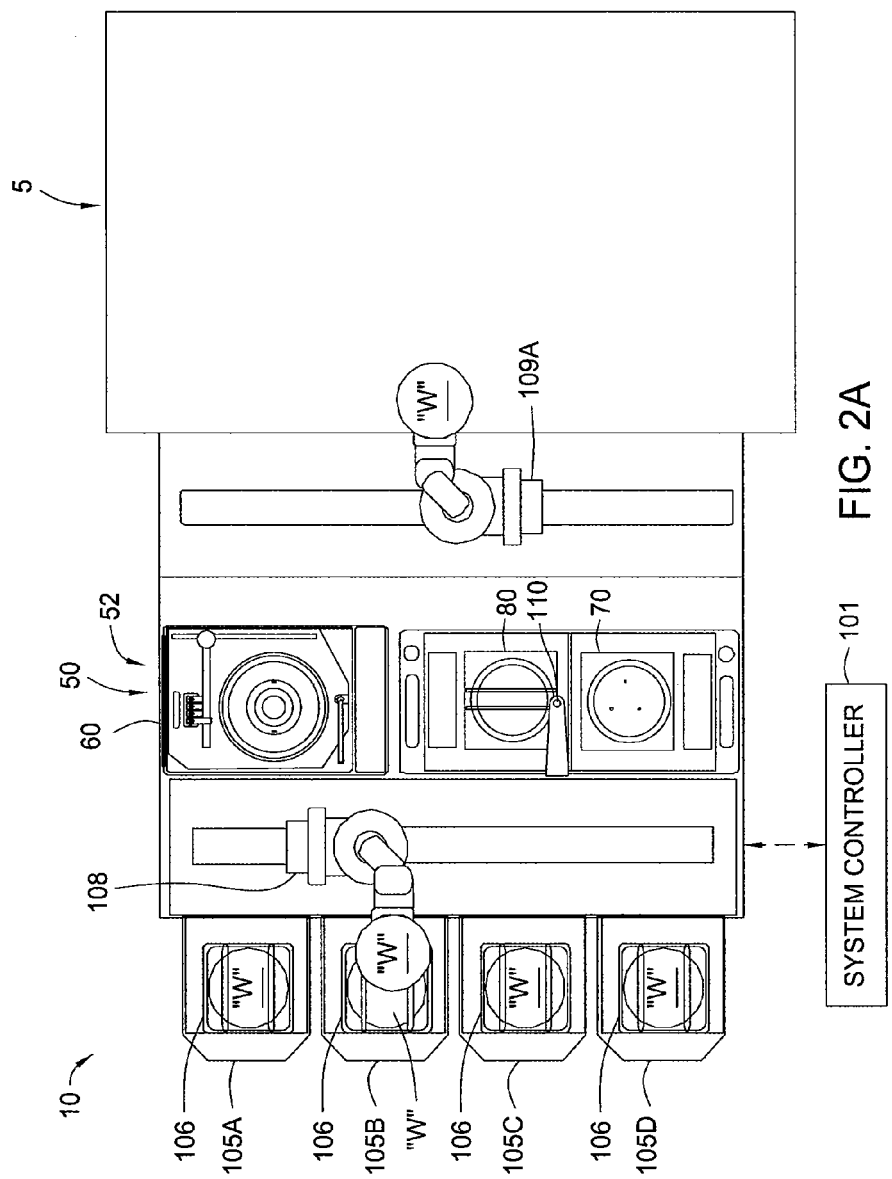
FIG. 2A is a plan view that illustrates another embodiment of cluster tool that only contains a front end module, which is adapted to communicate with a stepper/scanner tool.

FIG. 2A is a plan view that illustrates another embodiment of cluster tool 10 that contains a front end module 50 that is attached to the stepper/scanner 5. The front end module 50 in this configuration may contain a front end robot 108, a front end processing rack 52, and a rear robot 109A, which is in communication with the stepper/scanner 5. In this configuration the front end processing rack 52 contains multiple processing chambers (e.g., coater/developer chamber 60, bake chamber 90, chill chamber 80, etc.) that are adapted to perform the various processing steps found in the substrate processing sequence. In this configuration the front end robot 108 is adapted to transfer substrates between a cassette 106 mounted in a pod assembly 105 and the one or more processing chambers retained in the front end processing rack 52. Also, in this configuration the rear robot 109A is adapted to transfer substrates between the front end processing rack 52 and a stepper/scanner 5. In one embodiment, a shuttle robot 110 is adapted to transfer substrates between two or more adjacent processing chambers retained in one or more processing racks (e.g., front end processing rack 52, first central processing rack 152 (FIG. 1B), etc.). In one embodiment, the cluster tool 10 contains the front end module 50, but does not contain a rear robot 109A and does not interface with the stepper/scanner 5.

Figure 2B:
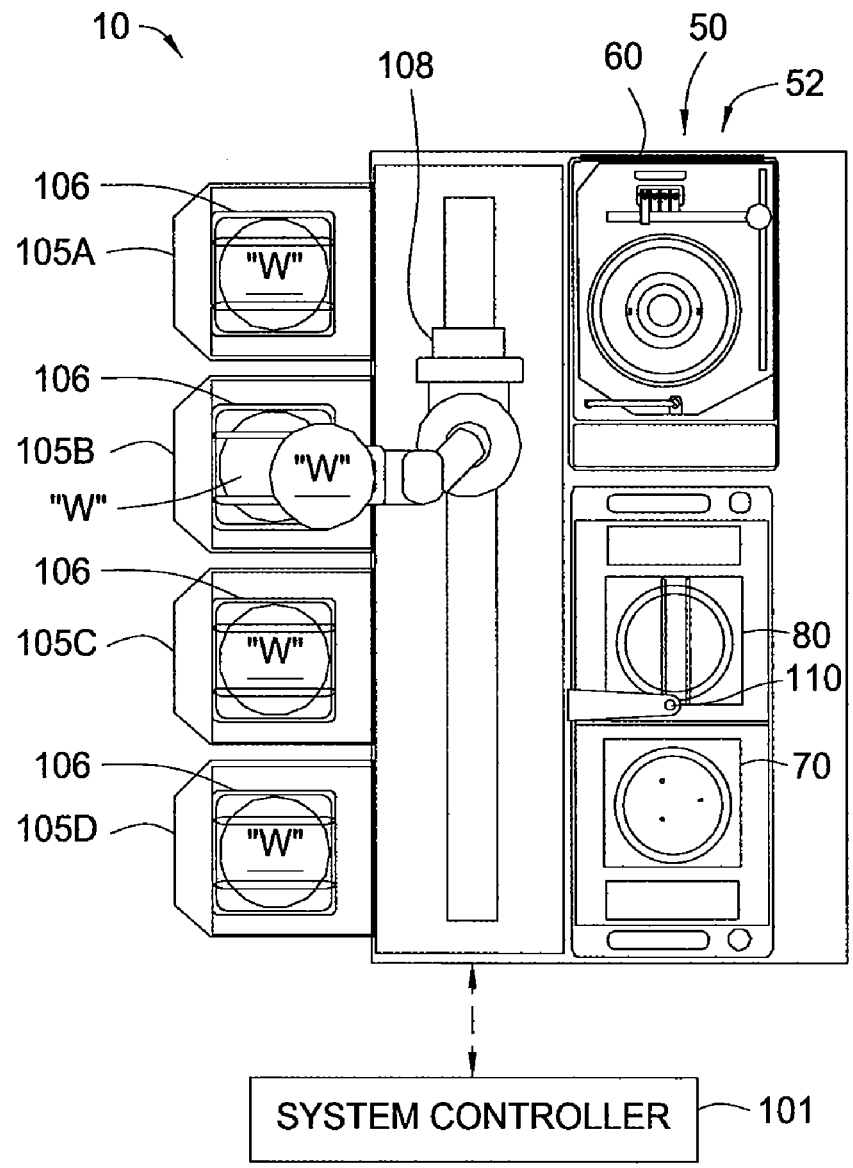
FIG. 2B is a plan view that illustrates another embodiment of cluster tool that only contains a stand-alone front end module.

FIG. 2B is a plan view that illustrates another embodiment of cluster 10 shown in FIG. 2A, that is not adapted to communicate with the stepper/scanner 5. In this configuration, the cluster tool 10 may be used as a stand alone tool to perform a desired process sequence utilizing the process chambers contained in the front end processing rack 52.

FIG. 2C is a plan view that illustrates yet another embodiment of the cluster tool 10 that contains a front end module 50 and a central module 150 that are attached to the stepper/scanner 5 and serviced by the front end robot 108 and the central robot 107. In one embodiment, the central robot 107 is adapted to transfer substrates between the front end processing rack 52, the first central processing rack 152, the second central processing rack 154 and/or the stepper/scanner 5. In one embodiment, a shuttle robot 110 is adapted to transfer substrates between two or more adjacent processing chambers retained in one or more processing racks (e.g., front end processing rack 52, first central processing rack 152, etc.).

Figure 2D:
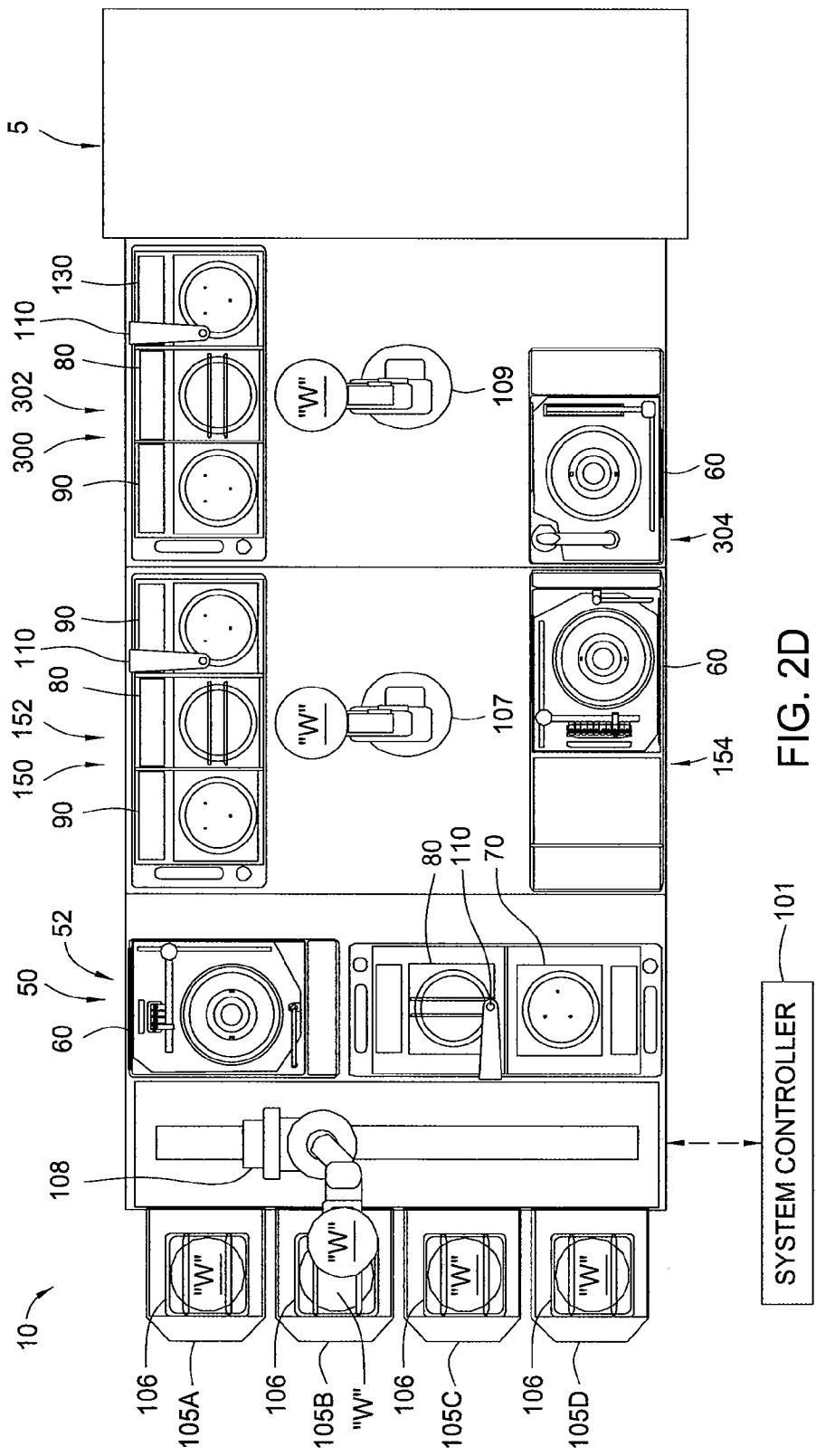
FIG. 2D is a plan view that illustrates another embodiment of cluster tool that contains a front end module, a central module and a rear module, wherein the rear module contains a first rear processing rack and a second rear processing rack and the rear robot is adapted to communicate with a stepper/scanner tool.

FIG. 2D is a plan view of yet another embodiment of the cluster tool 10 that contains front end module 50, a central module 150, and a rear module 300, where the rear processing rack 302 is configured to contain a first rear processing rack 302 and a second rear processing rack 304. In this configuration the rear robot 109 may be adapted to transfer substrates from the first central processing rack 152, the second central processing rack 154, the first rear processing rack 302, the second rear processing rack 304, the central robot 107, and/or the stepper/scanner 5. Also, in this configuration the central robot 107 may be adapted to transfer substrates from the first central processing rack 152, the second central processing rack 154, the first rear processing rack 302, the second rear processing rack 304, and/or the rear robot 109. In one embodiment, a shuttle robot 110 is adapted to transfer substrates between two or more adjacent processing chambers retained in one or more processing racks (e.g., front end processing rack 52, first central processing rack 152, etc.).

Figure 2E:
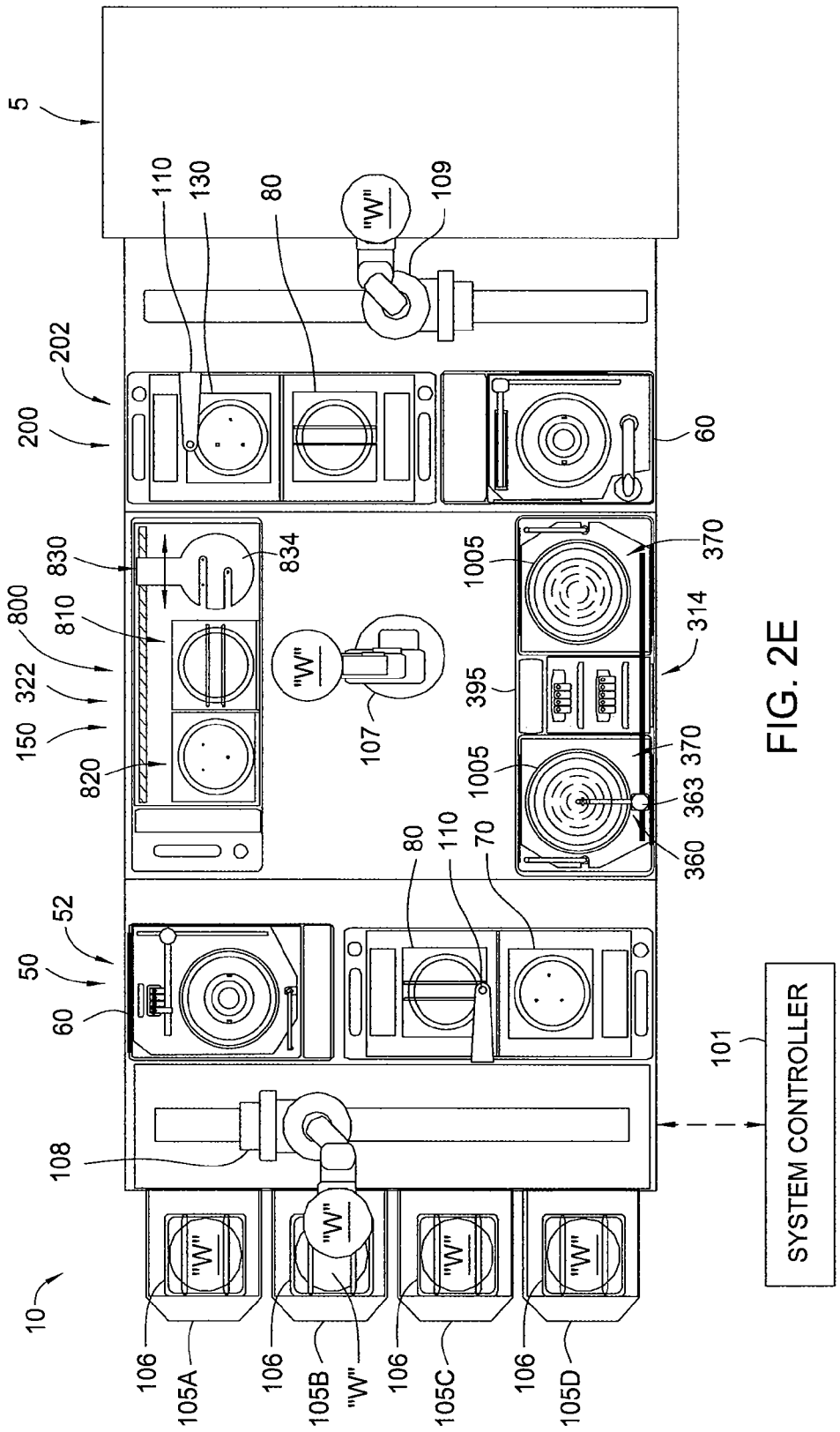
FIG. 2E is a plan view of a processing system illustrated in FIG. 1A, that contains a twin coater/developer chamber 350 and integrated bake/chill chamber 800 wherein the present invention may be used to advantage.
Figure 9A:
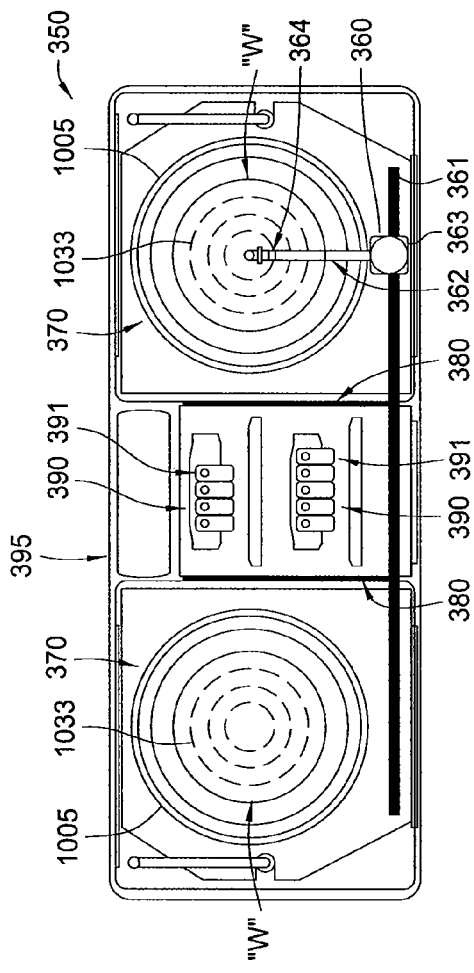
FIG. 9A is a plan view of a twin coater/developer chamber 350 according to the present invention.
Figure 9B:
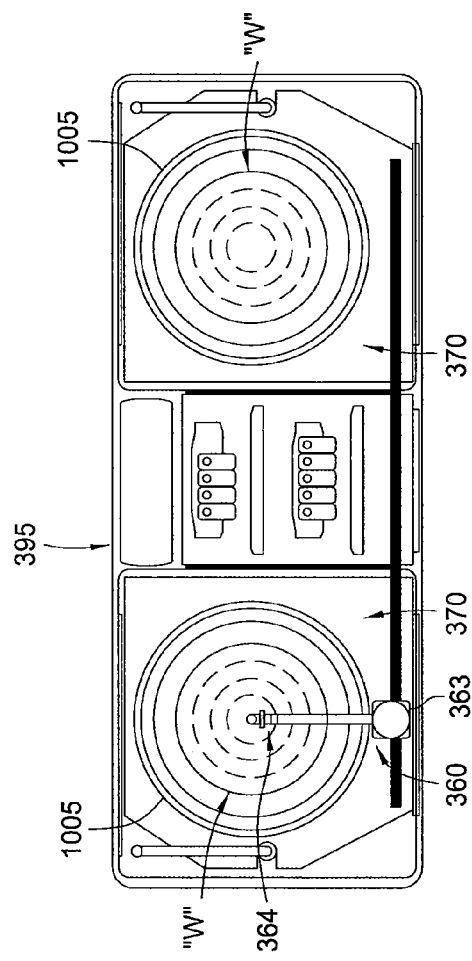
FIG. 9B is a plan view of a twin coater/developer chamber 350 according to the present invention.

FIG. 2E illustrates a plan view of one embodiment illustrated in FIG. 1B, which contains a twin coater/developer chamber 350 (FIGS. 9A-B) mounted in the second central processing rack 314 (FIG. 4J), that may adapted to perform a photoresist coat step 520 (FIGS. 3A-C) or a develop step 550 (FIGS. 3A-C) in both of the process chambers 370. This configuration is advantageous since it allows some of the common components found in the two process chambers 370 to be shared thus reducing the system cost, complexity and footprint of the tool. FIGS. 9A-B, described below, illustrates the various aspects of the twin coater/developer chamber 350. FIG. 2E also contains a bake/chill chamber 800 mounted in a first central processing rack 322 (FIG. 4K), that may be adapted to perform the various bake steps (e.g., post BARC bake step 512, PEB step 540, etc. (FIGS. 3A-C)) and chill steps (e.g., post BARC chill step 514, post PEB chill step 542, etc. (FIGS. 3A-C)) in the desired processing sequence. The bake/chill chamber 800 is described below in conjunction with FIGS. 18A-B.

Figure 2F:
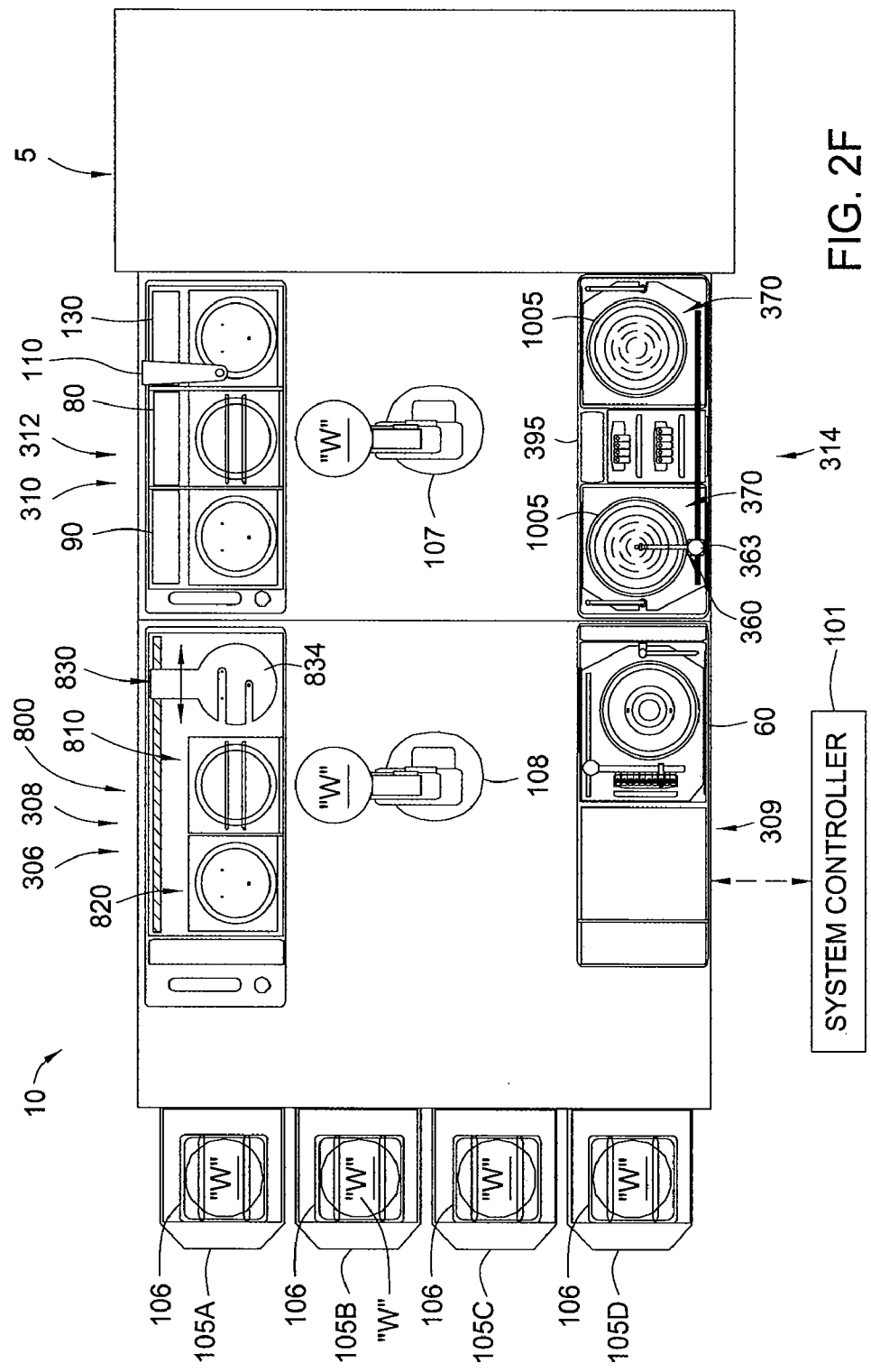
FIG. 2F is a plan view that illustrates another embodiment of cluster tool that contains a front end module and a central processing module, which each contain two processing racks.

FIG. 2F is a plan view of yet another embodiment of the cluster tool 10, which contains a front end module 306, and a central module 310. In this embodiment the front end module 306 may contain a first processing rack 308 and a second processing rack 309, and the central module 310 may contain a first central processing rack 312 and a second central processing rack 314. The front end robot 108 is adapted to transfer substrates between a cassette 106 mounted in a pod assembly 105, the first processing rack 308, the second processing rack 309, the first central processing rack 312, the second central processing rack 314, and/or the central robot 107. The central robot 107 is adapted to transfer substrates between the first processing rack 308, the second processing rack 309, the first central processing rack 312, the second central processing rack 314, the front end robot 108, and/or the stepper/scanner 5. In one embodiment, the front end robot 108, and the central robot 107 are articulated robots (described below). In one embodiment, a shuttle robot 110 is adapted to transfer substrates between two or more adjacent processing chambers retained in one or more processing racks (e.g., first processing rack 308, first central processing rack 312, etc.). In one aspect, the front end robot 108 is positioned in a central location between the first processing rack 308 and a second processing rack 309 of the front end module 306. In another aspect, the central robot 107 is positioned in a central location between the first central processing rack 312 and a second central processing rack 314 of the central module 310.

Figure 2G:
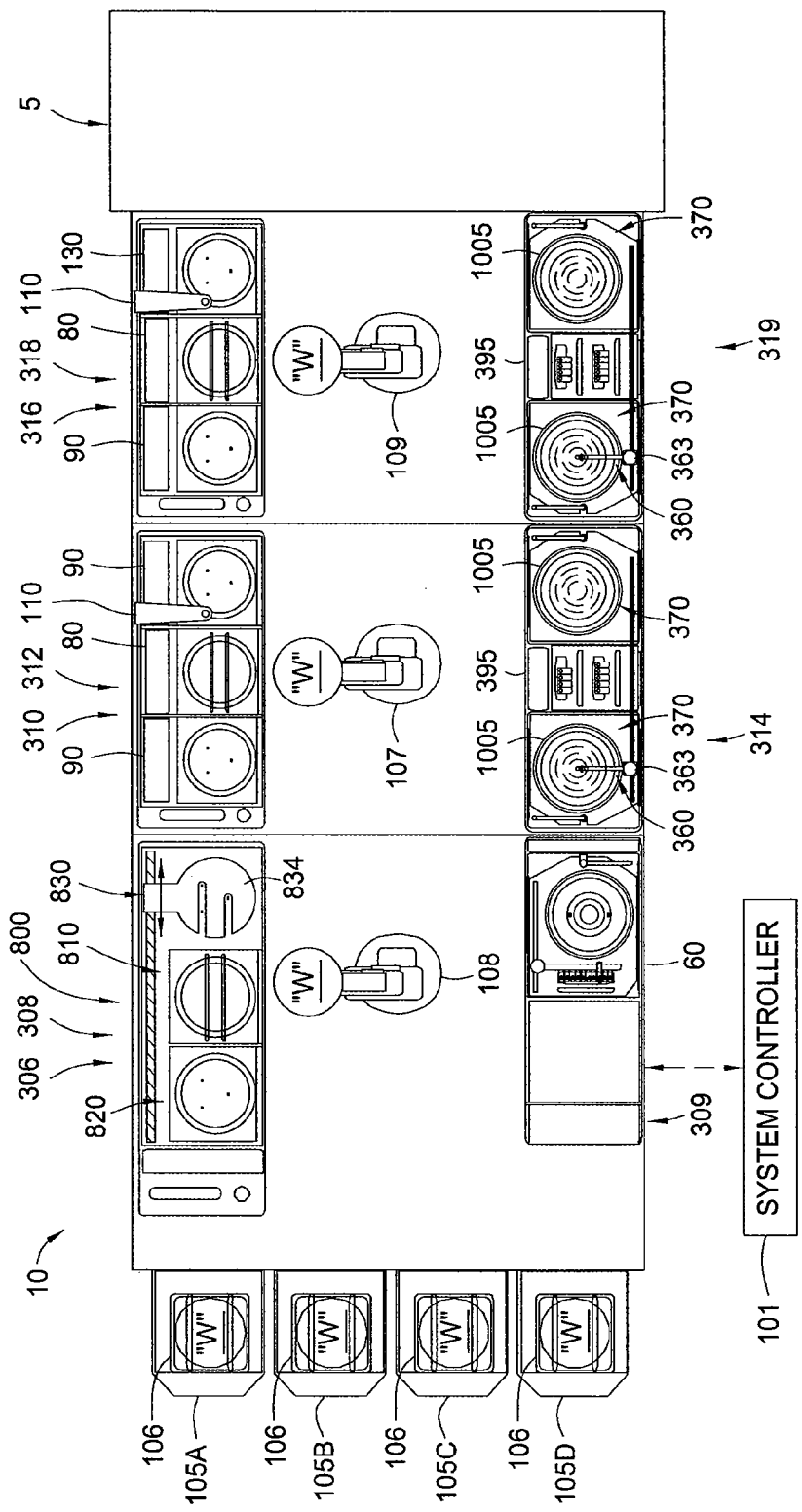
FIG. 2G is a plan view that illustrates another embodiment of cluster tool that contains a front end module, central processing module and a rear processing module, which each contain two processing racks.

FIG. 2G is a plan view of yet another embodiment of the cluster tool 10, which is similar to the embodiment shown in FIG. 2F, with the addition of a rear module 316 which may be attached to a stepper/scanner 5. In this embodiment the front end module 306 may contain a first processing rack 308 and a second processing rack 309, the central module 310 may contain a first central processing rack 312 and a second central processing rack 314, and the rear module 316 may contain a first rear processing rack 318 and a second rear processing rack 319. The front end robot 108 is adapted to transfer substrates between a cassette 106 mounted in a pod assembly 105, the first processing rack 308, the second processing rack 309, the first central processing rack 312, the second central processing rack 314, and/or the central robot 107. The central robot 107 is adapted to transfer substrates between the first processing rack 308, the second processing rack 309, the first central processing rack 312, the second central processing rack 314, the first rear processing rack 318, the second rear processing rack 319, the front end robot 108, and/or the rear robot 109. The rear robot 109 is adapted to transfer substrates between the first central processing rack 312, the second central processing rack 314, the first rear processing rack 318, the second rear processing rack 319, the central robot 107, and/or the stepper/scanner 5. In one embodiment, one or more of the front end robot 108, the central robot 107, and the rear robot 109 are articulated robots (described below). In one embodiment, a shuttle robot 110 is adapted to transfer substrates between two or more adjacent processing chambers retained in one or more processing racks (e.g., first processing rack 308, first central processing rack 312, etc.). In one aspect, the rear robot 109 is positioned in a central location between the first rear processing rack 318 and a second rear processing rack 319 of the rear module 316.

The embodiments illustrated in FIGS. 2F and 2G may be advantageous since the gap formed between the processing racks forms a relatively open space that will allow maintenance personnel access to cluster tool components that have become inoperable. As shown in FIGS. 2F and 2G, in one aspect of the invention, the gap is as wide as the space between the processing racks and as high the height of the processing racks. Since system down-time and system availability are important components in determining the CoO for a given tool, the ability to easily access and maintain the cluster tool components have an advantage over other prior art configurations.

FIG. 2H is a plan view of yet another embodiment of the cluster tool 10, which is similar to the embodiment shown in FIG. 2F, with the addition of a slide assembly 714 (FIG. 16H) which allows the base of the front end robot 108 and the central robot 107 to translate along the length (items $A_1$ and $A_2$, respectively) of the cluster tool. This configuration extends the reach of each of the robots and improves the "robot overlap." Robot overlap is the ability of a robot to access processing chambers in the processing rack of other modules. While FIG. 2H illustrates the front end robot 108 and the central robot 107 on a single slide assembly 714 other embodiments may include having each of the robots (Items 107 and 108) on their own slide assembly or only one of the robots mounted on a slide assembly and the other mounted to the floor or system frame, without varying from the scope of the invention.

FIG. 2I is a plan view of yet another embodiment of the cluster tool 10, which is similar to the embodiment shown in FIG. 2G, with the addition of two slide assemblies 714A-B (described in FIG. 16H) which allows the base of the front end robot 108 and the base of the central robot 107 and rear robot 109 to translate along the length (items $A_1$, $A_2$ and $A_3$, respectively) of the cluster tool 10. While FIG. 2I illustrates the front end robot 108 on one slide assembly 714A and the central robot 107 and the rear robot 109 on a single slide assembly 714B, other embodiments may include having one or more of the robots (Items 107, 108 and 109) on their own slide assembly (not shown), on a shared slide assembly or all three on a single slide assembly (not shown), without varying from the scope of the invention.

Photolithography Process Sequence

Figure 3A:
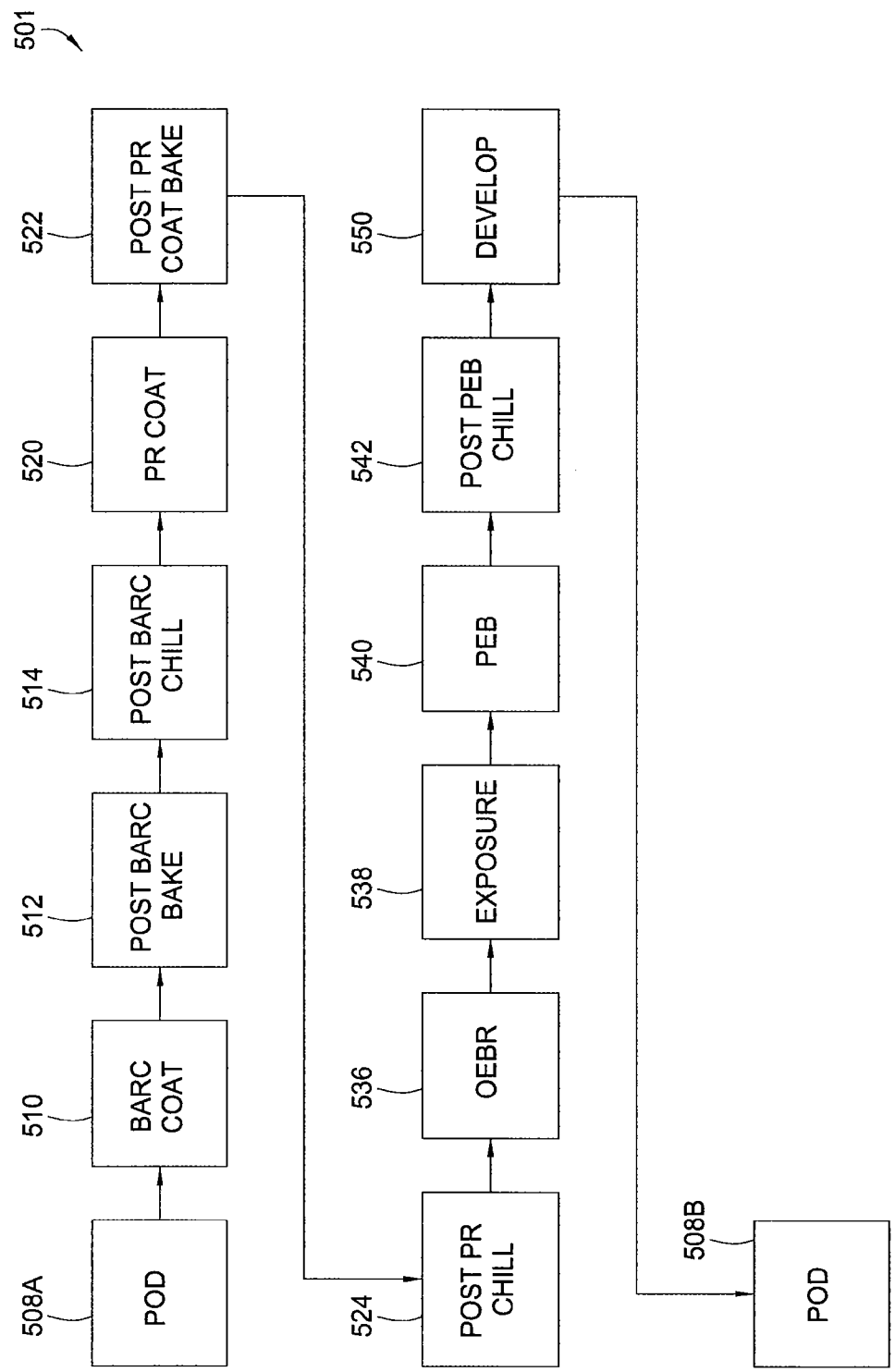
FIG. 3A illustrates one embodiment of a process sequence containing various process recipe steps that may be used in conjunction with the various embodiments of the cluster tool described herein.

FIG. 3A illustrates one embodiment of a series of method steps 501 that may be used to deposit, expose and develop a photoresist material layer formed on a substrate surface. The lithographic process may generally contain the following: a remove substrate from pod 508A step, a BARC coat step 510, a post BARC bake step 512, a post BARC chill step 514, a photoresist coat step 520, a post photoresist coat bake step 522, a post photoresist chill step 524, an optical edge bead removal (OEBR) step 536, an exposure step 538, a post exposure bake (PEB) step 540, a post PEB chill step 542, a develop step 550, and a place in pod step 508B. In other embodiments, the sequence of the method steps 501 may be rearranged, altered, one or more steps may be removed, or two or more steps may be combined into a single step without varying from the basic scope of the invention.

The remove substrate from pod 508A step is generally defined as the process of having the front end robot 108 remove a substrate from a cassette 106 resting in one of the pod assemblies 105. A cassette 106, containing one or more substrates "W", is placed on the pod assembly 105 by the user or some external device (not shown) so that the substrates can be processed in the cluster tool 10 by a user-defined substrate processing sequence controlled by software retained in the system controller 101.

The BARC coat step 510, or bottom anti-reflective coating process (hereafter BARC), is a step used to deposit an organic material over a surface of the substrate. The BARC layer is typically an organic coating that is applied onto the substrate prior to the photoresist layer to absorb light that otherwise would be reflected from the surface of the substrate back into the photoresist during the exposure step 538 performed in the stepper/scanner 5. If these reflections are not prevented, optical standing waves will be established in the photoresist layer, which cause feature size(s) to vary from one location to another depending on the local thickness of the photoresist layer. The BARC layer may also be used to level (or planarize) the substrate surface topography, since surface topography variations are invariably present after completing multiple electronic device fabrication steps. The BARC material fills around and over the features to create a flatter surface for photoresist application and reduces local variations in photoresist thickness. The BARC coat step 510 is typically performed using a conventional spin-on photoresist dispense process in which an amount of the BARC material is deposited on the surface of the substrate while the substrate is being rotated, which causes a solvent in the BARC material to evaporate and thus causes the material properties of the deposited BARC material to change. The air flow and exhaust flow rate in the BARC processing chamber is often controlled to control the solvent vaporization process and the properties of the layer formed on the substrate surface.

The post BARC bake step 512, is a step used to assure that all of the solvent is removed from the deposited BARC layer in the BARC coat step 510, and in some cases to promote adhesion of the BARC layer to the surface of the substrate. The temperature of the post BARC bake step 512 is dependent on the type of BARC material deposited on the surface of the substrate, but will generally be less than about 250° C. The time required to complete the post BARC bake step 512 will depend on the temperature of the substrate during the post BARC bake step, but will generally be less than about 60 seconds.

The post BARC chill step 514, is a step used to assure that the time the substrate is at a temperature above ambient temperature is controlled so that every substrate sees the same time-temperature profile; thus process variability is minimized. Variations in the BARC process time-temperature profile, which is a component of a substrate's wafer history, can have an effect on the properties of the deposited film layer and thus is often controlled to minimize process variability. The post BARC chill step 514, is typically used to cool the substrate after the post BARC bake step 512 to a temperature at or near ambient temperature. The time required to complete the post BARC chill step 514 will depend on the temperature of the substrate exiting the post BARC bake step, but will generally be less than about 30 seconds.

Figure 5A:
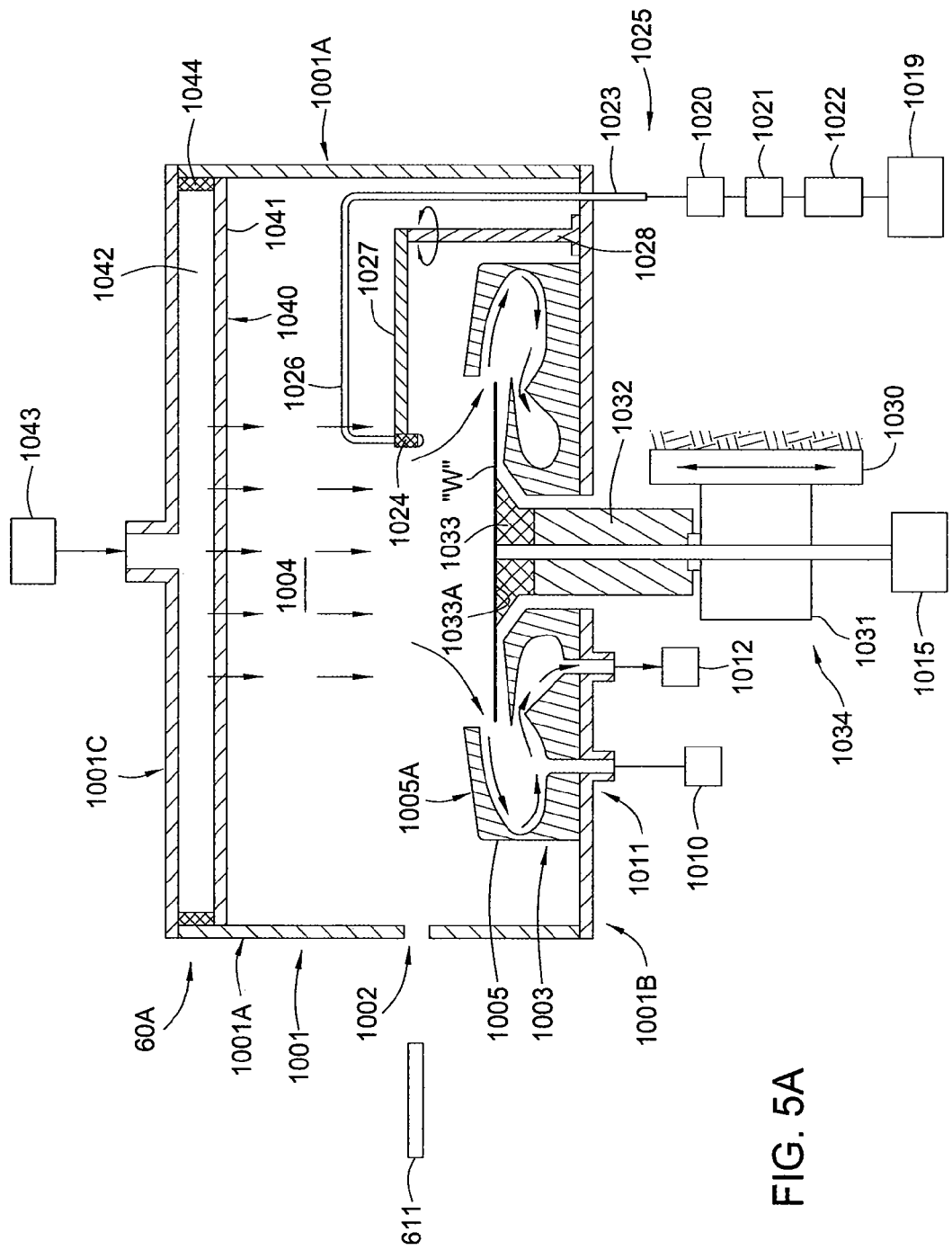
FIG. 5A is a side view that illustrates one embodiment of a coater chamber wherein the present invention may be used to advantage.

The photoresist coat step 520 is a step used to deposit a photoresist layer over a surface of the substrate. The photoresist layer deposited during the photoresist coat step 520 is typically a light sensitive organic coating that is applied onto the substrate and is later exposed in the stepper/scanner 5 to form the patterned features on the surface of the substrate. The photoresist coat step 520 is a typically performed using conventional spin-on photoresist dispense process in which an amount of the photoresist material is deposited on the surface of the substrate while the substrate is being rotated, thus causing a solvent in the photoresist material to evaporate and the material properties of the deposited photoresist layer to change. The air flow and exhaust flow rate in the photoresist processing chamber is controlled to control the solvent vaporization process and the properties of the layer formed on the substrate surface. In some cases it may be necessary to control the partial pressure of the solvent over the substrate surface to control the vaporization of the solvent from the photoresist during the photoresist coat step by controlling the exhaust flow rate and/or by injecting a solvent near the substrate surface. Referring to FIG. 5A, to complete the photoresist coat step 520 the substrate is first positioned on a spin chuck 1033 in a coater chamber 60A. A motor rotates the spin chuck 1033 and substrate while the photoresist is dispensed onto the center of the substrate. The rotation imparts an angular torque onto the photoresist, which forces the photoresist out in a radial direction, ultimately covering the substrate.

The post photoresist coat bake step 522 is a step used to assure that most, if not all, of the solvent is removed from the deposited photoresist layer in the photoresist coat step 520, and in some cases to promote adhesion of the photoresist layer to the BARC layer. The temperature of the post photoresist coat bake step 522 is dependent on the type of photoresist material deposited on the surface of the substrate, but will generally be less than about 250° C. The time required to complete the post photoresist coat bake step 522 will depend on the temperature of the substrate during the post photoresist bake step, but will generally be less than about 60 seconds.

The post photoresist chill step 524, is a step used to control the time the substrate is at a temperature above ambient temperature so that every substrate sees the same time-temperature profile and thus process variability is minimized. Variations in the time-temperature profile can have an affect on properties of the deposited film layer and thus is often controlled to minimize process variability. The temperature of the post photoresist chill step 524, is thus used to cool the substrate after the post photoresist coat bake step 522 to a temperature at or near ambient temperature. The time required to complete the post photoresist chill step 524 will depend on the temperature of the substrate exiting the post photoresist bake step, but will generally be less than about 30 seconds.

The optical edge bead removal (OEBR) step 536, is a process used to expose the deposited light sensitive photoresist layer(s), such as the layers formed during the photoresist coat step 520 and the BARC layer formed during the BARC coat step 510, to a radiation source (not shown) so that either or both layers can be removed from the edge of the substrate and the edge exclusion of the deposited layers can be more uniformly controlled. The wavelength and intensity of the radiation used to expose the surface of the substrate will depend on the type of BARC and photoresist layers deposited on the surface of the substrate. An OEBR tool can be purchased, for example, from USHIO America, Inc. Cypress, Calif.

The exposure step 538 is a lithographic projection step applied by a lithographic projection apparatus (e.g., stepper scanner 5) to form a pattern which is used to manufacture integrated circuits (ICs). The exposure step 538 forms a circuit pattern corresponding to an individual layer of the integrated circuit (IC) device on the substrate surface, by exposing the photosensitive materials, such as, the photoresist layer formed during the photoresist coat step 520 and the BARC layer formed during the BARC coat step 510 (photoresist) of some form of electromagnetic radiation. The stepper/scanner 5, which may be purchased from Cannon, Nikon, or ASML.

The post exposure bake (PEB) step 540 is a step used to heat a substrate immediately after the exposure step 538 in order to stimulate diffusion of the photoactive compound(s) and reduce the effects of standing waves in the photoresist layer. For a chemically amplified photoresist, the PEB step also causes a catalyzed chemical reaction that changes the solubility of the photoresist. The control of the temperature during the PEB is critical to critical dimension (CD) control. The temperature of the PEB step 540 is dependent on the type of photoresist material deposited on the surface of the substrate, but will generally be less than about 250° C. The time required to complete the PEB step 540 will depend on the temperature of the substrate during the PEB step, but will generally be less than about 60 seconds.

The post exposure bake (PEB) chill step 542 is a step used to assure that the time the substrate is at a temperature above ambient temperature is controlled, so that every substrate sees the same time-temperature profile and thus process variability is minimized. Variation in the PEB process time-temperature profile can have an effect on properties of the deposited film layer and thus is often controlled to minimize process variability. The temperature of the post PEB chill step 542 is thus used to cool the substrate after the PEB step 540 to a temperature at or near ambient temperature. The time required to complete the post PEB chill step 542 will depend on the temperature of the substrate exiting the PEB step, but will generally be less than about 30 seconds.

The develop step 550 is a process in which a solvent is used to cause a chemical or physical change to the exposed or unexposed photoresist and BARC layers to expose the pattern formed during the exposure step 538. The develop process may be a spray or immersion or puddle type process that is used to dispense the developer solvent. In one embodiment of the develop step 550, after the solvent has been dispensed on the surface of the substrate a rinse step may be performed to rinse the solvent material from the surface of the substrate. The rinse solution dispensed on the surface of the substrate may contain deionized water and/or a surfactant.

The insert the substrate in pod step 508B is generally defined as the process of having the front end robot 108 return the substrate to a cassette 106 resting in one of the pod assemblies 105.

Figure 3B:
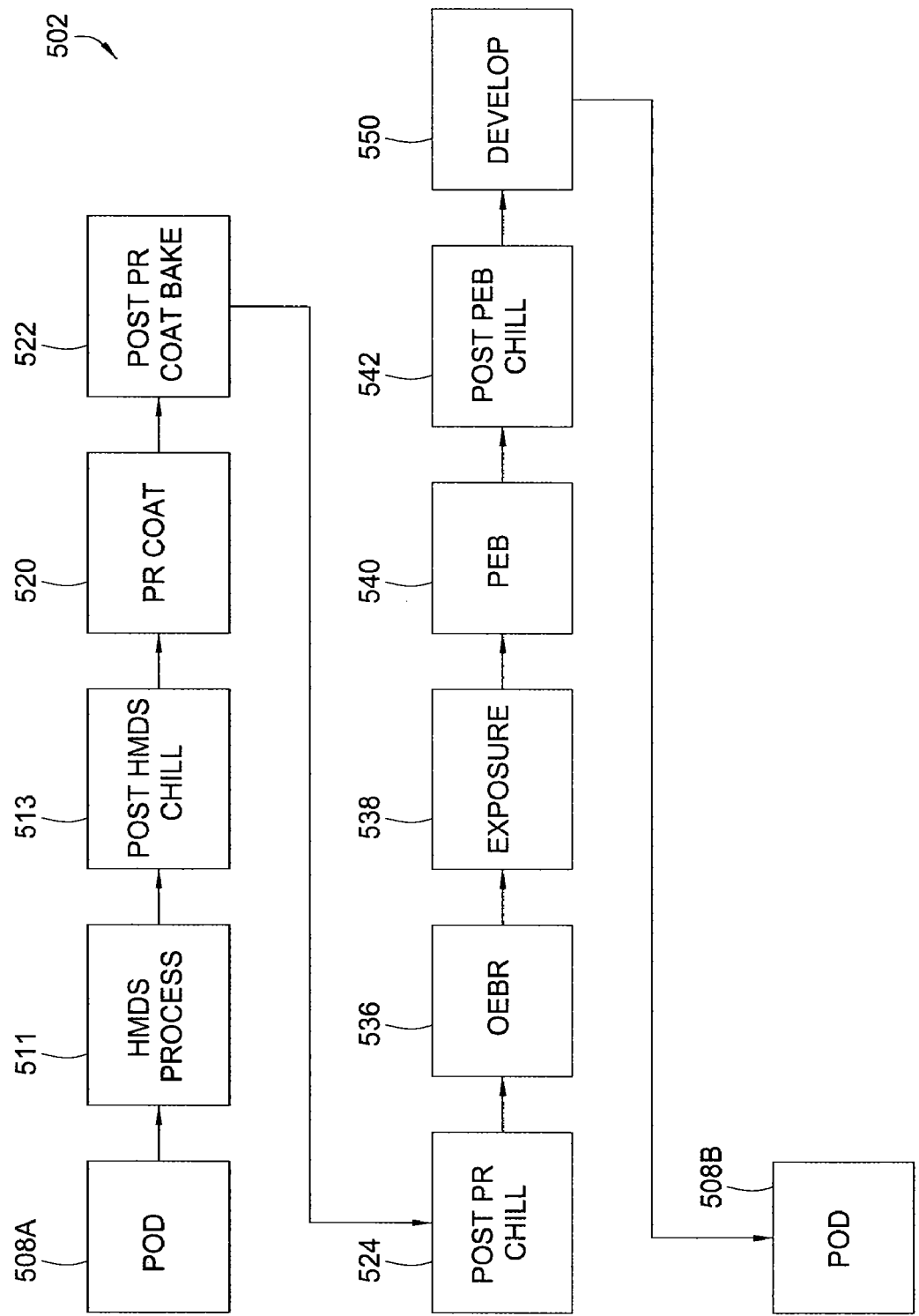
FIG. 3B illustrates another embodiment of a process sequence containing various process recipe steps that may be used in conjunction with the various embodiments of the cluster tool described herein.

FIG. 3B illustrates another embodiment in which a series of method steps 502 that may be used to perform a track lithographic process on the substrate surface. The lithographic process in the method steps 502 contains all of the steps found in FIG. 3A, but replaces the BARC coat step 510 and post BARC bake step 512 with a hexamethyldisilazane (hereafter HMDS) processing step 511 and a post HMDS chill step 513. In other embodiments, the series of the method steps 502 may be rearranged, altered, one or more steps may be removed or two or more steps may be combined into a single step with out varying from the basic scope of the invention.

The HMDS processing step 511 generally contains the steps of heating the substrate to a temperature greater than about 125° C. and exposing the substrate to a process gas containing an amount of HMDS vapor for a short period of time (e.g., <120 seconds) to prepare and dry the surface of the substrate to promote adhesion of the photoresist layer deposited later in the processing sequence. While the use of HMDS vapor is specifically described above as the chemical used in conjunction with the HMDS processing step 511, the HMDS processing step 511 is meant to more generally describe a class of similar processes that may be utilized to prepare and dry the surface of the substrate to promote adhesion of the photoresist layer. Thus the use of the term HMDS in this specification is not intended to be limiting of the scope of the invention. In some cases the HMDS step is called a "vapor prime" steps.

The post HMDS chill step 513 controls the temperature of the substrate so that all substrates entering the photoresist processing step are at the same initial processing temperature. Variations in the temperature of the substrate entering the photoresist coat step 520, can have a dramatic affect on properties of the deposited film layer and thus is often controlled to minimize process variability. The temperature of the post HMDS chill step 513, is thus used to cool the substrate after the HMDS processing step 511 to a temperature at or near ambient temperature. The time required to complete the post HMDS chill step 513 will depend on the temperature of the substrate exiting the HMDS processing step 511, but will generally be less than about 30 seconds.

Figure 3C:
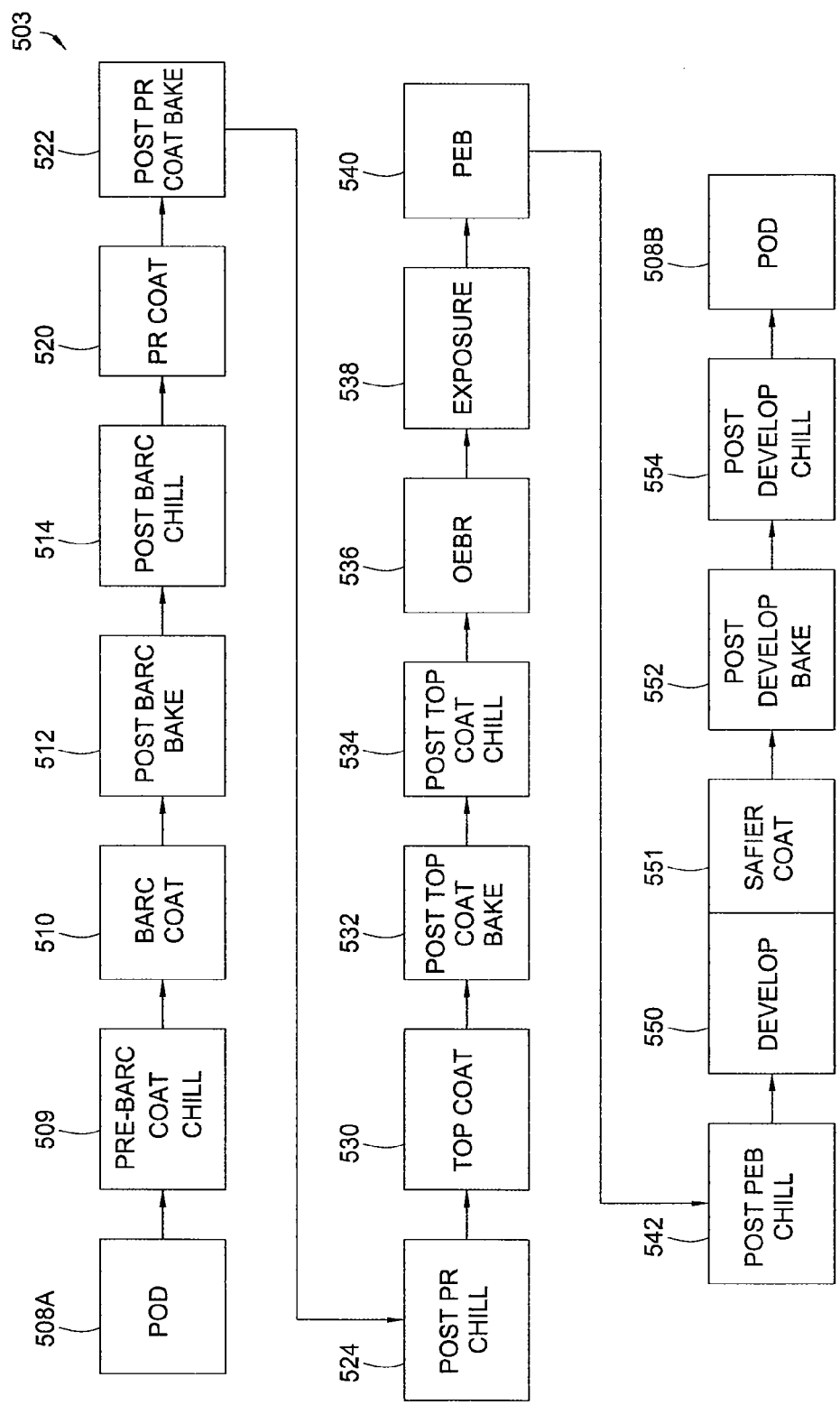
FIG. 3C illustrates another embodiment of a process sequence containing various process recipe steps that may be used in conjunction with the various embodiments of the cluster tool described herein.

FIG. 3C illustrates another embodiment of a process sequence, or method steps 503, that may be used to perform a track lithographic process on the substrate. The lithographic process may generally contain a remove from pod 508A step, a pre-BARC chill step 509, a BARC coat step 510, a post BARC bake step 512, a post BARC chill step 514, a photoresist coat step 520, a post photoresist coat bake step 522, a post photoresist chill step 524, an anti-reflective top coat step 530, a post top coat bake step 532, a post top coat chill step 534, an optical edge bead removal (OEBR) step 536, an exposure step 538, a post exposure bake (PEB) step 540, a post PEB chill step 542, a develop step 550, a SAFIER™ (Shrink Assist Film for Enhanced Resolution) coat step 551, a post develop bake step 552, a post develop chill step 554, and a place in pod step 508B. The lithographic process in the method steps 503 contains all of the steps found in FIG. 3A, and adds the anti-reflective top coat step 530, the post top coat bake step 532, the post top coat chill step 534, a post develop bake step 552, a post develop chill step 554 and the SAFIER™ coat step 551. In other embodiments, the sequence of the method steps 503 may be re-arranged, altered, one or more steps may be removed or two or more steps may be combined into a single step with out varying from the basic scope of the invention.

The pre-BARC chill step 509 controls the temperature of the substrate so that all substrates entering the BARC processing step are at the same initial processing temperature. Variations in the temperature of the substrate entering the BARC coat step 510, can have a dramatic affect on properties of the deposited film layer and thus is often controlled to minimize process variability. The temperature of the pre-BARC step 509, is thus used to cool or warm the substrate transferred from the POD to a temperature at or near ambient temperature. The time required to complete the pre-BARC chill step 509 will depend on the temperature of the substrates in the cassette 106, but will generally be less than about 30 seconds.

The anti-reflective top coat step 530 or top anti-reflective coating process (hereafter TARC), is a step used to deposit an organic material over the photoresist layer deposited during the photoresist coat step 520. The TARC layer is typically used to absorb light that otherwise would be reflected from the surface of the substrate back into the photoresist during the exposure step 538 performed in the stepper/scanner 5. If these reflections are not prevented, optical standing waves will be established in the photoresist layer, which cause feature size to vary from one location to another on the circuit depending on the local thickness of the photoresist layer. The TARC layer may also be used to level (or planarizing) the substrate surface topography, which is invariably present on the device substrate. The anti-reflective top coat step 530 is a typically performed using conventional spin-on photoresist dispense process in which an amount of the TARC material is deposited on the surface of the substrate while the substrate is being rotated which causes a solvent in the TARC material to evaporate and thus densify the TARC layer. The air flow and exhaust flow rate in the coater chamber 60A is controlled to control the solvent vaporization process and the properties of the layer formed on the substrate surface.

The post top coat bake step 532 is a step used to assure that all of the solvent is removed from the deposited TARC layer in the anti-reflective top coat step 530. The temperature of the post top coat bake step 532 is dependent on the type of TARC material deposited on the surface of the substrate, but will generally be less than about 250° C. The time required to complete the post top coat bake step 532 will depend on the temperature of the process run during the post top coat bake step, but will generally be less than about 60 seconds.

The post top coat chill step 534 is a step used to control the time the substrate is at a temperature above ambient temperature is controlled so that every substrate sees the same time-temperature profile and thus process variability is minimized. Variations in the TARC process time-temperature profile, which is a component of a substrates wafer history, can have an affect on the properties of the deposited film layer and thus is often controlled to minimize process variability. The post top coat chill step 534, is typically used to cool the substrate after the post top coat bake step 532 to a temperature at or near ambient temperature. The time required to complete the post top coat chill step 534 will depend on the temperature of the substrate exiting the post top coat bake step 532, but will generally be less than about 30 seconds.

The post develop bake step 552 is a step used to assure that all of the developer solvent is removed from the remaining photoresist layer after the develop step 550. The temperature of the post develop bake step 552 is dependent on the type of photoresist material deposited on the surface of the substrate, but will generally be less than about 250° C. The time required to complete the post develop bake step 552 will depend on the temperature of the substrate during the post photoresist bake step, but will generally be less than about 60 seconds.

The post develop chill step 554 is a step used to control and assure that the time the substrate is at a temperature above ambient temperature is controlled so that every substrate sees the same time-temperature profile and thus process variability is minimized. Variations in the develop process time-temperature profile, can have an effect on properties of the deposited film layer and thus is often controlled to minimize process variability. The temperature of the post develop chill step 554, is thus used to cool the substrate after the post develop bake step 552 to a temperature at or near ambient temperature. The time required to complete the post develop chill step 554 will depend on the temperature of the substrate exiting the post develop bake step 552, but will generally be less than about 30 seconds.

The SAFIER™ (Shrink assist film for enhanced resolution) coat step 551, is a process in which a material is deposited over the remaining photoresist layer after the develop step 550 and then baked in the post develop bake step 552. The SAFIER™ process is typically used to cause physical shrinkage of IC trench patterns, vias and contact holes with very little deterioration of the profile and also improve line edge roughness (LER). The SAFIER™ coat step 551 is typically performed using conventional spin-on photoresist dispense process in which an amount of the SAFIER™ material is deposited on the surface of the substrate while the substrate is being rotated.

Processing Racks

FIGS. 4A-J illustrate side views of one embodiment of a front end processing rack 52, a first central processing rack 152, a second central processing rack 154, a rear processing rack 202, a first rear processing rack 302, a second rear processing rack 304, a first processing rack 308, a second processing rack 309, a first central processing rack 312, a second central processing rack 314, a first rear processing rack 318 and a second rear processing rack 319, that contain multiple substrate processing chambers to perform various aspects of the substrate processing sequence. In general, the processing racks illustrated in FIGS. 4A-J may contain one or more process chambers, such as, one or more coater chambers 60A, one or more developer chambers 60B, one or more chill chambers 80, one or more bake chambers 90, one or more PEB chambers 130, one or more support chambers 65, one or more OEBR chambers 62, one or more twin coater/developer chambers 350, one or more bake/chill chambers 800, and/or one or more HMDS chambers 70, which are further described below. The orientation, type, positioning and number of process chambers shown in the FIGS. 4A-J are not intended to be limiting as to the scope of the invention, but are intended to illustrate the various embodiments of the invention. In one embodiment, as shown in FIGS. 4A-J, the process chambers are stacked vertically, or one chamber is positioned substantially above another chamber, to reduce the footprint of the cluster tool 10. In another embodiment, the chambers stacked vertically so that the processing chambers are positioned in a horizontally staggered pattern, one chamber is positioned partially above another chamber, to help make more efficient use of the processing rack space when one or more chambers are different physical sizes. In yet another embodiment, the process chambers may be staggered vertically, the base of the process chambers do not share a common plane, and/or are horizontally staggered, where a side of a process chamber does not share a common plane with another process chamber. Minimizing the cluster tool footprint is often an important factor in developing a cluster tool, since the clean room space, where the cluster tool may be installed, is often limited and very expensive to build and maintain.

Figures 4A, 4B:
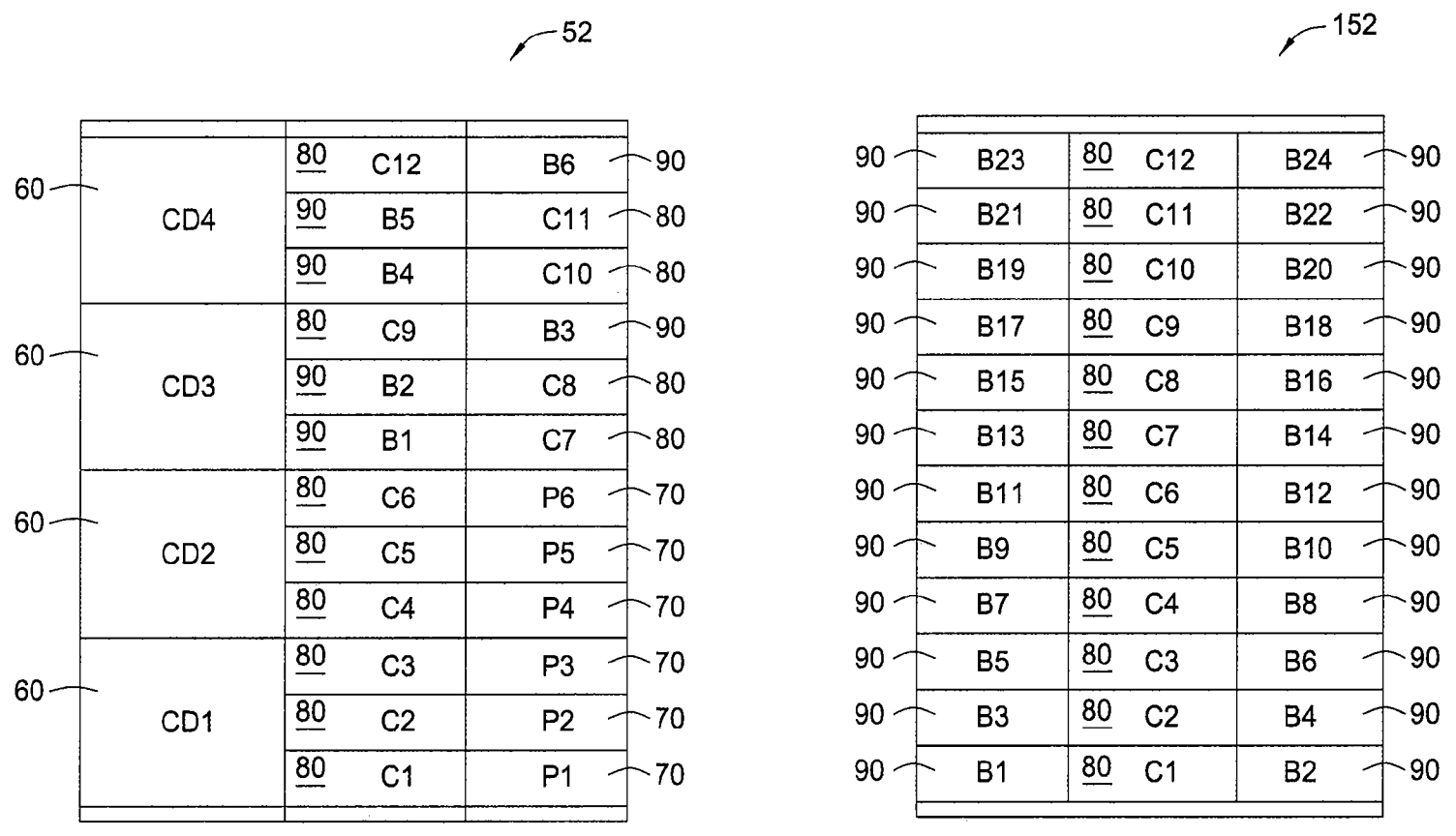

FIG. 4A illustrates a side view of the front end processing rack 52 as viewed from outside the cluster tool 10 and in front of the pod assemblies 105 when facing the central robot 107 and thus will coincide with the view shown in FIGS. 1A-B and FIGS. 2A-C. In one embodiment, as shown in FIG. 4A, the front end processing rack 52 contains four coater/developer chambers 60 (labeled CD1-4), twelve chill chambers 80 (labeled C1-12), six bake chambers 90 (labeled B1-6) and/or six HMDS process chambers 70 (labeled P1-6).

FIG. 4B illustrates a side view of the first central processing rack 152 as viewed from outside the cluster tool 10 while facing the central robot 107 and thus will coincide with the view shown in FIGS. 1A-B and FIGS. 2A-C. In one embodiment, as shown in FIG. 4B, the first central processing rack 152 contains twelve chill chambers 80 (labeled C1-12) and twenty four bake chambers 90 (labeled B1-24).

Figures 4C, 4D:
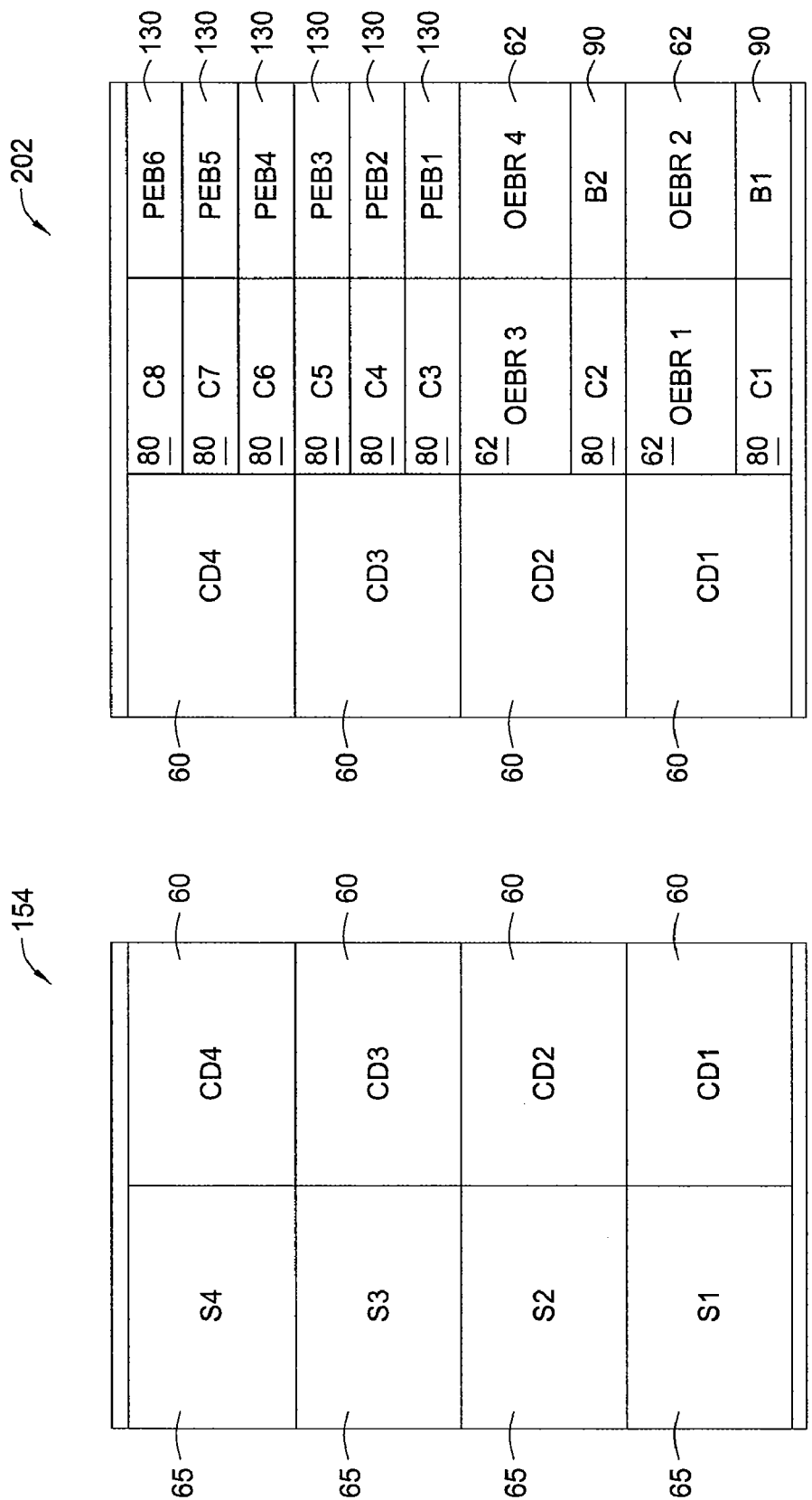
FIG. 4C is a side view that illustrates one embodiment of the second processing rack 154 according to the present invention.
FIG. 4D is a side view that illustrates one embodiment of the rear processing rack 202 according to the present invention.

FIG. 4C illustrates a side view of the second central processing rack 154 as viewed from outside the cluster tool 10 while facing the central robot 107 and thus will coincide with the view shown in FIGS. 1A-B and FIGS. 2A-C. In one embodiment, as shown in FIG. 4C, the second central processing rack 154 contains four coater/developer chambers 60 (labeled CD1-4) and four support chambers 65 (labeled S1-4). In one embodiment, the four support chambers 65 are replaced with four coater/developer chambers 60.

FIG. 4D illustrates a side view of the rear processing rack 202 as viewed from outside the cluster tool 10 while facing the central robot 107 and thus coincides with the views shown in FIGS. 1A-B and FIG. 2B. In one embodiment, as shown in FIG. 4D, the rear processing rack 202 contains four coater/developer chambers 60 (labeled CD1-4), eight chill chambers 80 (labeled C1-8), two bake chambers 90 (labeled B1-24), four OEBR chambers 62 (labeled OEBR1-4), and six PEB chambers 130 (labeled PEB1-6).

FIG. 4E illustrates a side view of the first rear processing rack 302 as viewed from outside the cluster tool 10 while facing the rear robot 109 and thus will coincide with the view shown in FIG. 2C. In one embodiment, as shown in FIG. 4E, the first rear processing rack 302 contains four coater/developer chambers 60 (labeled CD1-4), eight chill chambers 80 (labeled C1-8), two bake chambers 90 (labeled B1-24), four OEBR chambers 62 (labeled OEBR1-4), and six PEB chambers 130 (labeled PEB1-6).

FIG. 4F illustrates a side view of the second rear processing rack 304 as viewed from outside the cluster tool 10 while facing the rear robot 109 and thus will coincide with the view shown in FIG. 2C. In one embodiment, as shown in FIG. 4F, the second rear processing rack 304 contains four coater/developer chambers 60 (labeled CD1-4) and four support chambers 65 (labeled S1-4). In one embodiment, the four support chambers 65 are replaced with four coater/developer chambers 60.

Figure 4H:
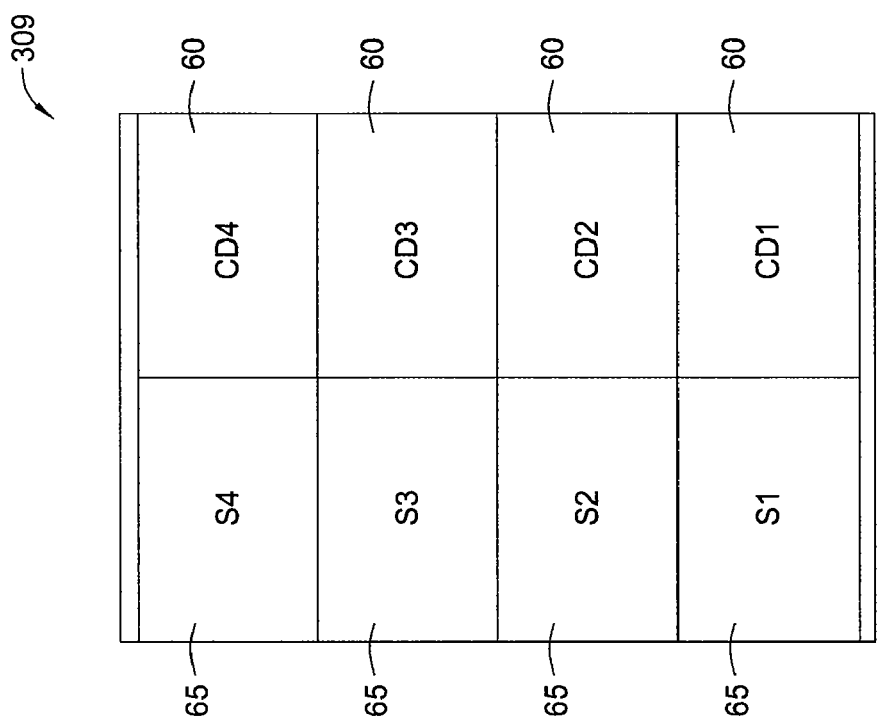
FIG. 4H is a side view that illustrates one embodiment of the second processing rack 309 according to the present invention.
Figure 4G:
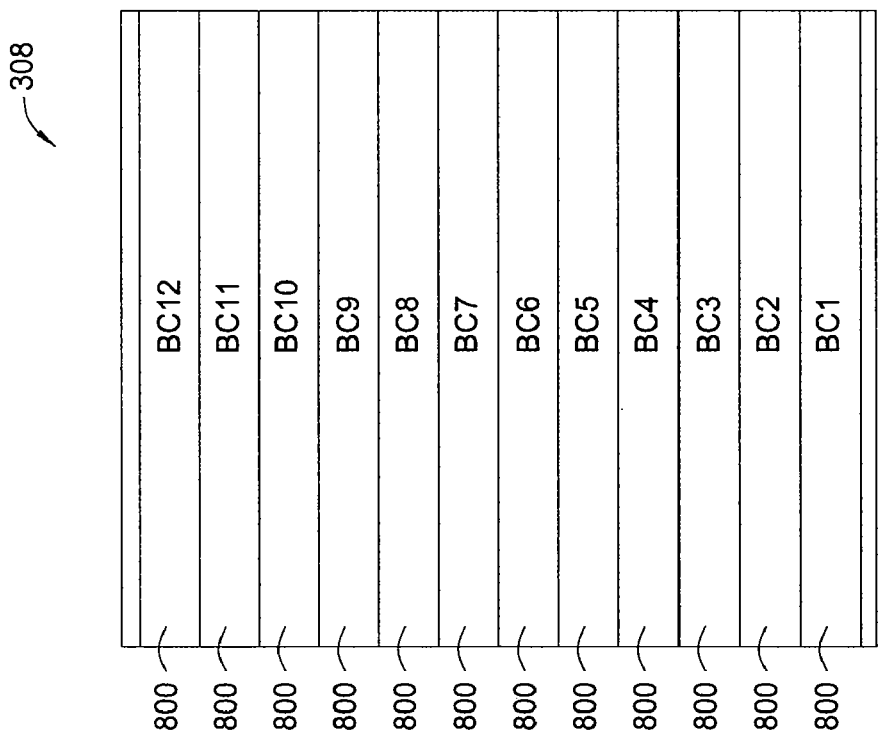
FIG. 4G is a side view that illustrates one embodiment of the first processing rack 308 according to the present invention.

FIG. 4G illustrates a side view of the first processing rack 308 as viewed from outside the cluster tool 10 while facing the front end robot 108 and thus will coincide with the views shown in FIGS. 2F-G. In one embodiment, as shown in FIG. 4G, the first processing rack 308 contains twelve bake/chill chambers 800 (labeled BC1-12) which are described below in conjunction with FIG. 18.

FIG. 4H illustrates a side view of the second processing rack 309 as viewed from outside the cluster tool 10 while facing the front end robot 108 and thus will coincide with the view shown in FIGS. 2F-G. In one embodiment, as shown in FIG. 4H, the second processing rack 309 contains four coater/developer chambers 60 (labeled CD1-4) and four support chambers 65 (labeled S1-4). In one embodiment, the four support chambers 65 are replaced with four coater/developer chambers 60.

Figures 4I, 4J:
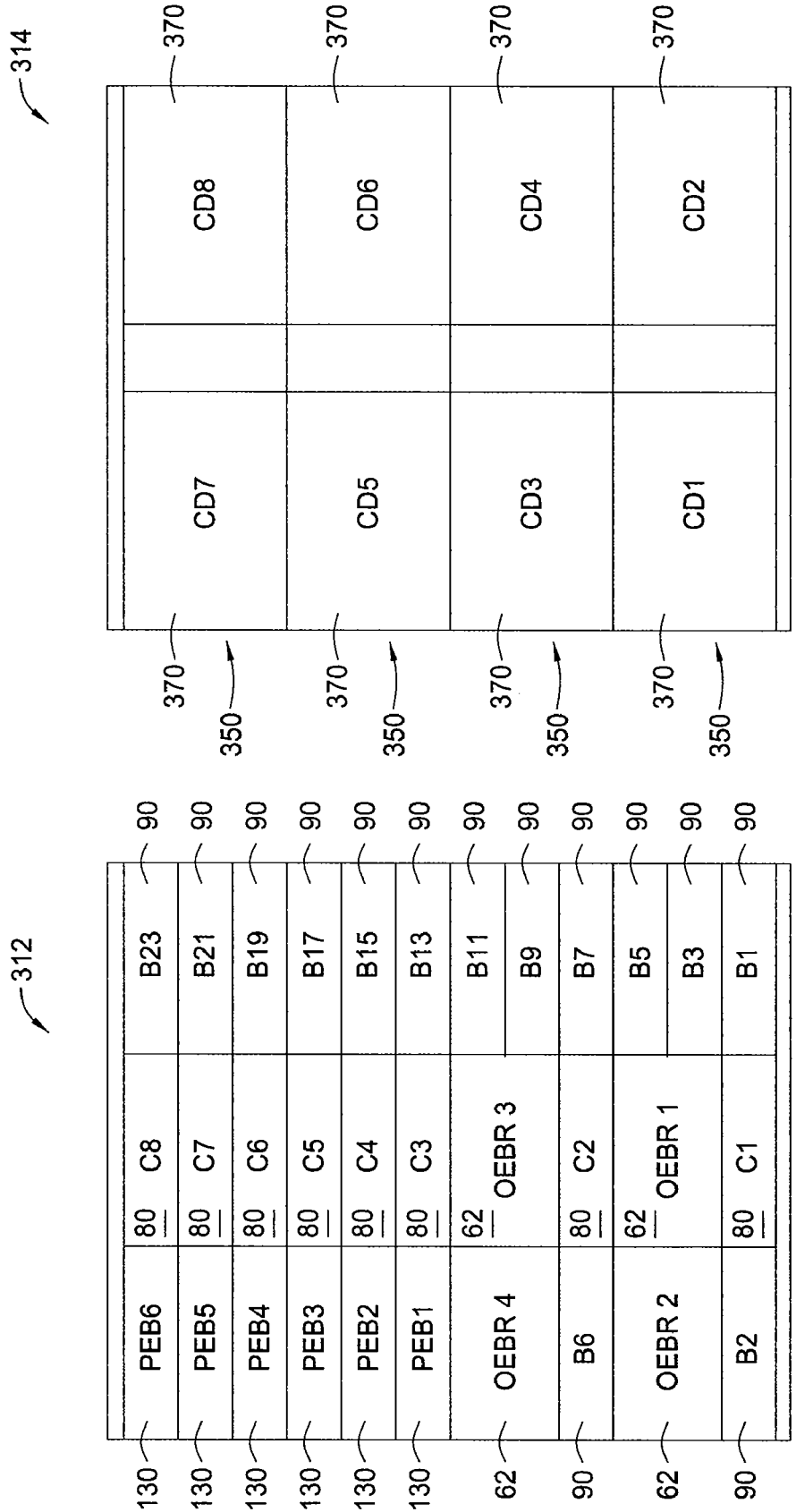
FIG. 4I is a side view that illustrates one embodiment of the first central processing rack 312 and the first rear processing rack 318, according to the present invention.
FIG. 4J is a side view that illustrates one embodiment of the second central processing rack 314 and the second rear processing rack 319, according to the present invention.

FIG. 4I illustrates a side view of the first central processing rack 312, or the first rear processing rack 318, as viewed from outside the cluster tool 10 while facing the central robot 107, or rear robot 109, and thus will coincide with the views shown in FIGS. 2F-G. In one embodiment, as shown in FIG. 4I, the first central processing rack 312, or the first rear processing rack 318, contains eight chill chambers 80 (labeled C1-8), fourteen bake chambers 90 (labeled B1, B2, B3, B5, B6, B7, etc.), four OEBR chambers 62 (labeled OEBR1-4), and six PEB chambers 130 (labeled PEB1-6). In another embodiment, the first central processing rack 312, or the first rear processing rack 318, may be arranged like the configuration illustrated in FIG. 4G, which contains twelve chill chambers 80 and twenty four bake chambers 90.

FIG. 4J illustrates a side view of the second central processing rack 314, or the second rear processing rack 319, as viewed from outside the cluster tool 10 while facing the central robot 107 (or rear robot 109) and thus will coincide with the views shown in FIGS. 2F-G. In one embodiment, as shown in FIG. 4J, the second central processing rack 314, or the second rear processing rack 319, contains four twin coater/developer chambers 350, which contain four pairs of process chambers 370 that may be configured as coater chambers 60A, as developer chambers 60B or combinations thereof.

Figure 4K:
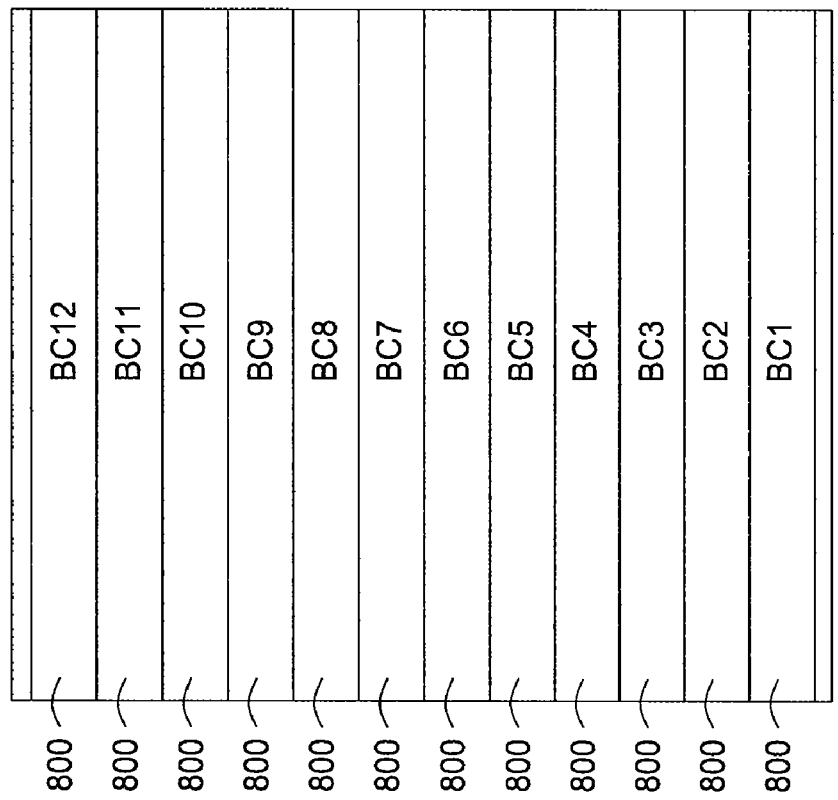
FIG. 4K is a side view that illustrates one embodiment of the first processing rack 322 according to the present invention.

FIG. 4K illustrates a side view of the first processing rack 322 as viewed from outside the cluster tool 10 while facing the front end robot 108 and thus will coincide with the views shown in FIG. 2E. In one embodiment, as shown in FIG. 4K, the first processing rack 322 contains twelve bake/chill chambers 800 (labeled BC1-12) which are described below in conjunction with FIGS. 18A-B.

Coater/Developer Chamber

The coater/developer chamber 60 is a processing chamber that may be adapted to perform, for example, the BARC coat step 510, the photoresist coat step 520, the anti-reflective top coat step 530, the develop step 550, and/or the SAFIER™ coat step 551, which are shown in FIGS. 3A-C. The coater/developer chamber 60 may generally be configured into two major types of chambers, a coater chamber 60A, shown in FIG. 5A, and a developer chamber 60B, shown in FIG. 5D (discussed below).

FIG. 5A, is a vertical sectional view of one embodiment of the coater chamber 60A, that may be adapted to perform the BARC coat step 510, the photoresist coat step and the anti-reflective top coat step 530. The coater chamber 60A may contain an enclosure 1001, a gas flow distribution system 1040, a coater cup assembly 1003, and a fluid dispense system 1025. The enclosure 1001 generally contains side walls 1001A, a base wall 1001B, and a top wall 1001C. The coater cup assembly 1003, which contains the processing region 1004 in which the substrate "W" is processed, also contains a cup 1005, a rotatable spin chuck 1034 and a lift assembly 1030. The rotatable spin chuck 1034 generally contains a spin chuck 1033, a shaft 1032 and a rotation motor 1031, and a vacuum source 1015. The spin chuck 1033, which is attached to the rotation motor 1031 through the shaft 1032, contains a sealing surface 1033A that is adapted to hold the substrate while the substrate is being rotated. The substrate may be held to the sealing surface 1033A by use of a vacuum generated by the vacuum source 1015. The cup 1005 manufactured from a material, such as, a plastic material (e.g., PTFE, PFA, polypropylene, PVDF, etc), a ceramic material, a metal coated with a plastic material (e.g., aluminum or SST coated with either PVDF, Halar, etc.), or other materials that is compatible with the processing fluids delivered from the fluid dispense system 1025. In one embodiment, the rotation motor 1031 is adapted to rotate a 300 mm semiconductor substrate between about 1 revolution per minute (RPM) and about 4000 RPM.

The lift assembly 1030 generally contains an actuator (not shown), such as an air cylinder or servomotor, and a guide (not shown), such as a linear ball bearing slide, which are adapted to raise and lower the rotatable spin chuck 1034 to a desired position. The lift assembly 1030 is thus adapted to position the substrate mounted on the rotatable spin chuck 1034 in the cup 1005 during processing and also lift the substrate above the top of the cup 1005A to exchange the substrate with an external robot (e.g., front end robot 108, central robot 107, rear robot 109, etc. which is not shown) positioned outside the enclosure 1001. A robot blade 611, which is attached to the external robot, enters the enclosure 1001 through the access port 1002 formed in the side wall 1001A.

The gas flow distribution system 1040 is adapted to deliver a uniform flow of a gas through the enclosure 1001 and coater cup assembly 1003 to the exhaust system 1012. In one embodiment the gas flow distribution system 1040 is a HEPA filter assembly which generally contains a HEPA filter 1041 and a filter enclosure 1044. The HEPA filter 1041 and filter enclosure 1044 form a plenum 1042 that allows the gas entering from the gas source 1043 to uniformly flow through the HEPA filter 1041, the enclosure 1001 and the coater cup assembly 1003. In one embodiment, the gas source 1043 is adapted to deliver a gas (e.g., air) at a desired temperature and humidity to the processing region 1004.

The fluid dispense system 1025 generally contains one or more fluid source assemblies 1023 which deliver one or more solution to the surface of a substrate mounted on the spin chuck 1033. FIG. 5A illustrates a single fluid source assembly 1023 which contains a discharge nozzle 1024, a supply tube 1026, a pump 1022, a filter 1021, a suck back valve 1020 and a fluid source 1019. The support arm actuator 1028 is adapted to move the discharge nozzle 1024 and the dispense arm 1027 to a desired position so that a processing fluid can be dispensed from the discharge nozzle 1024 onto a desired position on the surface of the substrate. The processing fluid may be delivered to the discharge nozzle 1024 by use of a pump 1022. The pump 1022 removes a processing fluid from the fluid source 1019 and discharges the processing fluid through the filter 1021, suck back valve 1020 and discharge nozzle 1024 and onto the surface of the substrate. The processing solution discharged from the discharge nozzle 1024 may be dispensed onto the substrate "W" while it is rotated by the spin chuck 1033. The suck back valve 1020 is adapted to draw back an amount of solution from the discharge nozzle 1024 after a desired amount of processing fluid is dispensed on the substrate to prevent dripping of unwanted material on the surface of the substrate. The dispensed processing solution is spun off the edge of the substrate, collected by inner walls of the cup 1005 and diverted to a drain 1011 and ultimately a waste collection system 1010.

Photoresist Thickness Control Chamber

Figure 5B:
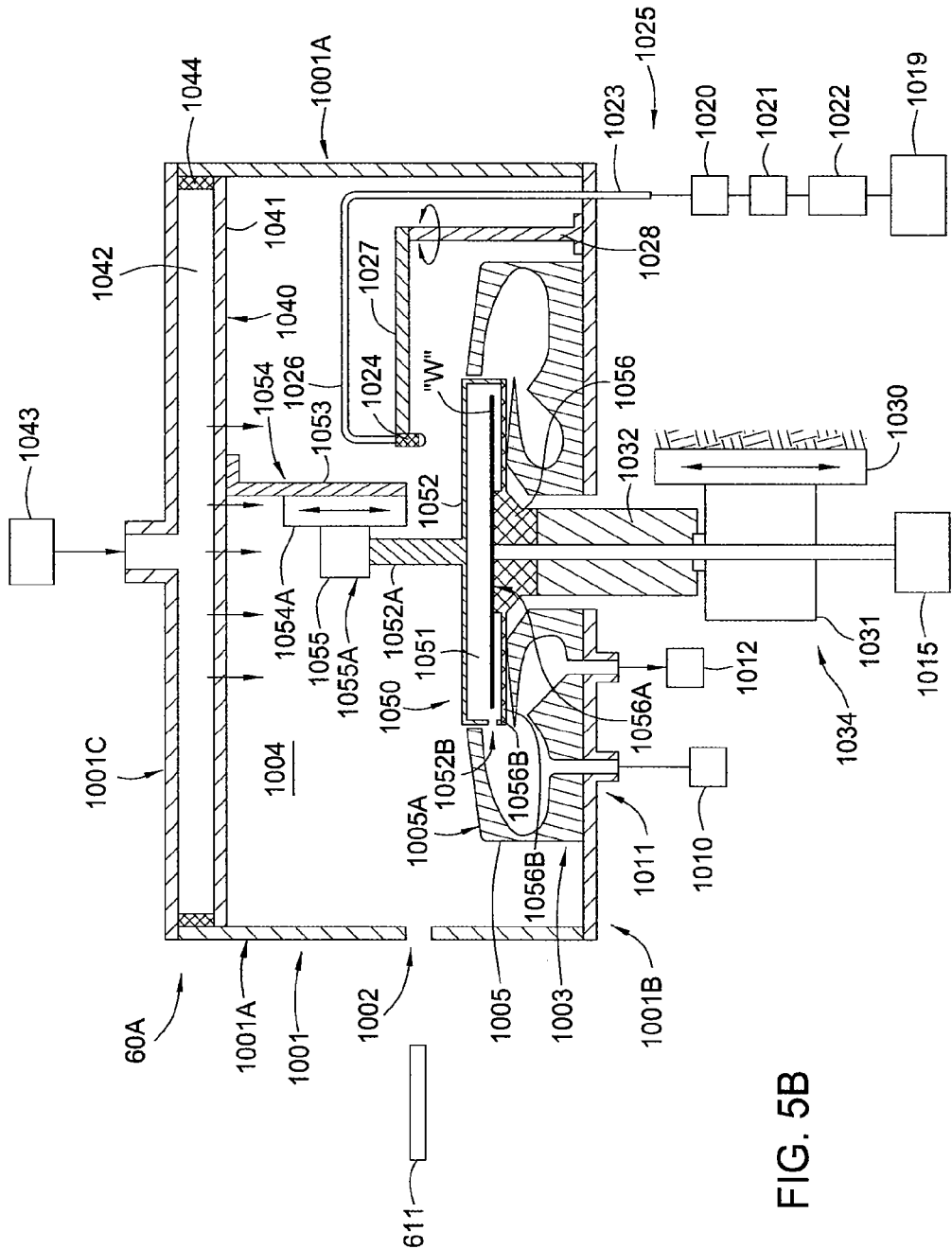
FIG. 5B is a side view that illustrates one embodiment of a coater chamber wherein the present invention may be used to advantage.

FIG. 5B is a side view of another embodiment of the coater chamber 60A, that may be adapted to perform, for example, the BARC coat step 510, the photoresist coat step and the anti-reflective top coat step 530. The embodiment shown in FIG. 5B is adapted to form an enclosure around a substrate during one or more phases of the deposition steps to control the evaporation of the solvent from the surface of the material deposited on the substrate surface to improve the thickness uniformity process results. Traditionally, thickness uniformity control in a typical spin-on type coating process relies on the control of the rotation speed of the substrate and exhaust flow rate to control the vaporization of the uniformity of the final deposited layer. The control of thickness uniformity is dependent on the air flow across the substrate surface during the processing step. The rotation speed during processing is commonly lowered as the diameter of the substrate processed in the coater chamber 60A is increased due to the increased likelihood of aerodynamic variations across the surface of the substrate (e.g., transition from laminar to turbulent flow). It is believed that the aerodynamic variations arise due to the variation in air velocity as a function of substrate radius due to the "pumping effect" caused by the momentum imparted to the air from its interaction with the substrate surface. One issue that arises is that the time it takes to complete the coat step depends on the ability to spread out and remove the required amount of solvent from the thinning photoresist layer, which is a function of the rotation speed of the substrate. The higher the rotation speed the shorter the processing time. Therefore, in one embodiment, an enclosure is placed around the substrate to control the environment around the surface of the substrate to improve the thickness uniformity control for larger substrate sizes. The improved uniformity control is believed to be due to the control of the vaporization of the solvent, since the enclosure formed around the substrate tends to prevent of gas flow across the surface of the substrate, and thus allows the photoresist to spread out before an appreciable amount of solvent has evaporated from the photoresist.

The coater chamber 60A in this embodiment generally contains an enclosure 1001, a gas flow distribution system 1040, a coater cup assembly 1003, an processing enclosure assembly 1050, and a fluid dispense system 1025. The embodiment illustrated in FIG. 5B contains a number of components described above in reference to the coater chamber 60A described in FIG. 5A and thus the reference numbers for the same or similar components have been reused in FIG. 5B for clarity. It should be noted that the spin chuck 1033 illustrated in FIG. 5A is replaced, in this embodiment, by the enclosure coater chuck 1056 that has an enclosure coater chuck sealing surface 1056A on which the substrate rests and a chuck base region 1056B.

FIG. 5B illustrates the processing enclosure assembly 1050 in the processing position. It should be noted that in the "exchange position" (not shown) the enclosure lid 1052 is separated from the chuck base region 1056B so that a substrate can be transferred to the enclosure coater chuck 1056 by use of a robot blade 611 attached to an external robot (e.g., front end robot 108, central robot 107, etc.). The processing enclosure assembly 1050 which contains an enclosure lid 1052 and the chuck base region 1056B which form a processing region 1051 around the substrate so that the processing environment can be controlled during different phases of the coating process. The processing enclosure assembly 1050 generally contains an enclosure lid 1052, the spin chuck 1033, a rotation assembly 1055, and a lift assembly 1054. The lift assembly 1054 generally contains a lift actuator 1054A and lift mounting bracket 1053 which may be attached to a rotation assembly 1055 and a surface of the enclosure 1001. The lift actuator 1054A generally contains an actuator (not shown), such as an air cylinder or DC servomotor, and a guide (not shown), such as a linear ball bearing slide, that are adapted to raise and lower all of the components contained in the processing enclosure assembly 1050, except the spin chuck 1033.

The rotation assembly 1055 generally contains one or more rotation bearings (not shown) and a housing 1055A that are adapted to allow the enclosure lid 1052 to be rotated as the enclosure coater chuck 1056 is rotated. In one embodiment, the housing 1055A is rotated as the spin chuck 1033 is rotated by the rotation motor 1031, due to friction created by the contact between the enclosure lid 1052 and the chuck base region 1056B. The enclosure lid 1052 is attached to the rotation bearings through the lid shaft 1052A. In one embodiment, the contact between the enclosure lid 1052 and the chuck base region 1056B is initiated by the movement of the lift assembly 1030, the lift assembly 1054 or both lift assemblies moving together.

In one embodiment, when the enclosure lid 1052 and the chuck base region 1056B are in contact, a seal is formed, thus creating an enclosed processing environment around the substrate. In one embodiment, the volume of the processing region 1051 is intended to be rather small to control the vaporization of a solvent from the photoresist on the surface of the substrate, for example, the gap between the enclosure lid 1052 and/or the chuck base region 1056B to the substrate may be about 3 mm.

In one embodiment, a photoresist material is delivered to the processing region 1051 through a tube (not shown) in a clearance hole (not shown) in the lid shaft 1052A, while the enclosure lid 1052 and chuck base region 1056B are in contact and the substrate is being rotated at a first rotational speed. In this step the photoresist will tend to spread out due to the centrifugal force effects caused by the rotation, but the photoresist's ability to change properties is restricted due to the formation of a solvent rich vapor over the surface of the substrate. After dispensing the photoresist the enclosure lid 1052 and enclosure coater chuck 1056 may then be rotated at a second rotational speed until the photoresist is thinned to a desired thickness at which time the enclosure lid 1052 is lifted from the surface of the enclosure coater chuck 1056, to allow the solvent remaining in the photoresist to escape and thus complete the final solvent vaporization process.

In another embodiment, the photoresist is dispensed using a conventional extrusion dispense process (e.g., sweep a photoresist dispensing arm (not shown) across a stationary substrate), after which the substrate is enclosed in the processing enclosure assembly 1050 and rotated at a desired speed to achieve a uniform layer of a desired thickness. After the desired thickness has been achieved the enclosure lid 1052 is separated from the enclosure coater chuck 1056 to allow the complete vaporization of the solvent from the photoresist.

In one embodiment of the enclosure lid 1052, a plurality of holes 1052B are formed in the outer wall of the enclosure lid 1052 to allow the excess photoresist to exit the processing region 1051 during processing. In this configuration air flow across the surface of the substrate is still prevented or minimized due to lack of an entry and/or exit points for the flowing air. In this configuration, due to the centrifugal force acting on the air and photoresist which will cause them to flow out of the holes 1052B, the pressure in the processing region 1051 will drop below ambient pressure. In one embodiment, the pressure in the processing region may be varied during different phases of the process to control the vaporization of the photoresist, by varying the rotation speed of the substrate, enclosure lid 1052 and enclosure coater chuck 1056.

In one embodiment, a solvent rich vapor is injected into the processing region 1051 through a hole in the lid shaft 1052A during processing to control the final thickness and uniformity of the photoresist layer.

Showerhead Fluid Dispensing System for Solvent/Developer Dispense

In an effort to achieve a uniform and repeatable photoresist layer on the surface of a substrate, prior art designs have emphasized the design of the coater chamber cup geometry, method of spinning the substrate, varying the air flow through the processing region of the chamber, and designing photoresist dispensing hardware that improves process of dispensing the photoresist layer. These designs achieve one level of uniformity at varying levels of complexity and cost. Due to the need to reduce CoO and the ever increasing process uniformity requirements further improvement is needed.

Figure 5C:
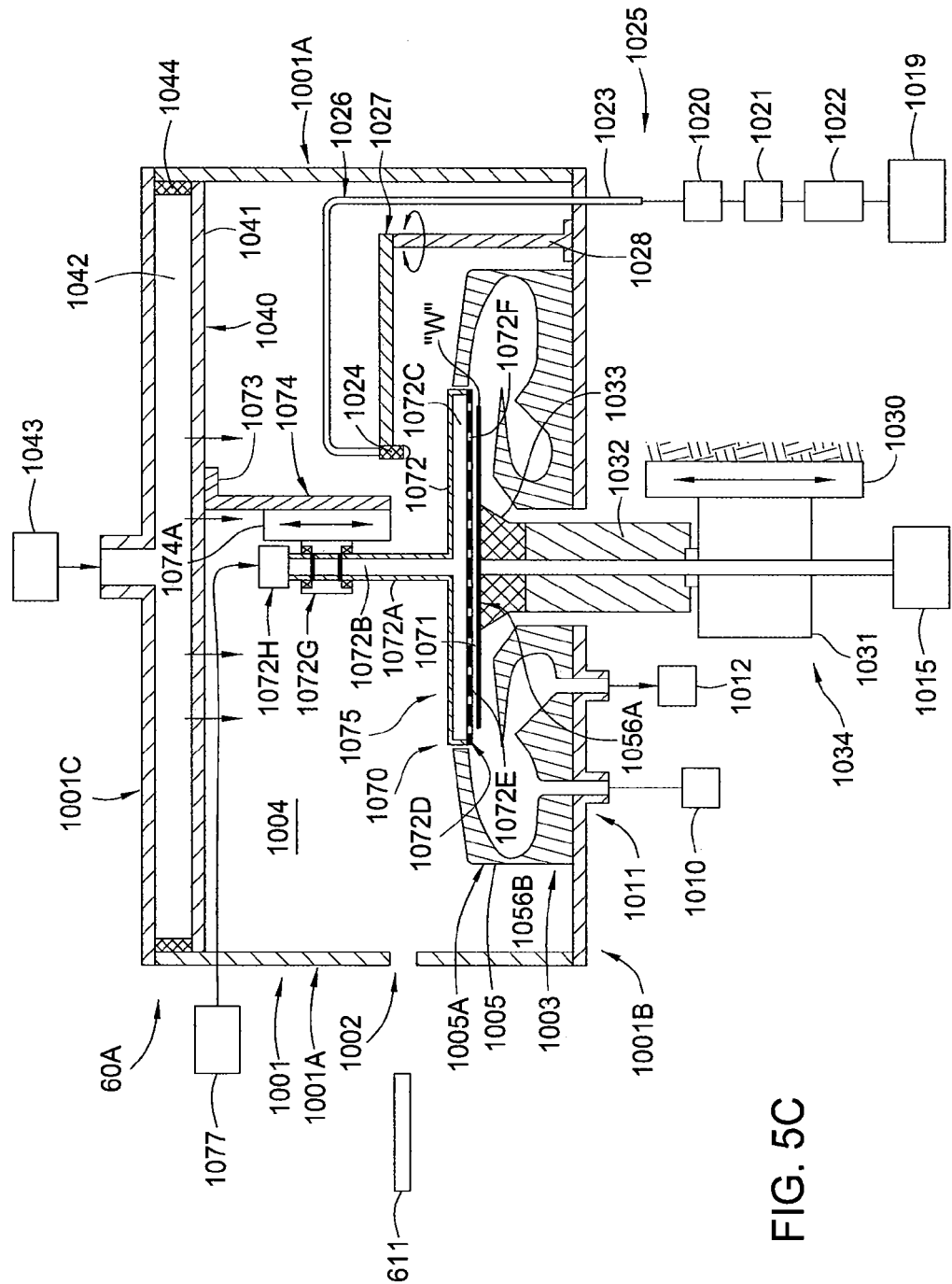
FIG. 5C is a side view that illustrates one embodiment of a coater/developer chamber that contains a showerhead assembly wherein the present invention may be used to advantage

FIG. 5C illustrates one embodiment of the coater/developer chamber 60, which contains a fluid distribution device 1070 that is adapted to deliver a fluid to the surface of the substrate during the coating process, to enhance the process uniformity results. In one aspect of the invention, the fluid is a solvent found in the photoresist layer so that the evaporation process can be controlled. In this configuration the fluid distribution device 1070 may be raised and lowered relative to the substrate surface by use of a lift assembly 1074 so that an optimum gap between the fluid distribution device 1070 and the surface of the substrate can be achieved so that the surface of the deposited layer can be uniformly saturated with the dispensed fluid. In one embodiment, the gap is between about 0.5 mm and about 15 mm. The lift assembly 1074 generally contains a lift actuator 1074A and lift mounting bracket 1073 which may be attached to a showerhead assembly 1075 and a surface of the enclosure 1001. The lift actuator 1074A generally contains an actuator (not shown), such as an air cylinder or DC servomotor, and a guide (not shown), such as a linear ball bearing slide, that are adapted to raise and lower all of the components contained in the fluid distribution device 1070.

FIG. 5C illustrates the fluid distribution device 1070 in the processing position. The fluid distribution device 1070 contains a showerhead assembly 1075 which forms a processing region 1071 between the substrate and the fluid distribution device 1070 so that the processing environment can be controlled during different phases of the coating process. The fluid distribution device 1070 generally contains a showerhead assembly 1075, a fluid source 1077 and a lift assembly 1074.

The showerhead assembly 1075 generally contains a showerhead base 1072, a shaft 1072A and a showerhead plate 1072D. The shaft 1072A is attached to the showerhead base 1072 and has a center hole 1072B formed in the shaft to allow fluid delivered from the fluid source 1077 to flow into a plenum 1072C formed within the showerhead base 1072. The showerhead plate 1072D, which is attached to the showerhead base 1072, contains a plurality of holes 1072F formed therein that connect the plenum 1072C, and thus the fluid source 1077, to the lower surface 1072E of the showerhead plate 1072D. During processing, a processing fluid is dispensed from the fluid source 1077 into the center hole 1072B, where it enters the plenum 1072C and then flows through the plurality of holes 1072F and into the processing region 1071 formed between the substrate and the lower surface 1072E. In one embodiment, the hole size, number of holes and distribution of the plurality of holes 1072F across the showerhead plate 1072D are designed to uniformly deliver the processing fluid to the processing region 1071. In another embodiment, the hole size, number of holes and distribution of the plurality of holes 1072F across the showerhead plate 1072D are unevenly spaced across the showerhead plate 1072D to deliver a desired non-uniform distribution of a processing fluid to the processing region 1071. A non-uniform pattern may be useful to correct the thickness variations caused by aerodynamic or other effects that may cause thickness variations in the deposited photoresist layer.

In one embodiment, the showerhead assembly 1075 contains a motor 1072G and a rotary seal 1072H that are adapted to rotate and deliver a processing fluid to the showerhead assembly 1075 during processing. The rotary seal 1072H may be a dynamic lip seal, or other similar device that are well known in the art.

Photoresist Nozzle Rinse System

Figure 6A:
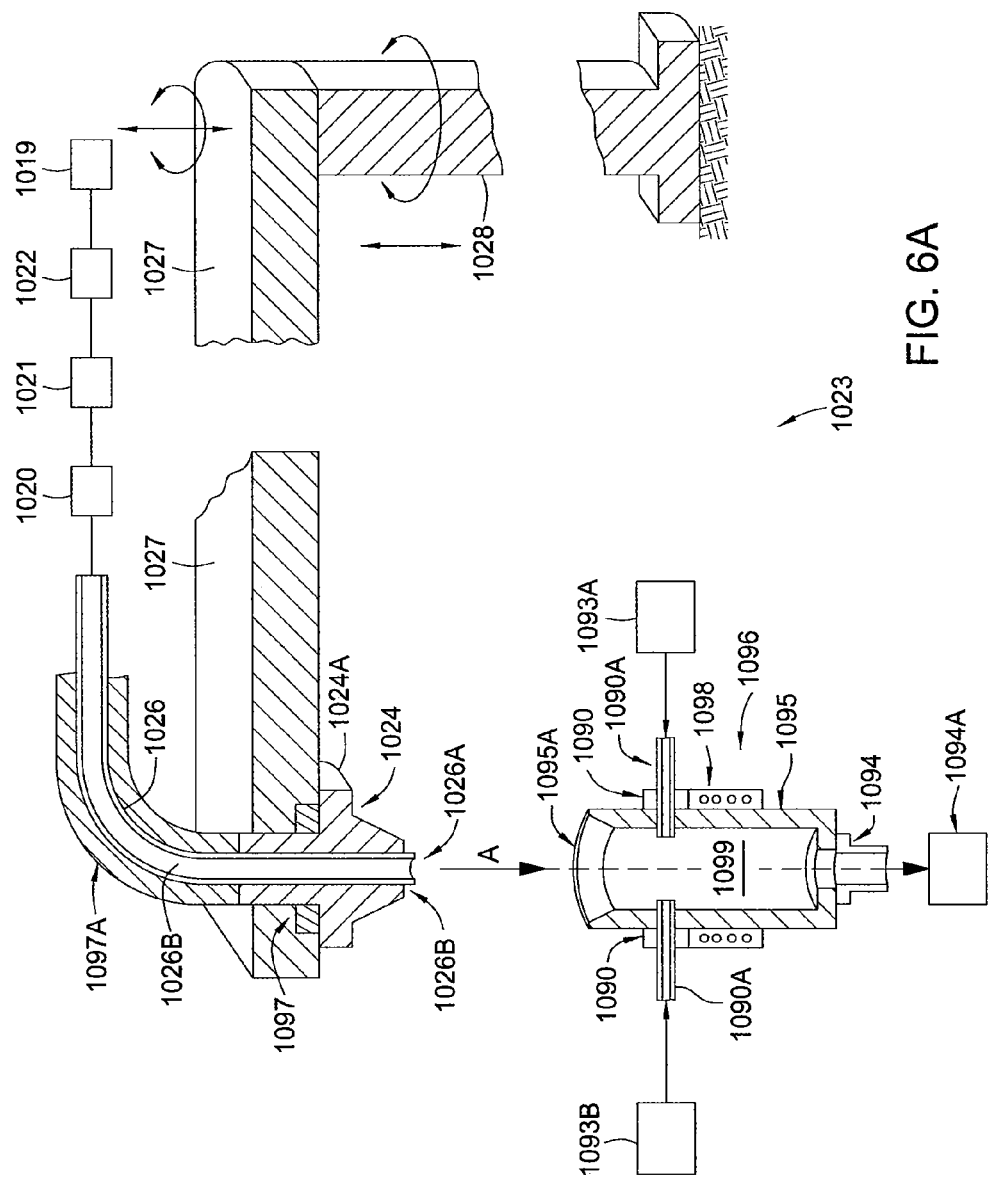
FIG. 6A is an exploded isometric view of one embodiment of the fluid source assembly.
Figure 6B:
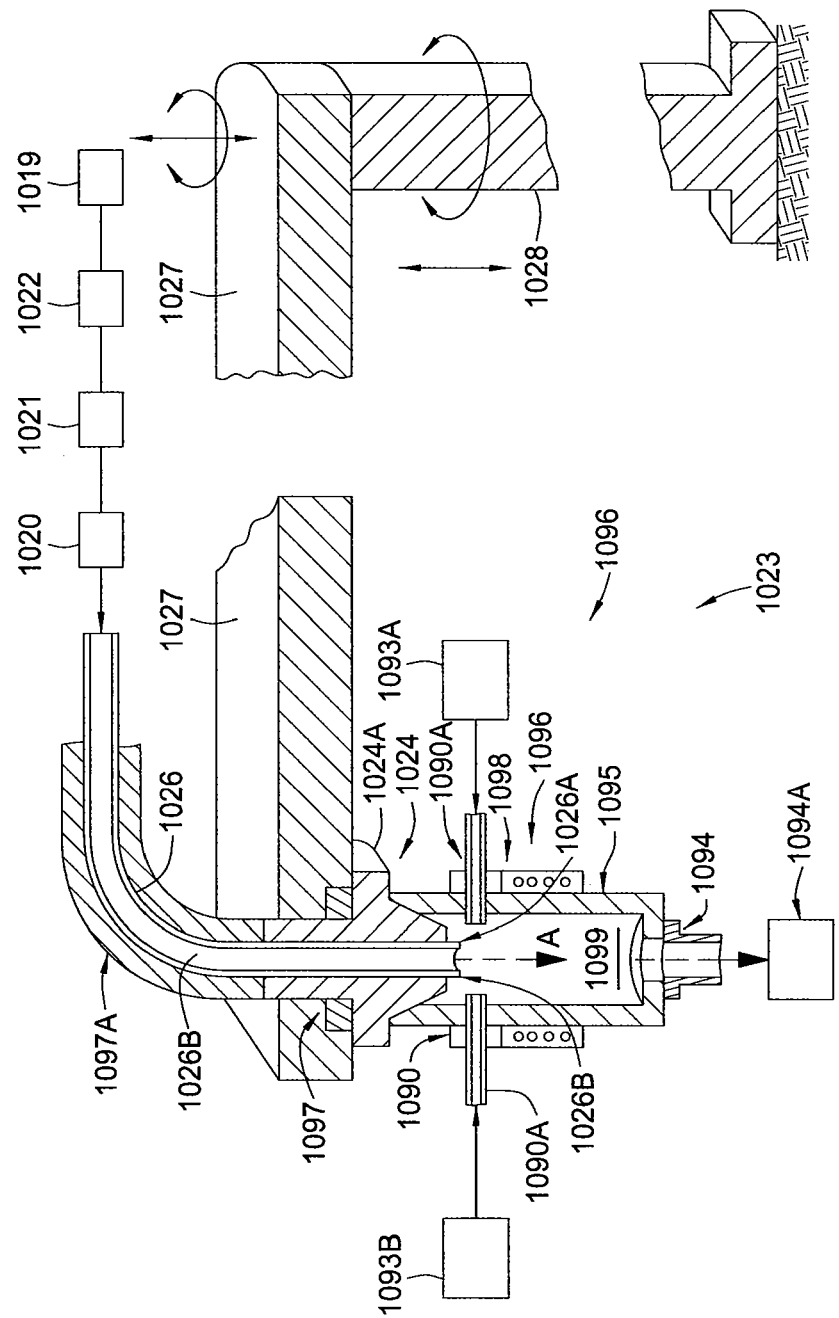
FIG. 6B is an exploded isometric view of one embodiment of the fluid source assembly.

FIGS. 6A-B are isometric views that illustrate one embodiment of a fluid source assembly 1023, described above, that also contains an encapsulating vessel assembly 1096. To reduce the possibility of contamination of the discharge nozzle 1024, to try to prevent the processing fluid in the supply tube 1026 from drying out, and/or to clean various components of the fluid source assembly 1023 (e.g., discharge nozzle 1024, supply tube outlet 1026A, etc.), during idle times or between processing steps the discharge nozzle 1024 is positioned over the vessel opening 1095A (see FIG. 6A) to form a controlled region in the environment region 1099. This configuration may be advantageous where the processing fluid, such as photoresist, is used, since it can easily dry and flake causing particle problems as the discharge nozzle 1024 is brought over the substrate surface in subsequent processing steps. In one embodiment, the discharge nozzle 1024, as shown in FIGS. 6A-B, contains a nozzle body 1024A that is configured to hold and support the supply tube 1026 so that the processing fluid can be cleanly and repeatably dispensed through the supply tube outlet 1026A.

FIG. 6A illustrates a configuration where the discharge nozzle 1024 is separated from the encapsulating vessel assembly 1096 so that it can be rotated to dispense the processing fluid on the surface of the substrate. The encapsulating vessel assembly 1096 generally contains one or more rinse nozzles 1090, a vessel 1095, a drain 1094, and a vessel opening 1095A. The rinse nozzles 1090, which are connected to the tubing 1090A, are in communication with one or more fluid delivery sources 1093 (two are shown in FIGS. 6A-B see items 1093A-B). The drain 1094 is generally connected to a waste collection system 1094A

Referring to FIG. 6B, in an effort to reduce contamination of the substrate during processing the discharge nozzle 1024 and supply tube outlet 1026A are cleaned by use of one or more rinse nozzles 1090 that are attached to the fluid delivery sources 1093 which can deliver one or more cleaning solutions to the nozzles. In one embodiment, the cleaning solution is a solvent that can remove leftover photoresist leftover after completing a dispense process. The number and orientation of the nozzles may be arranged so that all sides and surfaces of the discharge nozzle 1024 and supply tube outlet 1026A are cleaned. After cleaning the remaining vapors retained in the environment region 1099 of the vessel 1095 may be useful to prevent the processing fluid(s) retained in the supply tube 1026 from drying out.

Point of Use Photo Resists Temperature Control

To assure a uniform and repeatable coating process the dispensed photoresist temperature is often tightly controlled since the properties and process results can be greatly affected by the temperature of dispensed photoresist. The optimum dispense temperature may vary from one photoresist to another. Therefore, since the coater chamber 60A may contain multiple fluid source assemblies 1023 to run different process recipes containing different photoresist materials, the temperature of the fluid source assemblies 1023 will each need to be independently controlled to assure desirable process results are consistently achieved. Embodiments of the invention provide various hardware and methods for controlling the temperature of a photoresist before it is dispensed on the surface of a substrate during a coat or develop process.

In one embodiment, as shown in FIGS. 6A and 6B, the discharge nozzle 1024 contains a heat exchanging device 1097 that is adapted to heat and/or cool the nozzle body 1024A, the supply tube 1026 and the processing fluid contained in the supply tube 1026. In one embodiment, the heat exchanging device is a resistive heater that is adapted to control the temperature of the processing fluid. In another embodiment, the heat exchanging device 1097 is a fluid heat exchanger that is adapted to control the temperature of the processing fluid by use of a fluid temperature controlling device (not shown) that causes a working fluid to flow through the fluid heat exchanger to control the temperature of the processing fluid. In another embodiment, the heat exchanging device is a thermoelectric device that is adapted to heat or cool the processing fluid. While FIGS. 6A and 6B show the heat exchanging device 1097 in communication with the nozzle body 1024A, other embodiments of the invention may include configurations where the heat exchanging device 1097 is in contact with the supply tube 1026 and/or the nozzle body 1024A to effectively control the temperature of the processing fluid. In one embodiment, a length of the supply tube 1026 is temperature controlled by use of a second heat exchanger 1097A to assure that all of the volume of the dispensed processing fluid retained in the supply tube inner volume 1026B will be dispensed on the surface of the substrate during the next process step is at a desired temperature. The second heat exchanger 1097A may be an electric heater, a thermoelectric device and/or a fluid heat exchanging device, as described above.

In one embodiment, the encapsulating vessel assembly 1096 is temperature controlled to assure that the temperature of the nozzle body 1024A and processing fluid in the supply tube 1026 are maintained at a consistent temperature when the discharge nozzle 1024 is positioned over the vessel opening 1095A (see FIG. 6B). Referring to FIGS. 6A-B, the vessel 1095 can be heated or cooled by use of a vessel heat exchanging device 1098 that is attached to the walls of the vessel 1095. The vessel heat exchanging device 1098 may be an electric heater, a thermoelectric device and/or a fluid heat exchanging device, as described above, which in conjunction with the system controller 101 is used to thus control the temperature of the vessel 1095.

In one embodiment, the temperature of the rinse nozzles 1090 and connected to the tubing 1090A are temperature controlled to assure that the cleaning solution sprayed on the discharge nozzle 1024 and supply tube outlet 1026A are at desired temperature so the processing fluid in the supply tube 1026 is not heated or cooled during the clean process.

Coater Nozzle Placement System

To assure uniform and repeatable process results the position where the photoresist material is dispensed on the substrate surface is preferably tightly controlled. The uniformity of the deposited photoresist layer can be affected by the position on the substrate surface at which the photoresist is dispensed. Therefore, it is common for the dispense arm 1027 position to be accurately controlled by use of an often expensive support arm actuator 1028 that is capable of precisely positioning the discharge nozzle 1024. An issue arises in that it is common for coater chambers 60A to have multiple discharge nozzles 1024 to dispense multiple different photoresist materials, which greatly increases the cost and complexity of the coater chamber 60A, due to the need to accurately or precisely control many dispense arms 1027. Therefore, various embodiments of the invention provide an apparatus and method that utilizes a single dispense arm 1027 that can be easily calibrated since there is only one arm to calibrate and also accurately control. In this configuration the multiple discharge nozzles 1024 found in the various fluid source assemblies 1023 are exchanged with the single dispense arm 1192 by use of shuttle assembly 1180 (FIG. 7A). In one embodiment, a dispense arm 1192 is adapted so that only one degree of freedom (e.g., a single linear direction (z-direction)) needs to be controlled. This configuration thus allows a more accurate and a repeatable control of the discharge nozzle 1024 position and reduces arm complexity, system cost, possible substrate scrap, and the need for calibration.

FIG. 7A is a plan view of one embodiment of a dispense arm system 1170 found in a coater chamber 60A, that utilizes a dispense arm 1192 that has a single degree of freedom. In this configuration the dispense arm system 1170 will generally contain a dispense arm assembly 1190, a shuttle assembly 1180, and a carrier assembly 1160. The dispense arm assembly 1190 generally contains a dispense arm 1192, a nozzle mounting position 1193 formed in or on the dispense arm 1192, and an actuator 1191. In one embodiment, a nozzle retaining feature 1194 is adapted to grasp the discharge nozzle 1024 when it is deposited on the nozzle mounting position 1193 by the shuttle assembly 1180. The nozzle retaining feature 1194 may be a spring loaded or pneumatically actuated device which grasps or interlocks with features on the discharge nozzle. The actuator 1191 is, for example, an air cylinder or other device that is able to raise and lower the dispense arm 1192. In one embodiment, the actuator 1191 also contains a linear guide (not shown) which helps to control the placement or movement of the dispense arm 1192 as it is moved from one position to the other.

The carrier assembly 1160 generally contains a nozzle support 1161, two or more fluid source assembly 1023 that contains a discharge nozzle 1024 and supply tube 1026 (six discharge nozzle 1024 and fluid source assemblies 1023 are shown) and a rotary actuator (not shown). The rotary actuator is adapted to rotate the nozzle support 1161 and all of the discharge nozzles 1024 and their associated supply tube 1026 to a desired position by use of commands from the system controller 101.

The shuttle assembly 1180 is adapted to pick up a discharge nozzle 1024 from the carrier assembly 1160 and then rotate to transfer the discharge nozzle 1024 to the nozzle mounting position 1193 on the dispense arm 1192. The shuttle assembly 1180 generally contains an actuator assembly 1181, a shuttle arm 1182 and a nozzle transfer feature 1183. The nozzle transfer feature 1183 is adapted to engage with or grasp the discharge nozzle 1024 so that it can be removed from the carrier assembly 1160 and transferred to nozzle mounting position 1193 and then returned from the nozzle mounting position 1193 to the carrier assembly 1160 after the process is complete. The actuator assembly 1181 generally contains one or more actuators that are adapted to raise and lower the shuttle assembly 1180 and rotate the shuttle arm 1182 to a desired position. The actuator assembly 1181 may contain, for example, one or more of the following devices to complete the lifting task tasks: an air cylinder, DC servo motor attached to a lead screw, a DC servo linear motor. The actuator assembly 1181 may also contain, for example, one or more of the following devices to complete the rotational tasks: an air cylinder, a stepper motor or a DC servo motor.

In operation the shuttle arm 1182 rotates from its home position (see item "A" in FIG. 7A) to a position over the carrier assembly 1160 and then moves vertically until it reaches a nozzle pickup position (not shown). The carrier assembly 1160 then rotates (see item "B") so that the discharge nozzle 1024 engages with the nozzle transfer feature 1183. The shuttle arm 1182 then moves vertically to separate the discharge nozzle 1024 from the carrier assembly 1160 and then rotates until the discharge nozzle 1024 is positioned over the nozzle mounting position 1193 in dispense arm 1192. The shuttle arm 1182 moves vertically until it deposits the discharge nozzle 1024 on the nozzle mounting position 1193. The shuttle arm 1182 then moves vertically and then rotates back to the home position (see item "A"). The actuator 1191 in the dispense arm assembly 1190 then moves the discharge nozzle to a desired position over the surface of the substrate (see item "W"), so that the substrate processing step can begin. To remove the discharge nozzle 1024 the steps are followed in reverse.

Figure 7B:
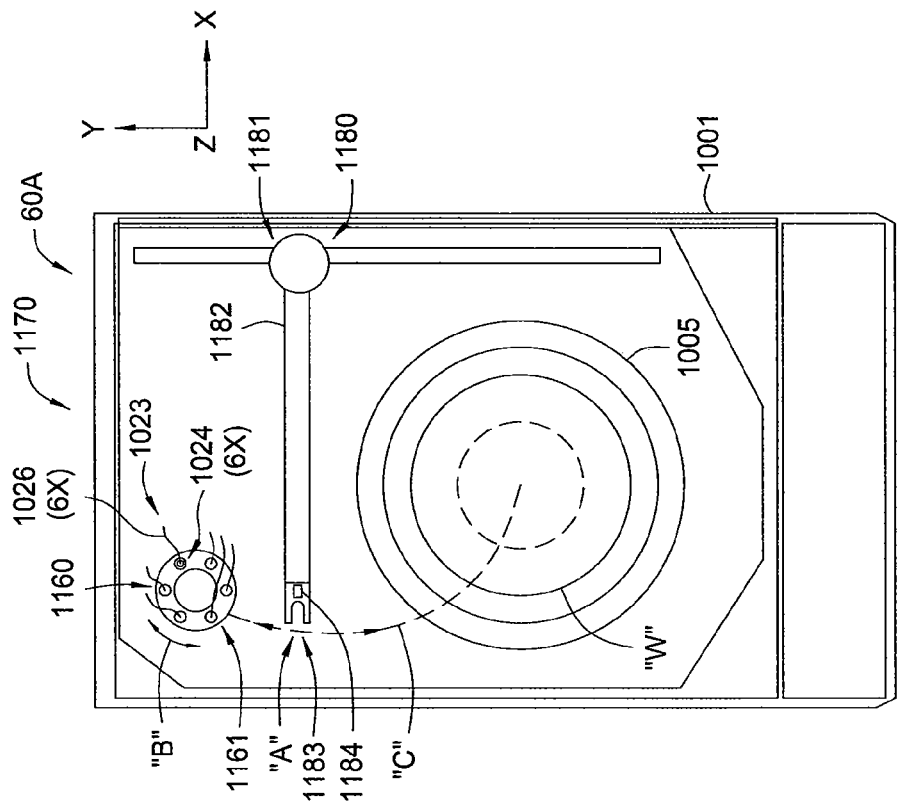
FIG. 7B illustrates a plan view of one embodiment of a coater chamber that contains a fluid dispense arm that has a two degrees of freedom.
Figure 7A:
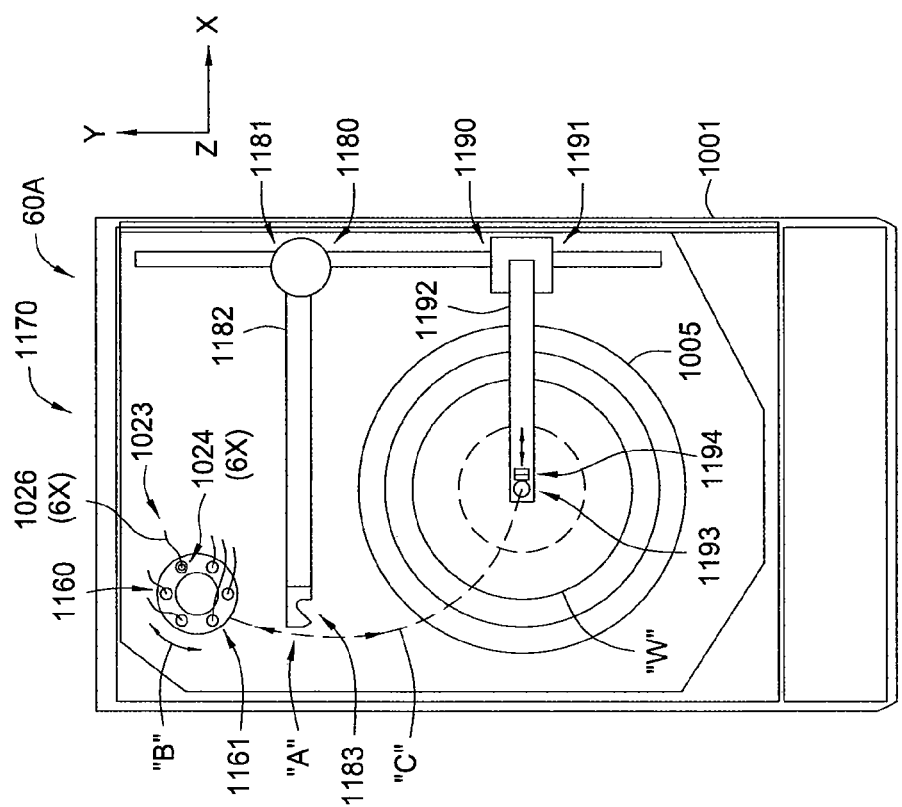
FIG. 7A illustrates a plan view of one embodiment of a coater chamber that contains a fluid dispense arm that has a single degree of freedom.

FIG. 7B illustrates another embodiment of the dispense arm system 1170, where the dispense arm assembly 1190 has two degrees of freedom, such as, a rotational degree of freedom, or a single linear degree of freedom (x-direction), and a vertical degree of freedom (z-direction). The dispense arm assembly 1190, which was a part of the embodiment shown in FIG. 7A, is not a part of the dispense arm system 1170 illustrated in FIG. 7B, thus reducing the complexity of the coater chamber 60A. In one embodiment, a nozzle retaining feature 1184 is adapted to grasp or retain the discharge nozzle 1024 when it is positioned in the nozzle transfer feature 1183. FIG. 7B also illustrates another possible configuration of the nozzle retaining feature 1184 that may be useful for holding and transferring the discharge nozzle 1024. In operation the shuttle arm 1182 rotates from its home position (see item "A" in FIG. 7B) to a position over the carrier assembly 1160 and then moves vertically until it reaches a nozzle pickup position (not shown). The carrier assembly 1160 then rotates (see item "B") so that the discharge nozzle 1024 engages with the nozzle transfer feature 1183. The shuttle arm 1182 then moves vertically to separate the discharge nozzle 1024 from the carrier assembly 1160 and then rotates until the discharge nozzle 1024 is positioned over a desired position over the surface of the substrate. The shuttle arm 1182 moves vertically until it reaches a desired position over the surface of the substrate (se item "W"), so that the substrate processing step can begin. To remove the discharge nozzle 1024 the steps are followed in reverse.

In one embodiment, the carrier assembly 1160 may contain a plurality of encapsulating vessel assemblies 1096 (not shown in FIGS. 7A-B (see FIGS. 6A-B)) which are temperature controlled to assure that the temperature of the nozzle body 1024A and processing fluid in the supply tube 1026 are maintained at a consistent temperature while they are waiting to be transferred to the shuttle assembly 1180 and brought over the surface of the substrate.

Developer Chamber

Figure 5D:
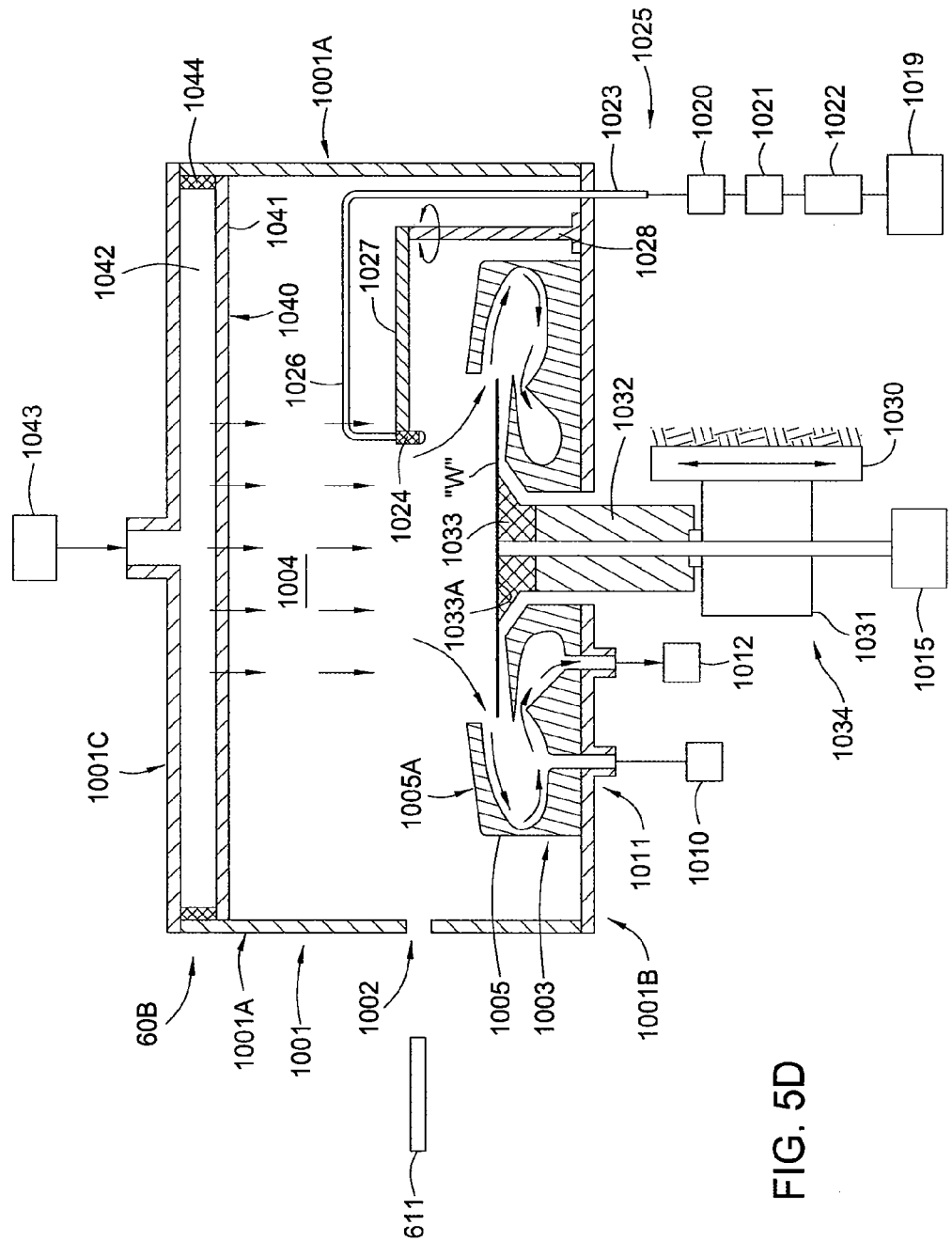
FIG. 5D is a side view that illustrates one embodiment of a developer chamber wherein the present invention may be used to advantage.

Referring to FIG. 5D, which is a side view of one embodiment of the developer chamber 60B, that may be adapted to perform, for example, the develop step 550, and the SAFIER™ coat step 551. In one embodiment, the developer chamber 60B generally contains all of the components contained in the coater chamber 60A and thus some components of the developer chamber 60B that are the same or similar to those described with reference to the developer chamber 60B, have the same numbers. Accordingly, like numbers have been used where appropriate.

In one embodiment, the developer chamber 60B contains a fluid distribution device 1070, described above, is adapted to deliver a uniform flow of a developer processing fluid to the surface of the substrate during the developing process. In one embodiment, the hole size, number of holes and distribution of the plurality of holes 1072F are designed to uniformly deliver the developer processing fluid to the processing region 1071 formed between the substrate and the bottom surface of the fluid distribution device 1070. In another embodiment, the hole size, number of holes and distribution of the plurality of holes 1072F are designed to deliver a non-uniform distribution of a developer processing fluid to the processing region 1071 formed between the substrate and the bottom surface of the fluid distribution device 1070.

Developer Endpoint Detection Mechanism

Figure 8A:
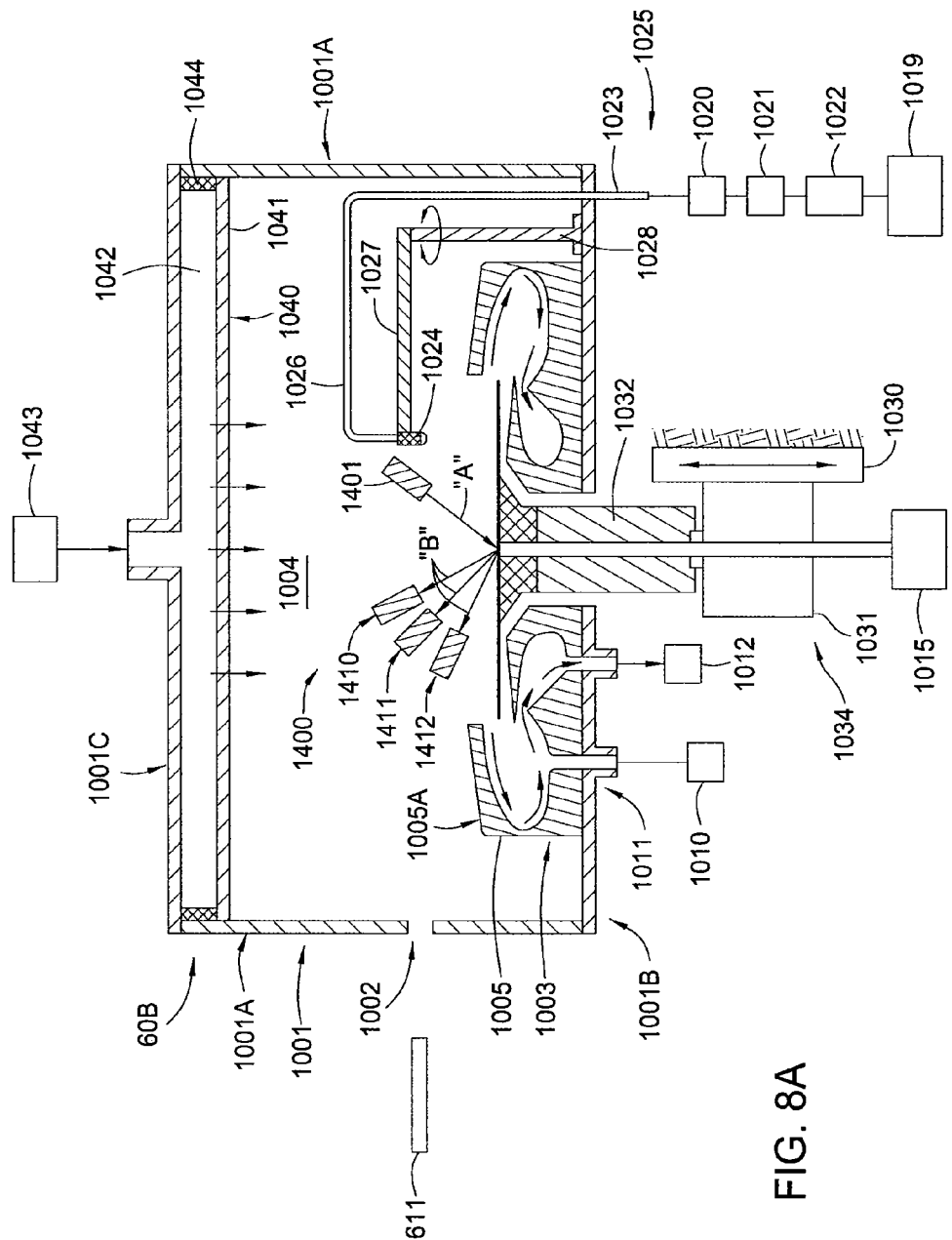
FIG. 8A is a side view of one embodiment of the developer chamber 60B that contains a developer endpoint detector assembly 1400.

FIG. 8A is a side view of one embodiment of the developer chamber 60B that contains a developer endpoint detector assembly 1400. The developer endpoint detector assembly 1400 uses a laser and one or more detectors to perform a scatterometry type technique to determine the endpoint of the develop step 550. In one embodiment, a single wavelength of emitted radiation, or beam, (see item "A") from a laser 1401 impinges on the surface of the substrate, having an exposed photoresist layer thereon, at an angle that is less than normal to the surface of the substrate. The beam "A" is reflected from the surface of the substrate and the intensity of the reflected radiation "B" is detected by a detector 1410. In one embodiment, the detector 1410 is oriented to receive the primary reflection from the surface and thus is aligned with the incident beam (e.g., same angle relative to the surface and the same direction). Due to the interference between the impinging beam and the pattern formed in the photoresist during the exposure step 538, the intensity of the detected radiation will vary as the develop step 550 progresses. The variation in the intensity of the reflected radiation is created when the developer dissolves the soluble portions of the photoresist during the develop step 550, thus causing a "grating" type pattern to emerge which thus increasingly interferes with the impinging beam. Therefore, the interference with the photoresist pattern causes scattering of the impinging beam, which causes a reduction in the main reflection that is detected. In one embodiment, the endpoint is detected when the change in the reflected intensity measured by the detector 1410 asymptotically approaches zero.

The area on the surface of the substrate, on which the beam emitted from the laser 1401 is projected, is defined as the detection area. In one embodiment, the size of the detection area is varied or controlled so that the amount of noise contained in the detected signal is minimized. Noise can be generated due to the variation in the pattern topology seen by the detection area during processing.

In one embodiment, a tunable laser is used in place of a single wavelength laser to more easily detect the change in the sharpness of the photoresist pattern as the develop process progresses. The amount of interference will depend on the size of the formed "grating" and the wavelength of the incident radiation. In another embodiment, a plurality of detectors (see items 1410-1412) that are able to detect the primary reflection and the amount of scattered radiation to help determine the develop endpoint. In another embodiment a CCD (charge coupled device) array is used to monitor the scattering and shift in intensity of the reflected radiation. In one embodiment, to prevent noise generated from the reflection of emitted radiation from the processing fluid retained on the substrate surface during processing, a slit may be used to prevent the reflection from reaching the detector.

Figure 8B:
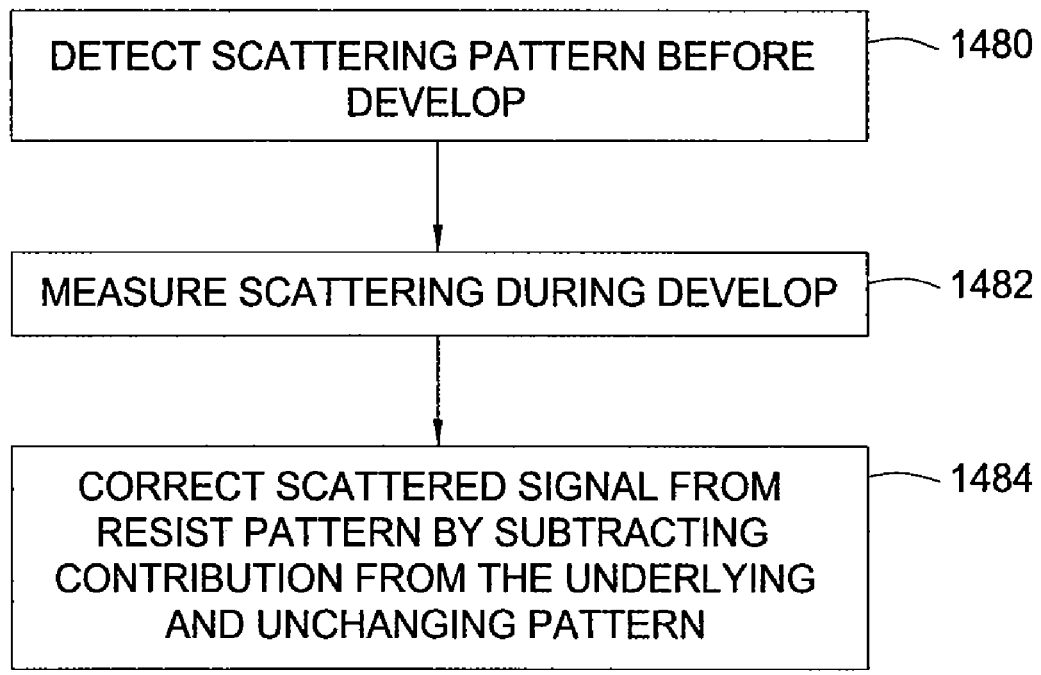
FIG. 8B is process method step used to improve the endpoint detection process described in conjunction with FIG. 8A.

For product substrates, where typically there is already a pattern on the surface of the substrate, the steps shown in FIG. 8B may be used. The process steps include measuring the initial intensity of the scattered radiation prior to performing the develop step 550 (item # 1480). The intensity is then measured during the develop process and compared to the initial data so that the contribution from the pattern present on the substrate surface (item # 1482). This method may only be needed if the photoresist profile is desired. If noting that the intensity changes over the develop processing period are all that is desired, then the use of a single wavelength is all that is needed and the information regarding the underlying scattering generally is not needed.

Figure 8C:
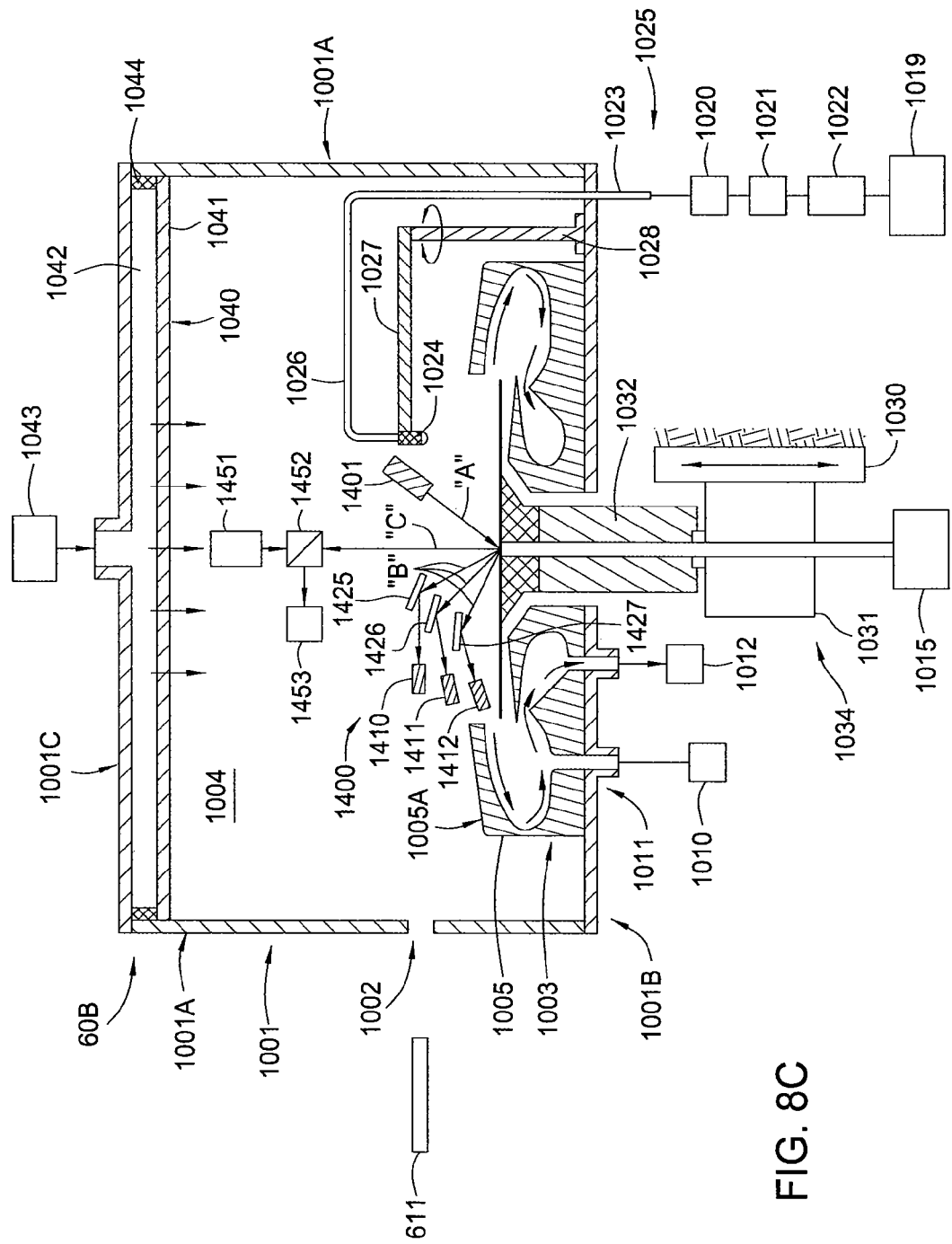
FIG. 8C is a side view of one embodiment of the developer chamber 60B that contains a developer endpoint detector assembly 1400.

If detailed knowledge of the pattern is required, then active correction (item# 1484 in FIG. 8C) for the possibly variable refraction at the developer surface is needed. The active correction adjusts for the variation in the developer fluid surface due to external vibrations, and works by having multiple small mirrors (items 1425-27) that adjust in position to compensate for the change in angle. FIG. 8C illustrates one such mirror, with knowledge of the change in the refraction of the incident beam "A" obtained via input from a perpendicular beam (item "C"), also shown. In particular, as the surface of the developer fluid momentarily deviates from flat and level, the normal reflection of the laser beam (item "C") from laser 1451 is detected in detector 1453, by use of beam splitter 1452. In this configuration the detector 1453 can be a CCD array that is able to sense the change in angle of the reflected beam due to the change in the angle with which the beam "C" strikes the surface of the developer fluid. The system controller 101 in conjunction with the CCD array is able to detect a change in the position of the peak intensity on the CCD array and thus know how much the reflection angle has changed so that the angle of the active mirrors 1425-1427 can be adjusted and thus the position of the reflected beam "B" can be sent to one or more of the detectors 1410-1412. Momentary deviation in the spatial position of this reflection should correlate well with deviations in the developer fluid surface. Therefore, by use of a suitable control system the detected variation in position of the reflected beam, through the use of actively positioned mirrors (items 1425-1427), a spatial correction to the reflected beams can be made.

The active mirrors 1425-1427 can be small and compact, such as used on the micromirror chip available from TI in Dallas, Tex. They are shown more widely separated in FIG. 8C for clarity. The active mirrors are designed to compensate for variation the developer surface leading to beam deflection as described above.

Twin Coater and Developer Chambers

FIGS. 9A-B are plan views of one embodiment of a twin coater/developer chamber 350 that contains two separate process chambers 370 and a central region 395. This configuration is advantageous since it allows some common components in the two chambers to be shared, thus increasing system reliability and reducing the system cost, complexity and footprint of the cluster tool. In one embodiment, the process chamber 370 generally contains all of the processing components described above in conjunction with the coater chamber 60A or developer chamber 60B, except the two chambers are adapted to share a fluid dispense system 1025. The central region 395 contains a shutter 380 and a plurality of nozzles 391 that are contained in a nozzle holder assembly 390. As noted above the fluid dispense system 1025 used in the coater or developer chambers may contain one or more fluid source assemblies 1023 which deliver one or more processing fluid to the surface of a substrate mounted on the spin chuck 1033. Each nozzle 391, contained in the fluid source assemblies 1023, is typically connected to a supply tube 1026, a pump 1022, a filter 1021, a suck back valve 1020 and a fluid source 1019, and is adapted to dispense a single type of processing fluid. Therefore, each fluid source assembly 1023 can be used in either the left or right process chambers 370, thus reducing the redundancy required to in each processing chamber. While FIGS. 9A-B illustrates a configuration where the nozzle holder assembly 390 contains five nozzles 391, in other embodiments the nozzle holder assembly 390 may contain a lesser number of nozzles or a greater number of nozzles without varying form the basic scope of the invention.

FIG. 9A is a plan view of the twin coater/developer chamber 350 where the nozzle arm assembly 360 is positioned over the right process chamber 370 to dispense a processing fluid on a substrate "W" retained on the spin chuck 1033. The nozzle arm assembly 360 may contain an arm 362 and nozzle holding mechanism 364. The nozzle arm assembly 360 is attached to an actuator 363 that is adapted to transfer and position the nozzle arm assembly 360 in any position along the guide mechanism 361. In one embodiment, the actuator is adapted to move the nozzle arm assembly 360 vertically to correctly position the nozzle 391 over the substrate during processing and also enable the nozzle holding mechanism 364 to pick-up and drop-off the nozzles 391 from the nozzle holder assembly 390. The system controller 101 is adapted to control the position of the nozzle arm assembly 360 so that the nozzle holding mechanism 364 can pick-up and drop-off nozzles 391 from the nozzle holder assembly 390. A shutter 380 is adapted to move vertically to close and isolate one process chamber 370 from the central region 395 and thus the other process chamber 370 during processing to prevent cross contamination of the substrates during processing. In one aspect, the shutter 380 is adapted to sealably isolate one process chamber 370 from the central region 395 and thus the other process chamber 370 during processing. Conventional o-ring and/or other lip seals may be used to allow the shutter to sealably isolate the two processing chambers.

FIG. 9B is a plan view of the twin coater/developer chamber 350 where the nozzle arm assembly 360 is positioned over the left process chamber 370 to dispense a processing fluid on a substrate retained on the spin chuck 1033.

In one embodiment, not shown, the twin coater/developer chamber 350 contains two nozzle arm assemblies 360 which are adapted to access the nozzles 391 in the central region 395 and position a nozzle over the surface of the substrate. In this configuration each process chamber could process two substrates using the same processing fluid by sharing the pump and dispensing from two different nozzles 391, or two different processing fluids could be dispensed in each of the chambers.

Chill Chamber

Figure 10A:
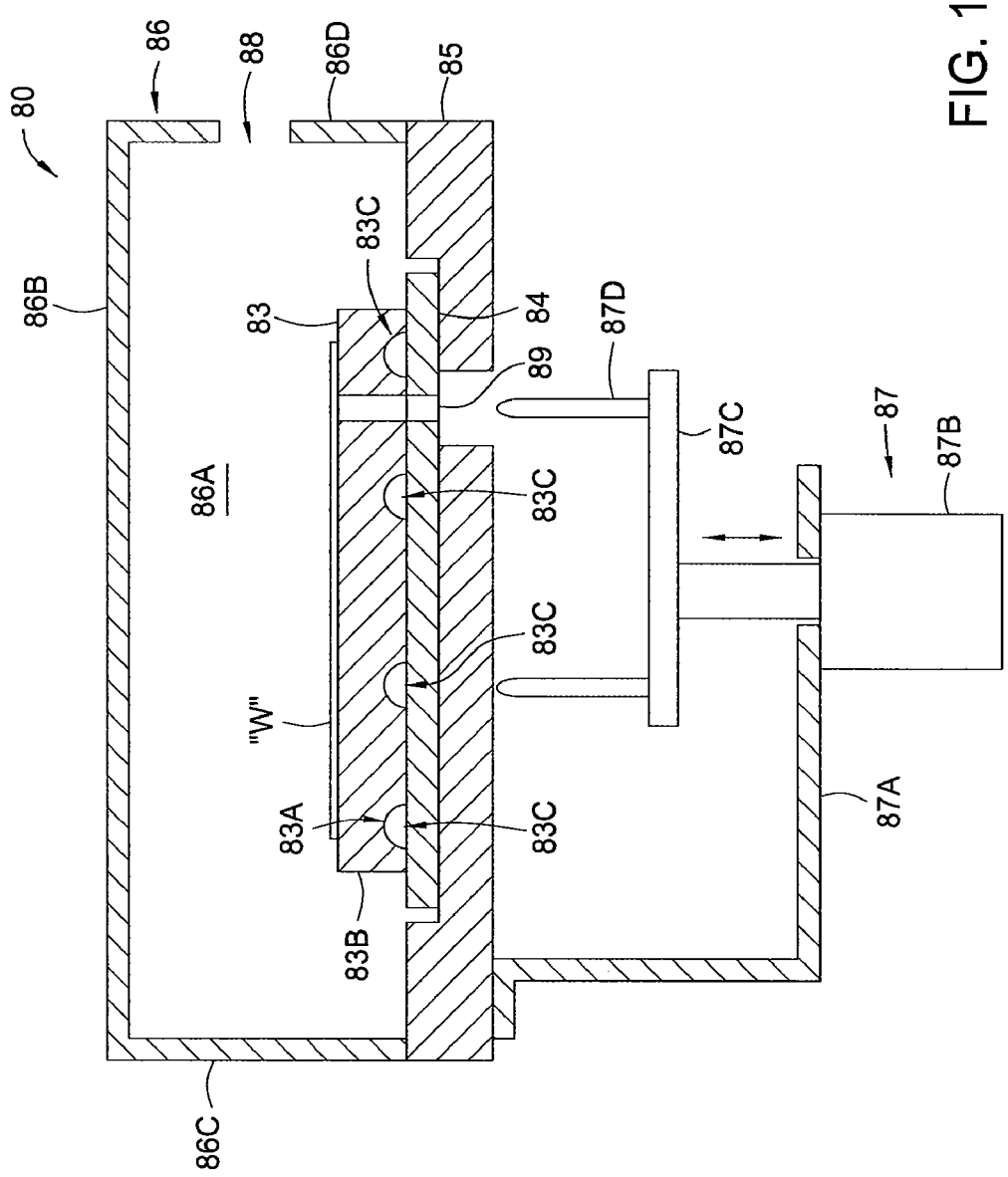
FIG. 10A is a side view that illustrates one embodiment of a chill chamber wherein the present invention may be used to advantage.

FIG. 10A is a vertical sectional view that illustrates one embodiment of a chill chamber 80 that may be adapted to perform the post BARC chill step 514, the post photoresist chill step 524, the post top coat chill step 534, the post PEB chill step 542 and/or the post develop chill step 554. The chill chamber 80 generally contains an enclosure 86, chill plate assembly 83, a support plate 84, and a lift assembly 87. The enclosure 86 is formed by a plurality of walls (items 86B-D and item 85) which isolate the processes performed in the chill chamber 80 from the surrounding environment to form a processing region 86A. In one aspect of the invention the enclosure is adapted to thermally isolate and minimize the possibility of atmospheric contamination in the chill chamber 80.

The chill plate assembly 83 generally contains a heat exchanging device 83A and a chill plate block 83B. The chill plate block 83B is a thermally conductive block of material that is cooled by the heat exchanging device 83A to perform the various chill processes described above (e.g., pre-BARC chill step 509, post BARC chill step 514, post photoresist chill step 524, etc.). The chill plate block 83B is thermally conductive to improve temperature uniformity during processing. In one embodiment, the chill plate block 83B may be made from aluminum, graphite, aluminum-nitride, or other thermally conductive material. In one embodiment, the chill plate block 83B surface which is in contact with the substrate "W" is coated with a Teflon impregnated anodized aluminum, silicon carbide or other material that can minimize particle generation on the backside of the substrate as it comes in contact with the chill plate block 83B. In one embodiment, the substrate "W" rests on pins (not shown) embedded in the surface of the chill plate block 83B so that only a small gap is maintained between the substrate and the chill plate block 83B to reduce particle generation. In another embodiment, as shown in FIG. 10A, the heat exchanging device 83A consists of a plurality of channels 83C formed in a surface of the chill plate block 83B, which are temperature controlled by use of a heat exchanging fluid that continually flows through the channels 83C. A fluid temperature controller (not shown) is adapted to control the heat exchanging fluid and thus the chill plate block 83B temperature. The heat exchanging fluid may be, for example, a perfluoropolyether (e.g., Galden®) that is temperature controlled to a temperature between about 5° C. and about 20° C. The heat exchanging fluid may also be chilled water delivered at a desired temperature between about 5° C. to about 20° C. The heat exchanging fluid may also be a temperature controlled gas, such as argon or nitrogen.

In one embodiment of the chill plate, the heat exchanging device 83A is adapted to heat and cool the substrate resting on the surface of the chill plate block 83B. This configuration may be advantageous since the time required to achieve a desired process set point temperature is dependent on the temperature differential between the substrate and the chill plate block 83B. Thus if the chill plate block 83B is set to a fixed temperature and it is desired that the substrate be cooled to that fixed temperature it will take a very long time to cool the last few degrees to reach the fixed temperature due to the small temperature differential between the substrate and the chill plate block 83B. The time to achieve a desired temperature can be reduced if the temperature of the chill plate block 83B is actively controlled so that a large temperature differential is maintained between the substrate and the chill plate block 83B until the substrate temperature is at or near the desired set point temperature and then the temperature of the chill plate block 83B is adjusted to minimize the amount of undershoot or overshoot in temperature of the substrate. The temperature of the chill plate block 83B is controlled by use of a conventional temperature sensing device (e.g., thermocouple; (not shown)) that is used in conjunction with the system controller 101 to vary the amount of energy removed from or delivered to the chill plate block 83B by the heat exchanging device 83A. Thus in this embodiment, the heat exchanging device 83A has the ability to both heat and cool the chill plate block 83B. In one embodiment, the heat exchanging device 83A is a thermoelectric device that is used to cool and/or heat the chill plate block 83B. In one embodiment, the heat exchanging device 83A is a heat pipe design, described below in conjunction with the PEB chamber 130, which is adapted to heat and cool the substrate. In one embodiment, it may also be advantageous to minimize the mass and/or increase the thermal conductivity of the chill plate block 83B to improve the ability to control the substrate temperature.

The support plate 84 is generally a plate that supports the chill plate assembly 83 and insulates it from the base 85. In general the support plate 84 may be made from a thermally insulating material such as a ceramic material (e.g., zirconia, alumina, etc.) to reduce external heat loss or gain.

Referring to FIG. 10A, the lift assembly 87 generally contains a lift bracket 87A, an actuator 87B, a lift pin plate 87C, and three or more lift pins 87D (only two are shown in FIG. 10A), which are adapted to raise and lower the substrate "W" off an extended robot blade (not shown) and place the substrate on the surface of the chill plate block 83B once the robot blade has been retracted. The robot blade (not shown) is adapted to enter the chill chamber 80 through an opening 88 in the side wall 86D of the enclosure 86. To prevent substrate to substrate process variation and damage to the substrate caused by misalignment of the substrate in the chamber the robot is calibrated to pick up and drop off a substrate from a transfer position, which is typically aligned to a center point between the lift pins. In one embodiment, three lift pins, which move through the lift pin holes 89 in the base 85, support plate 84, and chill plate assembly 83, are adapted to raise and lower the substrate by use of the actuator 87B. The actuator may be an air cylinder or other conventionally available means of raising and lowering the substrate.

Bake Chamber

FIG. 10B is a side view that illustrates one embodiment of a bake chamber 90 that may be adapted to perform the post BARC bake step 512, the post photoresist coat bake step 522, the post top coat bake step 532 and/or the post develop bake step 552. The bake chamber 90 generally contains an enclosure 96, bake plate assembly 93, a support plate 94, and a lift assembly 97. The enclosure 96 generally contains a plurality of walls (items 96B-D and element 95) which tend to isolate the processes performed in the bake chamber 90 from the surrounding environment to form a processing region 96A. In one aspect of the invention the enclosure is adapted to thermally isolate and minimize contamination of the bake chamber 90 from the surrounding environment.

The bake plate assembly 93 generally contains a heat exchanging device 93A and a bake plate block 93B. The bake plate block 93B is a thermally conductive block of material that is heated by the heat exchanging device 93A to perform the various bake processes described above (e.g., post BARC bake step 512, post photoresist coat bake step 522, etc.). The bake plate block 93B is thermally conductive to improve temperature uniformity during processing. In one embodiment, the bake plate block 93B may be made from aluminum, graphite, aluminum-nitride, or other thermally conductive material. In one embodiment, the bake plate block 93B surface which is in contact with the substrate "W" is coated with a Teflon impregnated anodized aluminum, silicon carbide or other material that can minimize particle generation on the backside of the substrate as it comes in contact with the bake plate block 93B. In one embodiment, the substrate "W" rests on pins (not shown) embedded in the surface of the bake plate block 93B so that only a small gap is maintained between the substrate and the bake plate block 93B to reduce particle generation. In one embodiment, the heat exchanging device 93A is a thermoelectric device that is used to heat the bake plate block 93B. In another embodiment, as shown in FIG. 10B, the heat exchanging device 93A consists of a plurality of channels 93C formed in a surface of the bake plate block 93B, which are temperature controlled by use of a heat exchanging fluid that continually flows through the channels 93C. A fluid temperature controller (not shown) is adapted to control the heat exchanging fluid and thus the bake plate block 93B temperature. The heat exchanging fluid may be, for example, a perfluoropolyether (e.g., Galden®) that is temperature controlled to a temperature between about 30° C. and about 250° C. The heat exchanging fluid may also be a temperature controlled gas, such as argon or nitrogen.

The support plate 94 is generally a plate that supports the bake plate assembly 93 and insulates it from the base 95. In general the support plate 94 may be made from a thermally insulating material such as a ceramic material (e.g., zirconia, alumina, etc.) to reduce external heat loss.

Referring to FIG. 10B, the lift assembly 97 generally contains a lift bracket 97A, an actuator 97B, a lift pin plate 97C, and three or more lift pins 97D (only two are shown in FIG. 10B), which are adapted to raise and lower the substrate "W" off an extended robot blade (not shown) and place the substrate on the surface of the bake plate block 93B once the robot blade has been retracted. In one embodiment, three lift pins, which move through the lift pin holes 99 in the base 95, support plate 94, and bake plate assembly 93, are adapted to raise and lower the substrate by use of the actuator 97B. The actuator may be an air cylinder or other conventionally available means of raising and lowering the substrate. The robot blade (not shown) is adapted to enter the bake chamber 90 through an opening 98 in the side wall 96D of the enclosure 96.

HMDS Chamber

Figure 10C:
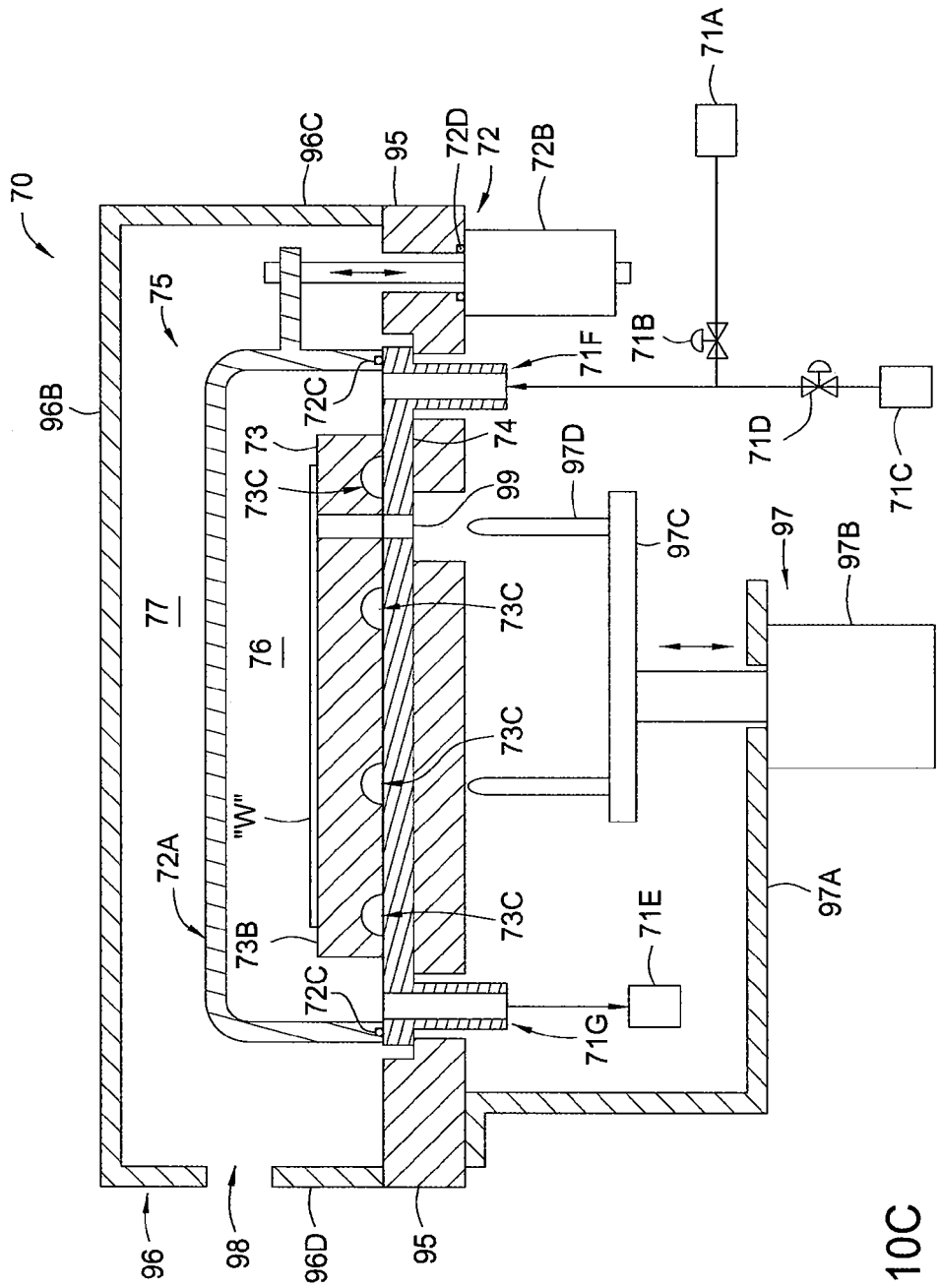
FIG. 10C is a side view that illustrates one embodiment of a HMDS process chamber wherein the present invention may be used to advantage.

FIG. 10C is a side view that illustrates one embodiment of a HMDS process chamber 70 that may be adapted to perform the HMDS processing step 511. In one embodiment, as shown in FIG. 10C, the HMDS process chamber 70 contains some of the components contained in the bake chamber 90 shown in FIG. 10B and thus some components of the HMDS process chamber 70 are the same or similar to those described with reference to the bake chamber 90, described above. Accordingly, like numbers have been used where appropriate.

The HMDS process chamber 70 also contains a lid assembly 75 that is used to form a sealed processing region 76 in which the processing gas is delivered to the substrate "W" which is heated by the HMDS bake plate assembly 73. The HMDS bake plate assembly 73 generally contains a heat exchanging device 73A and a HMDS bake plate block 73B. The HMDS bake plate block 73B is a thermally conductive block of material that is heated by the heat exchanging device 73A to perform the various HMDS processing steps described above. The HMDS bake plate block 73B is thermally conductive to improve temperature uniformity during processing. In one embodiment, the HMDS bake plate block 73B may be made from aluminum, graphite, aluminum-nitride, or other thermally conductive material. In one embodiment, the HMDS bake plate block 73B surface which is in contact with the substrate "W" is coated with a Teflon impregnated anodized aluminum, silicon carbide or other material that can minimize particle generation on the backside of the substrate as it comes in contact with the HMDS bake plate block 73B. In one embodiment, the substrate "W" rests on pins (not shown) embedded in the surface of the HMDS bake plate block 73B so that only a small gap is maintained between the substrate and the HMDS bake plate block 73B to reduce particle generation. In one embodiment, the heat exchanging device 73A is a thermoelectric device that is used to heat the HMDS bake plate block 73B. In another embodiment, as shown in FIG. 10C, the heat exchanging device 73A consists of a plurality of channels 73C formed in a surface of the HMDS bake plate block 73B, which are temperature controlled by use of a heat exchanging fluid that continually flows through the channels 73C. A fluid temperature controller (not shown) is adapted to control the heat exchanging fluid and thus the HMDS bake plate block 73B temperature. The heat exchanging fluid may be, for example, a perfluoropolyether (e.g., Galden®) that is temperature controlled to a temperature between about 30° C. and about 250° C. The heat exchanging fluid may also be a temperature controlled gas, such as, argon or nitrogen.

The lid assembly 75 generally contains a lid 72A, one or more o-ring seals 72C and an actuator assembly 72. The actuator assembly 72 generally contains an actuator 72B and an o-ring seal 72D. The o-ring seal 72D is designed to isolate the HMDS processing region 77 from the environment outside of the HMDS process chamber 70. The actuator 72B is generally adapted to raise and lower the lid 72A so that a substrate can be transferred to and from the lift pins 97D in the lift assembly 97. The lid 72A is adapted to form a seal between the HMDS base 74 using the o-ring seal 72D retained in the lid 72A (or on the HMDS base 74) to form the processing region 76 and prevent the process gases used during the HMDS processing step 511 from escaping into the HMDS processing region 77.

During processing the actuator 72B lowers the lid 72A to form a seal between the lid 72A, the o-ring seals 72C and the HMDS base 74 to form a leak tight seal. The process gas delivery system 71 delivers the process gas(es) to the processing region 76 to perform the HMDS processing step 511. To deliver the process gas(es) an HMDS vaporization system 71A delivers the HMDS vapor and a carrier gas to the processing region through an isolation valve 71B and through the inlet 71F formed in the HMDS base 74, across the surface of the substrate, and out the outlet 71G formed in the HMDS base 74, to a scrubber 71E. In one embodiment, a purge gas is delivered to the processing region 76 from a purge gas source 71C after the HMDS vapor containing processing gas has been delivered to the processing region to remove any leftover HMDS vapor. The purge gas source 71C may be isolated from the HMDS vaporization system 71A by use of an isolation valve 71D. In one embodiment, the purge gas delivered from the purge gas source 71C is heated or cooled by use of a conventional gas heat exchanging means (not shown) to control the temperature of the injected purge gas.

Post Exposure Bake Chamber

During an exposure process using a positive photoresist an insoluble photoresist material is transformed into a soluble material. During the exposure process, components in the photoresist that contain photoacid generators (or PAGs) generate an organic acid that can attack the unexposed areas of the photoresist and affect the sharpness of the pattern formed in the photoresist layer during the exposure process. The attack of the unexposed photoresist is thus affected by the migration of the generated photoacid, which is a diffusion dominated process. Since the photoacid attack of the formed pattern is a diffusion dominated process, the rate of attack is dependent on two related variables, time and temperature. The control of these variables are thus important in assuring that the critical dimension (CD) uniformity is acceptable and consistent from substrate to substrate.

In one embodiment, the PEB step 540 is performed in a bake chamber 90 as shown in FIG. 10B. In another embodiment, the PEB step 540 is performed in a HMDS process chamber 70 where a temperature controlled gas is delivered from the purge gas source 71C to the processing region 76, to heat or cool the substrate retained on the HMDS bake plate assembly 73.

Figure 10D:
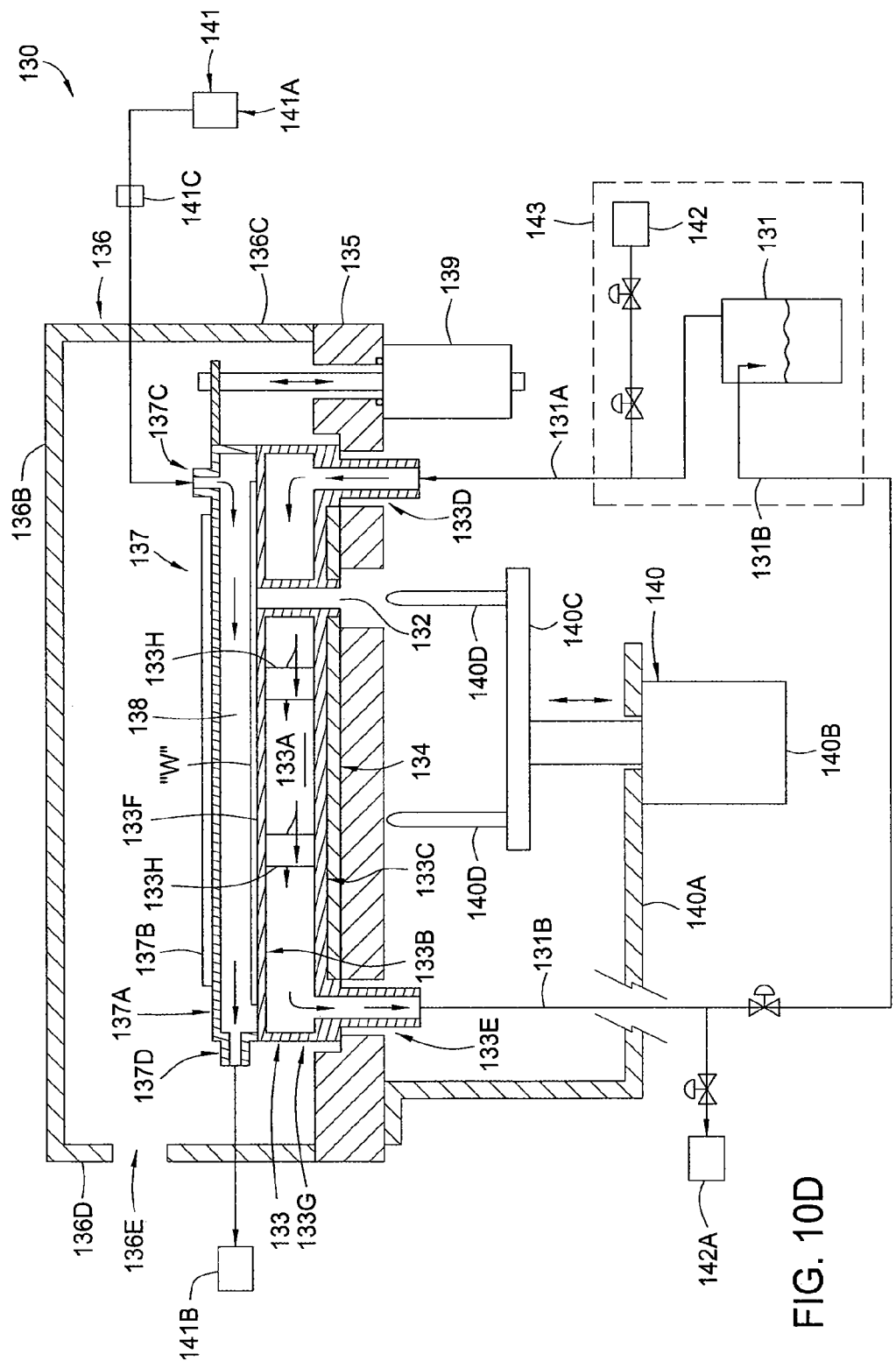
FIG. 10D is a side view that illustrates one embodiment of a Post Exposure Bake (PEB) chamber wherein the present invention may be used to advantage.

In another embodiment, the PEB step 540 is performed in a PEB chamber 130. FIG. 10D illustrates a side view of the PEB chamber 130 in which the processing region 138 and mass of the PEB plate assembly 133 are optimized to improve thermal uniformity, allow rapid changes in temperature, and/or improve process repeatability. In one embodiment, the PEB plate assembly utilizes a low thermal mass PEB plate assembly 133 and a heat exchanging source 143 to rapidly heat up and/or cool down a substrate that is in communication with the top surface 133F of the PEB plate assembly 133. In this configuration the PEB plate assembly 133 will generally contain a substrate supporting region 133B that has a top surface 133F on which the substrate may rest, a heat exchanging region 133A, and a base region 133C. The temperature of the substrate supporting region 133B is controlled by use of a temperature sensing device (not shown) that is used in conjunction with the system controller 101 to vary the amount of energy delivered to the PEB plate assembly 133 by the heat exchanging region 133A.

The heat exchanging region 133A is a region enclosed between the substrate supporting region 133B, the base region 133C, and the side walls 133G. The heat exchanging region 133A is in communication with the heat exchanging source 143 through one or more inlet ports 133D and one or more outlet ports 133E. The heat exchanging region 133A is adapted to accept various heat exchanging fluids delivered from the heat exchanging source 143 in order to heat or cool the substrate that is in thermal communication with the top surface 133F. In one aspect of the invention, the material thickness of the top surface 133F (i.e., distance between the heat exchanging region 133A and the top surface 133F), and thus the mass of the top surface 133F, is minimized to allow for rapid heating and cooling of the substrate.

In one embodiment, the heat exchanging region 133A may contain a resistive heater or thermoelectric device to control the temperature of the substrate. In another embodiment the heat exchanging region 133A is adapted to control the temperature of the PEB plate assembly 133 by use of a radiation heat transfer method, for example, halogen lamps mounted below the substrate supporting region 133B.

The PEB plate assembly 133 may be formed by conventional means (e.g., machining, welding, brazing, etc.) from one single material or it may be formed from a composite structure (e.g., structure containing many different types of materials) that makes the best use of each material's thermal conductivity, thermal expansion, and thermal shock properties to form an optimal PEB plate assembly 133. In one embodiment, the PEB plate assembly 133 is made from a thermally conductive material such as aluminum, copper, graphite, aluminum-nitride, boron nitride, and/or other material.

The heat exchanging source 143 generally contains at least one heat exchanging fluid delivery system which is adapted to deliver a heat exchanging fluid to the heat exchanging region 133A. In one embodiment, as shown in FIG. 10D, the heat exchanging source 143 contains two heat exchanging fluid delivery systems, which are a heat source 131 and a cooling source 142.

In one embodiment, the heat source 131 is a conventional heat pipe which is used to heat the substrate. In general a heat pipe is an evacuated vessel, typically circular in cross sections, that may be back-filled with a small quantity of a working fluid that transfers heat from the heat source 131 to a heat sink (e.g., the substrate supporting region 133B and thus the substrate). The transfer of heat is performed by the evaporation of the working fluid in the heat source 131 and condensation of a working fluid in the heat exchanging region 133A. In operation the heat exchanging region 133A is evacuated by a vacuum pump (not shown) and then energy is added to a working fluid, retained in the heat source 131, which creates a pressure gradient between the heat source 131 and the heat exchanging region 133A. This pressure gradient forces the vapor to flow to the cooler section where it condenses, thus giving up energy due to the latent heat of vaporization. The working fluid is then returned to the heat source 131 by gravity, or capillary action, through the outlet port 133E and the outlet line 131B. The temperature of the substrate supporting region 133B is controlled by use of a temperature sensing device (not shown) that is used in conjunction with the system controller 101 by varying the amount energy (e.g., flow of the working fluid) delivered to the heat exchanging region 133A.

In another embodiment, the heat source 131 delivers a heated gas, vapor or liquid from a fluid source (not shown) to the heat exchanging region 133A to transfer heat to the substrate by a convective heat transfer type process. In this configuration the heated gas, vapor or liquid is delivered to the heat exchanging region 133A through an inlet port 133D from an inlet line 131A and exits the heat exchanging region 133A through the outlet port 133E where it is delivered to a waste collection source 142A. The waste collection source 142A may be a scrubber or typical exhaust system.

In one embodiment, as shown in FIG. 10D, the heat exchanging source 143 also contains a cooling source 142 which is adapted to cool the substrate to a desired temperature. In one embodiment of the cooling source 142, the cooling source delivers liquid nitrogen to the heat exchanging region 133A to remove heat from the substrate supporting region 133B and thus the substrate. In another embodiment, the cooling source delivers a chilled gas, liquid or vapor to the heat exchanging region 133A to cool the substrate. In one aspect of the invention the cooling source is used to cool the substrate to a temperature near ambient temperature.

In another embodiment of the PEB plate assembly 133, a heat exchanging device 134 is placed on the base region 133C to heat or cool the PEB plate assembly 133. In one aspect of the invention, the heat exchanging device 134 is used to cool the base region 133C, which is in thermal contact with the substrate supporting region 133B through a plurality of thermally conductive pillars 133H (only two shown). In this configuration the substrate can be heated by the injection of a hot fluid from the heat source 131 and cooled by use of the heat exchanging device 134. This configuration may avoid the need for the cooling source 142 to cool the substrate. The plurality of thermally conductive pillars 133H are regions in which heat can be transferred from the substrate supporting region 133B to the base region 133C or vise versa. The conductive pillars 133H may be arranged in any pattern, size or density (e.g., number of pillars 133H per unit area) that allows heat to uniformly flow to or from the heat exchanging device 134 and allows the fluid delivered from the heat source to uniformly communicate with the substrate supporting region 133B.

Referring to FIG. 10D, in one aspect of the invention a lid assembly 137 is placed over the substrate "W" and contacts the top surface 133F of the PEB plate assembly 133 to form a controlled environment around the substrate. The lid assembly generally contains the lid 137A and a lid actuator 139. The lid actuator 139 is a device that may be adapted to raise and lower the lid 137A so that the lift assembly 140 can transfer the substrate to and from the cluster tool robot (not shown) and the top surface 133F. In one embodiment, the lid actuator 139 is an air cylinder. When the lid is in the processing position, as shown in FIG. 10D, the lid contacts the top surface 133F and thus forms a processing region 138 that surrounds the substrate to create a controlled thermal environment.

In one embodiment, the lid assembly 137 may contain a heat exchanging device 137B to control the temperature of the lid 137A and thus form an isothermal environment around the substrate to improve thermal uniformity across the substrate during processing. In this configuration the heat exchanging device 137B adapted to act as a heat pipe in a similar fashion as described above, to rapidly heat and cool the lid assembly 137. In one embodiment, the heat exchanging device 137B and the heat exchanging region 133A are both adapted to act as a heat pipe to rapidly and uniformly control the temperature of the substrate. In another embodiment, the heat exchanging device 137B is adapted to control the temperature of the lid assembly 137 by use of a radiative (e.g., heat lamps), or convective heat transfer means (described above).

In another embodiment of the lid assembly 137, a heated fluid source 141 is connected to the processing region 138 through a lid inlet port 137C to deliver a temperature controlled process fluid across the substrate surface and then out the lid outlet port 137D to a waste collection device 141B. The heated fluid source 141 generally contain a fluid source 141A, a fluid heater 141C and a waste collection device 141B (e.g., typically an exhaust system or scrubber). The fluid source 141A may deliver a gas or liquid during processing to control the temperature of the substrate. In one aspect of the invention the fluid source 141A may deliver an inert gas, for example, argon, nitrogen, or helium.

Referring to FIG. 10D, the PEB chamber 130 generally contains an enclosure 136, the PEB plate assembly 133, and a lift assembly 140. The enclosure 136 generally contains a plurality of walls (items 136B-D and item 135) which tend to isolate the processes performed in the PEB chamber 130 from the surrounding environment. In one aspect of the invention the enclosure is adapted to thermally isolate and minimize contamination of the PEB chamber 130 from the surrounding environment. The lift assembly 147 generally contains a lift bracket 140A, an actuator 140B, a lift pin plate 140C, and three or more lift pins 140D (only two are shown in FIG. 10D), which are adapted to raise and lower the substrate "W" off an extended robot blade (not shown) and place the substrate on the surface of the PEB plate assembly 133 once the robot blade has been retracted. The lift pin holes 132 are configured to allow the lift pins 140D to access the substrate so that it can be raised and lowered from the surface of the PEB plate assembly 133. The actuator 140B may be an air cylinder or other conventionally available means of raising and lowering the substrate. The robot blade (not shown) is adapted to enter the enclosure 136 through an opening 136E in the side wall 136D of the enclosure.

Variable Heat Transfer Valve

Figure 11A:
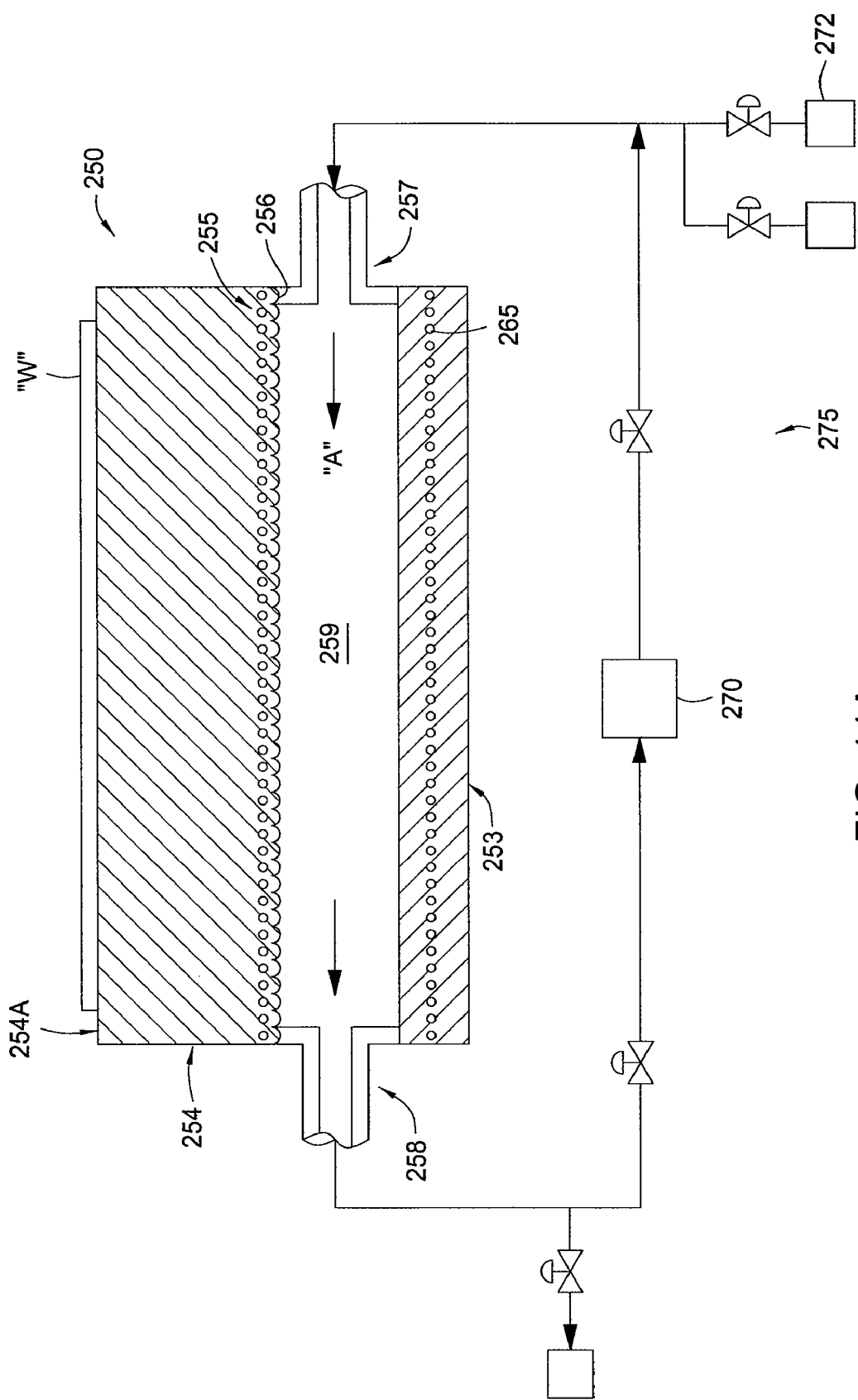
FIG. 11A is side view that illustrates one embodiment of a plate assembly that may be used to rapidly heat and cool a substrate.

FIG. 11A is side view that illustrates one embodiment of a plate assembly that may be used to rapidly heat and cool a substrate. The term "plate assembly" used hereafter is intended to generally describe an embodiment of the PEB plate assembly 133, the chill plate assembly 83, the bake plate assembly 93, or the HMDS bake plate assembly 73 which may be adapted to benefit from this configuration. Referring to FIG. 11A, in one embodiment, a plate assembly 250 contains a conductive block 254 which has a block surface 254A that is in thermal communication with a substrate "W" during processing, a cooling region 253, a gap 259 formed between the conductive block 254 and the cooling region 253, an inlet region 257, an outlet region 258, and a fluid delivery system 275.

The conductive block 254 is used to support the substrate, and it contains a heating device 255 which is adapted to heat a substrate that is in thermal communication with the block surface 254A. The conductive block 254 may be made from a thermally conductive material such as aluminum, copper, graphite, aluminum-nitride, boron nitride, and/or other material. The heating device 255 may be a resistive heater or a thermoelectric device that is used to heat the conductive block 254. In another embodiment, the heating device 255 consists of a plurality of channels formed in a surface of the conductive block 254 (not shown), which are temperature controlled by use of a heat exchanging fluid that continually flows through the channels. A fluid temperature controller (not shown) is adapted to control the heat exchanging fluid and thus the conductive block 254 temperature. The heat exchanging fluid may be, for example, a perfluoropolyether (e.g., Galden®) that is temperature controlled to a temperature between about 30° C. and about 250° C. The heat exchanging fluid may also be a temperature controlled gas, such as, argon or nitrogen.

The cooling region 253 is an area of the plate assembly 250 that is isolated from the conductive block 254 by the gap 259 and is maintained at a low temperature to cool the conductive block 254 when a conductive working fluid is delivered to the gap 259 by the fluid delivery system 275. The cooling region 253 contains a cooling device 265 that is used to cool this area of the plate assembly 250. The cooling region 253 may be made from a thermally conductive material such as aluminum, copper, graphite, aluminum-nitride, boron nitride, and/or other material. The cooling device 265 may be a thermoelectric device that is used to cool the cooling region 253. In another embodiment, the cooling device 265 consists of a plurality of channels (not shown) formed in a surface of the cooling region 253, which are temperature controlled by use of a heat exchanging fluid that continually flows through the channels. A fluid temperature controller (not shown) is adapted to control the heat exchanging fluid and thus the cooling region 253 temperature. The heat exchanging fluid may be, for example, a perfluoropolyether (e.g., Galden®) that is temperature controlled to a temperature between about 5° C. and about 20° C. The heat exchanging fluid may also be a temperature controlled gas, such as, argon or nitrogen.

The fluid delivery system 275 generally contains a fluid delivery source 270 that is adapted to deliver a conductive working fluid to the gap 259 formed between the conductive block 254 and the cooling region 253. The fluid delivery system 275 thus causes the conductive working fluid to flow from the fluid delivery system 275 through the inlet region 257 into the gap 259 and then out the outlet region 258, where it is returned to the fluid delivery system 275. The conductive working fluid is thus used to increase the thermal coupling between the cooling region 253 and the conductive block 254 during different phases of the process, to heat and cool the substrate. The conductive working fluid may a liquid, vapor or gas that is able to increase the thermal coupling between the conductive block 254 and the cooling region 253. In one embodiment, the conductive working fluid is liquid such as: a liquid metal alloy of gallium, indium, and tin (e.g., galinstan); mercury (Hg); Galden; or polyethylene glycol. In another embodiment, the conductive working fluid is a gas, such as, helium, argon, or carbon dioxide ($CO_2$).

In one embodiment, the plate assembly 250 is used to bake the substrates in, for example, the PEB chamber to perform the PEB step 540. In this configuration the substrate is first delivered to the block surface 254A while the conductive working fluid is flowing through the gap 259 and thus the cooling region 253 is in communication with the conductive block 254 and the block surface remains at a low temperature. Once the substrate contacts the block surface 254A the flow of the conductive working fluid is stopped and is removed from the gap 259 to decouple the cooling region 253 from the conductive block 254. In one embodiment, a gas source 272 is used to force the remaining conductive working fluid back to the fluid delivery system 275. The conductive block 254 is then heated by energy delivered from the heating device 255 until a desired processing temperature is achieved in the conductive block 254. After maintaining the desired processing temperature for a period of time the heating device 255 is shut off and the conductive working fluid is delivered to the gap 259 to cool the conductive block 254 by increasing the thermal coupling between the conductive block 254 and cooling region 253. Once the substrate has reached a desired temperature it is removed from the processing chamber.

In one embodiment of the plate assembly 250, as shown in FIG. 11A, the block surface 256 is purposely roughened by use of a mechanical fabrication process, such as, bead blasting, knurling, or other machining process to reduce the chance of thermal shock damage to the conductive block 254 material, and increase the surface area to couple the cooling region 253 to the conductive block 254.

PEB Process Endpoint Detection System

In an effort to reduce the processing time in the bake chamber, PEB chamber and/or the HMDS process chamber and improve the repeatability of the process results, an endpoint detector can be integrated into the chamber to notify the system controller 101 that the process is complete or nearly complete so that it can then be transferred to the next chill chamber 80. This design thus minimizes the need to run the process longer than necessary, or "over bake", while still assuring that the chamber process is complete. This process is especially important in the PEB chamber due to the prevention of the generated organic acid during exposure from attacking the unexposed areas of the photoresist.

Figure 12A:
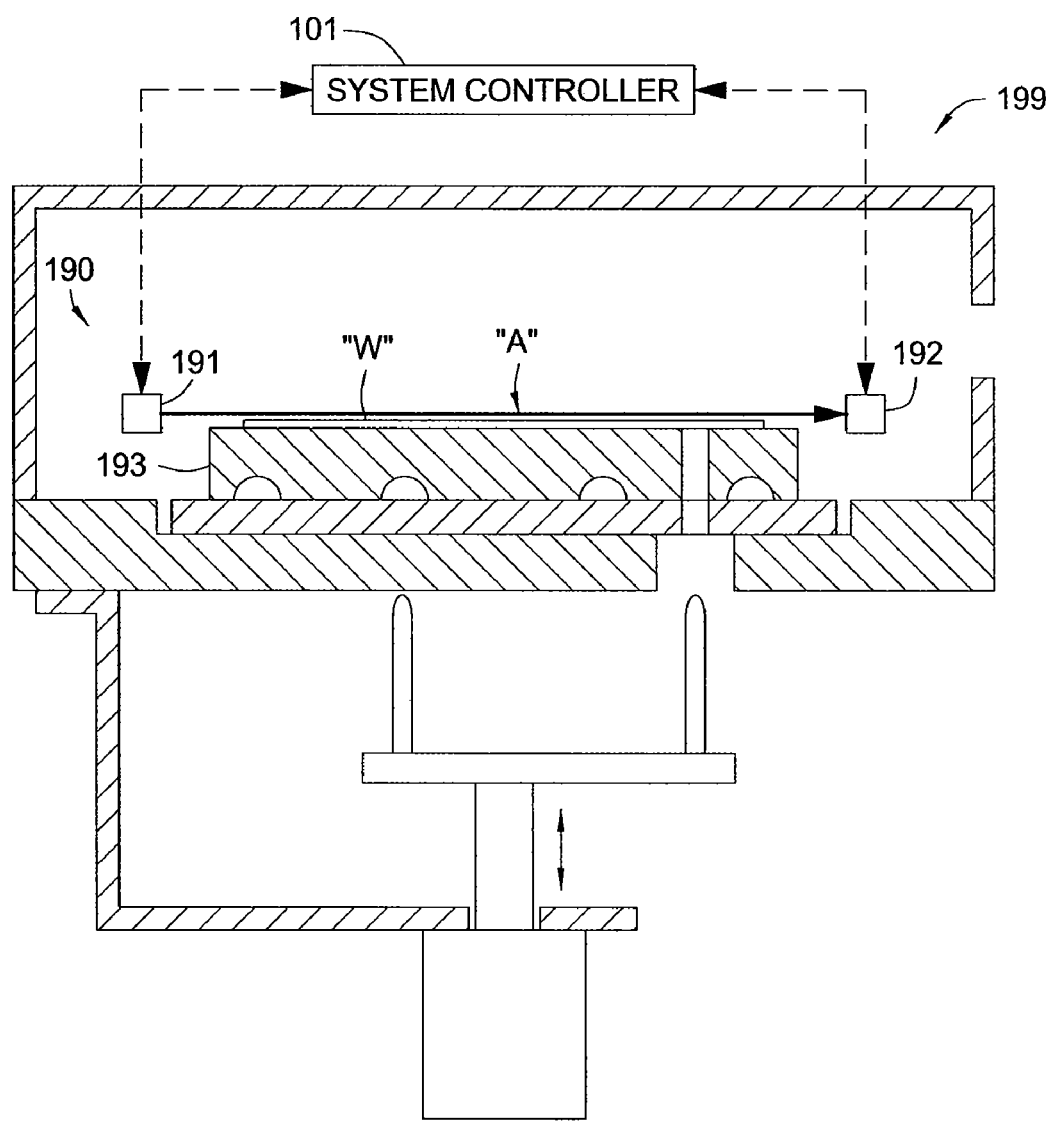
FIG. 12A is a side view of a bake chamber, PEB chamber or HMDS process chamber that contains one embodiment of a process endpoint detection system.

To resolve this problem, in one embodiment, the process endpoint is determined by measuring the concentration of a previously identified PEB, HMDS, or bake chamber reaction byproducts contained in the gas, or vapor, above the surface of the previously deposited or exposed photoresist layer. FIG. 12A illustrates one embodiment of an endpoint detection system 190 that is adapted to detect a change the concentration of the byproducts diffusing from the surface of the photoresist layer (not shown) on the surface of the substrate "W". In this configuration a laser 191 emits a beam (see item "A") at a wavelength that is tuned so that the intensity of the signal received by the detector 192 is decreased due to the interaction with the byproducts that diffuse into the gas, or vapor, above the surface of the photoresist during the processing step. The wavelength and intensity of the laser is also tuned so that the laser will not potentially cause further exposure of the photoresist. In general the typical photoresist process byproducts will be, for example, hydrocarbon containing materials and carbon dioxide ($CO_2$). From the variation in intensity caused by the change in the concentration of $CO_2$ or other organic breakdown products evolving from the photoresist, an endpoint can be inferred. The wavelength, or wavelengths, emitted by the laser may be between about 500 nm and about 4000 nm. In one embodiment, where carbon dioxide concentration is being detected, the wavelength of the laser is about 1960 nm, which conventional laser diodes can readily achieve. In another embodiment, the wavelength of the beam emitted by the laser is 4230 nm.

FIG. 12A is a side view of a bake chamber, PEB chamber or HMDS process chamber (see element 199) that contains a laser 191 that emits a beam that crosses just above the surface of the photoresist contained on the surface of the substrate. In this configuration the laser 191 and detector 192 are mounted so that the emitted beam is parallel and in close proximity to the photoresist layer on the surface of the substrate "W" which is retained on the plate assembly 193. The plate assembly 193 may be, for example, the PEB plate assembly 133 or bake plate assembly 93, which is used to process the substrate during the bake, PEB or HMDS process steps described above. Since the concentration of the evolved byproducts are the highest just above the surface of the photoresist the endpoint detection system 190 will generally have the highest sensitivity to changes in the concentration of the byproducts in the gas, or vapor in this configuration. An advantage of this configuration is that by projecting the beam over the surface of the photoresist, the detected variation in intensity is the sum of the amount of byproducts passing through the beam over the whole length of the beam. This method provides a lower signal to noise ratio, and also corrects for variations in the process during different phases of the process.

Figure 12C:
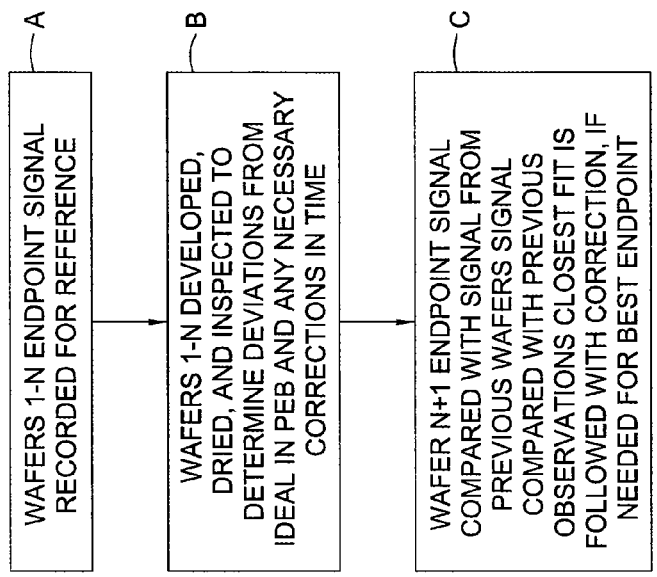
FIG. 12C is process method step used to improve the endpoint detection process described in conjunction with FIGS. 12A-B.
Figure 12B:
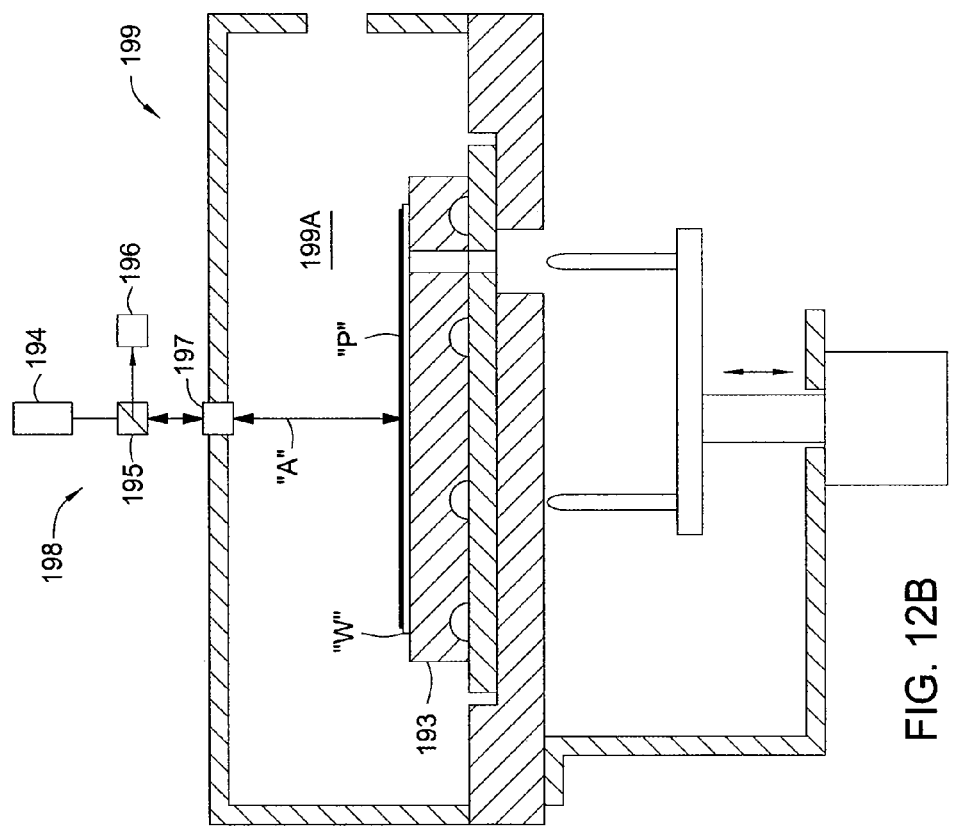
FIG. 12B is a side view of a bake chamber, PEB chamber or HMDS process chamber that contains another embodiment of the process endpoint detection system.

In another embodiment of the endpoint detector, a laser is used to determine the photoresist layer thickness and/or sense a change in the index of refraction of the photoresist layer to determine the endpoint of the process. FIG. 12B illustrates one embodiment of a endpoint detection system 198 that can be used to measure the photoresist layer thickness and/or sense a change in the index of refraction of the photoresist layer. The endpoint detection system 198 generally contains a laser 194, a beam splitter 195 and a detector 196. In one embodiment, shown in FIG. 12B, the endpoint detection system 198 also contains a fiber optic cable 197 which can allow the laser 194, beam splitter 195 and detector 196 to be positioned a desirable distance from the processing region 199A above the surface of the substrate.

In one embodiment of the endpoint detection process, the laser is designed to emit multiple wavelengths so that the photoresist thickness and/or index of refraction changes can be monitored during the processing. The thickness of the photoresist is measured by detecting a change in multi-wavelength interference patterns that will change as the photoresist thickness and index of refraction change during the process. In one embodiment of the endpoint detection process, the laser 194 emits radiation to a beam splitter 195, where a percentage of the radiation emitted from the laser 194 passes directly through the beam splitter 195 to the fiber optic cable 197. The fiber optic cable 197 then directs the emitted energy towards the surface of the substrate. The emitted radiation is then reflected, scattered or absorbed at the surface of the photoresist layer (item "P") and/or the surface of the substrate. A percentage of the reflected radiation then travels back to the fiber optic cable 197 where it directs the radiation to the beam splitter 195. The beam splitter 195 then reflects a percentage of the reflected radiation to the detector 196 where the incident radiation is detected.

To detect when the endpoint of a process has occurred, using either of the embodiments described above, the detected signal may be compared with the signal or data collected from previously processed substrates. In one embodiment, obtaining post process measurements before the endpoint can be confidently detected may be required. FIG. 12C illustrates a method of optimizing the endpoint detection process by using data collected from previously processed wafers. The method requires that endpoint signals from two or more substrates be recorded for reference or be stored in the memory of the system controller 101 (see item A). The two or more substrates are then fully processed to and inspected to determine how the endpoint signal compared with the ideal process (see item B). The inspection data is then used to determine the ideal process time and actual endpoint signal, which is then used by subsequent substrates processed in the chamber to determine the actual end of the process (see item C).

Improved Heat Transfer Design With Minimum Contact

To increase the system throughput, by reducing the chill chamber, bake chamber, PEB chamber and/or the HMDS process chamber processing times, various methods have been employed to increase the thermal coupling of the substrate to the heat exchanging device. While increasing the contact between the substrate surface and the surface of the plate assembly (e.g., PEB plate assembly 133, chill plate assembly 83, etc.) will increase the thermal coupling and reduce the time it takes a substrate to reach the desired process temperature, increasing contact is often undesirable since it will increase the number of particles generated on the backside of the substrate, which can affect the exposure process results and also device yield.

To reduce the particle generation on the backside of the substrate the contact of the substrate to the surface of the plate assembly can be minimized by use of an array of protrusions that space the substrate off the surface of the plate assembly. While protrusions reduce the number of particles generated they may tend to reduce the thermal coupling between the substrate and the plate assembly. Therefore, it is often desirable to minimize the height of the protrusions from the surface of the plate assembly to improve the thermal coupling, while also assuring that the substrate will not touch the surface of the plate assembly. Prior art applications have typically used sapphire spheres that are pressed or placed into machined holes in plate assembly surface to act as the protrusions. It is often difficult to mechanically achieve sufficiently good height control between the spheres and the surface of the plate assembly, since it needs to be very flat for this technique to assure that the substrate will not contact the plate assembly surface. These problems arise since the machining operations required to form the surface features that hold the spheres, or pins, are all referenced to some reference datum and thus does not take into account the variation in the surface topology of the plate assembly. This issue becomes especially important where the height of the protrusions from the surface of the plate assembly is about 30 micrometers.

Referring to FIG. 13A, to resolve these competing issues, in one embodiment, an array of accurately controlled small contact area protrusions 171 are formed on the surface of the plate assembly 170 and the substrate is biased towards the plate assembly to increase the thermal coupling between the substrate and the plate assembly. The substrate may be biased towards the plate assembly 170 by use of a vacuum chucking device, an electrostatic chucking device or other conventional method of forcing the substrate against plate assembly. The array of accurately controlled small contact area protrusions 171 can be formed by use of a CVD and/or PVD deposition process. By use of a CVD and/or PVD deposition process a thin layer of material, of a controlled size, can be uniformly deposited on the surface of the plate assembly to a desired height. The material deposited on the surface of the plate assembly 170 to form the protrusions 171 may be silicon dioxide ($SiO_2$), silicon (Si), a metal (e.g., nickel, titanium, titanium nitride, molybdenum, tungsten, etc.), a ceramic material, a polymeric material (e.g., polyimide, Teflon, etc.) or other material that is hard enough to withstand the biasing force without appreciable deformation and is not easily abraded by the interaction with the backside of the substrate (e.g., diamond, diamond-like carbon, or boron nitride). This approach is advantageous since the height of the protrusion above the surface of the plate assembly surface can be controlled to height that may be about ten times smaller (e.g., $\frac{1}{10}^{th}$) than on a state of the art configuration. The decrease in protrusion height will increase the heat transfer rate, so the wafer can heat much faster, and thus reduces the time that the wafer spends transiting to the final temperature, which reduces the variation in the diffusion and chemical reaction. It also ensures closer thermal coupling between the wafer and heater, which reduces the thermal impact of other chamber non-uniformities. Another advantage of this approach is that by using more protrusions 171, the magnitude of the substrate bow is reduced since the substrate bow is inversely proportional to the fourth power of the distance between the protrusions when an external pressure is applied to the substrate. With each protrusion 171 nominally the same height from the surface of the plate assembly, and the substrate being uniformly held above the surface of the plate assembly, with minimal bowing between protrusions, the thermal transfer from the plate assembly to the substrate will be uniform. Therefore, this design brings the temperature of the substrate quickly and uniformly to the target temperature, while minimizing the generation of backside particles that are inherent in normal vacuum chucks.

To form the protrusions 171, in one embodiment, a mask (not shown) is placed over the surface of the plate assembly which allows CVD or PVD material to be deposited on certain defined areas of the substrate by use of features or holes formed in the mask. In this way the size is controlled by the features formed in the mask and the height of the protrusion is can be controlled by assuring a certain amount of material is deposited on the surface of the plate assembly using a known PVD or CVD process deposition rate. In one embodiment, the protrusions 171 which are deposited by a PVD or CVD process are about 100 micrometers thick.

Figure 13B:
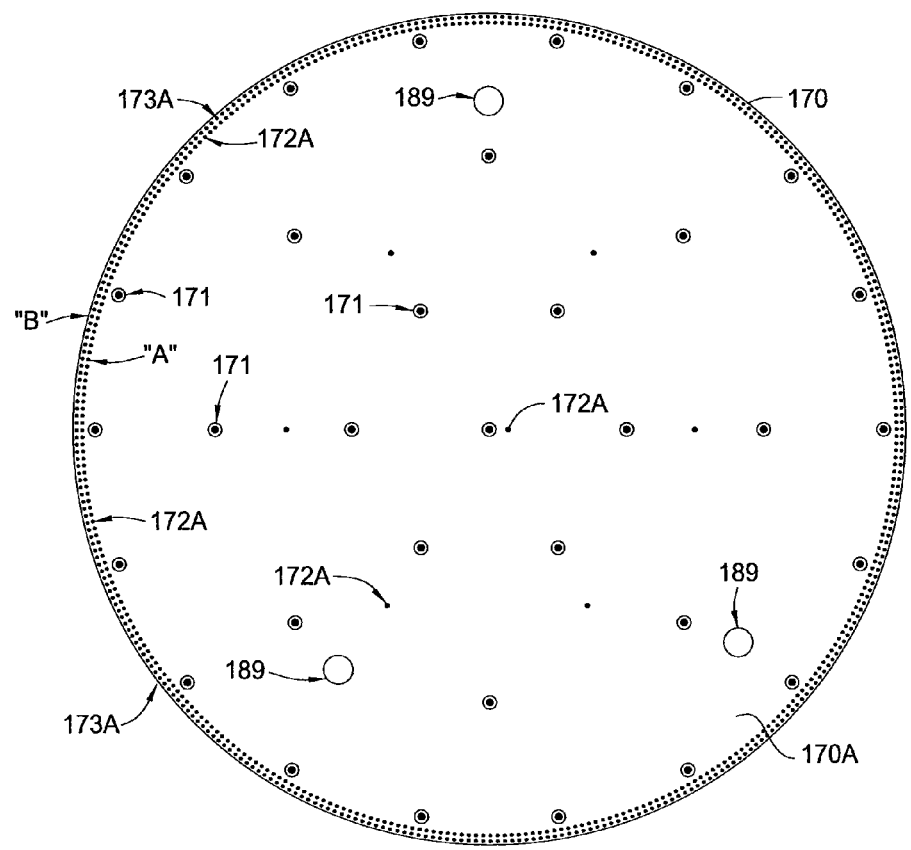
FIG. 13B is a plan view of the top of the plate assembly shown in FIG. 13A.
Figure 13C:
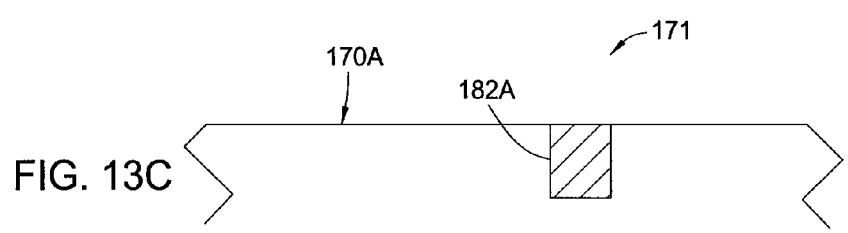
FIG. 13C is a cross-sectional view of a seed crystal imbedded in the surface of the plate assembly shown in FIG. 13A.
Figure 13D:
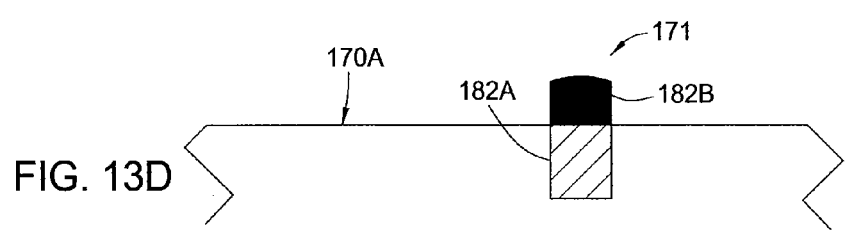
FIG. 13D is a cross-sectional view of a seed crystal imbedded in the surface of the plate assembly shown in FIG. 13A, that has a selectively deposited layer on its surface.

FIGS. 13C and 13D illustrate one embodiment of a masking process where a selective CVD deposition process is used to deposit protrusions of a desired height. In this configuration, for example, a silicon dioxide or diamond seed crystal 182A layer is imbedded in the plate assembly surface 170A of plate assembly 170 made from Teflon coated aluminum. In this configuration a conventional CVD process may be adapted to selectively deposit a layer 182B of silicon dioxide or diamond film on the seed crystal 182A. In this embodiment, a seed crystal 182A is imbedded into the plate assembly surface 170A so that the top surface of the seed crystal is substantially flush with the plate assembly surface 170A. In one aspect of the invention an insertion tool (not shown) is used to assure the seed crystal 182A can be repeatably installed and it is flush with the plate assembly surface 170A. The insertion tool should be made from a material is relatively incompressible, flat, and has a polished face. The insertion tool should have a working surface (not shown), which contacts with the seed crystal during insertion into the plate assembly, that is at-least as hard as the material from which the seed crystal 182A is made.

FIG. 13A illustrates one embodiment of a heat/cool assembly 180 which may be used in the chill chamber 80, the bake chamber 90, the PEB chamber 130 and/or the HMDS process chamber 70. In one embodiment, the heat/cool assembly 180 contains a plate assembly 170, and a vacuum source 175, which are mounted in a processing chamber 186. The plate assembly 170 generally contains a plate 170B, plate assembly surface 170A, protrusions 171, and a vacuum source port assembly 172. In this configuration the vacuum source 175 is used to create a negative pressure in the vacuum port plenum 172B, thus causing air to flow into the a plurality of vacuum ports 172A formed in the surface of the plate assembly 170, which creates a reduced pressure behind the substrate which causes the substrate to be biased towards to the surface of the protrusions 171. The plate 170B may be made from a thermally conductive material such as aluminum, copper, graphite, aluminum-nitride, boron nitride, and/or other material, and is in communication with a heat exchanging device 183A. While FIG. 13A illustrates a heat exchanging device 183A which has a different shape than that shown in the chill chamber 80, the bake chamber 90, the PEB chamber 130 and/or the HMDS process chamber 70 drawings described above, this embodiment is intended incorporate all of the features described above.

In one embodiment, the plate assembly 170 also contains a gas source port assembly 173 and a gas source 174 to purge the edge of the substrate during processing to prevent the evaporating solvent vapors from being deposited on the plate assembly surface 170A or the backside of the substrate due to the reduced pressure generated behind the substrate (e.g., a vacuum chuck configuration). In this configuration the gas source 174 is used to create a positive pressure in the gas port plenum 173B, thus causing the gas to flow out of a plurality of gas ports 173A formed in the surface of the plate assembly 170. In one embodiment the gas source 174 is adapted to deliver an inert gas to the edge of the substrate, such as, argon, xenon, helium, nitrogen, and/or krypton. The gas source 174 may also be adapted to deliver a fluid to the edge of the substrate.

FIG. 13B illustrates a plan view of the surface of the plate assembly 170 with no substrate on top of the protrusions 171, to illustrate one possible configuration of protrusions 171 (33 shown), vacuum ports 172A (~367 shown), and gas ports 173A (~360 shown). In general, the plurality of protrusions 171 are spaced across the surface of the plate assembly 170 so that the contact area can be minimized and the gap between the substrate and the plate assembly surface 170A is substantially uniform. The plurality of vacuum ports 172A are spaced across and around the surface of the plate assembly 170 so that the substrate can be uniformly biased towards the plate assembly 170 and thus the gap between the substrate and the plate assembly surface 170A is substantially uniform. In one embodiment, as shown in FIG. 13B an inner array of vacuum ports 172A (see item "A") is mirrored with an outer array of gas ports 173A (see item "B"), where the diameter of the inner array "A" is smaller than the substrate diameter and the diameter of the outer array "B" is equal to or larger than the substrate diameter. In one embodiment, a small ridge of the CVD or PVD deposited material that is used to form the protrusions 171 (not shown) is placed between the inner array of vacuum ports 172A and the outer array of gas ports 173A to minimize the amount of gas required to purge the edge of the substrate. FIGS. 13A-B also illustrate a configuration having a lift assembly 87 and lift pin hole 189 extending through the plate assembly surface 170A to lift the substrate off the plate assembly surface 170A.

In one embodiment, the gas delivered from the gas source 174 is heated prior to exiting the gas ports 173A to prevent cooling of the edge of the substrate during processing. In another embodiment, the length of the gas port plenum 173B in the plate assembly 170 is designed to assure that the gas resides in the gas port plenum long enough for the injected gas to substantially achieve the plate temperature before it exits the gas ports 173A.

Support Chamber

The support chamber 65 (FIGS. 4C, 4F and 4H) may be used to house containers, pumps, valves, filters and other support components that are useful for completing the process sequence in the cluster tool 10.

In one embodiment, the support chamber 65 contains various metrology tools, such as, a particle measurement tool, an OCD spectroscopic ellipsometry device, spectroscopic reflectometry and various scatterometry devices to detect defects in the processed substrates, perform statistical process control, and/or allow the system to compensate for variations in the incoming substrate quality. In one case a non-contact visible and/or DUV reflectometry technique can be used to perform measurements of film thickness and uniformity of the films on the substrate in the cluster tool. A reflectometry tool can be purchased from Nanometrics Incorporated, Milpitas Calif.

An integrated OCD spectroscopic ellipsometry tool may be used to enable complete film characterization and closed-loop control within the lithographic process without having to move the wafer to a standalone metrology tool, saving transport time and eliminating potential handling contamination and damage. The integration of the various process control metrology capability directly into the cluster tool will thus help improve CD control and CoO. An OCD spectroscopic ellipsometry tool can be purchased from Nanometrics Incorporated, Milpitas Calif.

Wafer Sequencing/Parallel Processing

In an effort to be more competitive in the market place and thus reduce CoO, electronic device manufacturers often spend a large amount of time trying to optimize the process sequence and chamber processing time to achieve the greatest substrate throughput possible given the cluster tool architecture limitations and the chamber processing times. In track lithography type cluster tools, since the chamber processing times tend to be rather short, (e.g., about a minute to complete the process) and the number of processing steps required to complete a typical track system process is large, a significant portion of the time it takes to process a substrate is taken up by the processes of transferring the substrates in a cluster tool between the various processing chambers. In one embodiment of the cluster tool 10, the CoO is reduced by grouping substrates together and transferring and processing the substrates in groups of two or more. This form of parallel processing thus increases the system throughput, and reduces the number of moves a robot has to make to transfer a batch of substrates between the processing chambers, thus reducing wear on the robot and increasing system reliability.

Figure 16A:
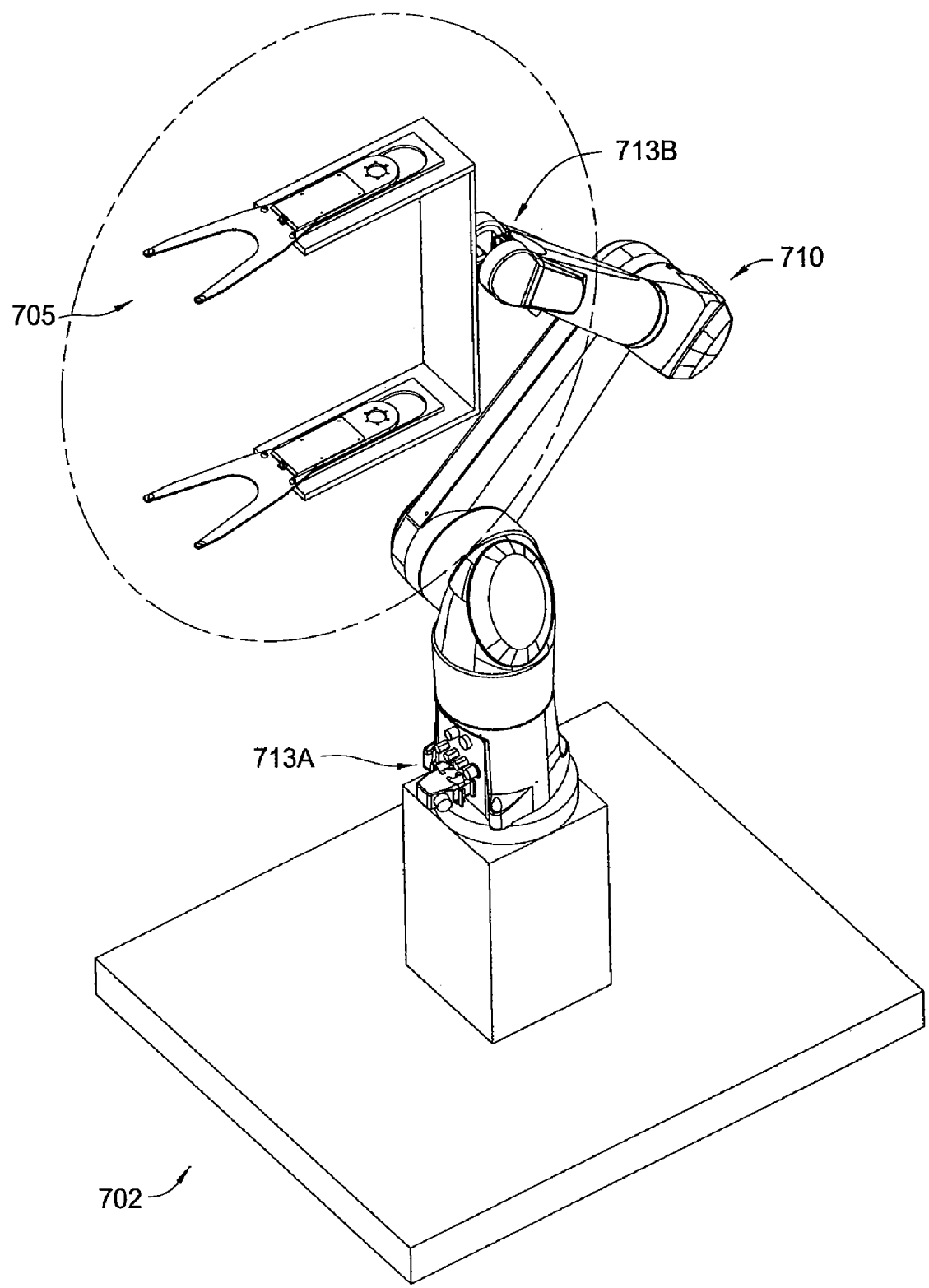
FIG. 16A is an isometric view illustrating one embodiment of a dual blade 6-axis articulated robot assembly according to the present invention.

In one aspect of the invention, the track architecture is designed so that substrates leave the cassette 106 mounted in the pod assemblies 105A-D one-by-one, and are then grouped together in groups containing two or more substrates after being processed in the first processing station. For example, when using the process sequence shown in FIG. 3A, the substrates might be grouped after completing the BARC coat step 510. In this configuration, the robot that serves the cassettes 106 and places each substrate in the first process stations may use a single blade robot, but the robot (e.g., central robot 107) that picks up the substrates from the first process stations and places them in subsequent process stations, will be a robot that contains as many substrate retaining devices (e.g., robot blades) as there are substrates to be grouped. For example, as shown in FIG. 16A, in the case where two substrates are to be grouped together, a dual bladed type central robot 107 may be used. In another aspect of the invention, the substrates are ungrouped before they are transferred into the stepper/scanner 5, then are regrouped again after the performing the PEB step 540, and are then ungrouped again at the last process station prior to being picked up by the front end robot 108.

In one aspect of the invention, the substrates may be grouped together at the pod assembly 105 and transferred through the cluster tool in groups, by use of a multiple bladed type front end robot 108, central robot 107 and rear robot 109. FIGS. 16A-D illustrate one embodiment of a multiple bladed robot. In this case, after each blade of the front end robot 108 is loaded with a substrates, all of the transfer processes through the cluster tool is completed in groups. One will note that it is likely that the substrates will have to be de-grouped, i.e, transferred one at a time, at the stepper/scanner 5.

In one embodiment, the substrates are grouped in pairs and thus the transferring process would include the grouping steps of single substrate transfer in to the first process chamber, then dual substrate transfer through the system, then single substrate transfer to and from the stepper/scanner 5, then dual substrate transfer through the system, and single substrate transfer from the last chamber to the cassette. In one embodiment, the central robot 107, as shown below in FIGS. 16A-B, contains a dual blade assembly 705 that contains at least one robot blade 711A on the first blade assembly 715A and at least one robot blade 711B on the second blade assembly 715B to transfer substrates in groups of two. In this configuration, the first blade assembly 715A and the second blade assembly 715B are a fixed distance apart, which corresponds to the vertical spacing of the two chambers in which the substrates are to be grouped. For example, if the substrates are grouped in pairs after the BARC coat step 510 is performed in CD1 and CD2 of the front end processing rack 52 shown in FIG. 4A, the spacing of the transfer positions in the CD1 and CD2 chambers is configured to allow transferring of the substrates to the C12 and C9 chill chambers or B5 and B2 bake chambers in the first central processing rack 152. Therefore, after the post BARC chill step 514 has been completed the central robot 107 may transfer the pair of substrates to one of the pairs of coater/developer chambers 60 retained in the second central processing racks 154, such as chambers CD1 and CD2, CD2 and CD3, or CD3 and CD4.

In one embodiment of the dual blade assembly 705, the horizontal spacing of the first blade assembly 715A relative to the second blade assembly 715B is a fixed distance apart, which corresponds to the horizontal spacing of the two chambers in which the substrates are to be grouped. In this configuration, the first blade assembly 715A and the second blade assembly 715B are aligned in the horizontal plane so that the dual blade assembly 705 can access chambers spaced horizontally.

Figure 16C:
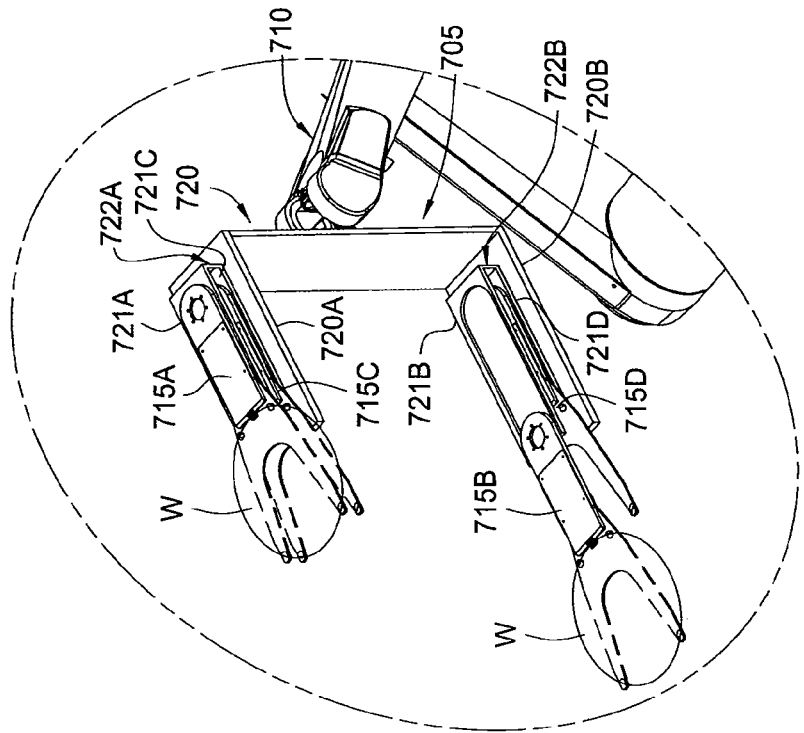
FIG. 16C is an isometric view illustrating one embodiment of the dual blade assembly shown in FIG. 16A.
Figure 16B:
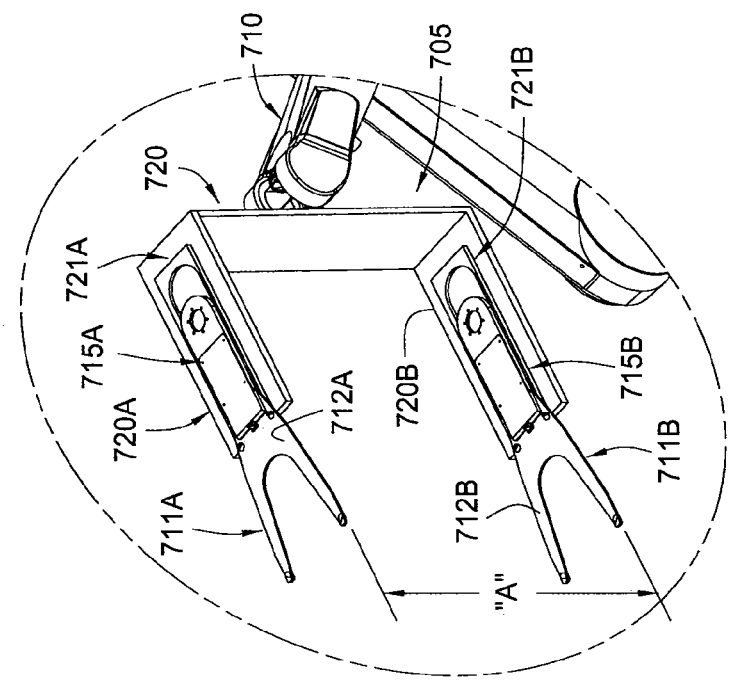
FIG. 16B is an isometric view illustrating one embodiment of the dual blade assembly shown in FIG. 16A.
Figure 16E:
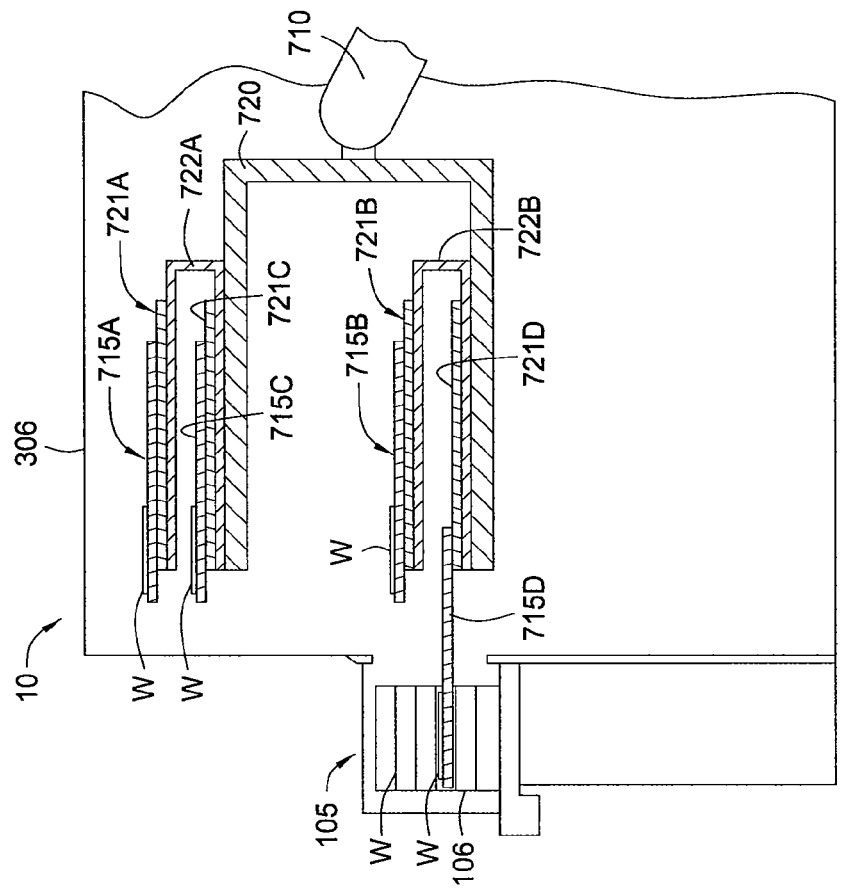
FIG. 16E illustrates a cross-sectional view of an over/under type dual blade assembly where a single blade has been extended to access a substrate in a cassette in a pod assembly.
Figure 16D:
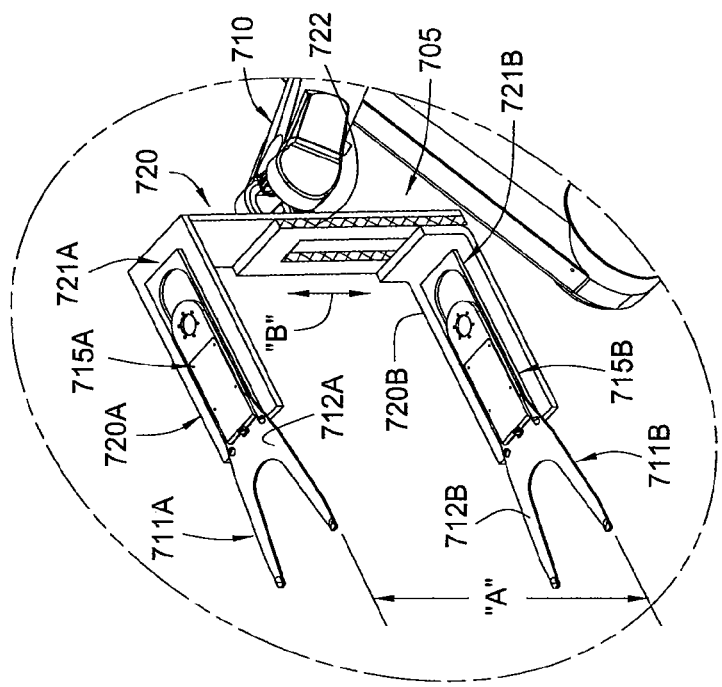
FIG. 16D is an isometric view illustrating one embodiment of the dual blade assembly shown in FIG. 16A that allows a variable pitch between robot blades.

Referring to FIG. 16D, in another embodiment, the spacing of the first blade assembly 715A and the second blade assembly 715B are made a variable distance apart by use of an actuator 722 mounted on the dual blade assembly 705. Generally, the actuator 722 is adapted to vary the spacing between the various number of grouped substrates to coincide with the desired spacing of the chambers to which the grouped substrates will be transferred. In one aspect, the actuator 722 is mounted on the support 720 and is adapted to position the second blade assembly 715B that is attached to the second surface 720B. In this configuration the actuator 722 can vary the spacing "A" between the second blade assembly 715B relative to the first blade assembly 715A by positioning the second surface 720B in a direction "B". In one embodiment, the actuator 722 is a direct drive linear brushless servomotor that may be purchased from Danaher Motion of Wood Dale, Ill. or Aerotech, Inc. of Pittsburgh, Pa.

In one embodiment, a batch develop process could be performed on the substrates, in which case the substrates would be transferred in a group and then ungrouped to perform the develop process, after which they would be regrouped transferred as a group.

Sequencing Without Buffer Stations

In one aspect of the invention, the substrate processing sequence and cluster tool are designed so that the substrate transferring steps performed during the processing sequence are completed to chambers that will perform the next processing step in the processing sequence. The prior art cluster tool configurations commonly install interim stations, or buffer chambers, in the process sequence so that the robot that dropped off a substrate can complete other transferring steps and/or allow other robots to pick up and transfer the waiting substrate to another desired position in the system. The step of placing a substrate in a chamber that will not perform the subsequent processing step wastes time, decreases the availability of the robot(s), wastes space in the cluster tool, and increases the wear on the robot(s). The addition of the buffering steps will also adversely affect device yield, due to the increase in the number of substrate handoffs which will increase the amount of backside particle contamination. Also, substrate processing sequences that contain buffering steps will inherently have different substrate wafer histories, unless the time spent in the buffer chamber is controlled for every substrate. Controlling the buffering time will increase the system complexity, due to an added process variable, and it will likely hurt the maximum achievable substrate throughput. In a case where the system throughput is robot limited, the maximum substrate throughput of the cluster tool is governed by the total number of robot moves to complete the process sequence and the time it takes to make the robot move. The time it takes a robot to make a desired move is usually limited by robot hardware, distance between processing chambers, substrate cleanliness concerns, and system control limitations. Typically the robot move time will not vary much from one type of robot to another and is fairly consistent industry wide. Therefore, a cluster tool that inherently has fewer robot moves to complete the processing sequence will have a higher system throughput than a cluster tool that requires more moves to complete the processing sequence, such as cluster tools that contain multiple buffering steps.

The various embodiments of the cluster tool shown on FIGS. 2A-G and 14A-B have particular advantage over prior art configurations since fewer moves and fewer robots are required to transfer the substrate through the system. One example, is the ability of the front end robot 108 to access the cassette(s) 106 and then directly place the substrate in a first processing chamber (e.g., coater chamber 60A) and then after processing in the first processing chamber deliver the substrate to a subsequent processing chamber (e.g., bake chamber 90). Prior art configurations require the use of multiple interim stations between the cassettes, process chambers and/or stepper/scanners, and multiple robots to complete the process sequence through the cluster tool. In some prior art configurations, for example, it is common for a first robot to place a substrate in a first position, where it is picked up by second robot and placed in a second position in a processing chamber. After being processed in the processing chamber the substrate is then placed back in the first position by the second robot where it is picked up by the first robot or third robot to be transferred to another position in the system. This transferring process, or transfer path, is wasteful since it requires a separate robot to complete the transfer between the first position and the second position and it requires two non-value added moves to transfer the substrate. Adding extra robots and/or increasing the non-value added moves can be costly due to decreased substrate throughput and will make the cluster tool less reliable. The importance of this aspect may be better understood by noting that the reliability of a serial sequence is proportional to the product of the reliability of each component in the sequence. Therefore, a single robot having 99% up-time is always better than two robots having 99% up-time, since the system up-time for two serial robots each having 99% up-time is only 98.01%. Since track lithography chamber processing times tend to be rather short, and the number of processing steps required to complete a typical process sequence is large, the system throughput can be significantly affected by the reliability of the system, the number of wafer handoffs and the non-value added moves of a robot.

One advantage of the cluster tool configuration described herein is the ability of the two or more robots to access processing chambers (e.g., chill chamber 80, bake chambers 90, etc.) in the different main modules (e.g., front end module 306, central module 310, etc.). For example, in the embodiment shown in FIG. 2F the front end robot 108 can access the processing chambers in the first central processing rack 312 and the second central processing rack 314 while the central robot 107 can access processing chambers in the first processing rack 308 and the second processing rack 309. The ability of a robot to access chambers in other main modules, or "robot overlap," can be an important aspect in preventing system robot transfer bottlenecks, since it allows an under utilized robot to help out a robot that is limiting the system throughput. Therefore, the substrate throughput can be increased, a substrate's wafer history can be made more repeatable, and the system reliability can be improved through the act of balancing the load each robot takes during the substrate sequence. In one aspect, the system controller 101 is adapted to adjust the substrate transfer path through the cluster based on an optimized throughput or to work around processing chambers that have become inoperable. The feature of the system controller 101 which allows it to optimize throughput is known as the logical scheduler. The logical scheduler prioritizes tasks and substrate movements based on inputs from the user and various sensors distributed throughout the cluster tool. The logical scheduler may be adapted to review the list of future tasks requested of each of the various robots (e.g., front end robot 108, central robot 107, rear robot 109, one or more shuttle robots 110, etc.), which are retained in the memory of the system controller, to help balance the load placed on each of the various robots. Use of a cluster tool architecture and system controller 101 to work together to maximize the utilization of the cluster tool to improve CoO makes the wafer history more repeatable and improves the system reliability.

In one aspect, the system controller 101 is further programmed to monitor and control the motion of the end-effector of all robots in the system (e.g., dual blade assembly 705 (FIGS. 16A-C), blade assembly 706 (FIG. 16F-G), etc.) to avoid a collision between the robots and improve system throughput by allowing robots to be in motion at the same time. This so called "collision avoidance system," may be implemented in multiple ways, but in general the system controller 101 monitors the position of each of the robots by use of various sensor positioned on the robot or in the cluster tool during the transferring process to avoid a collision. In one aspect, the system controller is adapted to actively alter the motion and/or trajectory of each of the robots during the transferring process to avoid a collision and minimize the transfer path length. In one embodiment, a "zone avoidance" system is used to prevent collisions between multiple robots. In one aspect of the zone avoidance system, the system controller, through use of its hardware and software components, is able to continually monitor, update and define regions around each robot that are "open" or safe to move within. The defined "open" or safe regions are thus areas in which a robot may move into, or through, without the possibility of colliding with another robot. In another embodiment of the collision avoidance system, the system controller is adapted to monitor and control multiple sensors (e.g., encoders on the various robot axes, position sensors, etc.) and emitters distributed around the cluster tool mainframe and on the robot(s) to continually track the actual position of each robot within the cluster tool to assure that the motion of two or more robots will not cause them to move into the same space and thus collide. In one aspect, the sensors are optical sensors that are positioned in various vertical and/or horizontal orientations in the cluster tool to monitor the position of each of the robots. In another aspect, each robot and its components are monitored by use of a sensing system that is able to triangulate the position of each of the various robot components by use of emitters positioned on the various robot components relative to multiple sensors positioned in the mainframe. In one aspect, the sensing system contains emitters and sensors that are RF transmitters and receivers.

Figure 14A:
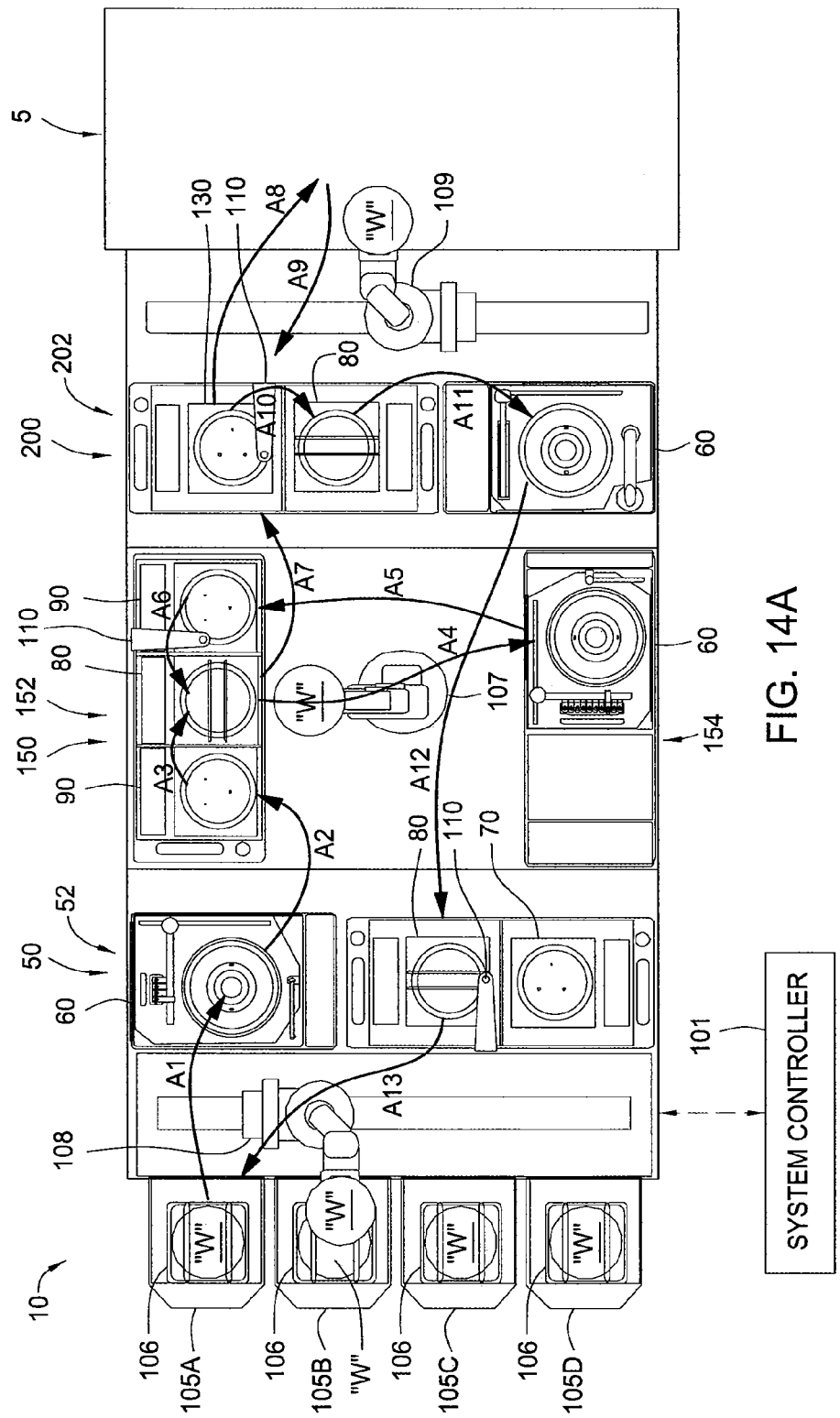
FIG. 14A is a plan view of a processing system illustrated in FIG. 1B that illustrates a transfer path of a substrate through the cluster tool following the process sequence illustrated in FIG. 3A.

FIG. 14A illustrates schematically a substrate transfer path which is intended to illustrate one example of the substrate flow through the cluster tool 10 where the number of buffering steps is minimized or completely eliminated. A transfer path is generally a schematic representation of the path a substrate will travel as it is moved from one position to another so that various process recipe steps can be performed on the substrate(s). FIG. 14A illustrates the transfer path of a substrate following the processing sequence described in FIG. 3A. In this embodiment, the substrate is removed from a pod assembly 105 (item # 105A) by the front end robot 108 and is delivered to a coater chamber 60A (e.g., CD1, CD2, etc. (FIG. 4A)) following the transfer path A1, so that the BARC coat step 510 can be completed on the substrate. Once the BARC process has been completed, the substrate is then transferred to a bake chamber 90 (e.g., B1, B3, etc. (FIG. 4B)) by the central robot 107 following the transfer path A2, where the post BARC bake step 512 is completed on the substrate. After completing the post BARC bake step 512 the substrate is then transferred to the post BARC chill step 514 (e.g., C1, C2, etc. (FIG. 4B)) by a shuttle robot 110 following the transfer path A3. After performing the post BARC chill step 514 the substrate is then transferred by the central robot 107, following the transfer path A4, to the coater chamber 60A (e.g., CD1, CD2, etc. (FIG. 4C)) where the photoresist coat step 520 is performed. After performing the photoresist coat step 520 the substrate is then transferred by the central robot 107, following the transfer path A5, to the bake chamber 90 (e.g., B2, B4, etc. (FIG. 4B)) where the post photoresist coat bake step 522 is performed. After performing the post photoresist coat bake step 522 the substrate is then transferred by a shuttle robot 110, following the transfer path A6, to the chill chamber 80 (e.g., C1, C2, etc. (FIG. 4B)) where the post photoresist chill step 524 is performed. After performing the post photoresist chill step 524 the substrate is then transferred by the central robot 107, following the transfer path A7, to the OEBR chamber 62 (e.g., OEBR1, etc. (not shown in FIG. 14A, see FIG. 4D)) where the OEBR step 536 is performed. The substrate is then transferred to the stepper/scanner 5 following the transfer path A8 using the rear robot 109. After the exposure step 538 is complete, the rear robot 109 transfers the substrate to the PEB chamber 130 (FIG. 4D) following the transfer path A9. After performing the PEB step 540 the substrate is then transferred by the shuttle robot 110, following the transfer path A10, to the chill chamber 80 where the post PEB chill step 542 is performed. After performing the post PEB chill step 542, the substrate is then transferred by the rear robot 109 (or central robot 107), following the transfer path A11, to the developer chamber 60B where the develop step 550 is performed. After performing the develop step 550 the substrate is then transferred by the central robot 107, following the transfer path A12, to the chill chamber 80 where it will be picked up by the front end robot 108 to be transferred to the pod assembly 105 following the transfer path A13.

In one aspect of the cluster tool 10 illustrated in FIG. 14A, the substrates are grouped together and transferred in groups of two or more, such that the grouped substrates may move as a group along the transfer paths A1-A7 and A10-A12. As noted above this form of parallel processing will increases the system throughput, and reduces the number of moves a robot has to make to transfer a batch of substrates between the processing chambers, thus reducing wear on the robot and increasing system reliability.

In one aspect of the cluster 10, as illustrated in FIG. 14A, the transfer paths A3, A6, and/or A10 are completed by the central robot 107. In one embodiment, the transfer path A11 is completed by a shuttle robot 110 that is adapted to transfer substrates between the chill chamber 80 and the developer chamber 60B.

Figure 14B:
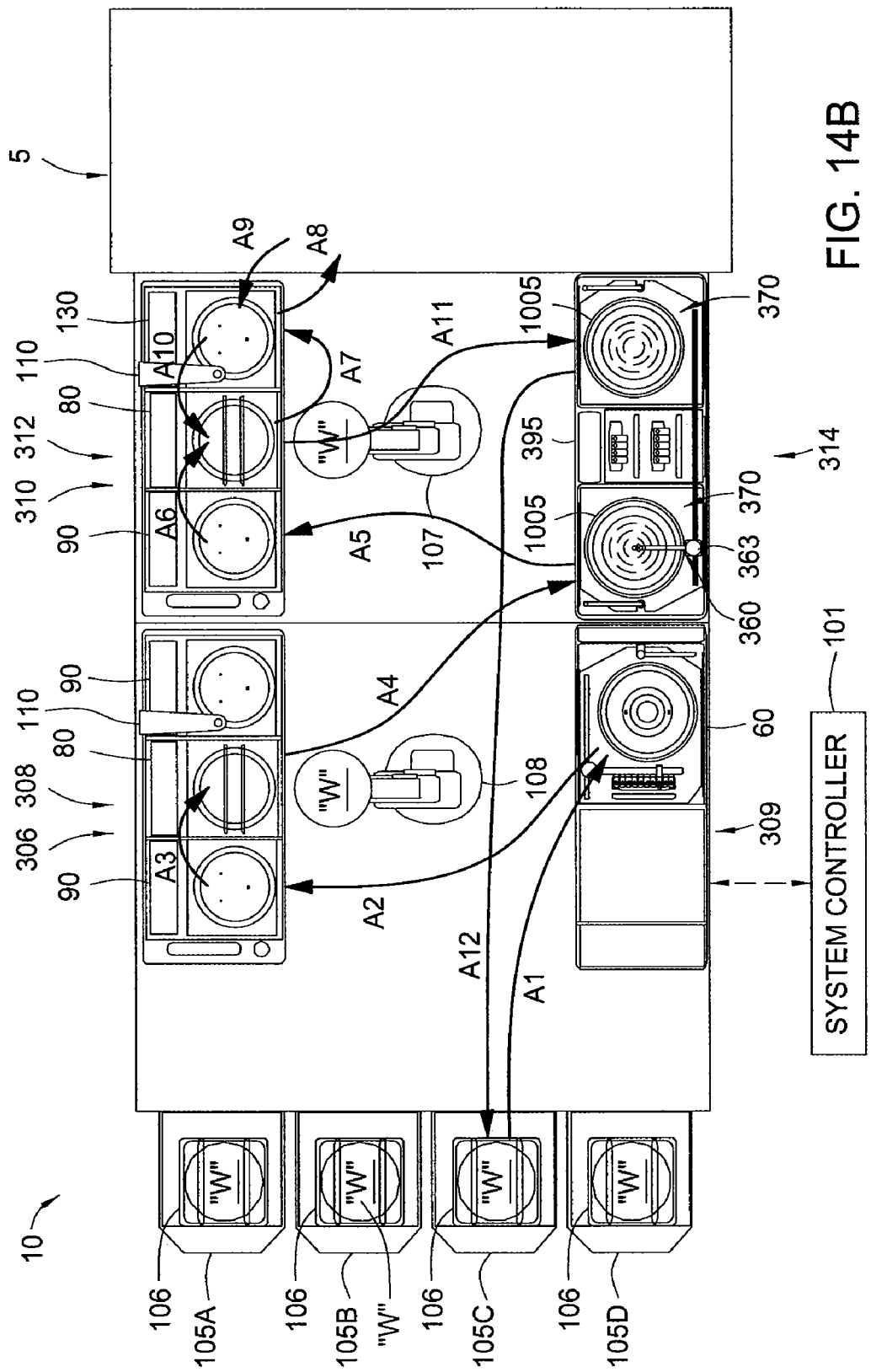
FIG. 14B is a plan view of a processing system illustrated in FIG. 2F that illustrates a transfer path of a substrate through the cluster tool following the process sequence illustrated in FIG. 3A.

FIG. 14B illustrates schematically one example of a substrate transfer path through the FIG. 2F configuration of cluster tool 10, where the number of buffering steps can be minimized or completely eliminated. FIG. 14B illustrates the transfer path of a substrate following the processing sequence described in FIG. 3A. In this embodiment, the substrate is removed from a pod assembly 105 (item # 105C) by the front end robot 108 and is delivered to a coater chamber 60A following the transfer path A1, so that the BARC coat step 510 can be completed on the substrate. Once the BARC process has been completed, the substrate is then transferred to a bake chamber 90 (e.g., B1, B2, B3, etc. (FIG. 4G)) by the front end robot 108 following the transfer path A2, where the post BARC bake step 512 is completed on the substrate. After completing the post BARC bake step 512 the substrate is then transferred to the post BARC chill step 514 (e.g., C1, C2, etc. (FIG. 4G)) by a shuttle robot 110 following the transfer path A3. After performing the post BARC chill step 514 the substrate is then transferred by the front end robot 108, or central robot 107, following the transfer path A4, to the process chamber 370 configured as a coater chamber 60A (e.g., CD1, CD2, CD3, etc. (FIG. 4J)) where the photoresist coat step 520 is performed. After performing the photoresist coat step 520 the substrate is then transferred by the central robot 107, following the transfer path A5, to the bake chamber 90 (e.g., B2, B4, etc. (FIG. 4I)) where the post photoresist coat bake step 522 is performed. After performing the post photoresist coat bake step 522 the substrate is then transferred by a shuttle robot 110, following the transfer path A6, to the chill chamber 80 (e.g., C1, C2, etc. (FIG. 4I)) where the post photoresist chill step 524 is performed. After performing the post photoresist chill step 524 the substrate is then transferred by the central robot 107, following the transfer path A7, to the OEBR chamber 62 (e.g., OEBR1, etc. (FIG. 4I)) where the OEBR step 536 is performed. The substrate is then transferred to the stepper/scanner 5 following the transfer path A8 using the central robot 107. After the exposure step 538 is complete, the central robot 107 transfers the substrate to the PEB chamber 130 following the transfer path A9. After performing the PEB step 540 the substrate is then transferred by the shuttle robot 110, following the transfer path A10, to the chill chamber 80 where the post PEB chill step 542 is performed. After performing the post PEB chill step 542, the substrate is then transferred by the central robot 107, following the transfer path A11, to the process chamber 370 configured as a developer chamber 60B (e.g., CD1, CD2, CD3, etc. as (FIG. 4J)) where the develop step 550 is performed. After performing the develop step 550 the substrate is then transferred by the front end robot 108, following the transfer path A12, to the pod assembly 105. In one aspect, transfer path A12 may be completed by picking up the substrate from the developer chamber 60B using the central robot 107, transferring the substrate to the front end robot 108, and then transferring the substrate to the pod assembly 105.

In one aspect, the transfer path A12 may be broken up into two steps (not shown) where the substrates are transferred to a chill chamber 80 in the first processing rack 308 by the central robot 107 and then transferred to the cassette using the front end robot 108. In this configuration the chill chamber 80 acts as a "safe" position where the substrate can reside without being exposed to thermal energy or processing fluids which may affect the wafer history and amount contamination on the processed substrate. A "safe" position may coincide with holding the substrate on raised lift pins 87D (shown in lower position of FIG. 10A) or retaining the substrate on the chill plate block 83B (FIG. 10A).

In one aspect, transfer path A12 may be completed by picking up the substrate from the developer chamber 60B using the central robot 107 and then transferring the substrate to the pod assembly 105. In this configuration the central robot 107 may be further adapted to translate a distance along the length of the cluster tool 10 by use of a slide assembly (not shown) and a translation actuator (e.g., linear servo motor, etc. (not shown)) to give the robot the desired reach to access the cassettes.

In one aspect of the cluster 10, as illustrated in FIG. 14B, the transfer paths A3, A6, and/or A10 are completed by the central robot 107 or the front end robot 108. In another aspect of the cluster tool 10 illustrated in FIG. 14B, the substrates are grouped together and transferred in groups of two or more, such that, the grouped substrates may move as a group along the transfer paths A1-A7 and A10-A12.

Cluster Robots Design

A. Vertical Rail Robot Design

Figure 15B:
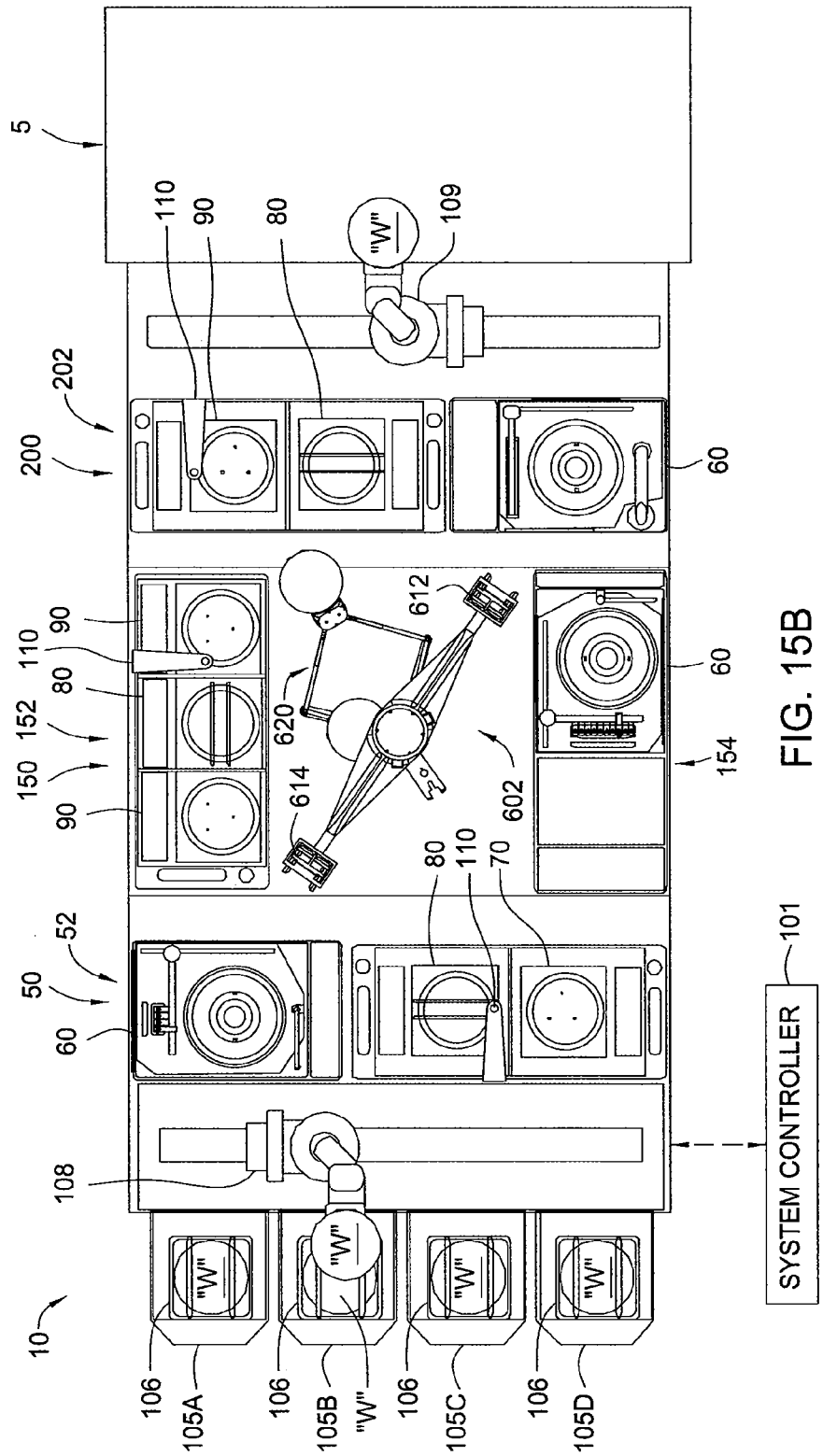
FIG. 15B is a plan view of a processing system illustrated in FIG. 15A, according to the present invention.

FIG. 15A is an isometric view of cluster tool 10 which illustrates one embodiment of the central robot 107. This embodiment of the central robot 107 contains a frog-leg robot (hereafter FLR or FL robot) assembly 602 that is adapted to transfer substrates to and from the various process chambers contained in the front end processing rack 52, the first central processing rack 152, the second central processing rack 154 and/or the rear processing rack 202. The second central processing rack 154 has been removed from the FIG. 15A to highlight and clarify the components contained in this embodiment. Referring to FIGS. 15A-D, the FLR assembly 602 generally contains an upper frog-leg (FL) robot assembly 610, a lower frog-leg (FL) robot assembly 620, and a lift rail assembly 626. The lift rail assembly 626 generally contains a front rail 614 and a back rail 612. This configuration thus contains two robot assemblies, the upper FL robot assembly 610 and the lower FL robot assembly 620, which are adapted to move independently of each other in both the vertical and horizontal planes. In this embodiment, the independent upper FL robot assembly 610 or the independent lower FL robot assembly 620 each are able to move in the vertical plane, (i.e., along the lift rail assembly 626), and are able to transfer the substrates to any position in the horizontal plane by movement of the FL robot 625 from commands from the system controller 101. While FIGS. 15A-D illustrate a configuration that contains two robot assemblies, the upper FL robot assembly 610 and the lower FL robot assembly 620, other embodiments of the cluster tool 10 may contain three or more robot assemblies. In another embodiment of the cluster tool 10, a single FL robot assembly is utilized to transfer substrates through the cluster tool.

FIG. 15B is plan view of the cluster tool 10 in which the lower FL robot assembly 620 of the FL robot assembly 602 is exchanging a substrate from a process chamber contained in the rear processing rack 202.

Figure 15C:
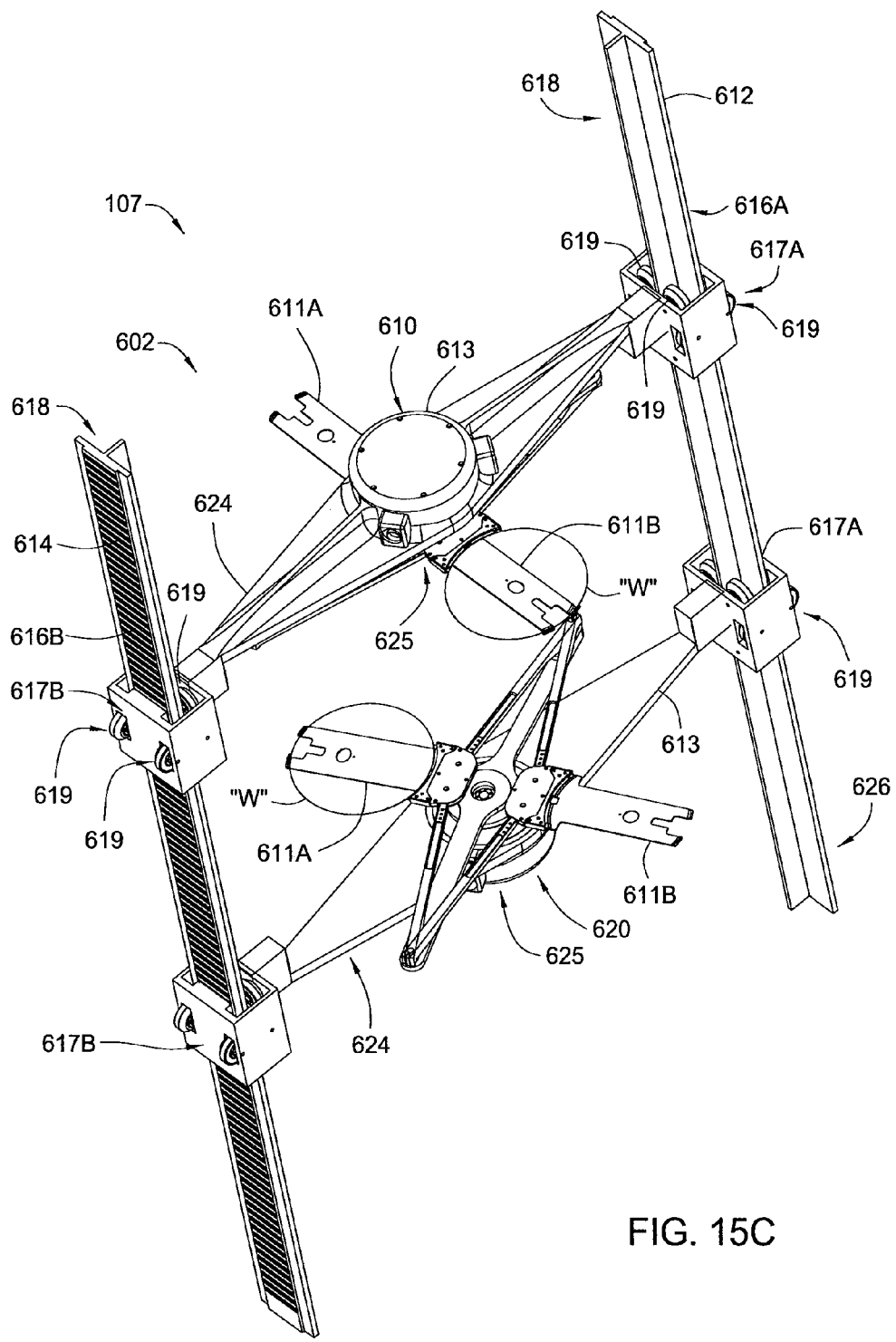
FIG. 15C is an isometric view illustrating one embodiment of a frog-leg robot assembly according to the present invention.

FIG. 15C is an isometric view of the central robot 107 which highlights the various components of the upper FL robot assembly 610 and the lower FL robot assembly 620. Typically the lift rail assembly 626 is mounted to a central module frame (not shown) that is part of the central module 150. While FIG. 15A-D illustrate a configuration in which the FL robot 625 in the upper FL robot assembly 610 or the lower FL robot assembly 620 are facing each other (i.e., the upper FL robot is facing down and the lower FL robot is facing up), but other configurations may be used, such as where the upper FL robot assembly 610 or the lower FL robot assembly 620 are both facing up or down, without varying from the scope of the invention.

FIG. 15D, which is a plan view of a lower FL robot assembly 620, is intended to show that various components that are commonly found in either the upper FL robot assembly 610 or the lower FL robot assembly 620. The upper FL robot assembly 610 or the lower FL robot assembly 620 will generally contain a FL robot 625 and a support assembly 624. In one embodiment, as shown in FIGS. 15A-D, the FL robot 625 has two substrate carriers (i.e., 611A and 611B) that are adapted to transfer substrates between the various processing stations, but this configuration is not intended to limit the scope of the present invention since the number of substrate carriers or the use of the frog-leg configuration is not intended to limit to the various aspects of the invention described herein. An example of an exemplary FL robot having two substrate carriers that may be adapted to benefit from the invention is described in commonly assigned U.S. Pat. No. 5,447,409, entitled "Robot Assembly" filed on Apr. 11, 1994, which is hereby incorporated by reference in its entirety. Examples of other FL robots designs that may be adapted to benefit from the invention are described in commonly assigned U.S. Pat. No. 5,469,035, entitled "Two-axis magnetically coupled robot", filed on Aug. 30, 1994 and U.S. Pat. No. 6,379,095, entitled Robot For Handling Semiconductor Substrates", filed on Apr. 14, 2000, which are hereby incorporated by reference in their entireties.

In one embodiment, where the FL robot 625 has two substrate carriers 611A-B, the FL robot 625 will generally contain a dual axis motor 615, primary arms 618A-B, secondary arms 619A-D, wrist assemblies 621A-B, and substrate carriers 611A-B. In general by movement of the various axes of the dual axis motor 615 the primary arms 618A-B can be rotated in an opposing direction to extend or retract the substrate carriers 611A-B or rotated in the same rotational direction to rotate the substrate carriers 611A-B to a desired position. The FL robot 625 is mounted on the support 613 of the support assembly 624 which supports and retains the robot assembly 625.

Referring to FIGS. 15C-D, the support assembly 624 generally contains the support 613, and the motor assembly 617A, which is in communication with the front rail 614, and the motor assembly 617B, which is in communication with the back rail 612, which are both attached to the support 613. The motor assembly 617A and motor assembly 617B generally contain an actuator 630 and a guiding mechanism 631. In one embodiment, the actuator 630 is a direct drive linear brushless servomotor, which through communication with the base component 616A-B (e.g., secondary coil or "rotor" section), mounted on the lift rail assembly 626 components, is adapted to independently raise or lower the attached FL robot assembly components (e.g., items 610 or 620). In one embodiment, it may advantageous from a cost and ease of control point of view to only have a single actuator 630 mounted to one of the lift rails (i.e., front rail 614 and a back rail 612) and the other rail only have the guiding mechanism 631. A direct drive linear brushless servomotor that may be purchased from Danaher Motion of Wood Dale, Ill. or Aerotech, Inc. of Pittsburgh, Pa. In other embodiments, the actuator 630 may be stepper motor or other type of actuator that can be used to raise and lower the various FL robot assembly 610 or 620 components.

The guiding mechanism 631 is adapted to support and precisely guide the FL robot assembly 610 or FL robot assembly 620 components as they are raised and lowered on the lift rails to assure that the position and accuracy of the motion of the FL robot assembly 610 or FL robot assembly 620 are well controlled to allow consistent movement and transfer of substrates. In one embodiment (not shown), the guiding mechanism 631 contains a linear guide which supports and retains the FL robot assembly 610 or 620 components. A linear guide may be purchased from Danaher Motion of Wood Dale, Ill. In another embodiment, as shown in FIGS. 15C-D, wheels 619 are attached in an orthogonal configuration to the motor assemblies 617A-B and roll on a t-shaped rail structure 618 to position and accurately control of the motion of the FL robot assembly 610 or FL robot assembly 620 components.

In one aspect of the invention the FL robot assembly 602 contains two or more FL robot assemblies (e.g., items 610, 620) which are synchronized to allow substrates to be grouped and transferred together. This configuration may be advantageous since it will improve substrate throughput in the cluster tool. In one aspect, the two or more FL robot assemblies are physically coupled together so that the motion of each blade of the FL robot assemblies moves in unison and thus are grouped. In this case the robot assemblies 610 may be a fixed distance apart and move in a synchronized motion. In another aspect, the FL robot assemblies (e.g., items 610, 620) are mechanically coupled together so that they maintained at a fixed distance apart, but each of the FL robots 625 are able to move independently of each other (e.g., move independently in the horizontal plane).

In another aspect, the system controller 101 is utilized to control and synchronize the movement of each of the two or more FL robot assemblies so that substrates can be transferred in groups of two or more. For example, if the central robot 107 is a FL robot assembly 602 that contains two robots, the transfer path A2, described in FIG. 14A, could be completed by using the upper FL robot assembly 610 and the lower robot assembly 620 to substantially simultaneously pick up substrates from two coater chambers 60A (e.g., CD1 and CD2 (FIG. 4A)) and then substantially simultaneously drop off the substrates into desired bake chambers 90 (e.g., B1 and B5 (FIG. 4B)). This configuration may be advantageous since it can allow grouped moves to improve throughput, but also allow for each robot to move independently if needed to complete some other desired task.

B. Articulated Robot

FIG. 16A is an isometric view of one embodiment of the central robot 107 containing an articulated robot assembly 702 (hereafter AR assembly 702). The AR assembly 702 is adapted to transfer substrates to and from the various process chambers contained in the front end processing rack 52, the first central processing rack 152, the second central processing rack 154 and/or the rear processing rack 202. The second central processing rack 154 has been removed from FIG. 16A to highlight and clarify the components contained in this embodiment. The AR assembly 702 generally contains articulated robot 710 and a dual blade assembly 705. The articulated robot 710 is generally a 6-axis articulated robot which can be purchased from Mitsubishi Electric Corporation, of Tokyo, Japan, Kawasaki Robotics (USA), Inc. of Wixom, Mich., and Staubli Corp. of Duncan, S.C. In one embodiment, the 6-axis articulated robot is a model number TX90 purchased from Staubli Corp. of Duncan, S.C. The articulated robot 710 has a robot base 713A and a mechanical interface 713B, which connect the robot to the cluster tool and the end-effector assembly (e.g., dual blade assembly 705, blade assembly 706, etc.) to the robot, respectively. In general, the 6-axis articulated robot is advantageous since the reach of the articulated robot is far superior from conventional robots due to its multiple axis and multiple linkage design, the reach of multiple articulated robots can more easily "overlap" since the motion of the end-effector, which retains and transfers the substrate(s), is not linked to motion of the robot base 713A which allows the robots to more effectively avoid each other while transferring substrates, and/or the reliability of the articulated robots exceeds most conventional robots.

The dual blade assembly 705 generally contains a support 720, and two or more blade assemblies 715 (e.g., first blade assembly 715A, a second blade assembly 715B, etc.). The support 720 attaches to and is guided by the articulated robot 710 so that a blade in a first blade assembly 715A and a blade in a second blade assembly 715B can each pick-up and/or place a substrate in a two different processing chambers retained in a processing rack. The pitch (see item "A"), or the distance, between the robot blades is fixed by the distance between the first supporting surface 720A and second supporting surface 720B, and is designed to coincide with the pitch between two of the processing chambers retained in the processing racks. Therefore, the distance between the transfer position of the bake chambers labeled B1 and B4, for example, in the first central processing rack 152, would coincide with the pitch between the coater/developer chambers labeled CD1 and CD2 in the front end processing rack 52, so that after completing the BARC coat step 510 the substrates could then be transferred to bake chambers labeled B1 and B4 to complete the post BARC bake step 512. Referring to FIG. 16B, the pitch "A" is generally defined as the distance, or spacing, between the blades 711A-B in a normal direction to the substrate receiving surfaces 712A-B. In one embodiment, the pitch (see item "A"), is a distance between about 100 mm and about 1200 mm, and preferably between about 300 mm and about 700 mm. While the dual blade assembly 705 is illustrated in conjunction with the articulated robot assembly 702, other configurations may utilize the dual blade assembly 705 on other types of robots without varying from the basic scope of the invention.

In one aspect, the substrate receiving surfaces 712A-B are adapted to retain a substrate positioned on the blade (not shown) by use of an edge gripping mechanism that holds the substrate in position on the robot blade. The edge gripping mechanism can be adapted to grab the edge of the substrate at multiple points (e.g., 3 points) to hold and retain the substrate.

Referring to FIG. 16B, in one embodiment, each blade assembly 715 (e.g., first blade assembly 715A or second blade assembly 715B), generally contains one or more robot blade actuators 721 (see items 721A-721B) and one or more robot blades 711 (see items 711A-711B). The robot blade actuators 721 may be a direct drive linear brushless servomotor or other equivalent device that is able to control the motion and position of the robot blade 711. Generally, the pitch between the robot blades will not affected by the actuation, or translation, of one robot blade relative to another robot blade, since it is preferred that the actuated blade translate in a plane that is parallel to the other robot blade.

FIG. 16C illustrates one embodiment of the dual blade assembly 705 which contains one pair of blade assemblies 715A and 715C mounted on the support bracket 722A positioned on the first supporting surface 720A and a second pair of blade assemblies 715B and 715D mounted on the support bracket 722B positioned on the second supporting surface 720B. FIG. 16C further illustrates a configuration where robot blade 711B is shown in an actuated position while the other blades (e.g., 715A and 715C-D) are shown in their retracted position. In one aspect of the dual blade assembly 705, each robot blade 711 (e.g., 711A-D), contained in its respective blade assembly 715 (e.g., 715A-D), may be independently actuated by use of the system controller (not shown) and its robot blade actuator 721 (e.g., 721A-D). In one aspect, as shown in FIG. 16C, each robot blade 711 in each of the pairs may be physically positioned in an orientation that is substantially horizontally aligned over each other and vertically spaced apart (often termed "over/under" configuration), so that a substrate can be retained on each blade at the same time. The over/under blade configuration may be advantageous, for example, where the robot has to remove a substrate from a processing chamber prior to placing the next substrate to be processed in the same processing chamber, without having to leave its basic position to move the "removed" substrate to another chamber. In another aspect, this configuration may allow the robot to fill up all of the blades and then transfer the substrates in groups to a desired location in the tool. For example, in FIG. 16C four substrates could be transferred on the four blades. This configuration also has a further advantage that allows substrates transferred in groups to be ungrouped by dropping-off or picking-up the substrates one at a time from each of the blades 711A-D. In other embodiments, three or more stacked blades mounted on each of the supporting surfaces (e.g., 720A and 720B FIG. 16B) may be used in place of the "pairs" of robot blades to further facilitate the transfer of multiple substrates in groups.

FIG. 16E illustrates a cross-sectional view of an over/under type dual blade assembly 705 where a single blade (item# 715D) has been extended to access a substrate "W" in a pod assembly 105 so that it can be picked-up or dropped-off in the cassette 106. This configuration will allow grouped transfer of the substrates through the system and then single drop-off and/or pick-up of substrates in stations that can only accept one substrate at a time (e.g., cassette 106, stepper/scanner 5, etc.).

In one aspect of the invention, to perform a single substrate transfer task using a robot that contains two or more fixed robot blades, i.e., contains no robot blade actuators 721, the robot is adapted to "re-position," e.g., flip, rotate, and/or detach, at least one of the robot blades so that the "re-positioned" blade(s) will not interfere with the process of transferring a substrate on another robot blade. In this configuration a special position or chamber (e.g., support chambers) may be adapted to receive a robot blade and reposition it in a desired orientation to allow substrates to be transferred using other robot blades. The ability to re-position one or more of the robot blades may be especially useful when one or more processing chambers in a grouped transferring sequence is not operational, and thus will not allow a blade to enter the processing chamber, since it will allow other adjacent processing chamber positions to be utilized.

FIGS. 16F and 16G are isometric views of one embodiment of the front end robot 108 or the rear robot 109 containing a single blade type articulated robot assembly 703. The single articulated robot assembly 703 (hereafter SA robot assembly 703) is adapted to transfer substrates to and from the various process chambers contained in the front end processing rack 52 and the pod assembly 105, or the rear processing rack 202 and stepper/scanner 5, depending on whether the robot is a front end robot 108 or the rear robot 109. The SA robot assembly 703 generally contains a articulated robot 710 and a blade assembly 706. The articulated robot 710 is generally a 6-axis articulated robot which can be purchased from Mitsubishi Electric Corporation, of Tokyo, Japan, Kawasaki Robotics (USA), Inc., of Wixom, Mich., and Staubli Corp. of Duncan, S.C.

Referring to FIG. 16G, the blade assembly 706 generally contains a support 718 and a blade assembly 715 (e.g., first blade assembly 715A), described above. The support 718 attaches to and is guided by the articulated robot 710 so that robot blade 711 in a blade assembly 715 can pick-up and/or place a substrate in a processing chamber retained in a processing rack. In one embodiment, the single blade articulated robot assembly 703 may contain a pair of blade assemblies 715 (e.g., items 715A and 715C) such as one of the pairs illustrated and described in conjunction with FIG. 16C.

In one embodiment, the front end robot 108 or the rear robot 109 are a dual blade assembly 705 as illustrated and described above in conjunction with FIGS. 16A-D and 14A-B. This configuration will allow grouped transfer of the substrates throughout the system and thus increase throughput, CoO and system reliability.

Figure 16H:
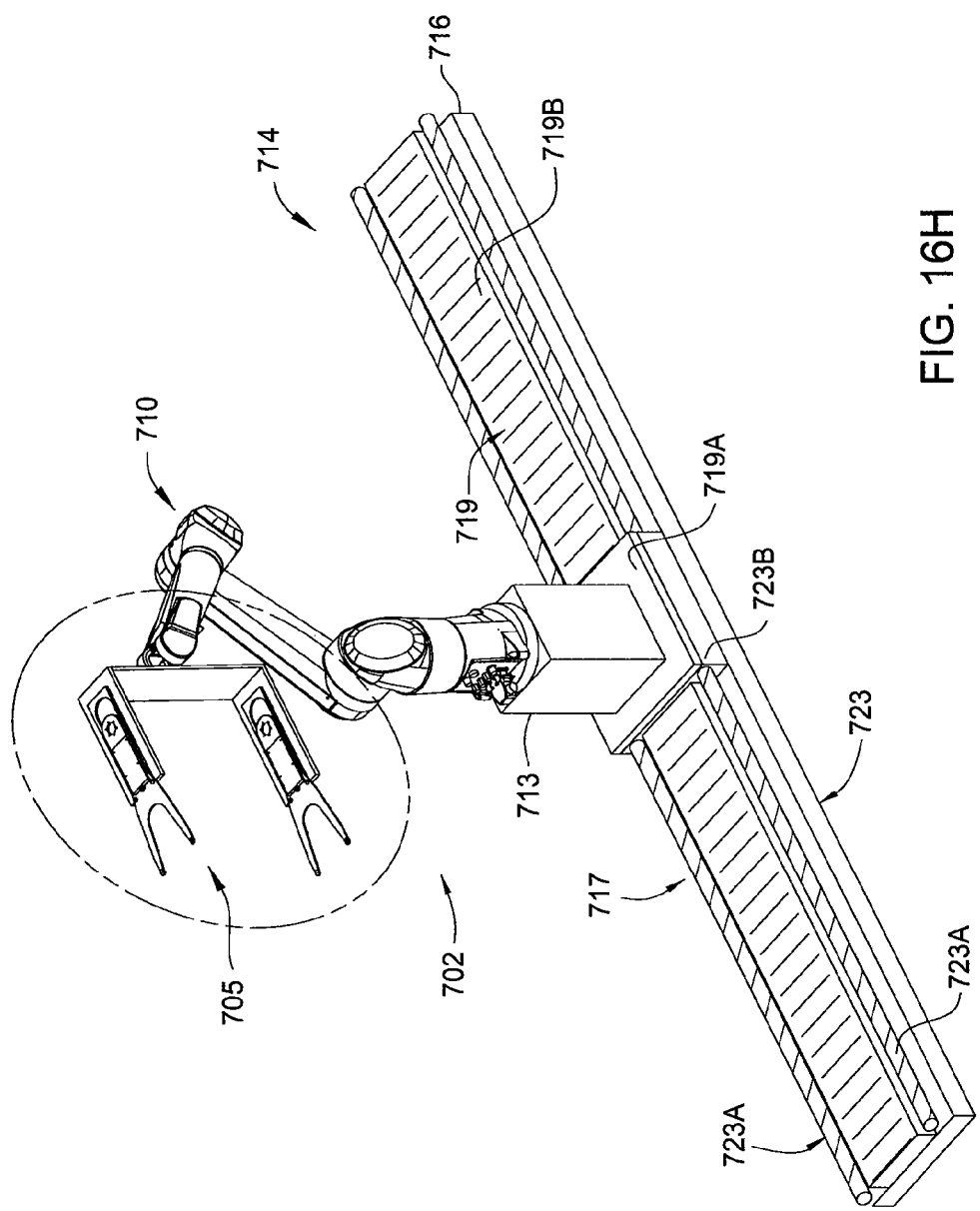
FIG. 16H is an isometric view illustrating one embodiment of a dual blade 6-axis articulated robot assembly and slide assembly according to the present invention.

FIG. 16H is an isometric view of one embodiment of a moveable articulated robot (e.g., AR assembly 702 is shown) that is adapted to allow the articulated robot base 713 to be translated and positioned along the length of a cluster tool by use of a slide assembly 714. In this configuration the articulated robot base 713 is connected to an actuator assembly 717 of the slide assembly 714, which is adapted to move the AR assembly 702 to a desired position in the cluster tool by use of commands from the system controller 101. The slide assembly 714 generally contains an actuator assembly 717, a cover (not shown), and a base 716. The base 716 supports and mounts the AR assembly 702 and slide assembly components to the cluster tool. The cover, not shown for clarity, is used to enclose the actuator assembly 717 and other slide assembly features to prevent generated particles from making their way to the processing chambers and prevent damage to these features during maintenance of the cluster tool. The actuator assembly 717 may generally contain an actuator 719 and a guiding mechanism 723 (elements 723A and 723B). In one embodiment, as shown in FIG. 16H, the actuator 719 is a direct drive linear brushless servomotor, which through communication with the base component 719A (e.g., secondary coil or "rotor" section) mounted on the base 716 and a slider 719B (e.g., stator), is adapted to move the AR assembly 702 along the length of the slide assembly 714. A direct drive linear brushless servomotor that may be purchased from Danaher Motion of Wood Dale, Ill. or Aerotech, Inc. of Pittsburgh, Pa. In other embodiments, the actuator 719 may be stepper motor or other type of actuator that can be used to position the robot. The guiding mechanism 723 is mounted to the base 716 and is used to support and guide the robot as it is moved along the length of the slide assembly 714. The guide mechanism 723 may be a linear ball bearing slides or a conventional linear guide, which are well known in the art.

While FIG. 16H illustrates a single robot mounted to the slide assembly 714, in other embodiments two or more robots may be affixed to the same slide assembly. This configuration can reduce cost by reducing the number of redundant parts and improve the precise motion of each of the robots relative each other. Also, while FIG. 16H illustrates a dual blade articulated robot mounted to the slide assembly 714, the type of robot or number of blades is not intended to be limiting of the scope of the invention.

Figure 16I:
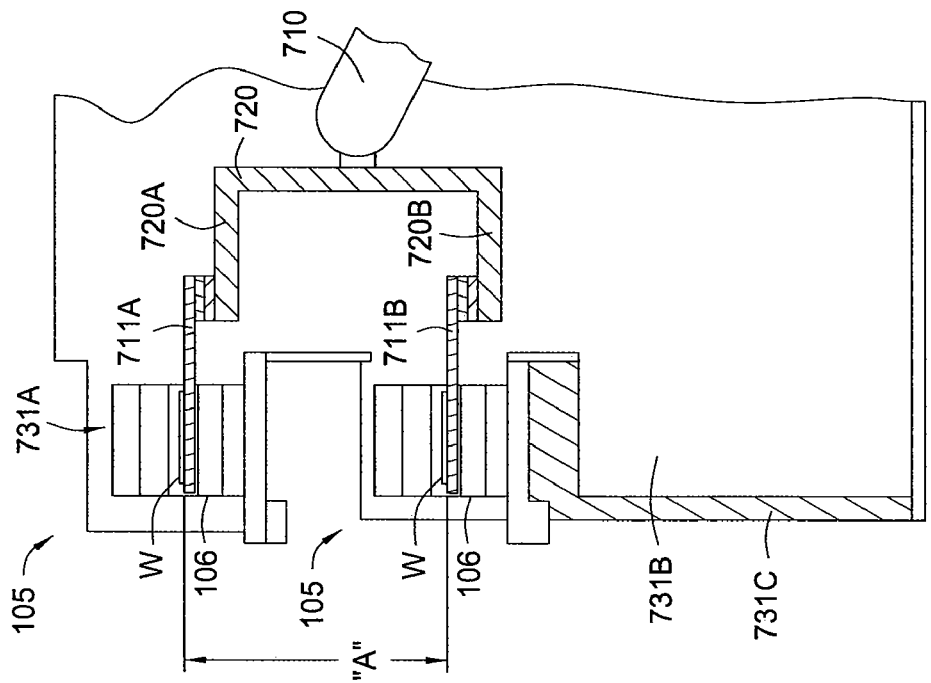
FIG. 16I illustrates a cross-sectional view of a dual blade assembly where the blades are positioned to transfer substrates from in a pair of cassettes.

FIG. 16I illustrates a cross-sectional view of one embodiment of a robot having two fixed blades that are positioned to pick-up two substrates positioned in the two separate vertically stacked pod assemblies 105. In this configuration the multiple bladed robot is adapted to pick-up and/or drop-off substrates positioned in the two cassettes (item #s 106A-B) to allow grouped substrate transferring process to be performed at the start and/or the end of the substrate transferring sequence. In one aspect, the cassettes and thus pod assemblies are spaced a distance "A" apart so that a robot can access the substrates in similar positions in each cassette. In one aspect, when at least one cassette (e.g., item 106A) is not required various regions (e.g., items 731A, 731B, etc.) may formed above and/or below one of the other cassettes to allow a robot that has a fixed blades to access a first cassette with a first fixed robot blade without causing a collision with a second fixed robot blade and a cluster tool wall 731C. Therefore, in one aspect a region 731B may be formed to allow the first blade 711A to access a position in the lower cassette 106B while allowing the lower blade 711B to enter the region 731B without colliding with the wall 731C. While FIG. 16I illustrates a configuration where the robot blades 711A-B are fixed to the support surfaces 720A-B of the support 720, and thus do not utilize a robot blade actuator 721, other embodiments having robot blade actuators can be used without varying from the basic scope of the invention.

C. Shuttle Robot.

Figure 17A:
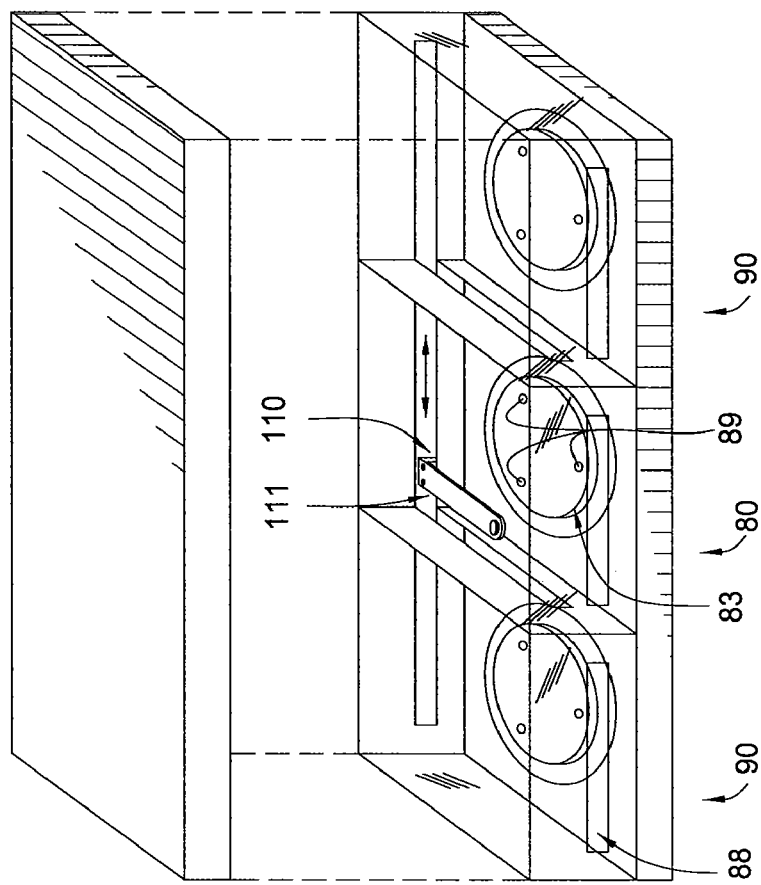
FIG. 17A is an isometric view of one embodiment of a bake chamber, a chill chamber and a robot adapted to transfer the substrate between the chambers.
Figure 17B:
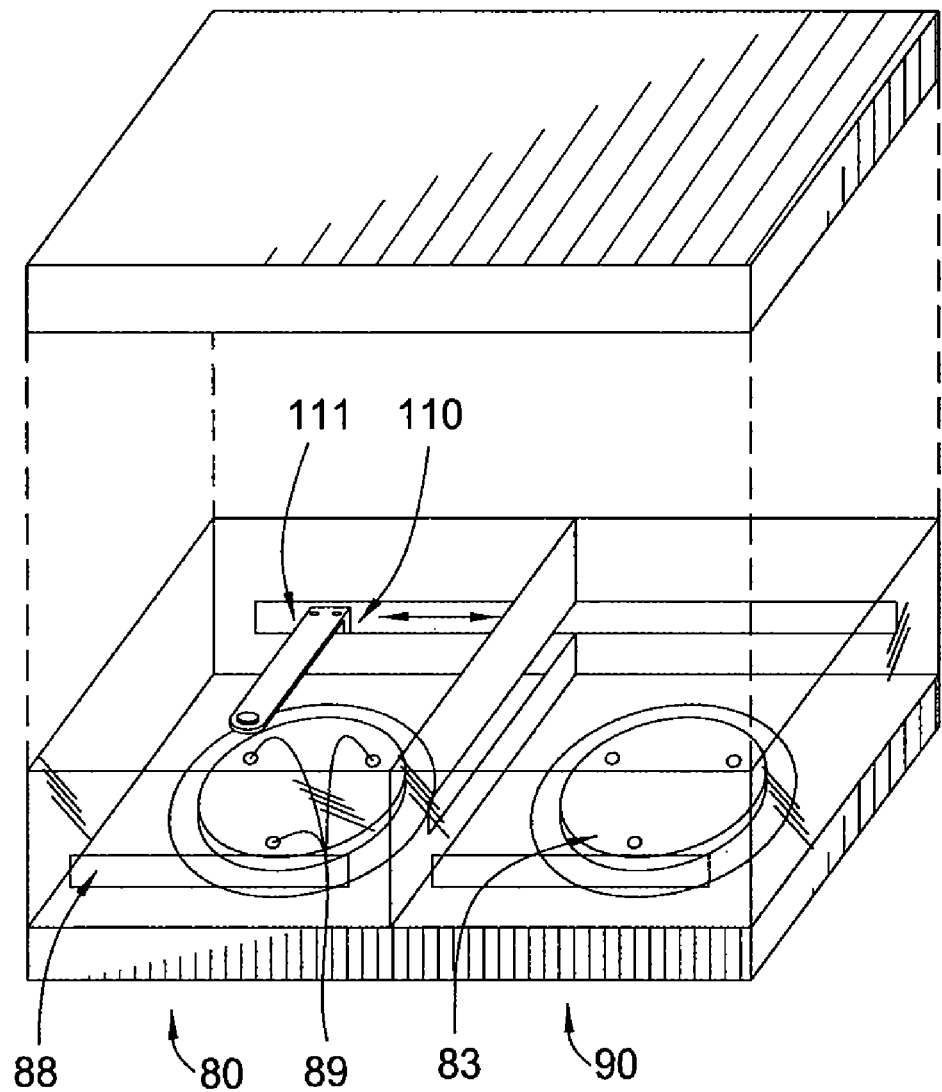
FIG. 17B is an isometric view of one embodiment of a bake chamber, a chill chamber and a robot adapted to transfer the substrate between the chambers.
Figure 17C:
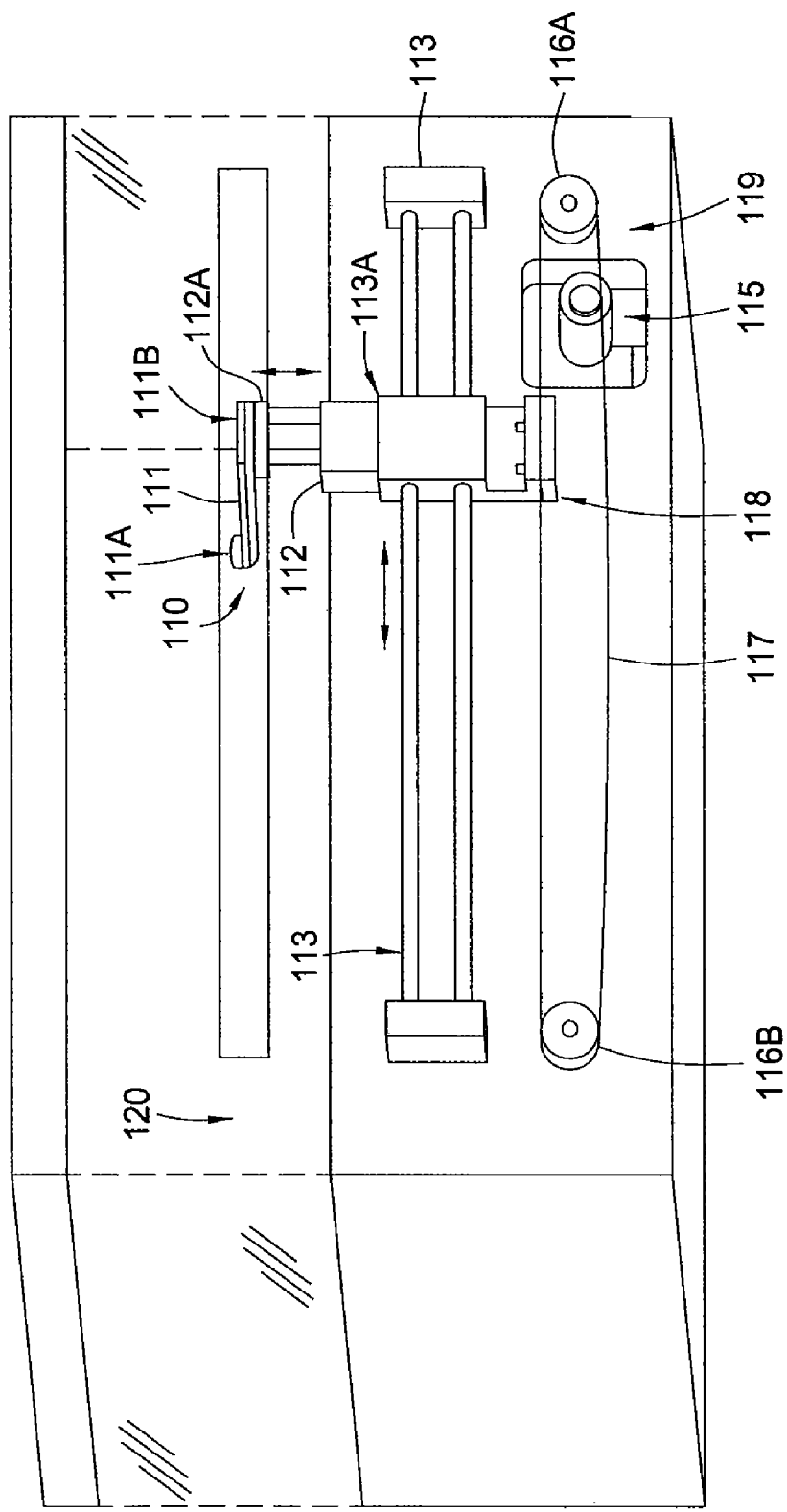
FIG. 17C is an isometric view showing the opposing side of the view shown in FIG. 17A which illustrates the robot adapted to transfer the substrate between the chambers.

FIGS. 17A-C illustrate various embodiments of a shuttle robot 110 that can be adapted to transfer substrates between adjacent chambers in the various processing racks. The design here may be advantageous for use when transferring substrates between a bake process chamber (e.g., bake chamber 90, HMDS process chamber 70, PEB chamber 130, etc.) and a chill chamber 80 which are used in subsequent processing steps, for example, between the post BARC bake step 512 and the post BARC chill step 514 and the post photoresist coat bake step 522 and the post photoresist chill step 524. The shuttle robot 110 is thus used to reduce the work load on the various system robots, such as, the front end robot 108, the central robot 107, and the rear robot 109, thus allowing the system robots to do other tasks while the other processing steps are completed on the substrates.

FIG. 17A is an isometric view of one configuration in which the shuttle robot 110 is used to transfer substrates between three adjacent processing chambers, such as between two bake chambers 90 and a chill chamber 80. This configuration may thus be used between, for example, a bake chamber B1, chill chamber C1 and bake chamber B2 in the first central processing rack 152 shown in FIG. 4B.

FIG. 17B is an isometric view of one configuration in which the shuttle robot 110 is used to transfer substrates between two adjacent processing chambers, such as between a bake chamber 90 and a chill chamber 80. This configuration may thus be used between, for example, a bake chamber B1 and chill chamber C7 contained in the front end processing rack 52 shown in FIG. 4A, a PEB bake chamber PEB1 and chill chamber C3 contained in the rear processing rack 202 shown in FIG. 4D, or a HMDS process chamber P1 and chill chamber C1 contained in the front end processing rack 52 shown in FIG. 4A.

FIG. 17C is an isometric view of the backside of the adjacent processing chambers shown in FIG. 17A or 17B which is intended to show an embodiment of the shuttle robot 110. The shuttle robot 110 generally contains a robot blade 111 and a shuttle robot actuator assembly 120. A shuttle robot actuator assembly 120 generally contains a robot blade actuator 112, a slide assembly 113 and a robot drive assembly 119. The robot blade 111 generally contains a substrate retaining area 111A and a mounting region 111B. The mounting region 111B is an area of the robot blade 111 that is used to attach the robot blade 111 to the robot blade actuator 112 (see mount 112A).

The substrate retaining area 111A may be adapted to act as a conventional vacuum chuck, which is attached to a vacuum generating source (not shown), to hold a substrate during the substrate transferring process. The robot blade actuator 112 is a device that is used to raise and lower the robot blade 111 so that the substrate can be transferred from one processing chamber to another. In one embodiment, the robot blade actuator 112 is an air cylinder. In one embodiment, a linear actuator (e.g., linear brushless servo motor (not shown)) is mounted between the robot blade actuator 112 and the robot blade 111, so that the robot blade 111 can be extended and/or retracted (e.g., into or out of the chamber) to complete the substrate transfer process with the lift pins or other substrate retaining features in the processing chamber.

In one embodiment, the slide assembly 113 is a linear ball bearing slide that guides the shuttle robot 110 as it transfers the substrates between the various processing chambers. The slide assembly 113 generally contains a shuttle 113A on which the robot blade actuator 112 is attached. The clamp 118 is used to attach the shuttle 113A to the belt 117 of the robot drive assembly 119 to allow the robot drive assembly 119 to move the robot blade 111 between the various processing chambers.

In one embodiment, as shown in FIG. 17C, the robot drive assembly 119 is a belt and pulley type system which is used move the robot along the length of the slide assembly 113. In this configuration the robot drive assembly 119 will generally contain two or more idler pulleys 116A-B, a belt 117 and a motor 115 that is adapted to drive and control the position of the robot. In one embodiment, the motor 115 is a DC servomotor with an integrated encoder so that the system controller 101 can keep track of and control the position of the shuttle robot 110. In another embodiment of the robot drive assembly 119, the belt and pulley type system is replaced with a direct drive linear brushless servomotor that may be purchased from Danaher Motion of Wood Dale, Ill.

Integrated Bake/Chill Chamber

Figure 18A:
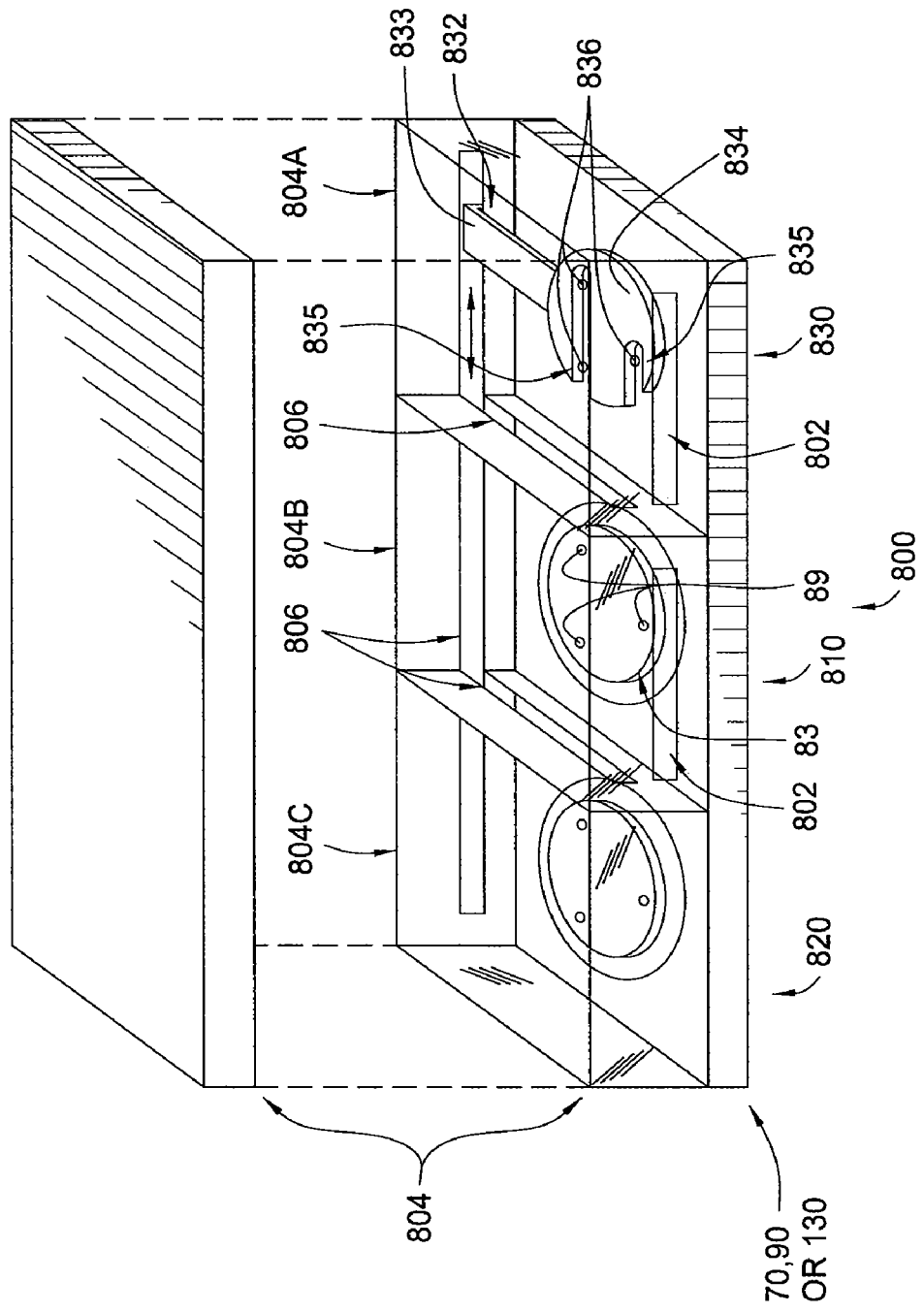
FIG. 18A is an isometric view of one embodiment of a bake/chill chamber 800.

FIG. 18A illustrates one embodiment of an integrated bake/chill chamber 800 that may be used in conjunction with the various embodiments of the cluster tool. In general the integrated bake/chill chamber 800 has three major processing regions: an input region 830, a chill region 810 and a bake region 820, which are adapted to perform a process sequence where various bake method steps (e.g., post BARC bake step 512, PEB step 540, etc.) and/or chilled method steps (e.g., post BARC chill step 514, post PEB chill step 542, etc.) are performed. The integrated bake/chill chamber 800 may contain two or more access ports 802 (two shown in FIG. 18A) in the enclosure 804, which are adapted to allow an external robot (e.g., front end robot 108, the central robot 107, etc. (not shown)) to access the input region 830 and/or the chill region 810 to pick up or drop off substrates. The enclosure 804 generally contains an input station enclosure 804A, a chill chamber enclosure 804B and a bake chamber enclosure 804C, that are adapted to isolate the various regions of the integrated bake/chill chamber 800.

In one embodiment, the input region 830 is used to receive a substrate from an external robot. The input region 830 is generally an enclosed region that contains a substrate exchanging device, such as lift pins 836 or some other similar device, that is adapted to allow an external robot to pick up or drop-off a substrate in the integrated bake/chill chamber 800. The input region 830 is also configured to allow a chilled transfer arm assembly 832 to pick-up and drop off substrates from the lift pins 836.

The chilled transfer arm assembly 832 generally contains a chilled blade 833 that has a blade receiving surface 834 and a plurality of cut-outs 835 that are adapted to allow the chilled blade 833 to pick-up, retain and drop-off substrates from the various substrate exchanging devices in the various processing regions of the integrated bake/chill chamber 800. In one embodiment, the chilled blade 833 of the chilled transfer arm assembly 832 contains a heat exchanging device 837 (FIG. 18B) that is in thermal communication with the blade receiving surface 834 so that the temperature of a substrate positioned on the blade receiving surface 834 can be temperature controlled. In one aspect, the temperature of the heat exchanging device 837 is monitored and controlled by use of a temperature controlling device 838 (FIG. 18B) that is in communication with the system controller 101. The heat exchanging device 837 may be a thermal electric device and/or embedded heating elements so that the temperature of the substrate can be controlled. In one aspect, the heat exchanging device 837 may contain a plurality of fluid channels (not shown) that are embedded in the chilled blade 833, that are configured to allow a temperature controlled heat exchanging fluid to flow therethrough. The blade receiving surface 834 may contain mechanical features (not shown) to retain a substrate on the receiving surface. In one aspect, the blade receiving surface 834 may contain a plurality of vacuum ports (not shown) that are connected to a vacuum source (not shown) to retain the substrate and assure intimate contact between the substrate and the blade receiving surface 834.

Figure 18B:
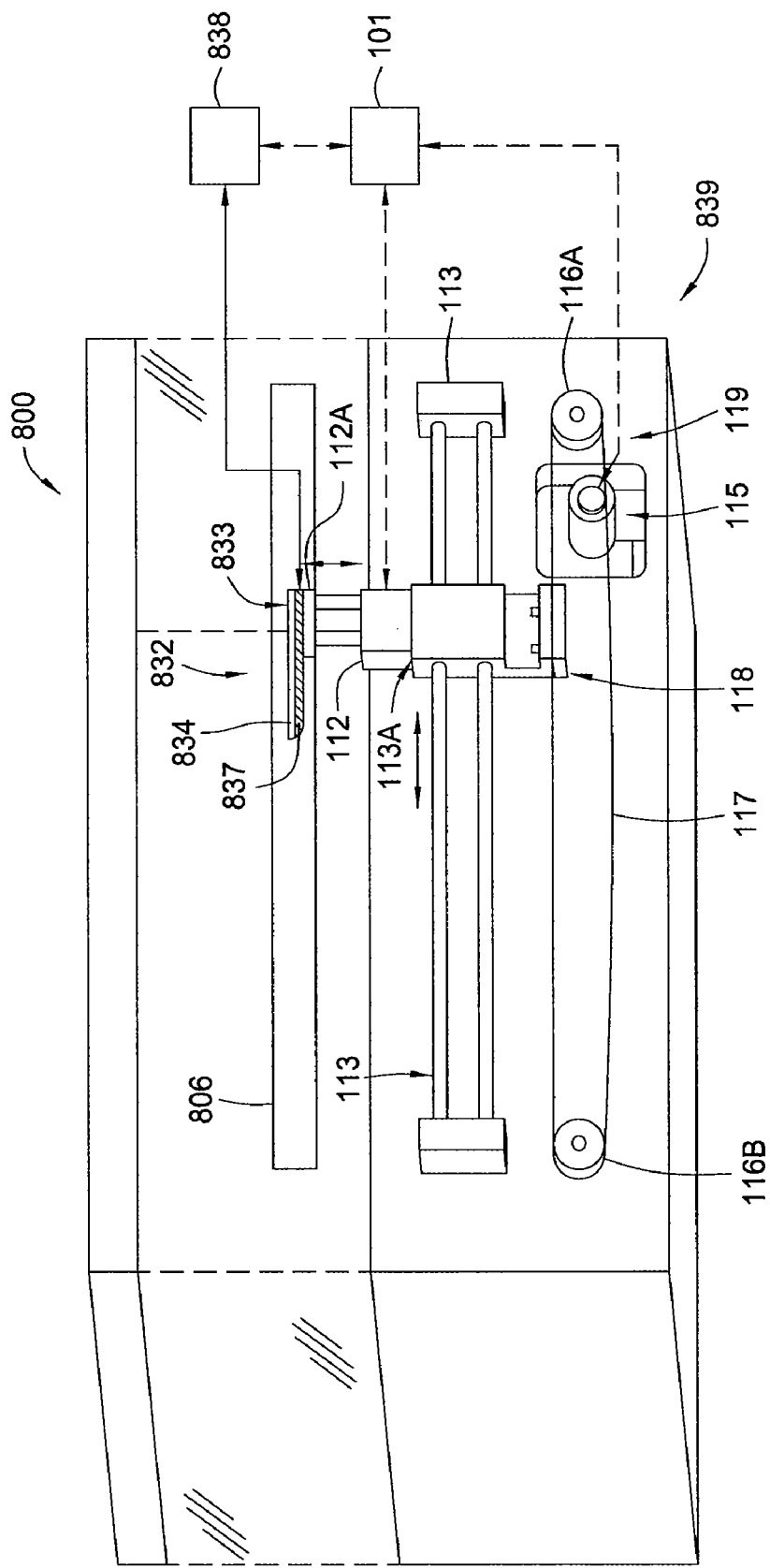
FIG. 18B is an isometric view showing the opposing side of the view shown in FIG. 18A which illustrates the robot adapted to transfer the substrate between the chambers.

FIG. 18B illustrates one embodiment of the chilled transfer arm assembly 832 that utilizes a chilled blade actuator assembly 839, similar to the shuttle robot actuator assembly 120 described above in conjunction with FIG. 17C, which is used to control the position of the chilled blade assembly 832 in any of the various processing regions of the integrated bake/chill chamber 800. One will note, for clarity reasons, the item numbers of the common components used in the chilled blade actuator assembly 839 and shuttle robot actuator assembly 120 have not been changed. In one aspect of the chilled transfer arm assembly 832, the system controller 101 is utilized to position, both vertically and horizontally, the chilled blade assembly 832 in any of the various processing regions of the integrated bake/chill chamber 800. The chilled blade 833 is positioned by use of a chilled blade actuator assembly 839, on which is mounted one or more surfaces of the integrated bake/chill chamber 800. Referring to FIGS. 18A-B, the enclosure 804 contains a plurality of enclosure cut-outs 806, which allow the chilled blade 833 to transfer a substrate between the various processing regions of the integrated bake/chill chamber 800.

Referring to FIG. 18A, the chill region 810 contains the chill chamber 80 components illustrated and described in reference to FIG. 10A. In one aspect of the chill region 810, the enclosure 804B contains one or more enclosure cut-outs 806 to allow the chilled transfer arm assembly 832 to facilitate the transfer of a substrate between the various processing regions of the integrated bake/chill chamber 800.

The bake region 820 may contain all of the components of a bake chamber 90, HMDS process chamber 70, or a PEB chamber 130 as illustrated and described in reference to FIGS. 10B-D. In one aspect of the bake region 820, the enclosure 804C contains one or more enclosure cut-outs 806 to allow the chilled transfer arm assembly 832 to transfer a substrate between the various processing regions of the integrated bake/chill chamber 800.

When the integrated bake/chill chamber 800 is in use, an external robot delivers the substrate to the lift pins 836 of the input region 830 through an access port 802. The chilled blade 833, which is positioned below the lift pins 836, then moves vertically to remove the substrate from the lift pins 836 and positions the substrate on the blade receiving surface 834. The chilled blade 833 is then moved to the bake region 820 where the chilled blade 833 deposits the substrate and then exits the bake region 820 so that a bake process can be performed on the substrate. After the bake process has been performed the chilled blade 834 picks up the substrate from the bake region 820, transfers the substrate to a substrate exchanging device in the chill region 810, and then exits the chill region 810. After a chill process has been performed, the substrate is removed from the chill region 810 through the access port 802 by use of the external robot. In one aspect, after the chill process has been performed the chilled blade 833 removes the substrate from the chill region 810 and deposits the substrate on the lift pins 836 in the input region. This configuration may be advantageous since the chill region 810 is made available to complete a chill process on a new substrate and/or it allows the external robot to pickup the substrate from the same position that it deposited the substrate.

Integrated Scanner/Stepper with PEB Cluster Tool Configuration

Figure 19A:
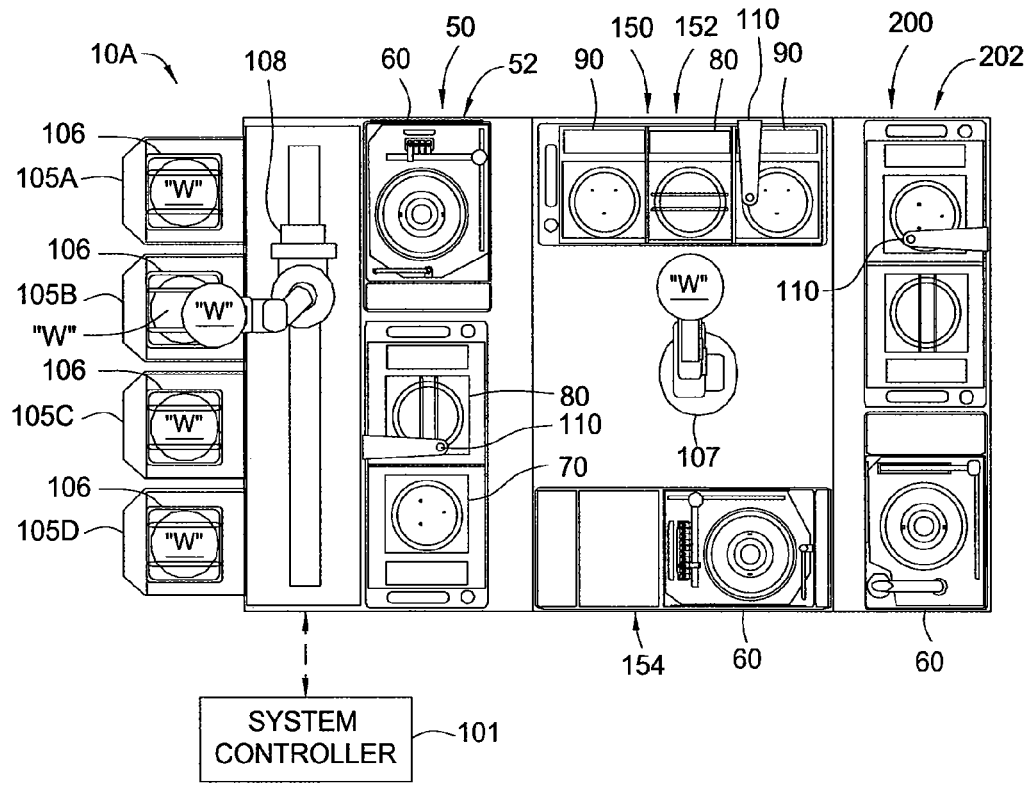
FIG. 19A is a plan view that illustrates another embodiment of cluster tool and stepper/scanner tool, where the stepper/scanner is separated from the cluster tool. The stepper/scanner has at least one PEB chamber integrated into the stepper/scanner.
Figure 19A:
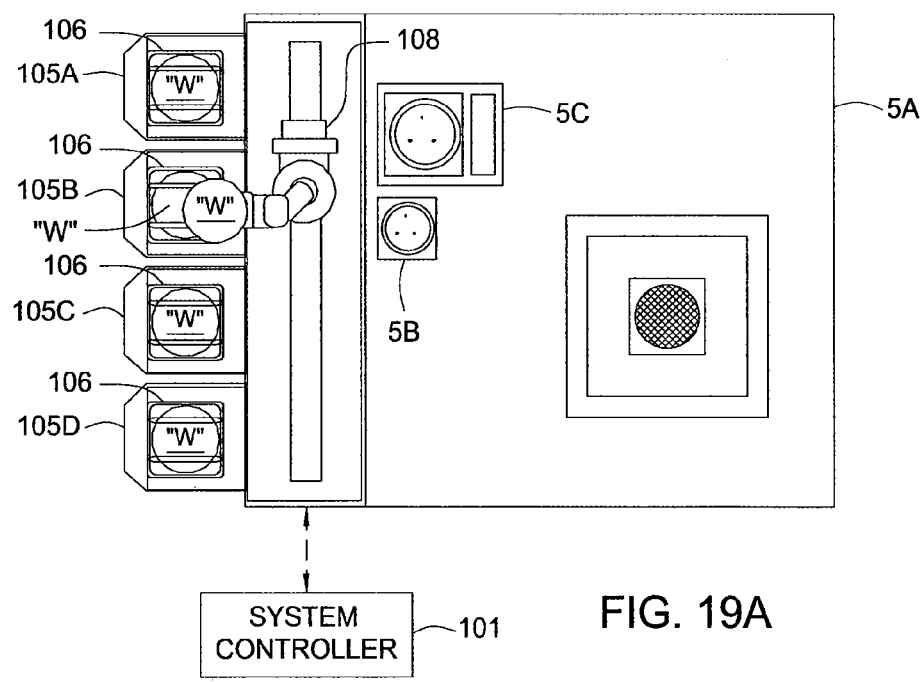

FIG. 19A illustrates a plan view of one embodiment of the invention in which a cluster tool contains a cluster tool 10A and a stepper/scanner 5A. In this configuration a PEB chamber 5C (i.e., element 130 described above (FIG. 10D)) is integrated into a stepper/scanner 5A and the stepper scanner is detached from the cluster tool 10A. This configuration has an advantage over the prior art since the throughput of the stepper/scanner is often many times greater than the throughput of the track system type cluster tool, and thus dedicating one stepper/scanner to a single track system wastes the stepper/scanner's excess throughput capacity. This embodiment allows a single stepper/scanner to service multiple track systems while also stabilizing the photoresist after performing the exposure process by performing the PEB step 540 and the post PEB chill step 542 in the stepper/scanner.

In one embodiment, as shown in FIG. 19A, the cluster tool 10A may contain the front end module 50, a central module 150, and a rear module 200 as illustrated and described above in relation to FIG. 1B. In this configuration, the cluster tool 10A is not integrated with the stepper/scanner and thus the rear robot 109 (shown in FIG. 2E) has been removed from the rear module 200 to save cost and reduce system complexity. In other embodiments, the cluster tool 10A may contain a different number of processing chambers and/or processing racks without deviating from the basic scope of the invention.

In this configuration the stepper/scanner 5A will generally contain one or more PEB chambers 5C and one or more chill chambers 5B (i.e., item 80 described above (FIG. 10A)). The number of PEB chambers and chill chambers that are required is dependent on the throughput need of the stepper/scanner 5A and the processing time in the PEB and chill chambers. In practice the PEB chambers 5C and/or chill chamber 5B may act as an input stage and/or an output stage of the stepper/scanners, so the stepper/scanner robot (not shown) has a place to pickup and return substrates. In one embodiment, where the PEB chamber 5C is adapted to both heat and cool the substrate (described above), at least two PEB chambers may be integrated into the stepper/scanner in the positions 5B and 5C, not shown in FIG. 19A. In one embodiment, where the PEB chamber 5C is adapted to both heat and cool the substrate (described above), only one PEB chamber is integrated into the stepper/scanner 5.

Figure 19B:
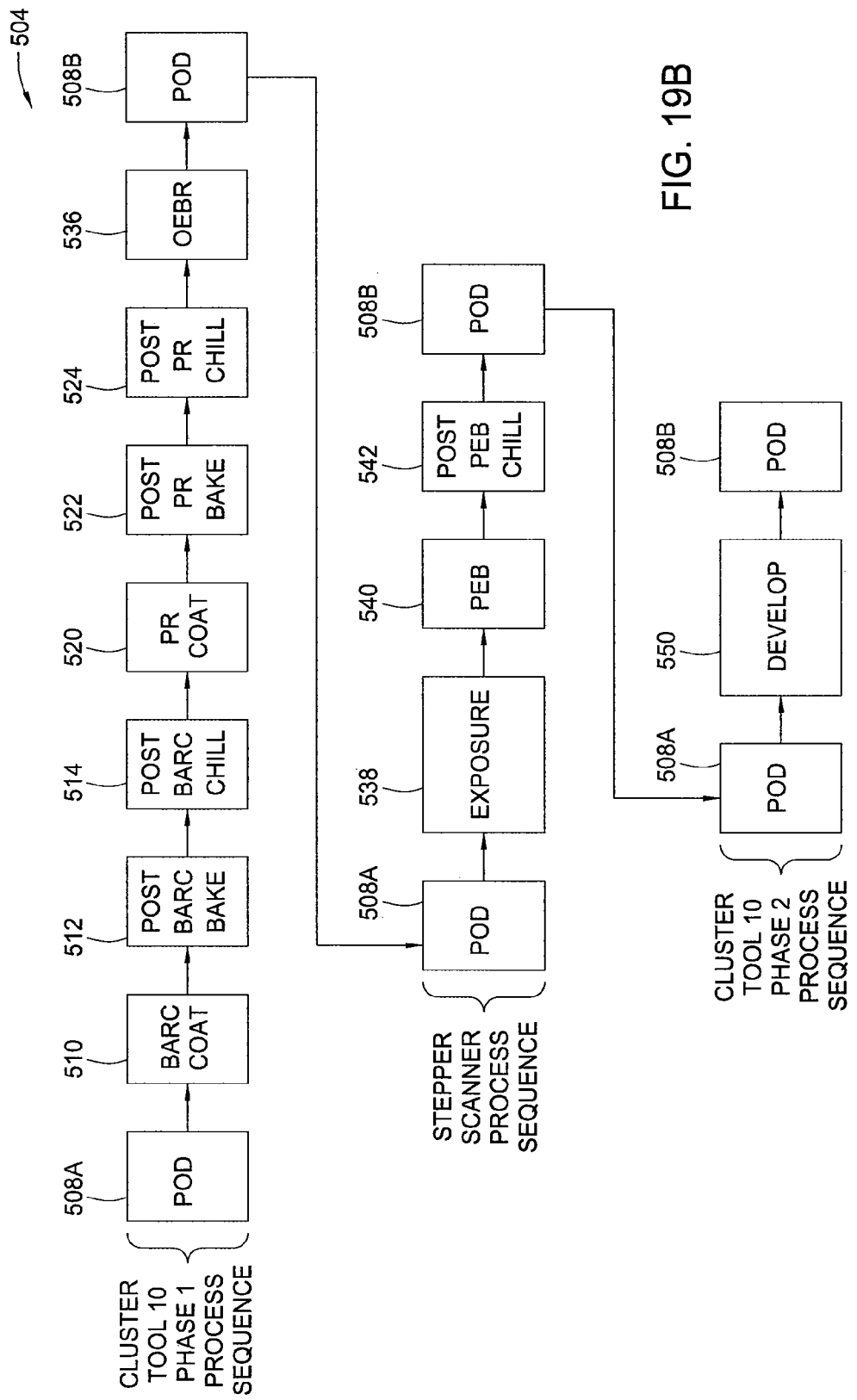
FIG. 19B illustrates one embodiment of a process sequence containing various process recipe steps that may be used in conjunction with the various embodiments of the cluster tool shown in FIG. 19A.

FIG. 19B illustrates one embodiment of method steps 504 containing various process recipe steps that may be used in conjunction with the cluster tool 10A and stepper/scanner 5A illustrated in FIG. 19A. In this embodiment, the processing sequence can be split into three distinct parts, the cluster tool phase 1, the stepper/scanner phase, and the cluster tool phase 2. The cluster tool phase 1 includes all of the processing steps completed before being transferred to the stepper/scanner tool which may include: a remove substrate from pod 508A step, a BARC coat step 510, a post BARC bake step 512, a post BARC chill step 514, a photoresist coat step 520, a post photoresist coat bake step 522, a post photoresist chill step 524, an optical edge bead removal (OEBR) step 536, and a place in pod step 508B. The pod of substrates is then removed from the cluster tool 10A and placed on the stepper/scanner 5A so that the stepper scanner can perform its processing steps which may include: a remove substrate from pod 508A step, an exposure step 538, a post exposure bake (PEB) step 540, a post PEB chill step 542, and a place in pod step 508B. The pod of substrates are then removed from the stepper/scanner 5A so that the cluster tool phase 2 steps can be completed which may include: a place in pod 508A step, a develop step 550, a post develop chill step 554 and a place in pod step 508B. In other embodiments, the sequence of the method steps 504 may be rearranged, altered, one or more steps may be removed, or two or more steps may be combined into a single step without varying from the basic scope of the invention.

Oval System Configuration

Figure 20A:
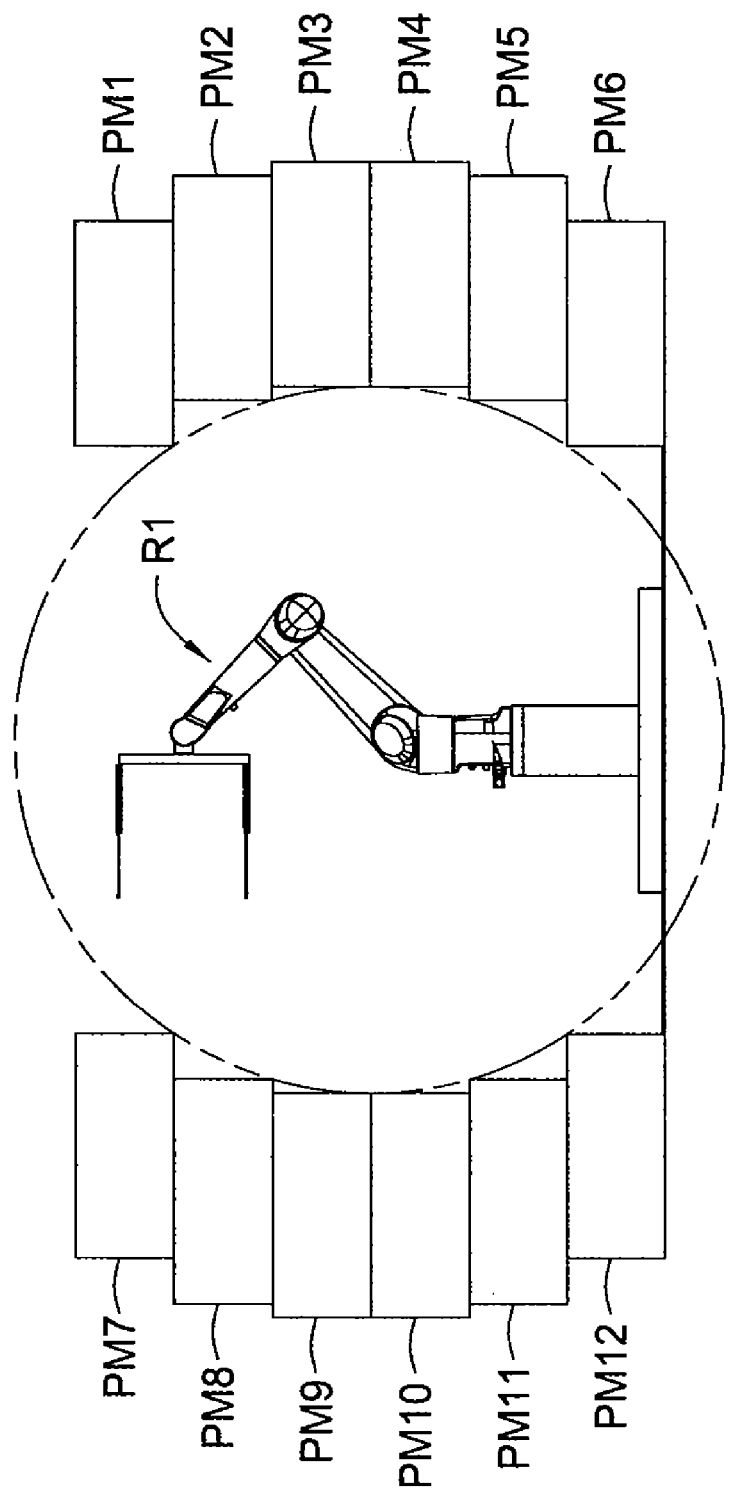
FIG. 20A is a side view of the robot illustrated in FIG. 16A which is used in a processing rack configuration that is configured to conform to the robot's reach.
Figure 20B:
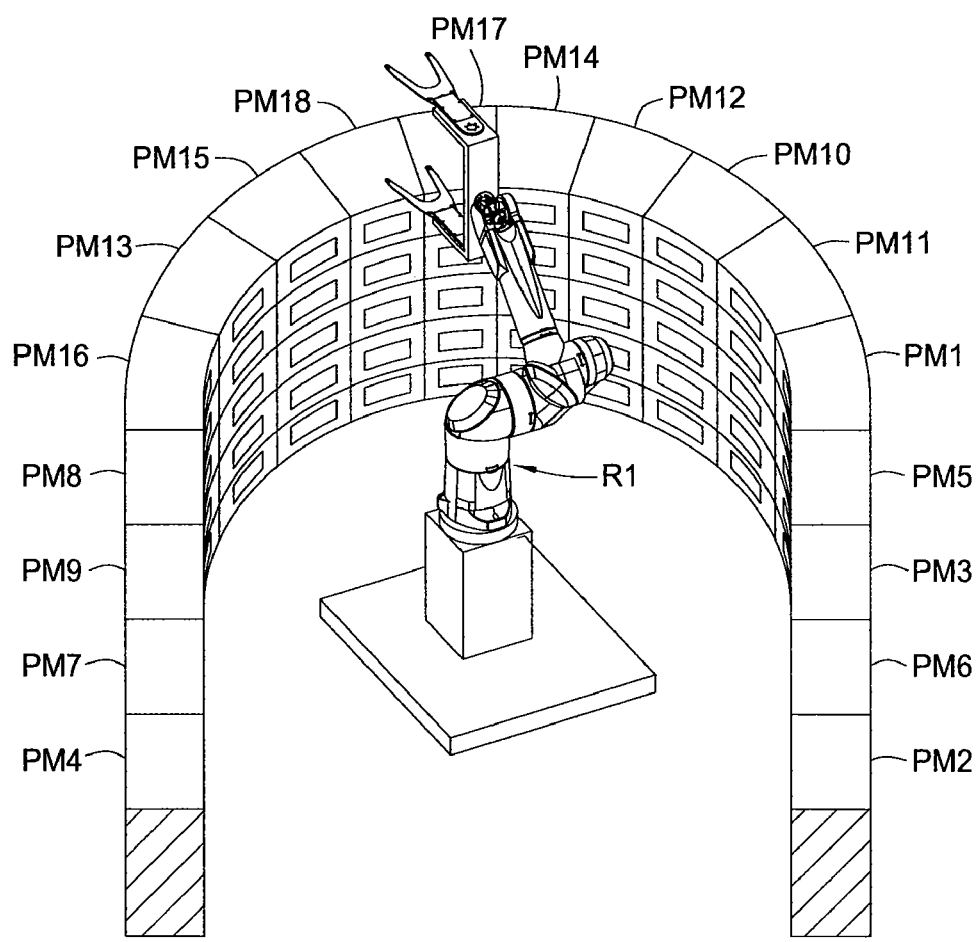
FIG. 20B is an isometric view another embodiment of a processing rack configuration that is adapted to conform to the reach of a robot having a central mounting point.

FIGS. 20A-B illustrate another embodiment of the cluster tool 10 in which the processing chambers contained in the various processing racks, shown in FIGS. 4A-K (e.g., front end processing rack 52, the first central processing rack 152, etc.), are not oriented in a linear fashion but are arranged around a common central point in the system. One drawback of the linear orientation of the chambers is that the top-most and bottom-most positions in a processing rack can be difficult for the robot to reach or requires a larger robot with greater arm extension to fully utilize all of the available space. This problem is especially problematic where the 6-axis articulated robots are used since their reach is limited by the distance from a central point. The problem becomes more pronounced where the chamber is at the top and at the end of a linearly arranged rack since these chambers are the farthest distance from the robot center. Any chamber that is out of the reach of the robot cannot be accessed, so the processing rack height in some cases may not be fully utilized. This problem thus necessitates additional chambers and/or robots to access these chambers, which increases the cost and footprint of the tool.

In one embodiment, as shown in FIG. 20A, an alternative orientation may be used to allow robot to access the process chambers which may be considered an oval shape or hemispherical shape. FIG. 20A is a side view of an oval cluster tool configuration where a robot R1 is able to access the process chambers (labeled PM1-12) that are in a hemispherical shape. In this configuration the top-most and bottom-most stations in the corner stacks can be moved in toward the center of the track, further reducing the distance the robot needs to move to service them. In this case, the corner stacks are cascaded in a staircase pattern from center to top and from center to bottom. The result is that a smaller robot with less reach can be used and the reduced reach distances will lower the robot handling times.

FIG. 20B illustrates an isometric view of one embodiment of a plurality of vertically spaced processing chambers (labeled PM1-18) are arranged about a center point of the robot (labeled R1). This configuration takes advantage of the spherical work area provided by a 6-axis articulated robot by bringing the "corner" stacks closer to the center of the track, making them easier for the robot to reach.

In one aspect of the invention, the configurations illustrated in FIGS. 20A and 20B are merged to form a complete spherical, partial spherical or hemispherical orientation of the processing chambers surrounding the robot to reduce the distance the robot needs to move to service the processing chambers and reduce the transfer time between processing chambers.

Gantry Robot Design Configuration

FIGS. 21A-D illustrate another embodiment of the cluster tool 10 which uses multiple robots that are configured in a parallel processing configuration around the various processing racks so that a desired processing sequence can be performed. In one embodiment, the parallel processing configuration contains three robots (items 420, 430 and 450 shown in FIG. 21B) that move in vertical (hereafter defined as the z-direction) and parallel directions to access the various processing chambers retained in the processing racks aligned along the parallel direction. One advantage of this system configuration is that if one of the robots in the central region 425 breaks or is taken down for servicing the system can still continue to process substrates using the other two robots. Another advantage of this configuration is the flexible and modular architecture allows the user to configure the number of processing chambers, processing racks, and processing robots required to meet the throughput needs of the user.

Figure 21:
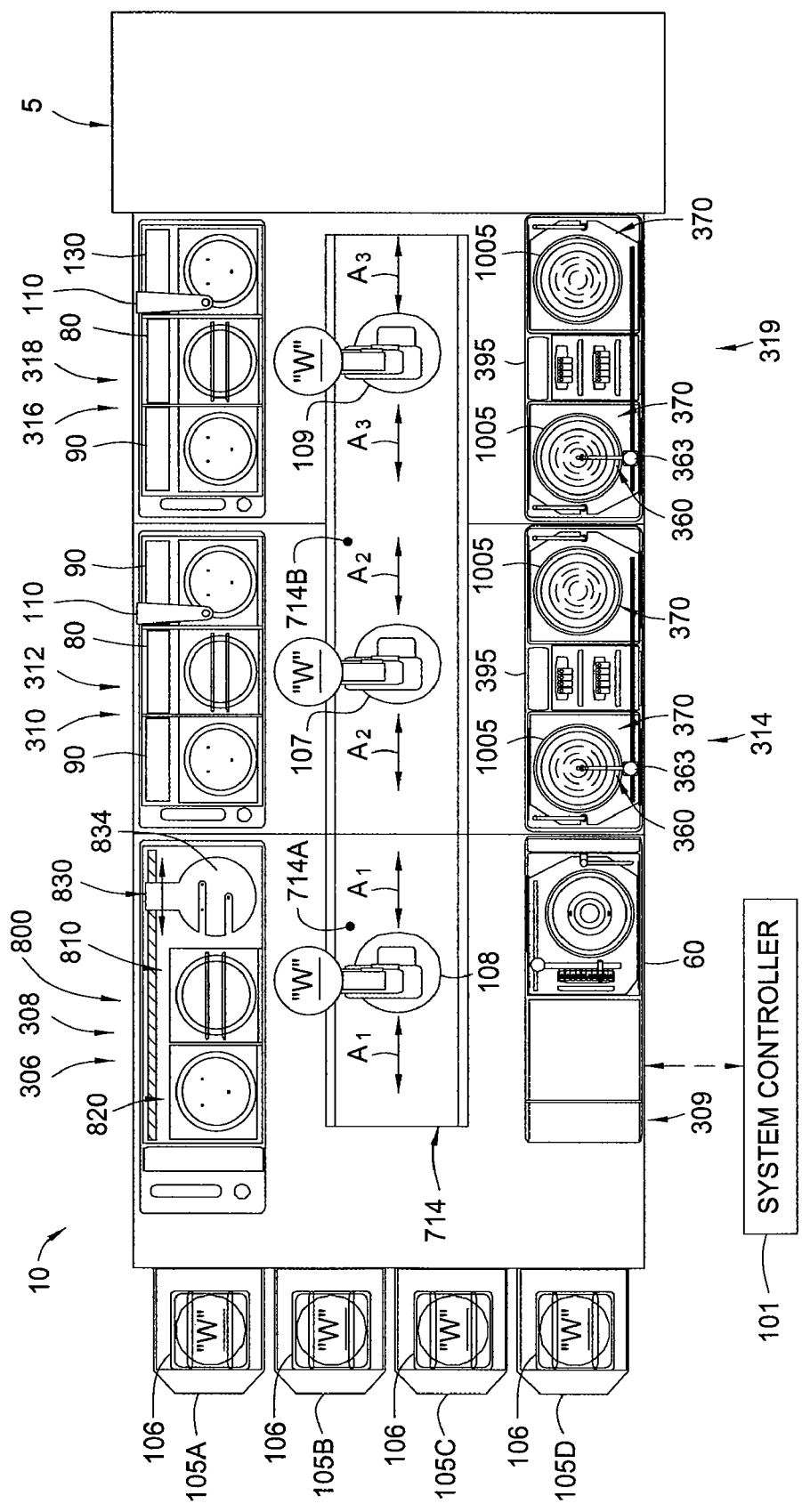
FIG. 21A is an isometric view illustrating another embodiment of a cluster tool of the invention.
FIG. 21B is a plan view of the processing system illustrated in FIG. 21A, according to the present invention.
FIG. 21C is a side view of the processing system illustrated in FIG. 21A, according to the present invention.
FIG. 21D is a side view that illustrates one embodiment of the first processing rack 460 of the cluster tool illustrated in FIG. 21A.
FIG. 21E is a side view that illustrates one embodiment of the second processing rack 480 according to the present invention.
FIG. 21F illustrates one embodiment of a process sequence containing various process recipe steps that may be used in conjunction with the various embodiments of the cluster tool described herein.
FIG. 21G is an isometric view illustrating one embodiment of a robot that may be adapted to transfer substrates in various embodiments of the cluster tool.
FIG. 21H is an isometric view illustrating one embodiment of a robot shown in FIG. 21G that utilizes a single arm robot. In this view the enclosure components have been removed.
FIG. 21I is an isometric view illustrating one embodiment of a horizontal motion assembly shown in FIGS. 21G and 21H.
Figure 21A:
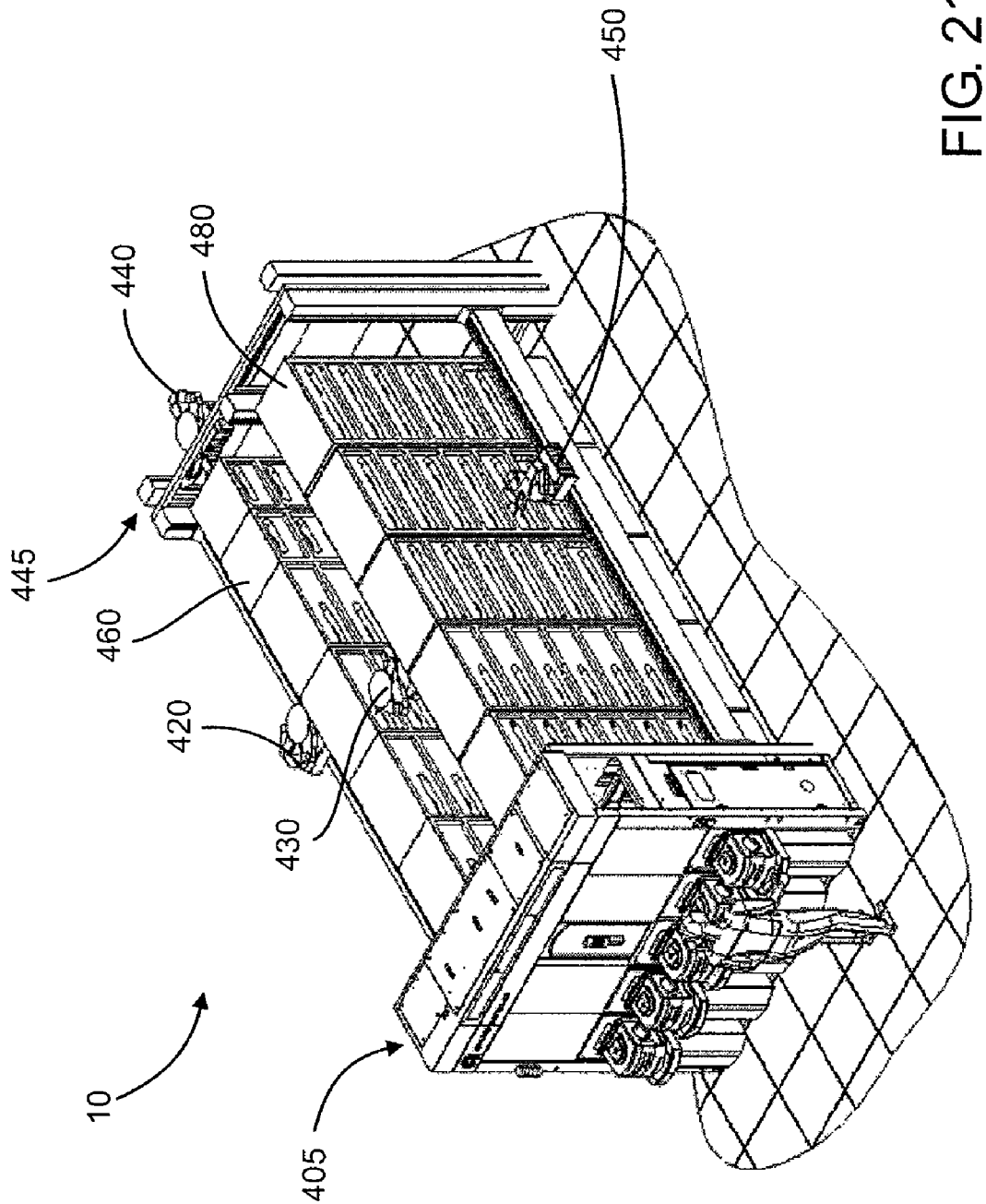

FIG. 21A is an isometric view that illustrates an embodiment of the cluster tool 10 which contains three robots that are adapted to access the various process chambers that are stacked vertically in a first processing rack 460 and a second processing rack 480. A stepper/scanner 5 which is typically attached to the rear region 445 is not shown in FIG. 21A.

Figure 21B:
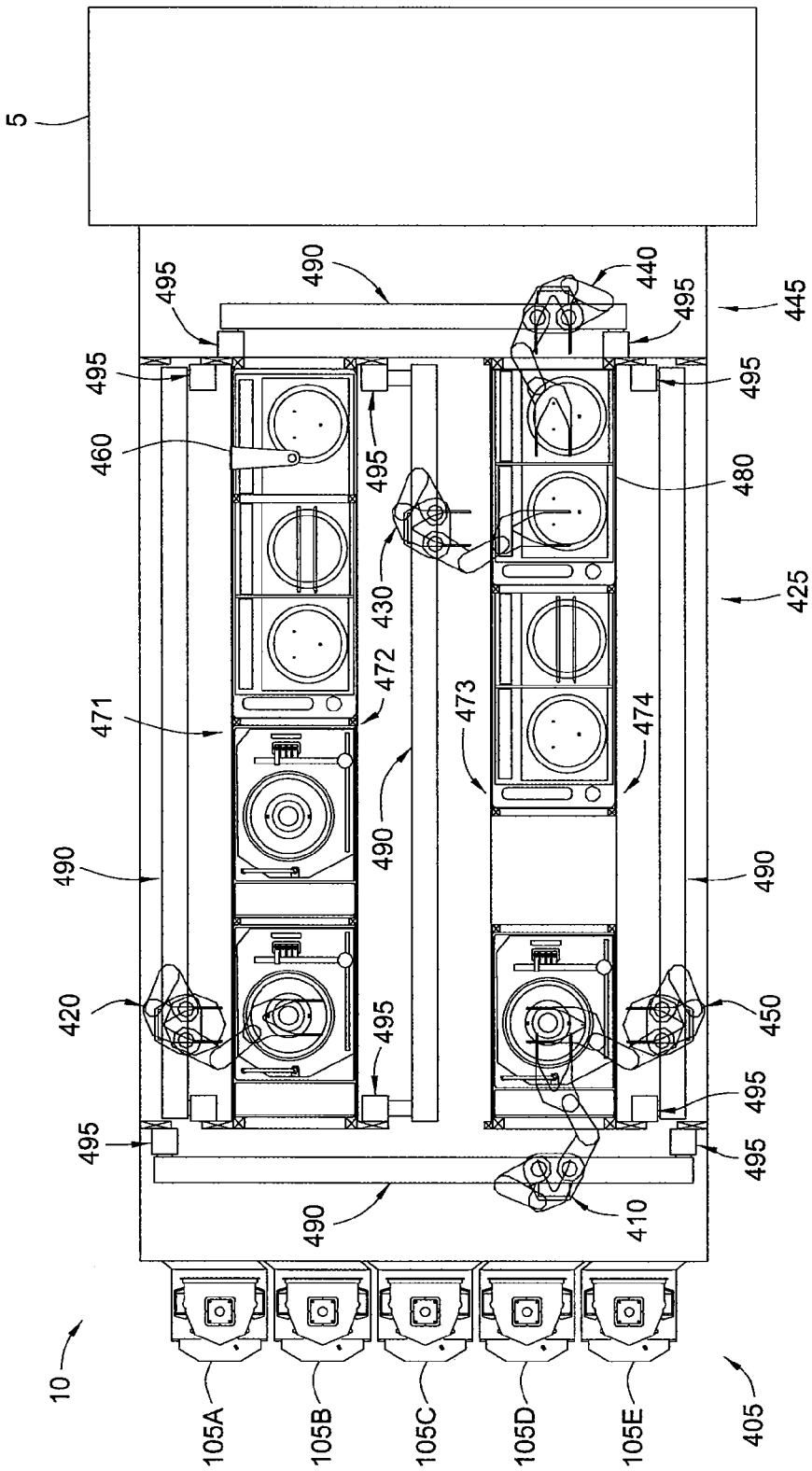
Figure 21C:
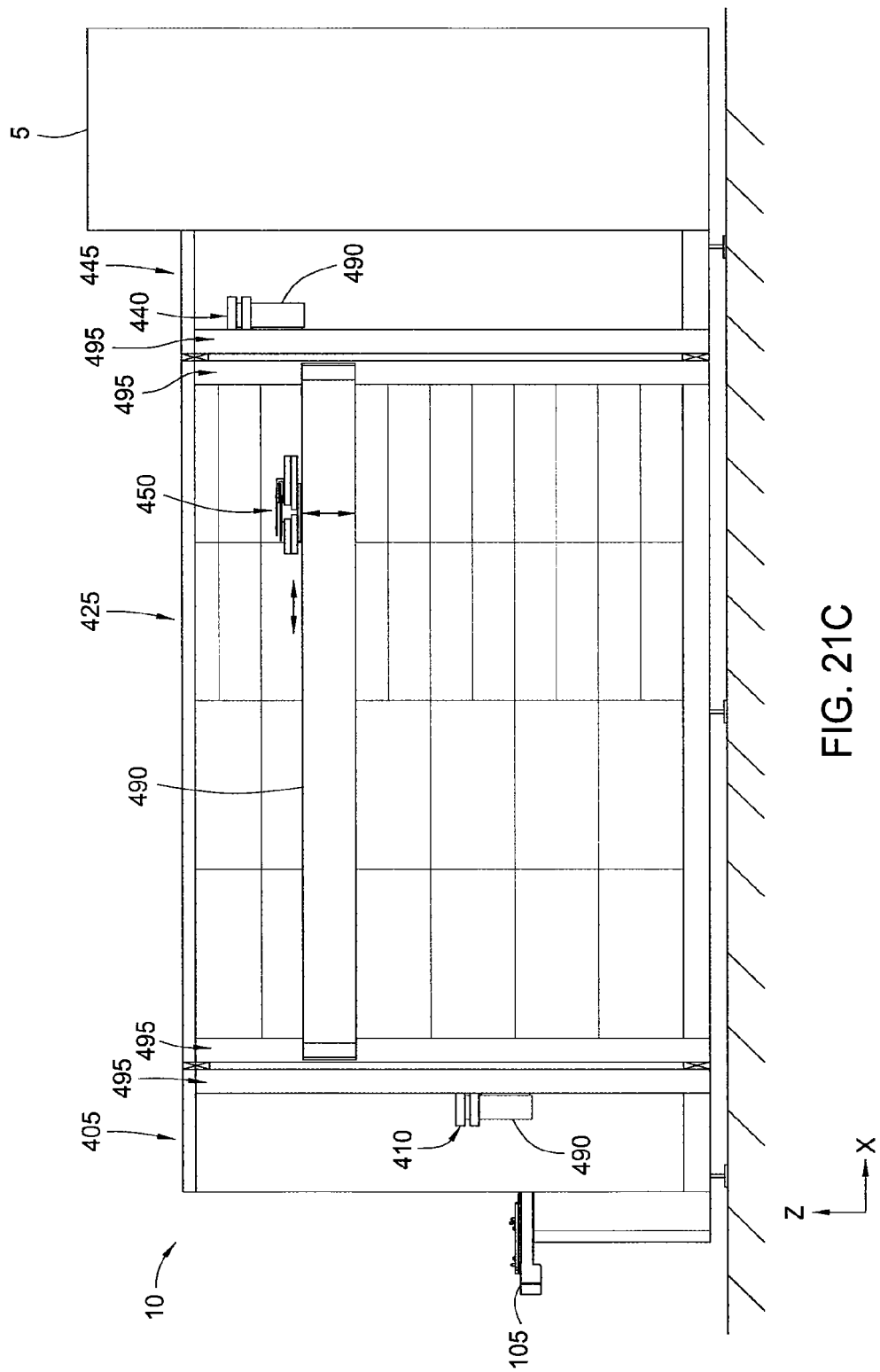

FIGS. 21B-C are plan and side views of the embodiment of the cluster tool 10 shown in FIG. 21A. FIGS. 21A-C are intended to illustrate some of the various robot and process chamber configurations that may be used in conjunction with this embodiment. In this configuration the cluster tool 10 will generally contain a front end region 405, a central region 425 and a rear region 445. The front end region 405 generally contains one or more pod assemblies 105 and a front end robot 410. The one or more pod assemblies 105, or FOUPs, are generally adapted to accept one or more cassettes 106 that may contain one or more substrates "W", or wafers, that are to be processed in the cluster tool 10. The central region 425 generally contains a first central robot 420, a second central robot 430, a third central robot 440, a first processing rack 460 and a second processing rack 480. The first processing rack 460 and a second processing rack 480 contain various processing chambers (e.g., coater/developer chamber 60, bake chamber 90, chill chamber 80, etc.) that are adapted to perform the various processing steps found in the substrate processing sequence. The front end robot 410 is adapted to transfer substrates between a cassette mounted in a pod assembly 105 and the one or more processing chambers in the first processing racks 460 or a second processing rack 480 that abuts the front end region 405.

The first central robot 420, the second central robot 430, and the third central robot 440 are adapted to transfer substrates to the various processing chambers contained in the first processing rack 460 and the second processing rack 480. In one embodiment, the second central robot 430 is adapted to transfer substrates between the first processing rack 460 and the second processing rack 480.

Referring to FIG. 21B, in one aspect of the invention the first central robot 420 is adapted to access the processing chambers in the first processing rack 460 from at least one side, e.g., the first side 471, as shown. In another aspect, the second central robot 430 is adapted to access the processing chambers in the first processing rack 460 from at least one side, and the second processing rack 480 from at least one side, e.g., the second side 472 of the first processing rack and the first side 473 of the second processing rack 480. In one aspect, the third central robot 450 is adapted to access the processing chambers in the second processing rack 480 from at least one side, e.g., the second side 474, as shown. In one aspect, the first side 471 of the first processing rack 460, the second side 472 of the first processing rack 460, the first side 473 of the second processing rack 480 and the second side 474 of the second processing rack 480 are all aligned along a direction parallel to the horizontal motion assembly 490 (described below) of each of the various robot assemblies (i.e., first central robot 420, second central robot 430, third central robot 450).

In one embodiment, the rear region 445 contains a rear robot 440 which is adapted to transfer substrates between the processing chambers retained in the first processing racks 460 and a second processing rack 480 that abut the rear region 445 and a stepper/scanner 5.

Figure 21D:
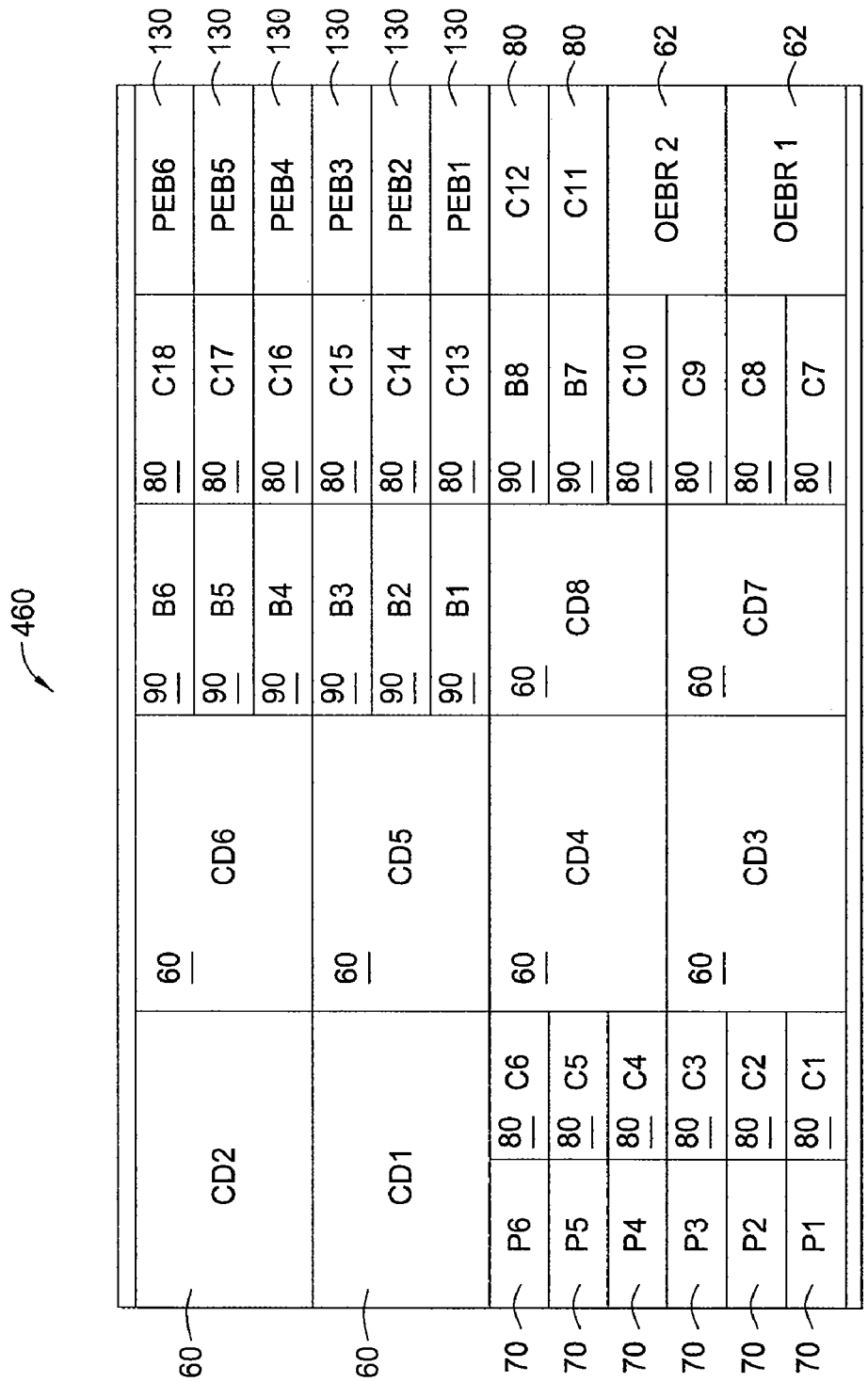

FIG. 21D illustrates a side view of one embodiment of the first processing rack 460 as viewed when facing the first processing rack 460 while standing on the side closest to the third central robot 440, and thus will coincide with the views shown in FIGS. 21A-C. The first processing rack 460 will generally contain one or more coater/developer chambers 60, one or more chill chambers 80, one or more bake chambers 90, one or more OEBR chambers 62, one or more PEB chambers 130, one or more support chambers 65, and/or one or more HMDS chambers 70. In one embodiment, as shown in FIG. 21D, the first processing rack 460 contains eight coater/developer chambers 60 (labeled CD1-8), eighteen chill chambers 80 (labeled C1-18), eight bake chambers 90 (labeled B1-8), six PEB chambers 130 (labeled PEB1-6), two OEBR chambers 62 (labeled 62) and/or six HMDS process chambers 70 (labeled P1-6).

FIG. 21E illustrates a side view of one embodiment of the second processing rack 480 as viewed when facing the second processing rack 480 while standing on the side closest to the third central robot 440, and thus will coincide with the views shown in FIGS. 21A-C. The second processing rack 480 will generally contain one or more coater/developer chambers 60, one or more chill chambers 80, one or more bake chambers 90, one or more OEBR chambers 62, one or more PEB chambers 130, one or more support chambers 65, and/or one or more HMDS chambers 70. In one embodiment, as shown in FIG. 21E, the second processing rack 480 contains four coater/developer chambers 60 (labeled CD1-4), twenty four chill chambers 80 (labeled C1-24), twelve bake chambers 90 (labeled B1-12), six PEB chambers 130 (labeled PEB1-6) and/or six support chambers 65 (labeled S1-6).

The orientation, positioning and number of process chambers shown in the FIGS. 21A-E are not intended to be limiting as to the scope of the invention, but are intended to illustrate the various embodiments of the invention.

Figure 21F:
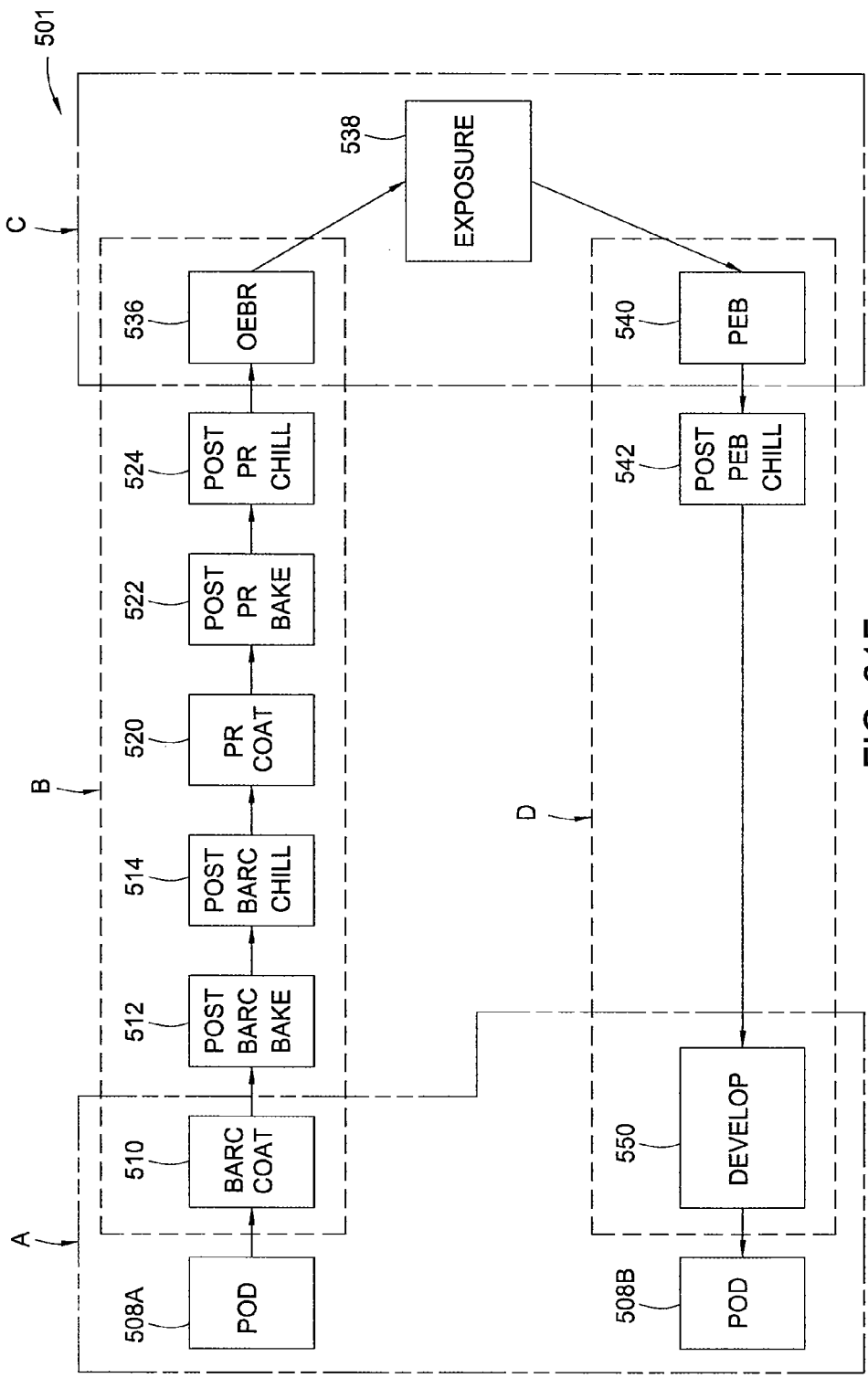

FIG. 21F illustrates the processing steps which each of the cluster tool robots will service in the completion of the method steps 501, shown in FIG. 3A, using the cluster tool configuration illustrated in FIGS. 21A-D. The method steps 508A, 510, 550 and 508B enclosed in the box labeled "A" are serviced by the front end robot 410. In one embodiment, the BARC coat step 510 is completed in a coater chamber 60A mounted in the first processing rack 460 that abuts the front end region 405. Referring to FIGS. 21B, 21D and 21F, the front end robot 410 removes a substrate from a pod assembly 105 and places the substrate in one of the coater chambers 60A labeled CD1 or CD2 in the first processing rack 460. In another embodiment, the BARC coat step 510 is completed in a coater chamber 60A mounted in the first processing rack 460 or the second processing rack 480 that abuts the front end region 405. In this embodiment, the develop step 550 may completed in a chill chamber 80 mounted in the second processing rack 480 that abuts the front end region 405.

In one embodiment, the process of transferring substrates between the method steps 510 through 536, which are enclosed in the broken line labeled "B", are completed using the first central robot 420 and the second central robot 430 and the chambers contained in the first processing rack 460. In another embodiment, the second central robot 430 may be used to transfer the substrates to and from the first processing rack 460 and the second processing rack 480 so that available chambers in these racks can be used as required to meet the process sequence requirements.

In one embodiment, the process of transferring substrates between the processing steps 536 through 550, which are enclosed in the box labeled "C", are completed using the rear robot 450. In one embodiment, the OEBR step 536 is completed in a OEBR chamber 62 mounted in the first processing rack 460 that abuts the rear region 445. Referring to FIGS. 21B and 21D, the rear robot 450 removes a substrate from OEBR chamber 62 and exchanges the substrate in the stepper/scanner 5 where the exposure step 538 is completed. After completing the exposure step 538 the rear robot 450 removes the substrate from stepper/scanner 5 and places the substrate in one of the PEB chambers labeled PEB1-6 contained in the first processing rack 460 or the second processing rack 480.

In one embodiment, the process of transferring substrates between the processing steps 540 through 550, which are enclosed in the box labeled "D", are completed using the second central robot 430 and the third robot 440, and the chambers contained in the second processing rack 480. In another embodiment, the second central robot 430 may be used to transfer the substrates to and from the first processing rack 460 and the second processing rack 480 so that available chambers in these racks can be used as required to meet the process sequence requirements.

Referring to FIGS. 21B, 21D and 21F, after completing the process step 550 the front end robot 410 then removes the substrate from one of the developer chambers labeled CD1 or CD2 and place the substrate in its respective pod assembly 105.

Figure 21H:
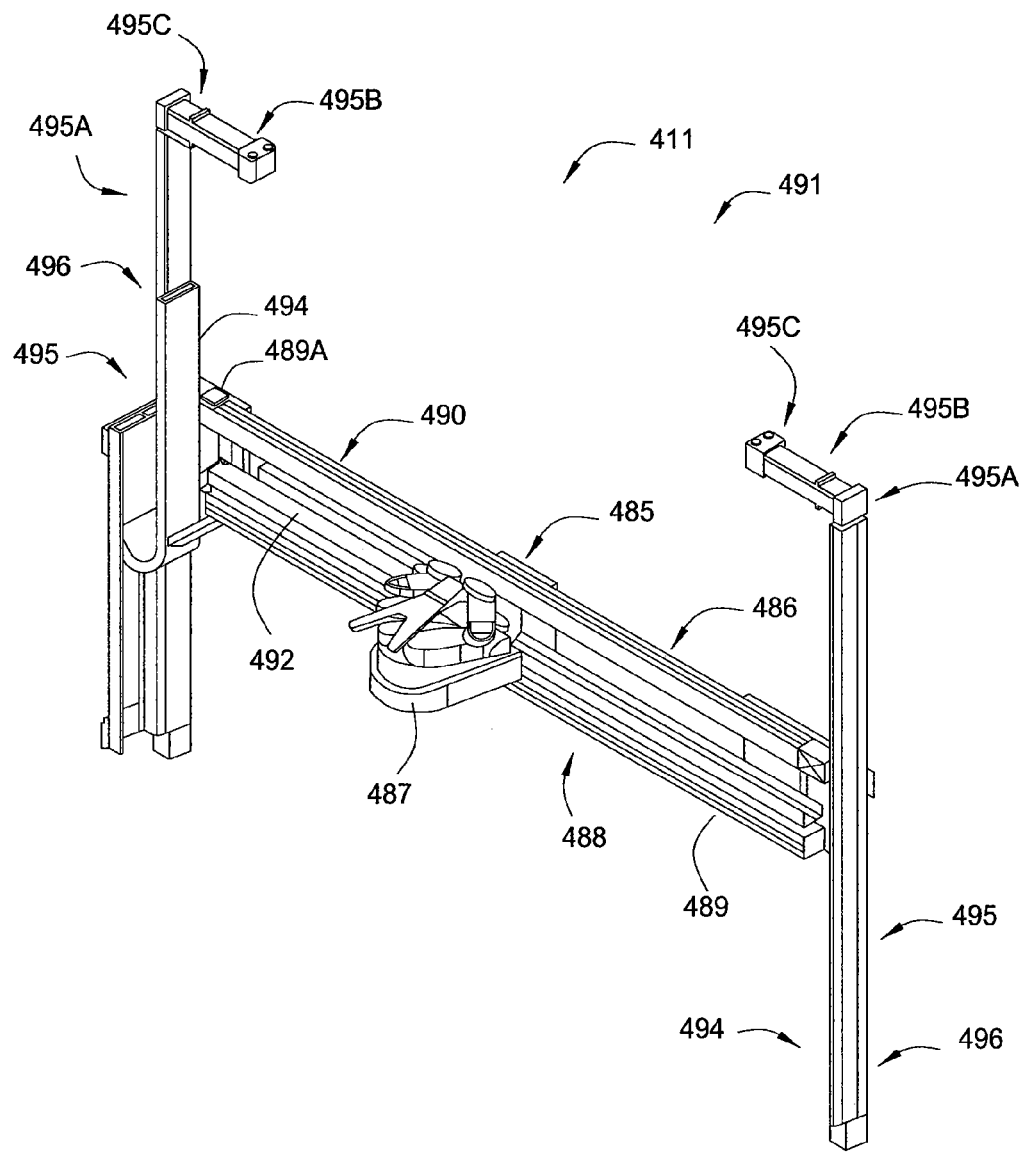

FIG. 21G illustrates an embodiment of a robot assembly 411 that may be adapted for use as the front end robot 410, the first central robot 420, the second central robot 430, the third central robot 440 and/or the rear robot 450. The robot assembly 411 generally contains a robot hardware assembly 485, a horizontal motion assembly 490 and two vertical motion assemblies 495. The robot hardware assembly 485 generally contains a conventional selectively compliant articulated robot arm (SCARA) robot containing two independently controllable arms/blades. In another embodiment, as shown in FIG. 21H, a single blade type robot hardware assembly 485 is used to transfer substrates. A dual blade robot may be advantageous, for example, where the robot has to remove a substrate from a processing chamber prior to placing the next substrate in the same processing chamber. An exemplary dual bladed robot may be purchased from Asyst Technologies in Fremont, Calif.

In one embodiment of the cluster tool 10, the front end robot 410, the first central robot 420, the second central robot 430, the third central robot 440 and/or the rear robot 450 may be adapted to transfer substrates in groups of two or more to improve the system throughput by parallel processing the substrates. For example, in one aspect, a robot containing multiple independently controllable arms/blades is used to pick up a plurality of substrates from a plurality of processing chambers and then transfer and deposit the substrates in a plurality of subsequent processing chambers. In one aspect, the robot is adapted to pick-up or drop off simultaneously using an arm that has multiple blades that are spaced a desired distance, or pitch, apart. For example, the front end robot 410, the first central robot 420, the second central robot 430, the third central robot 440 and/or the rear robot 450 may have a pair of blade assemblies 715A and 715B mounted on a support 720 (shown in FIGS. 16A-B) that is attached to an end of a SCARA robot's independently controllable arms/blades. In another aspect, the robot is adapted to separately pick-up, transfer and drop off multiple substrates. For example, a two arm robot is adapted to pick-up a substrate using a first arm, or blade, from a first chamber and then move to second processing chamber to pick-up a substrate using a second arm, or blade, so that they can be transferred and dropped off in a group.

Figure 21I:
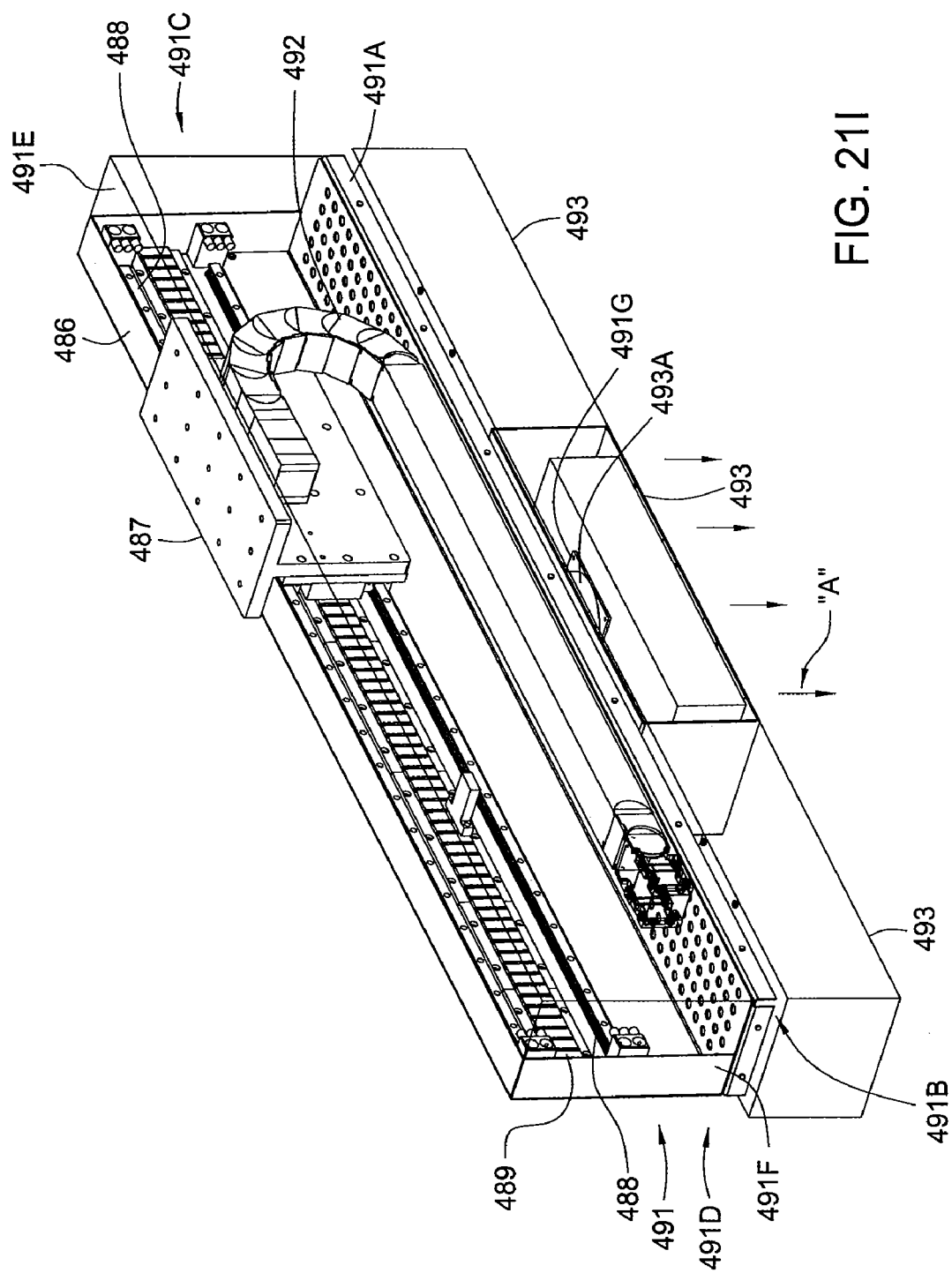

Referring to FIGS. 21G-I, the horizontal motion assembly 490 generally contains an enclosure 491, a robot actuator 489, a robot support interface 487, a linear slide 488 and cable guide assembly 492. The linear slide 488 may contain one or more linear ball bearing slides, or a conventional linear guide, that guides the robot support interface 487 (e.g., robot base interface) and robot hardware assembly 485 as it transfers the substrates between the various processing chambers. In one embodiment, the robot actuator 489 is a direct drive linear brushless servomotor, illustrated in FIG. 21I, which is adapted to move the robot support interface 487 relative to the linear slide 488 mounted on the support structure 486 of the enclosure 491. FIG. 21H illustrates one embodiment of the horizontal motion assembly 490 in which a motor 489A (e.g., DC servo motor, stepper motor, etc.), a belt (not shown) and pulley system (not shown) which runs horizontally along the length of the horizontal motion assembly 490, are adapted to transfer and position the robot support interface 487 so that substrates can be transferred between the processing chambers.

FIG. 21H illustrates an isometric view of an embodiment of a robot assembly 411 shown in FIG. 21G that is intended to illustrate the internal components contained in the horizontal motion assembly 490 and vertical motion assemblies 495. The vertical motion assembly 495 generally contains a lift rail assembly 495A, a lift actuator 495B, and a vertical enclosure 495D (see FIG. 21G, not shown in FIG. 21H). The lift rail assembly 495A contains a structural support 496 and a guide mechanism 494 to precisely raise and lower the horizontal motion assembly 490. The structural support 496 is a conventional structural member, such as an I-beam or other common structural component, that is designed to connect the robot assembly 411 to a frame member (not shown) in the cluster tool 10 and support the weight and loads created by the vertical motion assembly 495 and the horizontal motion assembly 490 components. The guide mechanism 494 may be a linear ball bearing slide or a conventional linear guide that is able to align and precisely guide the horizontal motion assembly 490 as it moves vertically along the guide mechanism 494.

Referring to FIG. 21H, in one embodiment of the vertical motion assembly 495, the lift actuator 495B contains a motor 495C (e.g., DC servomotor, stepper motor, or other type of actuator) that is used in conjunction with a belt and pulley configuration (not shown) to raise and lower the horizontal motion assembly 490 and its components. In another embodiment of the vertical motion assembly 495 (not shown), the lift actuator 495B is a direct drive linear brushless servomotor that may be purchased from Danaher Motion of Wood Dale, Ill. In one embodiment of the robot assembly 411, each vertical motion assembly contains a lift actuator 495B to raise and lower the horizontal motion assembly 490 and other supporting components. In another embodiment of the robot assembly 411, a single lift actuator 495B mounted to one of the two vertical motion assemblies 495 and the other vertical motion assembly 495 only contains the guiding mechanism 494.

FIG. 21I illustrates an isometric view of one embodiment of the enclosure 491 contained in the horizontal motion assembly 490. The enclosure 491 is adapted to cover and support the components in the horizontal motion assembly 490, for safety and contamination reduction reasons. Since particle generation is commonly generated by mechanical components that roll, slide, or contact each other, it is important to assure that the components in the horizontal motion assembly 490, and also the vertical motion assembly 495, do not cause defects on the substrates while the substrates are transferred through the cluster tool. The enclosure 491 generally contains a plurality of walls (see items 491A-F) and a support structure 486, which form an enclosed region that minimizes the chance that generated particles inside the enclosure can make their way to the surface of a substrate. The support structure 486 is a structural member to which the walls 491A-F, robot actuator 489, robot hardware assembly 485, and linear slides 488 all attach.

The fan unit 493 is adapted to draw air from inside the enclosure 491 through a fan port 491G formed in one of the walls of the enclosure 491 and pushes the particulate containing air through a filter (not shown) to remove particles before it is exhausted (see item "A") into the cluster tool 10. In this configuration a fan 493A, contained in the fan unit 493, is designed to create a negative pressure inside the enclosure 491 so that air outside the enclosure is drawn into the enclosure thus limiting the possibility of particles generated inside the enclosure 491 from leaking out. In one embodiment, the filter (not shown) is a HEPA type filter or other type of filter that can remove the generated particulates from the air. The configuration shown in FIG. 21I illustrates an embodiment where there are three fan units 493 that are used to draw air from the enclosure. In another embodiment, a single or dual fan unit system may be used in place of a three fan unit 493 configuration, as shown, without varying form the scope of the invention.

In one embodiment of the lift rail assembly 495A, a fan unit 493 (not shown) is adapted to draw air from inside each of the vertical enclosures 495D to minimize the chance that the particles generated inside the vertical motion assembly 495 will cause defects on the devices formed on the surface of the substrate.

Substrate Center Finding Device

In an effort to be more competitive in the market place and thus reduce CoO, electronic device manufacturers often spend a large amount of time trying to improve the system uptime and system reliability to reduce substrate scrap and increase the total system throughput (i.e., wafers starts per week). One factor that can affect the system uptime and reliability is the misplacement of substrates in the various processing chambers which can cause substrate damage (e.g., chipping, substrate breakage, etc.). Damage to the substrates will cause the user to shut down the current process, scrap all of the partially processed substrates, clean the affected chamber(s) and then restart the process sequence, all leading to significant system downtime and cost. Typically, to prevent substrate to substrate process variation and damage to the substrate caused by misalignment of the substrate in one of the processing chambers, or other chambers, the robot is repeatedly calibrated to pick up and drop off a substrate from a transfer position. The transfer position may be, for example, the center point between the process chamber lift pins or the center point of the chuck.

Figure 22A:
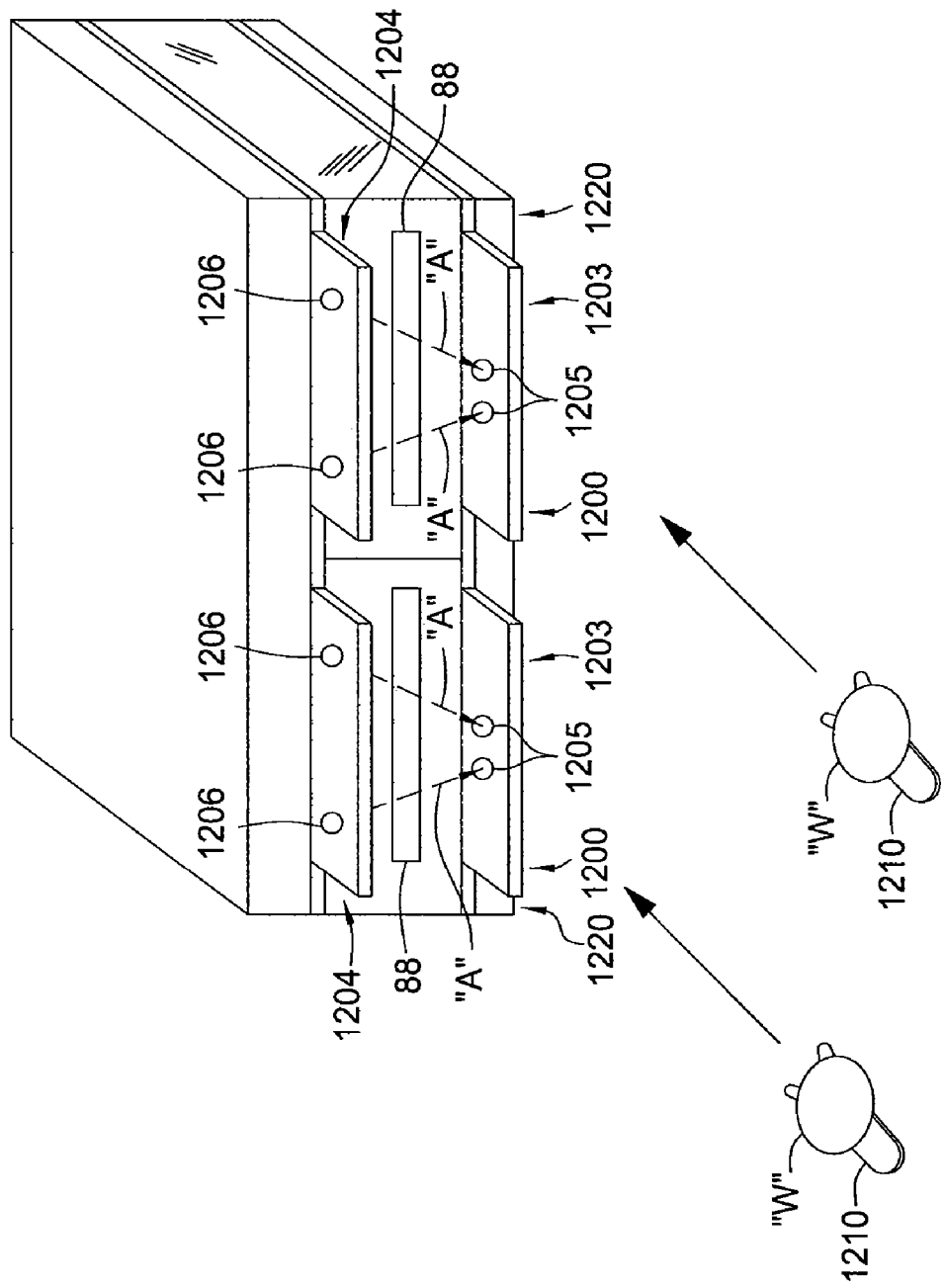
FIG. 22A illustrates an isometric view of processing chambers retained in a processing rack that have a substrate position error detection and correction systems mounted outside each of their openings.

To solve these problems, in one embodiment of the cluster tool 10, a substrate position error detection and correction system 1200 (hereafter SPEDAC 1200), shown in FIG. 22A, is used. FIG. 22A illustrates an isometric view of two adjacent process chambers 1220 (e.g., bake chamber 90, chill chamber 80, coater/developer chamber 60, etc.) retained in a processing rack that have two separate substrate position error detection and correction systems 1200 mounted outside each of their openings 88. FIG. 22A illustrates one embodiment of the SPEDAC system 1200 in which the transmitters 1206 are mounted to a top support 1204 and the detectors 1205 are mounted n a bottom support 1203 which are all connected to the process chamber 1220.

The SPEDAC system 1200 determines the presence of a substrate on a substrate transport robot blade as it enters or exits the opening 88 found in the various processing chambers and corrects for any error by repositioning the robot blade 1210 in subsequent transferring steps. The SPEDAC system 1200 utilizes a pair of beams (item "A") sent from two pairs of transmitters 1206 to detectors 1205 to detect the position of the substrate as it passes through the beams and adjusts the robot position to compensate for any error in the substrate's position. When a substrate position error is detected, the system determines the extent of the misalignment and corrects such misalignment, if correctable, by the movement of the robot blade position or alerts an operator for operator intervention. Further description of an exemplary method of detecting and compensating for substrate misplacement on the blade of the robot is further described in U.S. Pat. No. 5,563,798, entitled "Wafer Positioning System," issued Oct. 8, 1996, U.S. Pat. No. 5,483,138, entitled "System and Method for Automated Positioning of a Substrate in a Processing Chamber," issued Jan. 9, 1996, and U.S. Pat. No. 5,980,194, issued Nov. 9, 1999, to Freerks, et al., which are incorporated by reference in their entirety to the extent not inconsistent with the present disclosure. An example of an exemplary method to control robot position and thus substrate position is further described in U.S. Pat. No. 6,556,887, issued Apr. 29, 2003 to Freeman, et al., which is incorporated by reference in their entirety to the extent not inconsistent with the present disclosure.

Global Positioning

Another embodiment which may be used to improve the system uptime and system reliability by preventing substrate damage (e.g., chipping, substrate breakage) is the use of global positioning system (GPS) (not shown) to track and correct errors in the position of the robot blade and/or the position of the substrate. In this configuration, the global positioning detection system is used to define the location of the robot blade (substrate or robot end effector) with respect to a predetermined system datum. Typically, positional feedback of the robot blade's position is provided by incorporating encoders on shafts of drive motors for each control axis, that report the position of the motor and not the actual position of the robot blade. The actual position may vary from the reported position due to a loose coupling between the various drive components, improper robot parameter setup, robot positional control drift, undetected motion failures, and hardware collisions that may occur. Therefore, to resolve these issues, embodiments of the invention can be used to track the actual position of the robot blade, and thus substrate position.

In one embodiment, a global positioning device 1300 and a communicating system (e.g., RF transmitter 1302, cable, etc.) is integrated into the robot blade or robot to measure and feedback its position to the system controller 101. Therefore, by use of previously collected 3-dimensional coordinate system measurements of each transfer position, using the GPS sensor or other device, the system controller can correct errors in the blade position by adjusting the position of the various robot parts. The robot parts are positioned by use of conventional control means which may include encoders and other devices feedback type device used to control the robot's position.

In one embodiment, real-time positional feedback of the blade position can be accomplished by the communication of the global positioning device 1300 which is in communication with a RF transmitter 1302 mounted near the robot blade, that is in communication with an RF receiver 1303 that communicates with the system controller 101. The feedback of the global positioning device 1300 allows the actual position of the robot blade to be compared to the commanded position eliminating positional drifting and failures due to undetected hardware failures, In one embodiment, the system controller 101 uses the GPS system and the SPEDAC system 1200 (described above) to correct the robot positional placement and also the substrate to robot blade misalignment errors. This embodiment thus can be used to correct for substrate placement errors or movement of the substrate relative to the robot blade.

While the foregoing is directed to embodiments of the present invention, other and further embodiments of the invention may be devised without departing from the basic scope thereof, and the scope thereof is determined by the claims that follow.

We claim:

1. A method of transferring a substrate in a cluster tool, comprising:
    inserting at least one substrate into each of two or more vertically stacked processing chambers in a first processing rack using a first robot;
    removing a substrate from at least two of the two or more vertically stacked processing chambers in the first rack substantially simultaneously using a second robot that comprises at least one moveable arm having at least one substrate supporting surface;
    substantially simultaneously transferring the substrates to two or more vertically stacked processing chambers in a second processing rack using the second robot, wherein simultaneously transferring comprises moving the second robot a distance in a horizontal direction using a horizontal motion assembly;
    substantially simultaneously depositing the substrates in at least two of the two or more vertically stacked processing chambers in the second processing rack using the second robot;
    creating a first list of one or more command tasks for the first robot based on a user defined processing sequence;
    creating a second list of one or more command tasks for the second robot based on the user defined processing sequence;
    storing one or more command tasks for the first robot and the second robot in a memory of a controller;
    reviewing the first list and the second list to calculate an imbalance in work load between the first and second robots; and
    moving at least one of the one or more command tasks from the first list to the second list to balance the work load.

2. A method of transferring a substrate in a cluster tool, comprising:
- inserting at least one substrate into each of two or more vertically stacked processing chambers in a first processing rack using a first robot;
- removing a substrate from at least two of the two or more vertically stacked processing chambers in the first rack substantially simultaneously using a second robot that comprises at least one moveable arm having at least one substrate supporting surface, wherein removing the substrates from the at least two of the two or more vertically stacked processing chambers in the first rack substantially simultaneously using a second robot comprises:
  - extending a first arm of the at least one moveable arms relative to a support by use of a first actuator;
  - extending a second arm of the at least one moveable arms relative to the support by use of a second actuator;
  - positioning a first substrate positioned in a first processing chamber on the first arm and a second substrate positioned in a second processing chamber on the second arm by positioning the support connected to the second robot; and
  - retracting the first arm and the second arm;
- substantially simultaneously transferring the substrates to two or more vertically stacked processing chambers in a second processing rack using the second robot, wherein simultaneously transferring comprises moving the second robot a distance in a horizontal direction using a horizontal motion assembly and moving the second robot a distance in a vertical direction using a vertical motion assembly, wherein the horizontal motion assembly and the vertical motion assembly each comprise at least one robot support positioning actuator that is disposed within an internal region of an enclosure;
- evacuating the internal region of the enclosure in the horizontal motion assembly or the vertical motion assembly using a fan to reduce the pressure therein;
- substantially simultaneously depositing the substrates in at least two of the two or more vertically stacked processing chambers in the second processing rack using the second robot;
- substantially simultaneously removing a substrate from at least two of the two or more vertically stacked processing chambers in the second processing rack using a third robot;
- inserting the substrates in two or more vertically stacked processing chambers in a third processing rack using the third robot;
- creating a first list of one or more command tasks for the first robot based on a user defined processing sequence;
- creating a second list of one or more command tasks for the second robot based on the user defined processing sequence;
- storing one or more command tasks for the first robot and the second robot in a memory of a controller;
- reviewing the first list and the second list to calculate an imbalance in work load between the first and second robots; and
- moving at least one of the one or more command tasks from the first list to the second list to balance the work load.

3. A method of transferring a substrate in a cluster tool, comprising:
- inserting at least one substrate into each of two or more vertically stacked processing chambers in a first processing rack using a first robot;
- removing a substrate from at least two of the two or more vertically stacked processing chambers in the first rack substantially simultaneously using a second robot that comprises at least one moveable arm having at least one substrate supporting surface;
- substantially simultaneously transferring the substrates to two or more vertically stacked processing chambers in a second processing rack using the second robot, wherein simultaneously transferring comprises moving the second robot a distance in a horizontal direction using a horizontal motion assembly and moving the second robot a distance in a vertical direction using a vertical motion assembly, wherein the horizontal motion assembly and the vertical motion assembly each comprise at least one robot support positioning actuator that is disposed within an internal region of an enclosure;
- evacuating the internal region of the enclosure in the horizontal motion assembly or the vertical motion assembly using a fan to reduce the pressure therein;
- substantially simultaneously depositing the substrates in at least two of the two or more vertically stacked processing chambers in the second processing rack using the second robot;
- substantially simultaneously removing a substrate from at least two of the two or more vertically stacked processing chambers in the second processing rack using a third robot;
- inserting the substrates in two or more vertically stacked processing chambers in a third processing rack using the third robot;
- creating a first list of one or more command tasks for the first robot based on a user defined processing sequence;
- creating a second list of one or more command tasks for the second robot based on the user defined processing sequence;
- storing one or more command tasks for the first robot and the second robot in a memory of a controller;
- reviewing the first list and the second list to calculate an imbalance in work load between the first and second robots; and
- moving at least one of the one or more command tasks from the first list to the second list to balance the work load.

* * * * *